United States Patent [19]
Akaogi et al.

[11] Patent Number: 5,576,637
[45] Date of Patent: Nov. 19, 1996

[54] XOR CMOS LOGIC GATE

[75] Inventors: Takao Akaogi; Hiromi Kawashima; Tetsuji Takeguchi; Ryoji Hagiwara; Yasushi Kasa; Kiyoshi Itano, all of Kawasaki; Yasushige Ogawa, Kasugai; Shouichi Kawamura, Kawasaki, all of Japan

[73] Assignee: Fujitsu Limited, Kanagawa, Japan

[21] Appl. No.: 441,460

[22] Filed: May 15, 1995

Related U.S. Application Data

[62] Division of Ser. No. 98,406, Aug. 6, 1993, abandoned.

[30] Foreign Application Priority Data

| Dec. 9, 1991 | [JP] | Japan | 3-324701 |
| Dec. 27, 1991 | [JP] | Japan | 3-346571 |
| Jan. 14, 1992 | [JP] | Japan | 4-4678 |
| Mar. 19, 1992 | [JP] | Japan | 4-64143 |
| Jun. 5, 1992 | [JP] | Japan | 4-145300 |
| Jun. 15, 1992 | [JP] | Japan | 4-154958 |
| Sep. 15, 1992 | [JP] | Japan | 4-256594 |
| Nov. 10, 1992 | [JP] | Japan | 4-299987 |
| Dec. 9, 1992 | [WO] | WIPO | PCT/JP92/01608 |

[51] Int. Cl.⁶ ................................................. H03K 19/21
[52] U.S. Cl. ..................................... 326/55; 326/54
[58] Field of Search .......................... 326/52, 54, 55, 326/121

[56] References Cited

U.S. PATENT DOCUMENTS

| 4,424,460 | 1/1984 | Best | 326/52 |
| 4,453,096 | 6/1984 | Le Can et al. | 326/52 |
| 4,541,067 | 9/1985 | Whitaker | 326/52 |

*Primary Examiner*—Edward P. Westin
*Assistant Examiner*—Richard Roseen
*Attorney, Agent, or Firm*—Nikaido Marmelstein Murray & Oram LLP

[57] ABSTRACT

An exclusive OR circuit includes a first series circuit in which a source of a first pMIS transistor is connected to a positive-voltage power supply line. A drain of the first pMIS transistor is connected to a drain of a first nMIS transistor via a second nMIS transistor. The source of the first nMIS transistor is connected to a low-voltage power supply line via a fourth nMIS transistor. A second series circuit has a drain of a third nMIS transistor connected to a high-voltage power supply line via a second pMIS transistor. The source of the third nMIS transistor is connected to the source of a third pMIS transistor. The drain of the third pMIS transistor is connected to the low-voltage power supply line via a fourth pMIS transistor. The gates of the first and third nMIS transistors and the first and third pMIS transistors are connected to one another and provided with a first input. The gates of the second and fourth nMIS transistors and the second and fourth pMIS transistors are connected to one another and provided with a second input. The sources of the second and third nMIS transistors are connected to each other and provide the exclusive OR of the first and second inputs.

1 Claim, 99 Drawing Sheets

FOR WRITING

FOR READING

FOR ERASING
(POSITIVE-VOLTAGE
APPLICATION)

FOR ERASING
(NEGATIVE-VOLTAGE
APPLICATION)

ERASING TIME AND THRESHOLD VALUE TRANSITION $I_L$ ... LOAD CURVE
$I_s$ ... CELL CHARACTERISTIC CURVE

Fig. 82
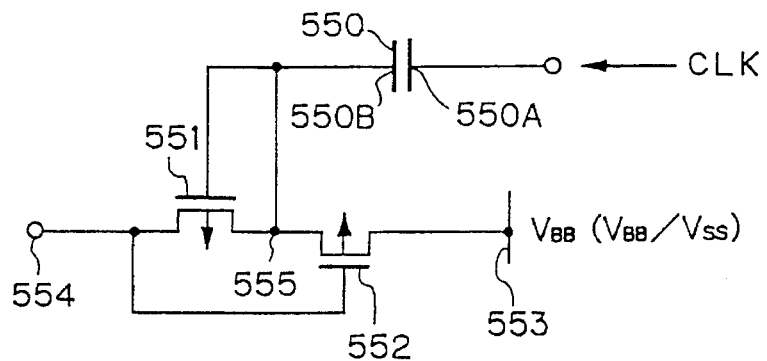
Fig. 83A
CLK
Fig. 83B
NODE 555
Fig. 83C
NEGATIVE-VOLTAGE OUTPUT TERMINAL 554
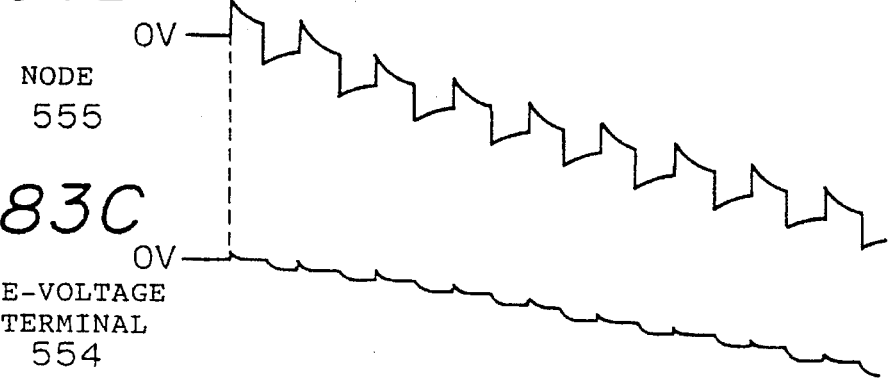

Fig. 87A CLK 
Fig. 87B NODE 599 
Fig. 87C 0 V
WL₁~WL₄ 
Fig. 89A SL 
Fig. 89B CLK 
Fig. 89C NODE 599 
Fig. 89D 0 V
WL₁~WL₄ 

Fig.III

XOR CMOS LOGIC GATE

This is a division of application Ser. No. 08/098,406 filed Aug. 6, 1993 now abandoned.

TECHNICAL FIELD

The present invention relates to a so-called flash memory or a nonvolatile semiconductor memory from which existent information can be electrically erased concurrently or block by block. In particular, this invention is concerned with improvements in erasing a flash memory and improvements in the associated circuitry.

In recent years, a variety of semiconductor memories such as an electrically erasable programmable read only memory (EEPROM), which can be rewritten by electrically erasing data stored therein, have been developed in the field of nonvolatile memories.

The semiconductor memories are nonvolatile memories which are made rewritable by electrically erasing specified data previously written therein.

As for this kind of nonvolatile memory, in consideration of the use as a substitute for a magnetic storage or the like, efforts have been made to increase the capacity and decrease the cost. For use in a portable information processing terminal or the like, however, it is required to lower the voltage requirements.

Known semiconductor memories, which are nonvolatile memories that are made rewritable by erasing specified data previously written therein, include an erasable programmable read only memory (EPROM) and the EEPROM.

The EPROM has the advantage of a small cell size. However, data erasing is a nuisance because ultraviolet light must be used to erase data. As for the EEPROM, data erasing is easy to do because data can be erased electrically. However, the cell size in the EEPROM is larger than that in the EPROM, which makes it difficult to increase the capacity of an EEPROM.

As a semiconductor memory having the advantages of the foregoing memories, for example, what is referred to as a flash memory has been developed.

The term "flash memory" will be adopted in the succeeding description.

BACKGROUND ART

The nonvolatile semiconductor memory has an overall configuration, for example, as that shown in FIG. 1. In FIG. 1, N cell blocks $11_1$ to $11_N$ (for example, eight blocks) each having multiple transistor cells are arranged in a row. The cell blocks $11_1$ to $11_N$ are provided with bit line select circuits $12_1$ to $12_N$ and sense amplifiers/sense buffers $13_1$ to $13_N$ respectively.

A row address signal is supplied from a row address buffer to each of the cell blocks $11_1$ to $11_N$ via a row decoder 15. A column address signal is supplied from a column address buffer 16 to each of the bit line select circuits $12_1$ to $12_N$ via a column address decoder 17. A voltage $V_S$ sent from a source power supply circuit 18 is applied to each of source electrodes of the transistor cells of the cell blocks $11_1$ to $11_N$.

FIG. 2 shows the cell block 11, one of the cells blocks in the aforesaid nonvolatile semiconductor memory, and its peripheral circuitry. In FIG. 2, components identical to those in FIG. 1 bear the same reference numerals, of which a description will be omitted. In FIG. 2, the bit line select circuit 12 comprises n-channel MOS field-effect transistors Q1 to Qn. Column address signals Y1 to Yn are fed from the column decoder 17 to the gates of the transistors Q1 to Qn.

The cell block 11 comprises a total of n by n field-effect transistors Q11 to Qnn having floating gates and control gates. The gates of n transistors Qil to Qin (where, i=1, 2, etc., and n) arranged in tandem are provided with row address signals Xi sent from the row decoder 15 via word lines.

The drains of the n transistors Qli to Qni arranged in tandem are connected to the drains of the transistors Qi in the bit line select circuit 12 via bit lines. Voltage from the source power circuit 18 is applied to each of the sources of the transistors Q11 to Qnn. A cell amplifier 13a and a write buffer 13b are connected to each of the sources of the transistors Q1 to Qn.

In the foregoing semiconductor memory, when row addresses Xi and column addresses Yi are selected for writing, data read from the write buffer 13 are written in the transistors Qij of the cell blocks $11_1$ to $11_N$. Writing is performed simultaneously on one bit per each of the cell blocks $11_1$ to $11_N$ or a total of N bits designated with the row addresses and column addresses. Data erasing is performed concurrently on all transistors in the cell blocks $11_1$ to $11_N$.

In a flash memory, information is retained depending on the presence or absence of a charge in a memory cell. FIG. 3 shows an example of a structure of a memory cell. As shown in FIG. 3, a gate has a two-layered structure consisting of a control gate (CG) 25 and a floating gate (FG) 24. The control gate 25 is connected to a word line WLi and a drain (D) 23 is connected to a bit line BLi. Reference numeral 26 denotes a tunneling oxide film.

The flash memory is broadly divided into two types of what are referred to as NOR and NAND. These types differ from each other in a method of writing, reading, or erasing information into or from a memory cell. Taking the NOR type flash memory as an example, writing, reading, or erasing information into or from a memory cell will be described below.

When information is to be written in a memory cell having the aforesaid structure, as shown in FIG. 4, the word line WLi is set to Vpp (approx. 12 V), the bit line BLi is set to approx. 6 V, and the source S is set to 0 V. High voltage is then applied to the control gate CG and drain D. Current then flows into the memory cell. Part of the electrons flowing through the memory cell are accelerated due to the high electric field in the vicinity of the drain D, gain energy, and then goes beyond the energy barrier of an insulating film of the floating gate. The electrons are finally injected into the floating gate FG. The floating gate FG is not electrically coupled with other circuits, so it therefore can retain charges on a semi-permanent basis.

When information is to be read from a memory cell, as shown in FIG. 5, the word line WLi is set to Vcc (about 5 V), the bit line BLi is set to about 1 V, and the source S is set to 0 V. The memory cell is then selected by specifying the word line WLi and bit line BLi. The threshold value of the cell transistor varies depending on the charges retained in the floating gate FG. Current flowing through the selected memory cell varies depending on the information stored therein. The information therefore can be read out by detecting and amplifying the current.

The voltage levels of the control gate CG, drain D, source S, and substrate PS in the aforesaid operative states are set to the values listed in Table 1.

TABLE 1

| | Voltages in modes in a prior art | | | |
|---|---|---|---|---|
| | CG | D | S | PS |
| Reading | Vcc | to 1 V | 0 V | 0 V |
| Writing | Vpp | to 6 V | 0 V | 0 V |
| Erasing | 0 V | Float | Vpp | 0 V |

When information is to be erased from a memory cell, as shown in FIG. 6, the word line WLi is set to about 0 V and the bit line BLi is opened. In this state, the drain D is opened, about 0 volt is applied to the control gate CG, and a high voltage of about 12 volts is applied to the source S.

Since a high voltage is applied to the source S, deep diffusion is required in order to increase the resistivity of the diffused layer in the source. This hinders reduction in cell area.

For divided erasing, it is required that the Vss line in the source must partly have a different voltage. This leads to disconnection or an increased number of drive circuits. Eventually, chip size increases.

A solution to the above problem is to apply a negative voltage to the word line WLi. To be more specific, as shown in FIG. 7, a negative voltage (about −10 V) is applied to the control gate CG and Vcc (about 5 V) is applied to the source S. The drain D is opened. Erasing is then executed.

In this case, since a low voltage is applied to the source S, the resistivity of the source need not be intensified. This contributes to reduction in cell size. Partial erasing is enabled by selectively applying negative voltage to the control gates CG.

The aforesaid erasing method is a source erasing method in which charges in the floating gate FG are routed to the source. A channel erasing method is also available, wherein charges in the floating gate are routed to a channel; that is, a substrate. Even in this method, negative voltage is applied to the control gate. The channel erasing method is sometimes employed for the aforesaid NAND-type flash memory.

FIGS. 8 to 11 show the states of a memory cell with voltage applied according to various erasing methods. In FIGS. 8 to 11, the memory cell is an n-channel transistor.

FIG. 8 shows a state in which positive voltage is applied according to a channel erasing method. The drain D and source S are opened, and the control gate CG is set to 0 V. The high voltage Vpp is applied to the P well equivalent to a channel. In channel erasing, a triple-well structure shown in FIG. 8 is adopted because positive bias is applied to the channel.

FIG. 9 shows a state in which a positive voltage is applied according to the source erasing method. The drain D is opened, and then the control gate CG is set to 0 V. The high voltage Vpp is applied to the source S. The substrate is opened or set to 0 V.

FIG. 10 shows a state in which a negative voltage is applied according to the channel erasing method. The drain D and source S are opened, and the control gate CG is set to a negative voltage $V_{BB}$. A positive voltage Vcc is applied to the p well equivalent to a channel. $V_{BB}$–Vcc is applied between the control gate CG and channel.

FIG. 11 shows a state in which negative voltage is applied according to the source erasing method. The drain D is opened, and then the control gate CG is set to the negative voltage $V_{BB}$. The source S is set to the positive voltage Vcc.

The methods for erasing a flash memory which have been described so far, have lots of problems with actual erasing. The problems will be described below.

Erasing of a flash memory is either concurrent erasing, in which all memory cells are erased concurrently, or block-by-block erasing in which erasing is performed block by block. Some of the memory cells to be erased concurrently contain data, while other cells do not contain data. In other words, some cells hold electrons in their floating gates, while other cells do not. If erasing is performed on a memory cell in which no electrons are held, a state in which too many electrons are extracted (that is, a state in which holes are injected) is set up. This is referred to as excessive erasing. When excessive erasing occurs, a "Normally On" state in which a memory cell is on even during normal operation is established disabling normal operation. Pre-erase writing is then performed, wherein data are written in all memory cells before erasing is done. The time required for erasing therefore includes the time required for pre-erase writing. In order to reduce the erasing time, the time required for pre-erase writing must be diminished.

In erasing a flash memory, whichever is adopted; channel erasing or source erasing, voltage applied between the control gate CG and channel or source S greatly affects the erasing. For stable erasing, the voltage to be applied between the control gate and the channel or source must be held constant irrelevant of the fluctuation in external power supply. A memory for a portable device is one of currently conceivable application fields for a flash memory. This kind of portable equipment use batteries as a power supply. When employed for portable equipment, a flash memory is therefore subjected to a voltage fluctuation in an external power supply. Under these circumstances, there is an increasing demand for an erasing method for a flash memory that permits stable erasing irrelevant of a fluctuations in an external power . supply, and for a flash memory that can be erased according to the erasing method.

Furthermore, when the source erasing method is employed, the foregoing fluctuation in external power supply may cause the voltage that is applied from a source to vary, or the characteristics of memory cells or drive circuits to differ from one another. As a result, the electric field in the source region becomes stronger and avalanche current increases. When the avalanche current flows, the memory cells deteriorate. Consequently, the rewritable frequency of a flash memory decreases or memory cells are destroyed.

The foregoing problems relate to the principle of erasing. The circuitry in a flash memory for performing the aforesaid erasing has several problems; such as, how to downsize the circuitry, reduce power consumption, or speed up processing.

As mentioned above, the resistivity of a junction in a source region can be improved by applying negative voltage to a control gate during erasing. This has the advantage of enabling reduction of a cell area. It is, however, a big problem how to realize application of negative voltage to the control gate.

It is, for example, conceivable to apply negative voltage from a row decoder to word lines. The voltage to be applied to a word line is changed depending on whether the word line is selected or not. In a flash memory, the voltage to be applied to a word line must be varied depending on whether the read mode or write mode is selected. When the row decoder is used to apply a negative voltage, the voltage to be applied to a word line must be changed to a negative voltage. A word line selected in the read or write mode has a higher voltage than other unselected word lines. For erasing, however, the selected word line must have a lower voltage than the unselected word lines. The level of applied voltage must therefore be reversed depending on the logic of selected or unselected word lines. This results in complex circuitry, making downsizing in possible.

A flash memory includes an internal power switching circuit for switching supply voltages depending on a mode. A conventional internal power switching circuit has a simple circuitry but is likely to cause a latch-up phenomenon. The switching speed is decreased in order to avoid the latch-up phenomenon. This contradicts efforts to speeding up processing.

Furthermore, for negative voltage erasing, bias voltage must be applied to a substrate or part of a well. A conventional substrate bias circuit is realized with a p-channel depletion-type transistor. The manufacturing process is complex and downsizing is hard to do.

Moreover, in a flash memory, the logic of a word line, selected or unselected, must be reversed depending on whether the erase mode or any other mode is specified. An exclusive-OR circuit is employed for the logical reversal. This circuit is also complex, posing an obstacle to downsizing.

DISCLOSURE OF THE INVENTION

The present invention attempts to solve the aforesaid problems, and has the following objects:

(1) To speed up an erasing operation including a pre-erase writing operation;

(2) To enable stable erasing for a specified period of time;

(3) To prevent deterioration of memory cells and increase rewritable frequency;

(4) To minimize the negative effect of excessive erasing by suppressing the influence of excessive erasing of a certain memory cell on other memory cells;

(5) To realize a simple structure that enables selective application of negative voltage to word lines;

(6) To realize an internal power switching circuit that can operate at a high speed with simple circuitry;

(7) To realize a substrate (well) voltage control circuit that consumes limited power and can be downsized; and (8) To realize exclusive-OR and exclusive-NOR circuits that can be downsized.

For attaining the object (1), in a flash memory based on the first mode of the present invention, each of multiple word lines is connected to the gates of multiple transistor cells arranged in a row, each of multiple bit lines is connected to the drains of multiple transistor cells arranged in tandem, and data can be written electrically in any transistor cell or data can be erased electrically from all transistor cells concurrently. When data of specified values are written in all transistor cells before data erasing, at least either all the bit lines or all the word lines are selected in units of multiple lines. The data of specified values are then written in multiple transistor cells connected to the selected multiple bit lines or word lines.

In a conventional flash memory, pre-erase writing as well as writing is performed for each memory cell. Therefore, too much time is taken up by this for pre-erase writing. In the flash memory based on the first mode of the present invention, pre-erase writing is performed in units of multiple memory cells. The time required for pre-erase writing can therefore be reduced.

For attaining the object (2), a flash memory based on the second mode of the present invention, which performs channel erasing or source erasing by applying a negative voltage to a control gate, includes a voltage restriction means for restricting the negative voltage to be applied to the control gate so that the negative voltage will be a constant value relative to the voltage of a channel or source, or two voltage restriction means for restricting the negative voltage to be applied to the control gate and the voltage to be applied to the source so that the voltages will be a constant value relative to a common reference voltage.

In the flash memory based on the second mode of the present invention, the voltage between a control gate and a channel or source is held constant all the time, so errors in erasing time will be diminished.

For attaining the object (3), a flash memory based on the third mode of the present invention includes a cell matrix in which rewritable nonvolatile memory cells are arranged at intersections between multiple word lines and multiple bit lines, and a power circuit for feeding a supply voltage to each of the sources of transistors forming the nonvolatile memory cells, and performs source erasing by applying a high voltage to the sources. The power circuit includes a current restriction element that has a specified load characteristic.

In the flash memory based on the third mode of the present invention, the power supply for applying high voltage to the sources of memory cells has a current restriction element. Despite the fluctuation in source voltage, as long as the load characteristics of the current restriction element are defined so that a specified voltage, which is equal to or lower than an avalanche voltage, will be applied, injection of holes during erasing can be suppressed. Deterioration of memory cells is therefore minimized.

For attaining the object (4), in a flash memory based on the fourth mode of the present invention, memory cells are grouped in units of a specified number of memory cells on the same word line, select lines are provided to select a specified memory cell group among the memory cell groups, the gates of MOS transistors are connected to the word lines of the memory cell groups and the sources thereof are connected to the sources of the memory cells in each memory cell group, and the memory cell groups including the MOS transistors are formed in a well. When specified data previously written in the memory cell groups are to be erased electrically, a negative voltage is applied to the word lines.

In the flash memory based on the fourth mode of the present invention, MOS transistors are employed and the gates of the MOS transistors are connected to the word lines of memory cell groups. The sources of the MOS transistors are connected to those of the memory cells of each memory cell group. When data is to be read, since only a selected memory cell group is connected to the sources of the MOS transistors, even if excessive erasing occurs in one cell of unselected memory cell groups, since the sources of the unselected memory cell groups are disconnected, the influence of the excessive erasing can be suppressed.

Complex control is unnecessary for erasing. Moreover, since one MOS transistor is added to each memory cell group, the cell area hardly deviates from that in a conventional memory. Eventually, the negative effect of excessive erasing can be prevented, and an increase in cell size can be minimized.

For attaining the object (5), in a flash memory based on the fifth mode of the present invention, a row decoder outputs the negative voltage to be applied to word lines for erasing. Herein, the row decoder includes drive units for supplying decoded signals to word lines. The drive unit selectively outputs a voltage to be applied to a first power terminal and a voltage to be applied to a second power terminal. The drive unit can enter either a first operation mode in which a first voltage is applied to the first power terminal and a second voltage that is lower than the first voltage is applied to the second power terminal or a second operation mode in which a third voltage is applied to the first power terminal and a fourth voltage that is higher than the third voltage is applied to the second power terminal. Output voltages are thus changed depending on whether the first or second operation mode is selected.

In the flash memory based on the fifth mode of the present invention, the levels of voltages to be applied to the power terminals of a drive unit in a row decoder are varied between two modes; that is, the levels of voltages to be applied to the power terminals of a drive unit in a row decoder are varied depending on which of the modes is specified. This obviates the need of changing the logic of each word line between Selected and unselected. Simple circuitry ensues.

In a flash memory based on the sixth mode of the present invention or another mode for attaining the object (5), a row decoder includes a level change circuit comprising a first connection switch element whose first terminal is connected to an input terminal for inputting an input signal and whose second terminal is connected to a first output terminal for outputting a first output signal, a second connection switch element whose first terminal is connected to the input terminal and whose second terminal is connected to a second output terminal for outputting a second output signal, a first inverter whose input terminal is connected to the second terminal of the first connection switch element, whose output terminal is connected to the second output terminal, and whose power terminals are connected respectively to a first voltage line for feeding a desired voltage that is higher than a supply voltage and a second voltage line for feeding a desired voltage that is lower than a ground voltage, and a second inverter whose input terminal is connected to the second terminal of the second connection switch element, whose output terminal is connected to the first output terminal, and whose power terminals are connected respectively to the first voltage line and second voltage line.

In the flash memory based on the sixth mode of the present invention, the level change circuit has the capacity for level change and logic change. A row decoder capable of applying negative voltage selectively to word lines can thus be realized with a small-scale circuitry.

For attaining the object (5), a flash memory based on the seventh mode of the present invention is provided with a negative voltage source independently of a row decoder. The negative voltage source is connected to word lines via a negative voltage bias circuit comprising a capacitor to one end of which a clock pulse is supplied, a first p-channel MIS field-effect transistor whose drain is connected to a negative voltage output terminal and whose gate and source are connected to the other end of the capacitor, and a second p-channel MIS field-effect transistor whose drain is connected to the source of the first p-channel MIS field-effect transistor, whose gate is connected to the negative voltage output terminal, and whose source is provided with negative voltage. When negative voltage is applied, the row decoder outputs a word line application signal whose logic is reversed. A logic circuit extends control so that when a word line application signal whose logical value is low is output, a clock pulse will be fed to the negative voltage bias circuit.

In a flash memory based on the seventh mode of the present invention, the foregoing negative voltage bias circuit is used to control whether or not to apply negative voltage depending on whether or not a clock signal is to be input. The input of a clock signal is controlled by a decoded signal sent from the row decoder, which enables selective application of negative voltage. Although another system independent of the row decoder is employed for negative voltage application, since an existing row decoder is used to select word lines, a simple circuitry ensues. Moreover, downsizing is possible.

The eight mode of the present invention is an internal power switching circuit for use in a flash memory or the like, comprising a first MOS transistor of a first polarity one of whose drain and source electrodes is connected to a first power line and the other of whose drain and source electrodes is connected to a second power line;

a second MOS transistor of a second polarity one of whose drain and source electrodes and whose well are connected to a third power line having a higher voltage than the first power line, and the other one of whose drain and source electrodes is connected to a node; and a third MOS transistor of the second polarity one of whose drain and source electrodes is connected to the node and the other of whose drain and source electrodes is connected to the second power line. The internal power switching circuit further includes a fourth MOS transistor of the first polarity one of whose drain and source electrodes is connected to the third power line and the other of whose drain and source electrodes is connected to the second power line.

In the internal power switching circuit based on the eighth mode of the present invention, when a low voltage is switched to a high voltage, the fourth MOS transistor assists in boosting the voltage of the second power line. This helps minimize the channel current in the second MOS transistor. A latch-up phenomenon can therefore be avoided.

The ninth mode of the present invention is a substrate (well) voltage control circuit for use in a flash memory or the like. For attaining the object (7), the substrate voltage control circuit comprises a negative voltage source for outputting a negative voltage to a power line connected to a component whose voltage is to be controlled, a first n-channel transistor whose substrate (well) and source are connected to the power line and whose drain is connected to a ground power supply, a second n-channel transistor whose substrate (well) and source are connected to the power line and whose drain is connected to the gate of the first n-channel transistor, a first switch installed between the gate of the first n-channel transistor and a positive power supply, a second switch for use in selecting whether the gate of the second n-channel transistor is to be connected to the positive power supply or ground power supply, or opened, and a capacitative element connected between the gate and source of the second n-channel transistor. When negative voltage is not applied, the negative voltage source is put into a non-output state, the first switch is made, and the second switch is connected to the ground power supply. When negative voltage is to be applied, the first switch is opened and the second switch is connected to the positive power supply at the same time. Thereafter, the second switch is opened and the negative voltage source is put into an output state.

In the substrate (well) voltage control circuit based on the ninth mode of the present invention, when negative voltage is applied, the gate-source voltage of the second n-channel transistor is held at a specified value owing to the charges retained in the capacitative element before switching is done. The second n-channel transistor therefore remains in the on state. The gate of the first n-channel transistor therefore assumes a negative voltage. The first n-channel transistor is then turned off. The power line is then disconnected from the ground power supply. A large voltage will not be applied between the gate and source of the second n-channel transistor, which obviates the need of improving resistivity, and downsizing becomes possible.

The tenth mode of the present invention is an exclusive-OR circuit for use in a flash memory or the like. For attaining the object (8), the exclusive-OR circuit includes a first CMIS inverter in which the source of a first pMIS transistor is connected to a high-voltage power supply line, the source of a first nMIS transistor is connected to a low-voltage power supply line, the gates of the first pMIS transistor and first nMIS transistor are connected to each other to serve ,as an input terminal, the drains of the first pMIS transistor and first nMIS transistor are connected to each other to serve as an output terminal, a second pMIS transistor whose source is connected to the input terminal of the first CMIS inverter and provided with a first input, and a second nMIS transistor whose drain is connected to the output terminal of the first CMIS inverter, whose source is connected to the drain of the second pMIS transistor, and whose gate is connected to the date of second pMIS transistor and provided with a second input. The exclusive OR of the first and second inputs is output from a contact point between the drain of the second pMIS transistor and the source of the second nMIS transistor.

BRIEF DESCRIPTION OF THE DRAWINGS

FIG. 4 shows the conditions for writing; FIG. 5 shows the conditions for reading; FIG. 6 shows the conditions for erasing; FIG. 7 shows the conditions for erasing based on negative-voltage application;

FIG. 82 is a diagram for explaining the principle of a negative voltage bias circuit for use in the seventh mode;

FIGS. 83A to 83C show waveforms for explaining the operations of the negative voltage bias circuit in FIG. 82;

FIGS. 87A to 87C show waveforms for explaining the operations of the twenty-third embodiment;

FIGS. 89A to 89D show waveforms for explaining the operations of the circuit in FIG. 88;

BEST MODE FOR CARRYING OUT THE INVENTION

To begin with, embodiments based on the first mode of the present invention, which reduce the time required for erasing, will be described. The invention of the first mode performs pre-erase writing efficiently to increase the overall speed of erasing. Prior to the embodiments, pre-erase writing will be described.

Figure 3:
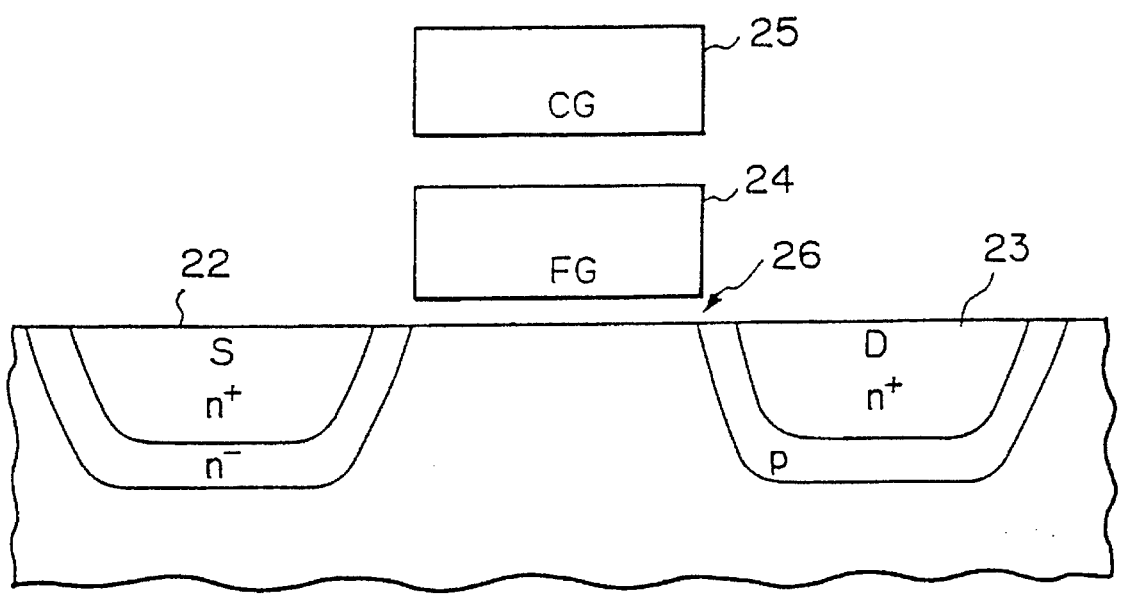
FIG. 3 shows a structure of a memory cell.
Figure 12:
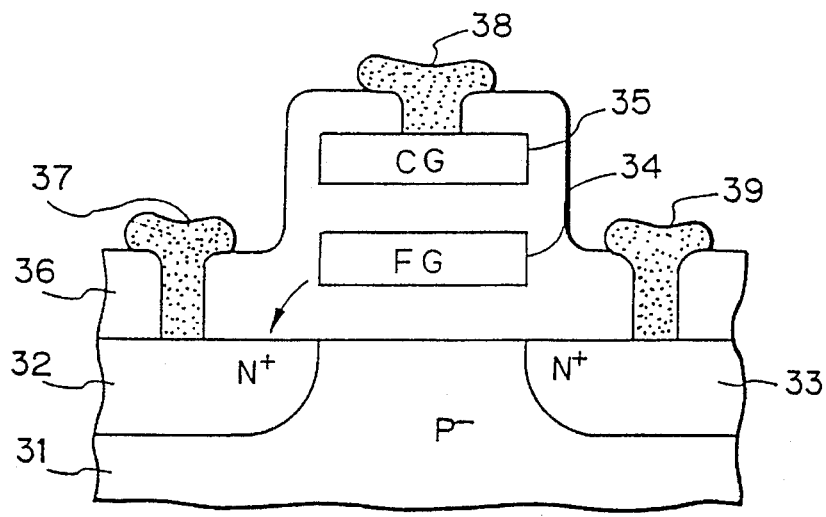
FIG. 12 shows a structure of a transistor cell.

FIG. 12 shows a structure of a memory cell shown in FIG. 3 in more detail. A transistor serving as the memory cell has, as shown in FIG. 12, such a structure that n-type diffusive regions 32 and 33 are formed in a p-type substrate 31 with a certain space between them. A floating gate (FG) 34 and a control gate (CG) 35 are formed above the p-type substrate 31, and coated with an oxide film 36. The n-type diffusive regions 32 and 33 are coupled with a source electrode 37 and a drain electrode 39 respectively. The control gate 35 is coupled with a gate electrode 38.

An insulating film for isolating between the floating gate (FG) and control gate (CG) in the stacked gate type memory cell transistor may be an oxide film or oxide nitride film. However, an ONO film; that is, a three-layered structure of an oxide film over a nitride film over an oxide film is preferred in an effort to prevent a time-sequential leakage of charges from the floating gate (FG). Using the same process for producing the insulating film between gate electrodes, an insulating film for a gate in a single gate-type transistor which is used in any region of peripheral circuits may be produced.

In this case, the gate insulating film for the single gate-type transistor formed in a region of peripheral circuits may be the ONO film or oxide nitride film. The gate insulating films for transistors except memory cell transistors are not necessarily oxide films.

Writing in a memory cell is achieved by injecting electrons into the floating gate (FG) 34, whereby "0" will be written. Erasing is achieved by removing electrons from the floating gate (FG) 34, whereby "1" will be written.

When a source erasing method based on high-voltage application is performed to erase the transistor cell (to write "1"), as described previously, high voltage is applied to the source electrode 37, zero volt is applied to the gate electrode 38, and the drain electrode 39 is opened. The electrons retained in the floating gate 34 are thus removed.

Figure 13:
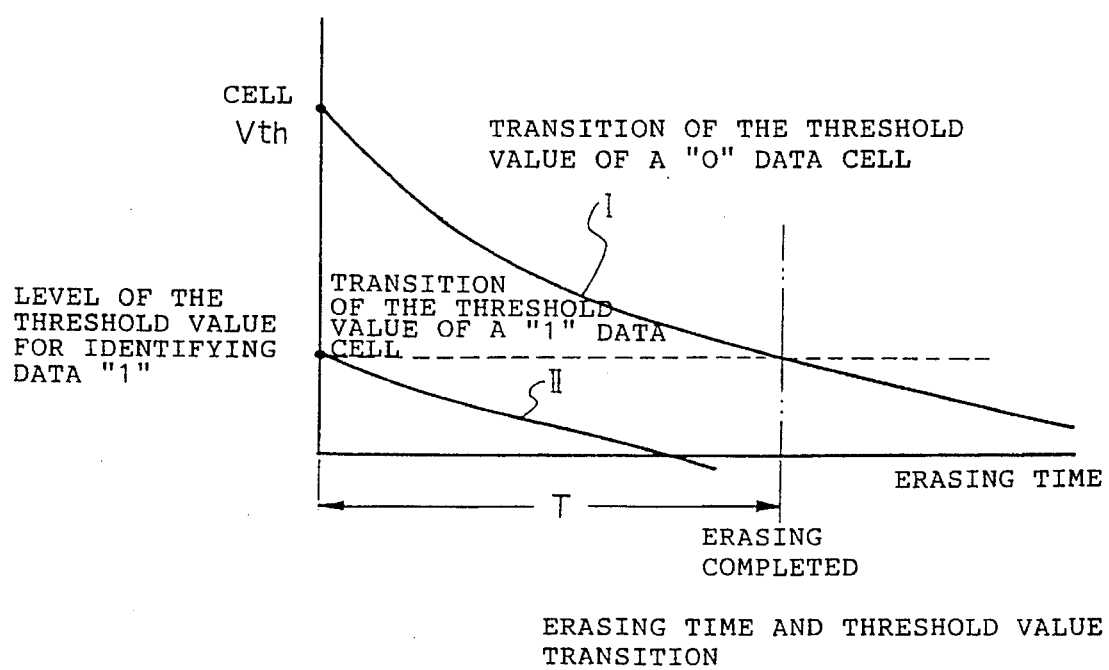
FIG. 13 is an explanatory diagram for excessive erasing.

When "0" has been written in the transistor cell; that is, when electrons have been retained in the floating gate 34, the threshold for the cell, I, in FIG. 13 decreases to be lower than a threshold level for identifying data "1" for the period of an erasing time T.

In contrast, when "1" has been written in the transistor cell; that is, when no electrons have been retained in the floating gate 34, since the threshold level is low, as the threshold of the cell decreases as indicated with II in FIG. 13 due to the erasing, the threshold level becomes 0 for a shorter period of time than the erasing time T. During the above erasing, too many electrons are removed from transistor cells in which "1s" have been written. The transistor cells consequently enter a Normally On state.

In order to prevent the foregoing excessive erasing, it is necessary for a flash memory, in which cells are NORed, to write data "0" in each of the transistor cells in all cell blocks before concurrent erasing is performed. Writing data "0" is performed on all transistor cells, wherein the data values written in the transistor cells are not checked. Specifically, a source voltage Vs for the source electrode 37 in the transistor cell shown in FIG. 12 is set to 0 V, a gate voltage Vg for the gate electrode 38 is set to a high voltage, and a drain voltage $V_D$ for the drain electrode 39 is set to a high voltage. High-energy electrons developed by applying high voltage between the source and drain then reach the floating gate 84 through the oxide film 36. Data "0" is thus ritten in the transistor cell.

Figure 1:
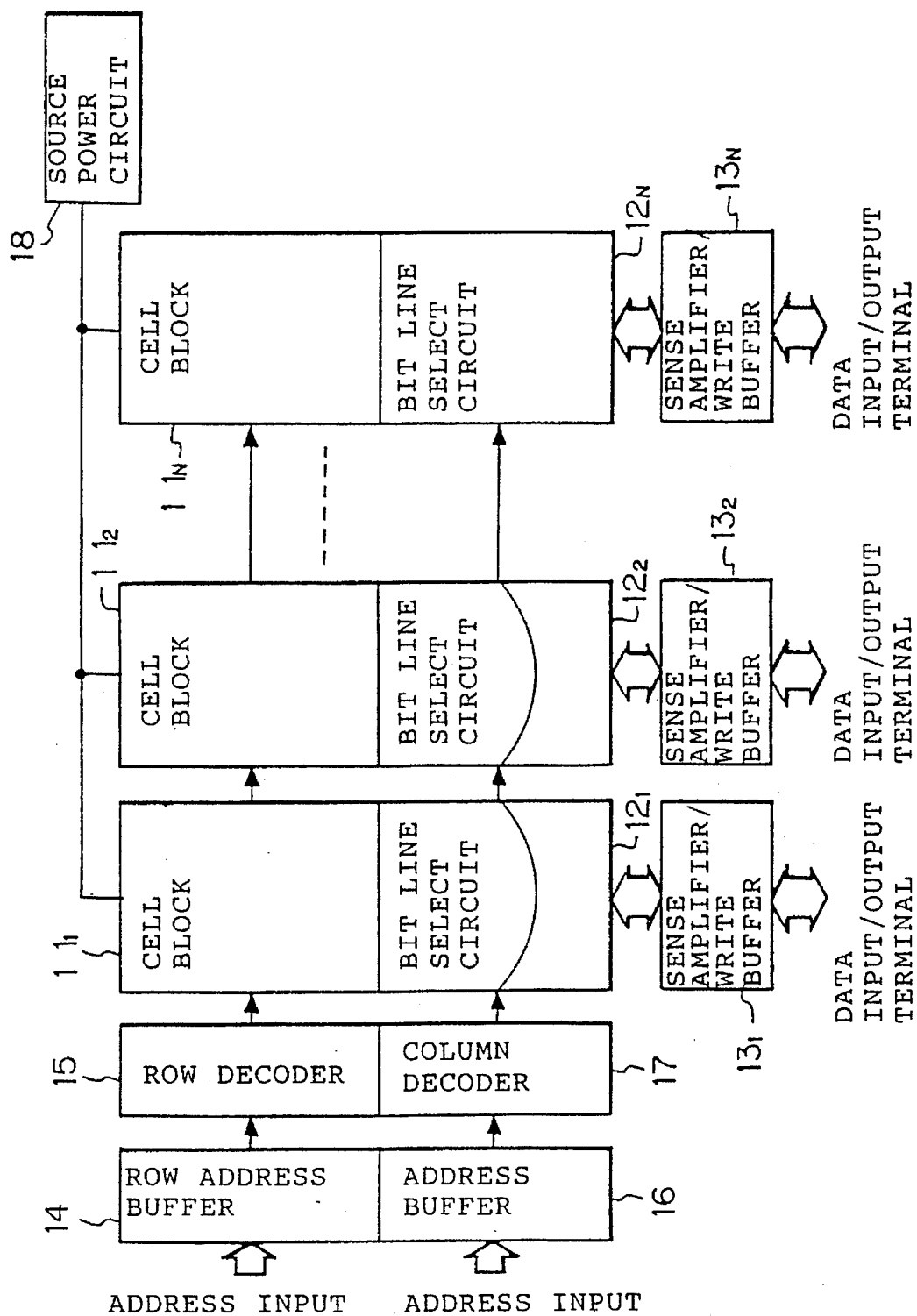
FIG. 1 shows an overall configuration of a flash memory in which the present invention is implemented.

In the past, the aforesaid pre-erase writing has been performed bit by bit in the cell blocks $11_1$ to $11_N$ shown in FIG. 1 in a manner similar to the foregoing normal writing of data "0". If N=8, it takes about 1.2 sec. to write all bits in a memory or one megabit. Assuming that the time required for concurrent erasing is about 1 sec., the writing time is too long for the whole data erasing time, so erasing cannot be achieved efficiently.

Figure 2:
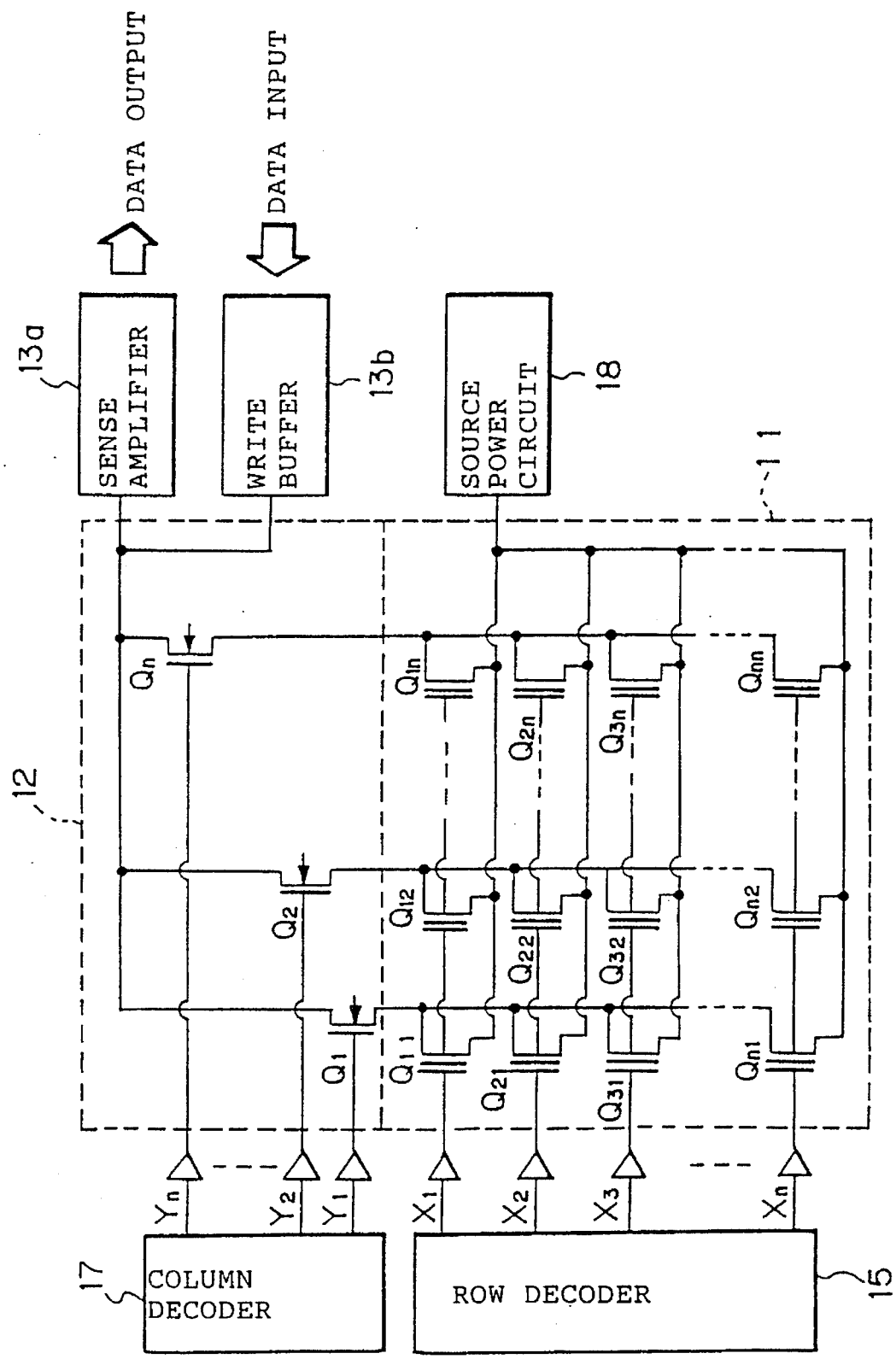
FIG. 2 is a circuit diagram showing a major section of FIG. 1.
Figure 14:
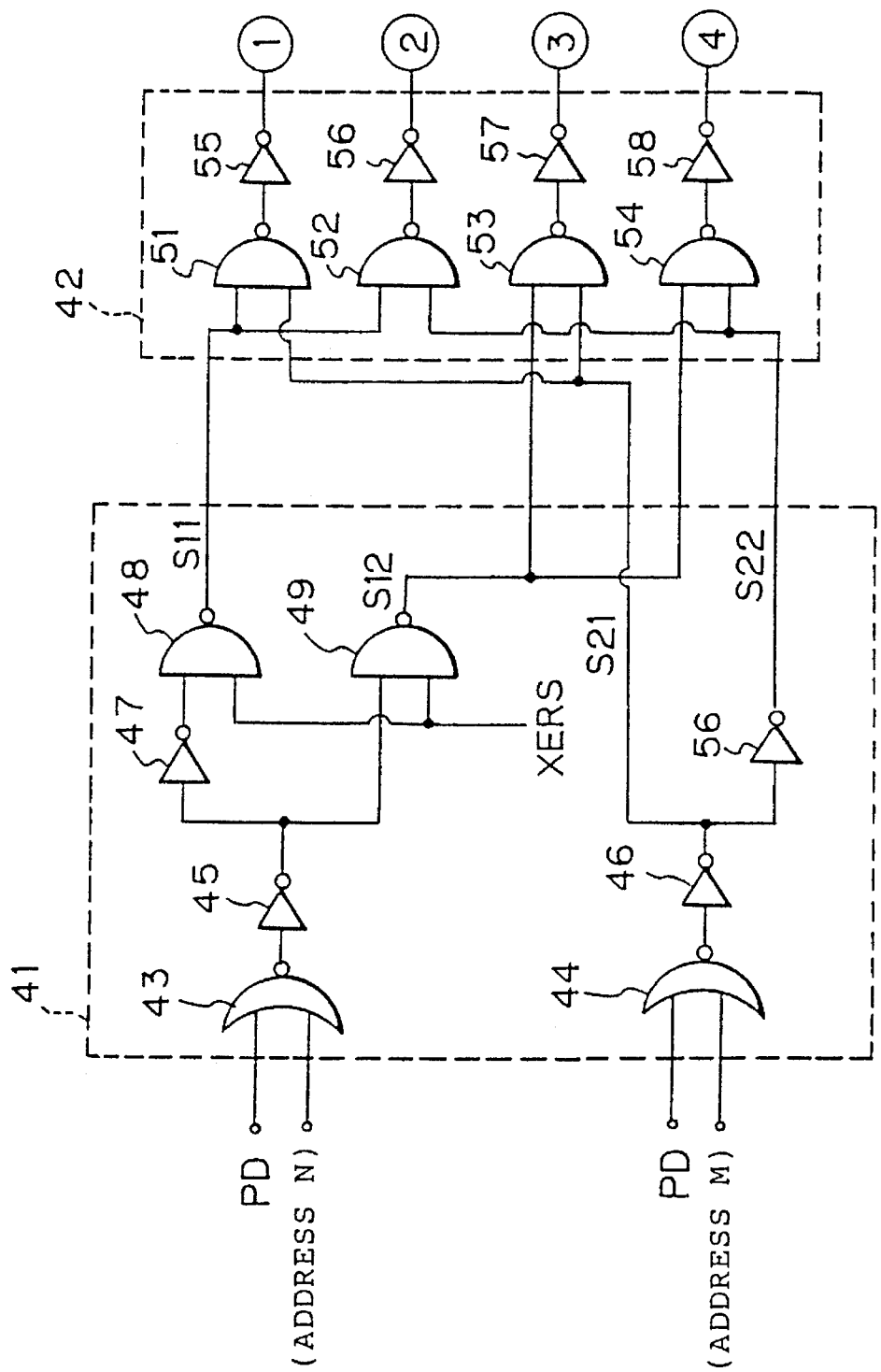
FIG. 14 is a circuit diagram showing the first embodiment.

The flash memory of the first embodiment has the same overall configuration as the one shown in FIGS. 1 and 2. At least either of the row address buffer 14 and row decoder 15 or the column address buffer 16 and column decoder 17 are realized with the circuits shown in FIG. 14. In FIG. 14, reference numeral 41 denotes an address buffer. 42 denotes a decoder. The decoder 42 corresponds to the row decoder 15 or column decoder 17 in FIGS. 1 and 2. The address buffer 41 corresponds to the row address buffer 14 or column address buffer 16. For a more concise explanation, the number of word lines (bit lines) to be selected is four. The number of word lines is not necessarily four.

The address buffer 41 comprises dual-input NOR circuits 43 and 44 each of which inputs address signals N and M and a power save signal PD, inverters 45 and 46 for inverting their output signals, an inverter 47, dual-input NAND circuits 48 and 49, and an inverter 56. The power save signal PD is driven high only when a nonvolatile semiconductor memory (herein, a flash memory) is put into a standby mode. The power save signal PD is low during operation. A signal XERS, which is input to one input terminal of each of the NAND circuits 48 and 49, is driven low only when writing is performed before concurrent erasing.

The decoder 42 comprises dual-input NAND circuits 51 to 54 and inverters 55 to 58. An output signal S11 of the NAND circuit 48 is fed to each of the NAND circuits 51 and 52. An output signal S12 of the NAND circuit 49 is fed to each of the NAND circuits 53 and 54. An output signal S21 of the inverter 46 is fed to each of the NAND circuits 51 and 53. An output signal S22 of the inverter 56 is fed to each of the NAND circuits 52 and 54. The address buffer 41 and decoder 42 constitute a multi-choice circuit.

The operations of this embodiment will be described. For writing before concurrent erasing, the power save signal PD is low, the address signals N and M are high, and the signal XERS is low. The output signals S11 and S12 of the NAND circuits 48 and 49 are then driven high. The output signal of the inverter 46 goes high, and the output signal S22 of the inverter 56 goes low.

The output signals of the inverters 55 and 57 are driven high, and the output signals of the inverters 56 and 58 are driven low. Two word lines (or bit lines) coupled with the output terminals of the inverters 55 and 57 are selected simultaneously Assuming that the selected two word lines transmit row addresses X1 and X3 in FIG. 2, if a bit line selected according to a column address fetched from the column decoder 17 is, for example, Y1, data "0" is written in each of the transistor cells Q11 and Q31 simultaneously.

Assuming that the two selected lines are bit lines corresponding to the column addresses Y1 and Y3 (not shown) in FIG. 2, if a word line specified according to a row address X1 is selected, data "0" is written in each of the transistor cells Q11 and Q13.

Similarly, when two word lines (or bit lines) are selected simultaneously, a column address (or a row address) is modified sequentially to write data on four transistor cells connected on each of the two word lines, a total of eight transistors. Thereafter, the address signals N and M are switched to, for example, low. This causes the output signals of the inverters 55 and 57 to go low and the output signals of the inverters 56 and 58 to go high. The other pair of word lines (or bit lines) connected to the output terminals of the inverters 56 and 58 are selected simultaneously.

In this state, a column address (or a row address) is modified sequentially as mentioned above. Data are then written in remaining transistor cells. Data are thus written in a total of eight transistor cells. According to this embodiment, pre-erase writing can be achieved for a period of time that is half of the time conventionally required.

Needless to say, the circuits shown in FIG. 14 may be employed for both pairs of the row address buffer 14 and row decoder 15, and the column buffer 16 and column decoder 17. In this case, the time required for pre-erase writing can further be reduced. In the circuits shown in FIG. 14, the signal XERS is driven high for normal writing. Only the output signal of any of the inverters 55 to 59 therefore becomes high. Only one word line (bit line) is then selected.

As mentioned above, in the first embodiment, writing efficiency is improved by performing pre-erase writing on multiple memory cells. Conventionally, a row decoder for normal writing is used as it is for pre-erase writing. Pre-erase writing is intended for erasing, which therefore need not be done for each bit. As long as the driving abilities of relevant circuits are high enough, pre-erase writing is allowed to be performed on all memory cells, which are subjected to concurrent erasing, at the same time.

Figure 15:
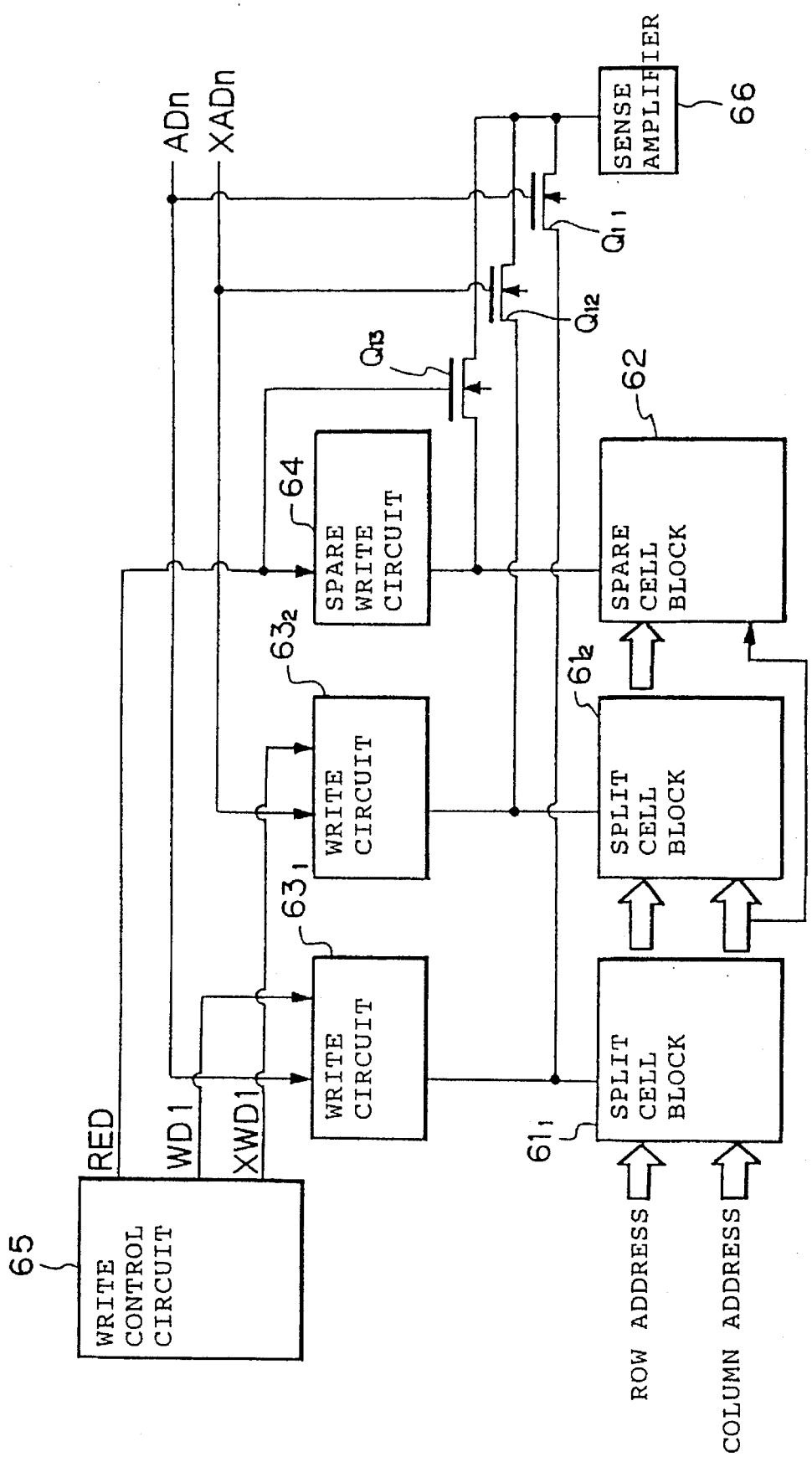
FIG. 15 is a configurational diagram showing the second embodiment.

Next, the second embodiment of the present invention will be described. FIG. 15 shows a configuration of the second embodiment. In FIG. 15, split cell blocks $61_1$ and $61_2$ result from halving a single cell block ($11_1$ in FIG. 1). The split cell blocks $61_1$ and $61_2$ input the same row address and column address. A spare cell block 62 consists of multiple redundant transistor cells which are designed to relieve faulty bits (transistor cells). The spare cell block 62 inputs part of the same row address and column address as those fed to the split cell blocks $61_1$ and $61_2$.

Write circuits $63_1$ and $63_2$ are installed in one-to-one correspondence with the split cell blocks $61_1$ and $61_2$. A spare write circuit 64 is installed in association with the spare cell block 62. The write circuits $63_1$ and $63_2$ as well as the spare write circuit 64 correspond to the aforesaid write buffer 13b. A write control circuit 65 controls the operations of the write circuits $63_1$ and $63_3$ as well as the spare write circuit 64. The write control circuit 65 supplies write inhibit signals WD1 and XWD1 to the write circuits $63_1$ and $63_2$ respectively, and an operation control signal RED to each of the spare write circuit 64 and the gate of an n-channel MOS field-effect transistor Q13.

Signals ADn and XADn are, for example, the signals S11 and S12 originating from the address buffer 41 in FIG. 14. The signal ADn is supplied to each of the write circuit $63_1$ and the gate of an n-channel MOS field-effect transistor Q11. The select signal XADn is supplied to each of the write circuit $63_2$ and the gate of an n-channel MOS field-effect transistor Q12.

The drains of the transistors Q11, Q12, and Q13 are connected to the split cell blocks $61_1$ and $61_2$, and the spare cell block 62 respectively. The sources thereof are connected to a sense amplifier 66.

Figure 16:
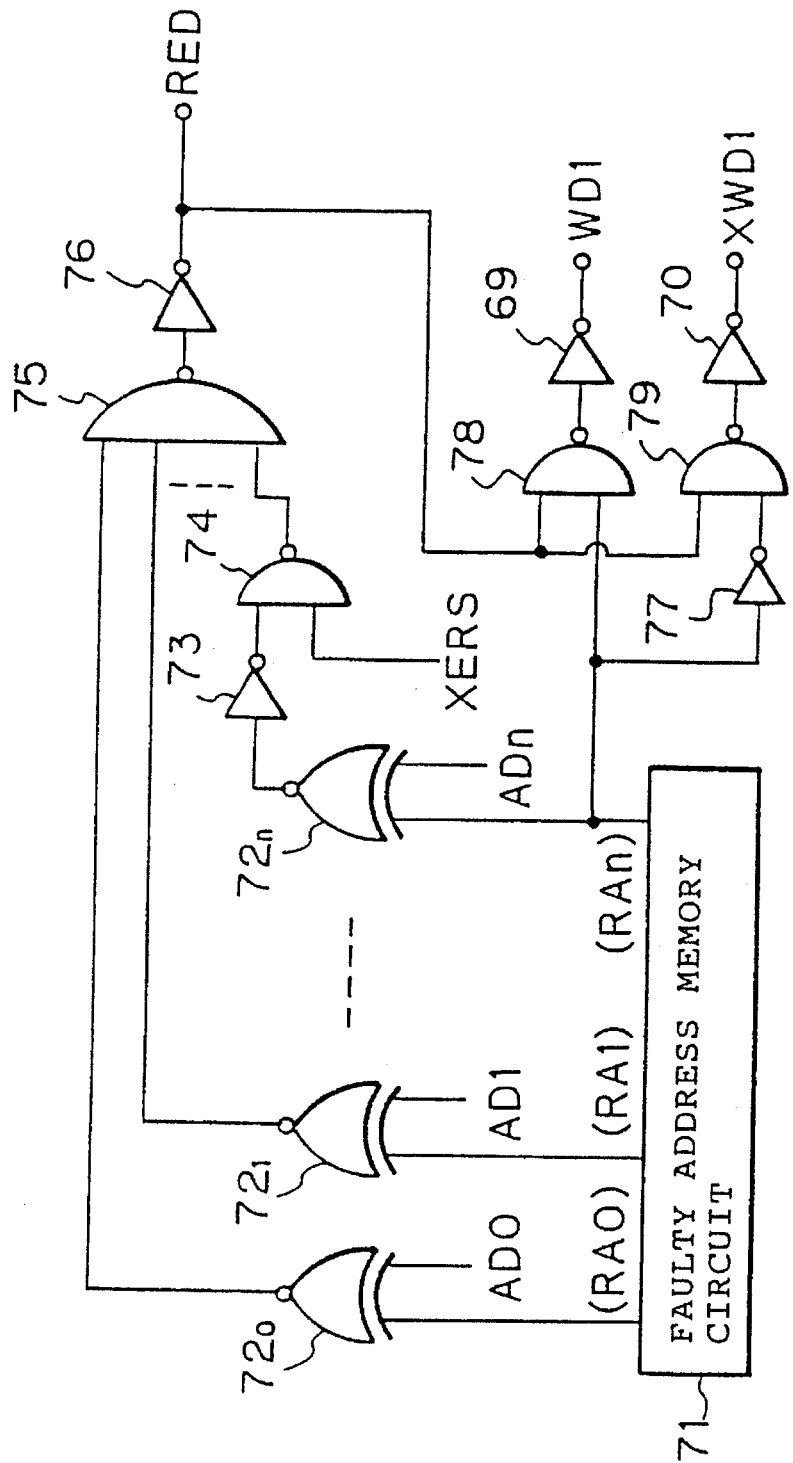
FIG. 16 is a circuit diagram showing an embodiment of a write control circuit in FIG. 15.

The foregoing write control circuit 65 has circuitry, for example, such as that shown in FIG. 16. In FIG. 16, addresses (faulty addresses) indicating locations of faulty ones (faulty bit lines) of numerous transistor cells constituting the split cell blocks $61_1$ and $61_2$, which have been determined faulty by previous examination, are stored in a faulty address memory circuit 71 beforehand.

Assuming that the output of the faulty address memory circuit 71 indicates a faulty address consisting of n+1 bits, the bit outputs RA0 to RAn of the faulty address are supplied to one input terminals of dual-input exclusive NOR (EX-NOR) circuits $72_0$ to $72_n$, and then exclusive-NORed with address signals $AD_0$ to $AD_n$. After passing through an inverter 73, the output signal of the exclusive NOR circuit 72n is exclusive-NORed with the signal XERS by a dual-input NAND circuit 74. Thereafter, the signal is fed to an n+1−input NAND circuit 74 together with the output signals of the exclusive NOR circuits $72_0$ to $72_{n-1}$.

The output signal of the NAND circuit 75 is provided as the operation control signal RED via the inverter 76, and fed to NAND circuits 78 and 79 by which the output signal is exclusive-NORed with the most-significant bit RAn of the faulty address read from the faulty address memory circuit 71 and with XRAn or a value inverted by the inverter 77. The output signals of the NAND circuits 78 and 79 are provided as the write inhibit signals WD1 and XWD1 through the inverters 69 and 70.

Next, the operations of the embodiment shown in FIGS. 15 and 16 will be described. For writing before concurrent erasing, the signal XERS is driven low. When the input address signals (row addresses and column addresses) $AD_0$ to $AD_n$ disagree with a faulty address; that is, when transistor cell writing is performed normally, the output operation control signal RED of the inverter 76 in FIG. 16 is driven low. The write inhibit signal WD1 fetched from the inverter 69 and the write inhibit signal XWD1 fetched from the inverter 81 are therefore low.

The spare write circuit 64 shown in FIG. 15 is then put into an operation inhibited state, and the transistor Q13 is turned off. For writing before concurrent erasing, the signals ADn and XADn are driven high. As a result, the write circuits 63$_1$ and 63$_2$ are put into operative states.

The same address signal (row address or column address) is fed to each of the split cell blocks 61$_1$ and 61$_2$. Data sent from the write circuits 63$_1$ and 63$_2$ are written simultaneously in the transistor cells designated with the address signal in the split cell blocks 61$_1$1 and 61$_2$. Data writing is thus performed in both the split cell blocks 61$_1$ and 61$_2$ simultaneously, and each data writing is sequentially performed on transistor cells of each block.

The foregoing operation is performed in a normal condition in which all input addresses disagree with a faulty address. If any input address agrees with the faulty address, the output signal of the NAND circuit 75 shown in FIG. 16 is driven low. The operation control signal RED sent from the inverter 76 then goes high. This causes either of the output signals WD1 and XWD1 of the inverters 69 and 70 to go high.

If the most-significant bit RAn of the faulty address is high, a transistor cell in the split cell block 61$_1$ is faulty. If the RAn is low, a transistor cell in the split cell block 61$_2$ is faulty. If a transistor cell in the split cell block 61$_1$ is faulty, the most-significant bit RAn of the faulty address is high. WD1 of the output signals WD1 and XWD1 of the inverters 69 and 70 in FIG. 16 is then driven high.

When the signal WD1 is driven high, the operation of the write circuit 63$_1$ is inhibited. When the operation control signal RED is driven high, the spare write circuit 64 is put into an operative state and the transistor Q13 is turned on.

In the above state, if the faulty address is designated, the same specified data is written in the associated transistor cell in the spare cell block 62, which substitutes for the faulty address transistor cell in the split cell block 61$_1$, and the associated transistor cell in the split cell block 61$_2$.

For normal writing, either of the signals ADn and XADn is driven high. When addresses disagree with a faulty address, the signal RED is driven low. Either of the write circuits 63$_1$ and 63$_2$ is put into an operative state, and data is written in either of the split cell blocks 61$_1$ and 61$_2$.

During writing before concurrent erasing, if four words are written simultaneously, writing in all cells can be completed for a period of time that is a quarter of the time required for normal writing.

As described above, in the second embodiment, all memory cells are grouped into multiple blocks, and a redundant spare cell block for rewriting a word including a faulty memory cell is related with each of the blocks. Even if the redundant spare cell block is not employed, it is effective to perform pre-erase writing alone on multiple blocks at a time. Pre-erase writing can be done more efficiently.

Next, an embodiment based on the second mode of the present invention, which permits stable erasing irrelevant of fluctuations in an external power supply, will be described.

Figure 17:
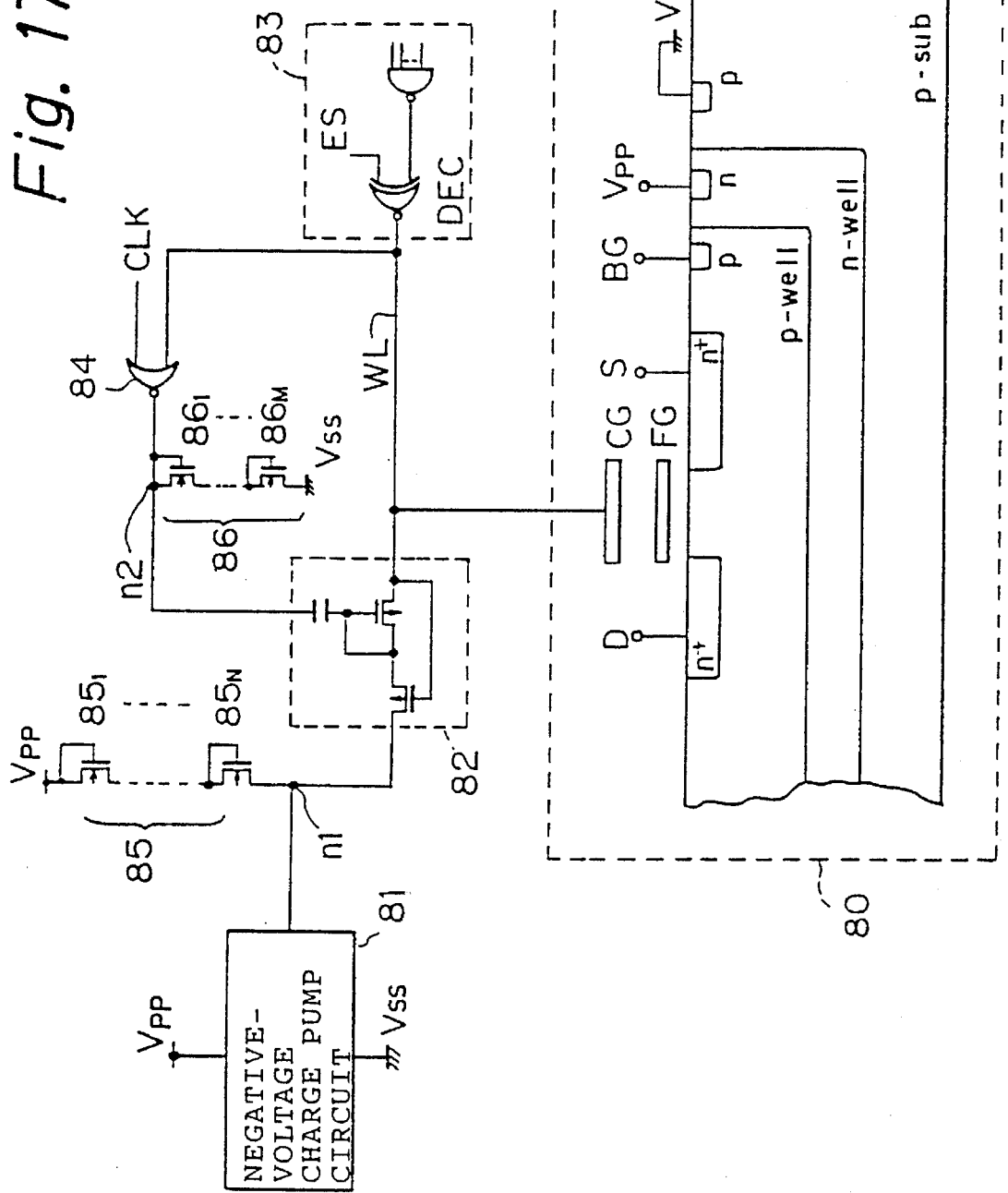
FIG. 17 shows a circuitry of the third embodiment.

FIG. 17 shows a configuration of the third embodiment, including a memory cell, a row decoder for feeding an access signal to a word line connected to a control gate CG of the memory cell, and a circuit for applying a negative voltage.

In FIG. 17, reference numeral 81 denotes a negative voltage charge pump circuit; 82 denotes a negative voltage bias circuit; 83 denotes a decoder; 80 denotes a cell transistor; 85 and 86 denote MOS diode arrays each consisting of n-channel enhancement field-effect transistors 85$_1$ to 85$_N$ or 86$_1$ to 86$_M$; n1 and n2 denote nodes; 84 denotes a NOR gate; WL denotes a word line; D denotes a drain; S denotes a source; BG denotes a well contact; CG denotes a control gate; FG denotes a floating gate; CLK denotes a clock signal; ES denotes an erase select signal; Vpp denotes an external supply voltage; and Vss denotes a ground voltage.

For reading, the erase select signal ES is held low and the clock signal CLK is held high. In this state, the decoder 83 outputs a high signal when the word line WL is selected and a low signal when the word line WL is unselected. When the word line WL is low, the NOR gate 84 can receive the clock signal CLK. The clock signal CLK is, however, held high. The negative voltage bias circuit 82 therefore does not operate. A negative voltage $V_{BB}$ generated by the negative voltage charge pump circuit 81 will therefore not be applied to the word line WL.

For erasing, the erase select signal ES is driven high and the clock signal CLk is supplied. In this state, the decoder 83 outputs a low signal when the word line WL is selected and a high signal when the word line WL is unselected. When the word line WL is low, the NOR gate 84 can receive the clock signal CLK and the negative bias circuit 82 operates. The negative voltage $V_{BB}$ generated by the negative voltage charge pump circuit 81 is then applied to the word line WL. In the meantime, the drain D and source S of the memory cell 80 are open, and the voltage Vpp is applied to the well contact BG. When data has been written in the memory cell 80, electrons are passed through the floating gate FG to the channel due to the tunnel effect. Erasing is thus carried out.

The nodes n1 and n2 are clamped at a specified voltage by the MOS diode arrays that are the transistor arrays 85 and 86.

As mentioned above, in this embodiment, it is the row decoder 83 that applies the high voltage Vpp and positive voltage Vcc to a selected word line WL during writing or reading and applies a zero voltage Vss to unselected word lines WL. Negative voltage is applied by the negative voltage charge pump circuit 81. The control for applying negative voltage to a selected word line alone is extended by the row decoder 83. The row decoder 83 has a logic reversing function for providing an output whose logic is reversed between erasing and reading or erasing.

The negative voltage charge pump circuit 81 generates and outputs a negative voltage during normal operation or negative voltage application. The output voltage is restricted to a specified value by the transistor arrays connected between the negative voltage charge pump circuit 81 and the high voltage source Vpp.

The negative voltage bias circuit MVB will be described later. The detailed description is omitted there. With the input of the clock signal CLK, the output voltage of the negative voltage charge pump circuit 81 is placed on a word line.

A decrease of Vpp by a V will be discussed next.

The potential difference between Vpp and n1 is held at Vpp–$V_{BB}$ by the MOS diode array 85 that is a transistor array. If Vpp decreases by a V, the n1 voltage becomes:

$V_{BB}$–a

The voltage between the control gate CG and channel in the memory cell 80 is held at:

Vpp–VBB

Next, an increase by a V of Vpp will be discussed.

If Vpp increases by a V, the n1 voltage becomes:

VBB+a

The voltage between the control gate CG and channel in the memory cell 80 is then held at:

Vpp–VBB

As mentioned above, even if the external voltage Vpp varies, the voltage between the control gate CG and channel is held constant all the time, so stable erasing characteristics are ensured.

In the foregoing third embodiment, the output voltage of the negative voltage charge pump circuit 81 is restricted to a specified value relating to the high voltage source Vpp, which is applied to the p well, by the transistor array. A constant voltage can thus be applied. In contrast, in the fourth embodiment to be described next, a negative voltage applied to the control gate CG and a positive voltage $V_{BB}$ Vcc applied to the p well are restricted to a ground (zero) voltage Vss. The potential difference between the negative voltage and positive voltage is thus held constant.

Figure 18:
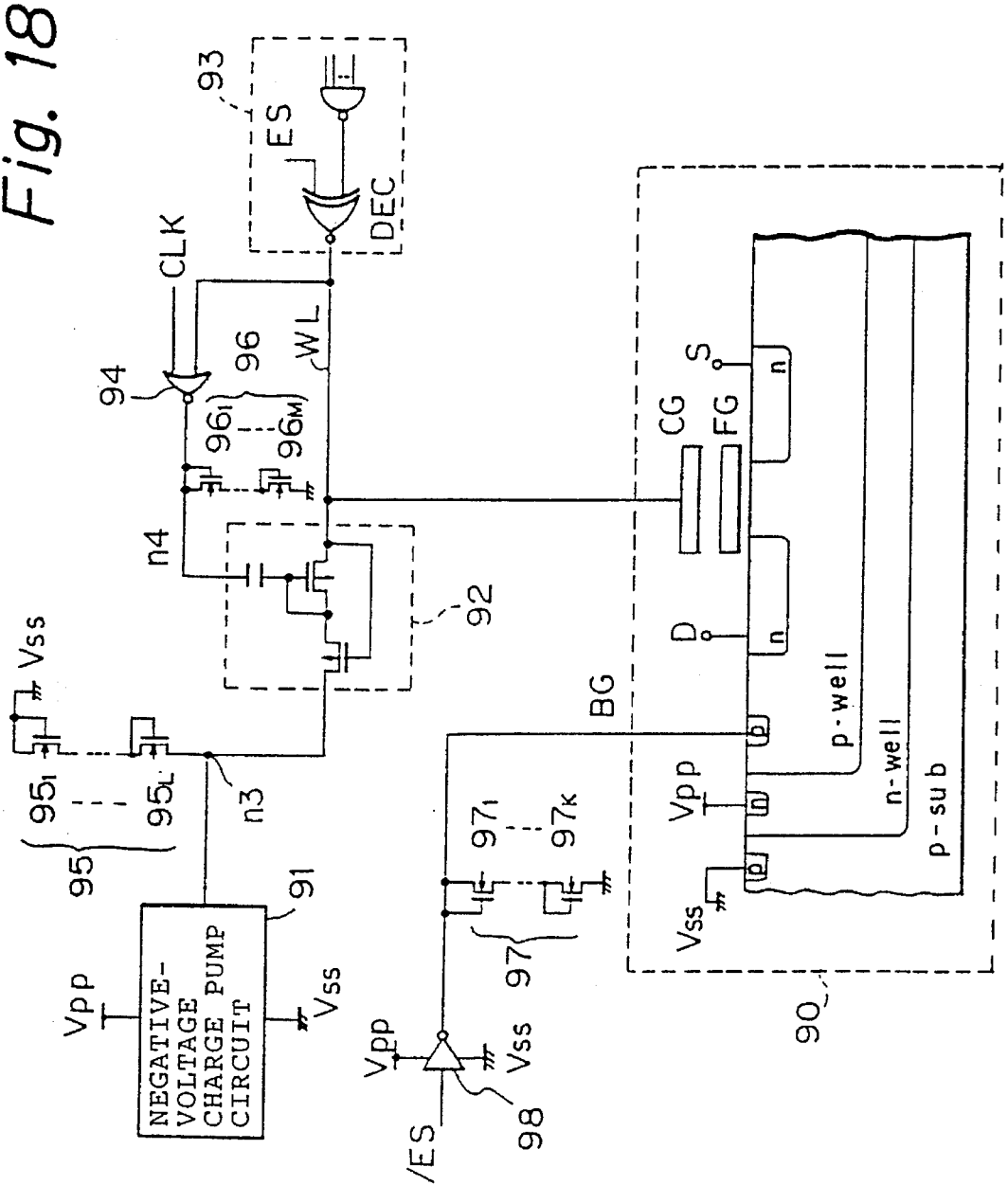
FIG. 18 shows a circuitry of the fourth embodiment.

FIG. 18 shows a configuration of the fourth embodiment. What differs from the circuitry in FIG. 17 is that the output of an inverter for generating voltage to be applied to the p well is restricted by a transistor array 97 and held constant relative to a ground voltage Vss, and that the output of a negative voltage charge pump 91 is restricted by a transistor array 95 and held constant relative the ground voltage Vss.

A fluctuation in Vpp will now be discussed.

The voltage between n3 and Vss or a well contact BG and Vss is held constant by a MOS diode array that is a transistor array 95 or a transistor array 97. Vss denotes a ground voltage, which therefore will not be affected by a fluctuation in Vpp. Irrelevant of the fluctuation in Vpp, a constant voltage is always supplied to a control gate CG and the well contact BG. The voltage between the control gate CG and channel is always held constant.

Despite a fluctuation in external voltage Vpp, the voltage between the control gate CG and channel is held constant. Stable erasing characteristics are ensured.

Figure 19:
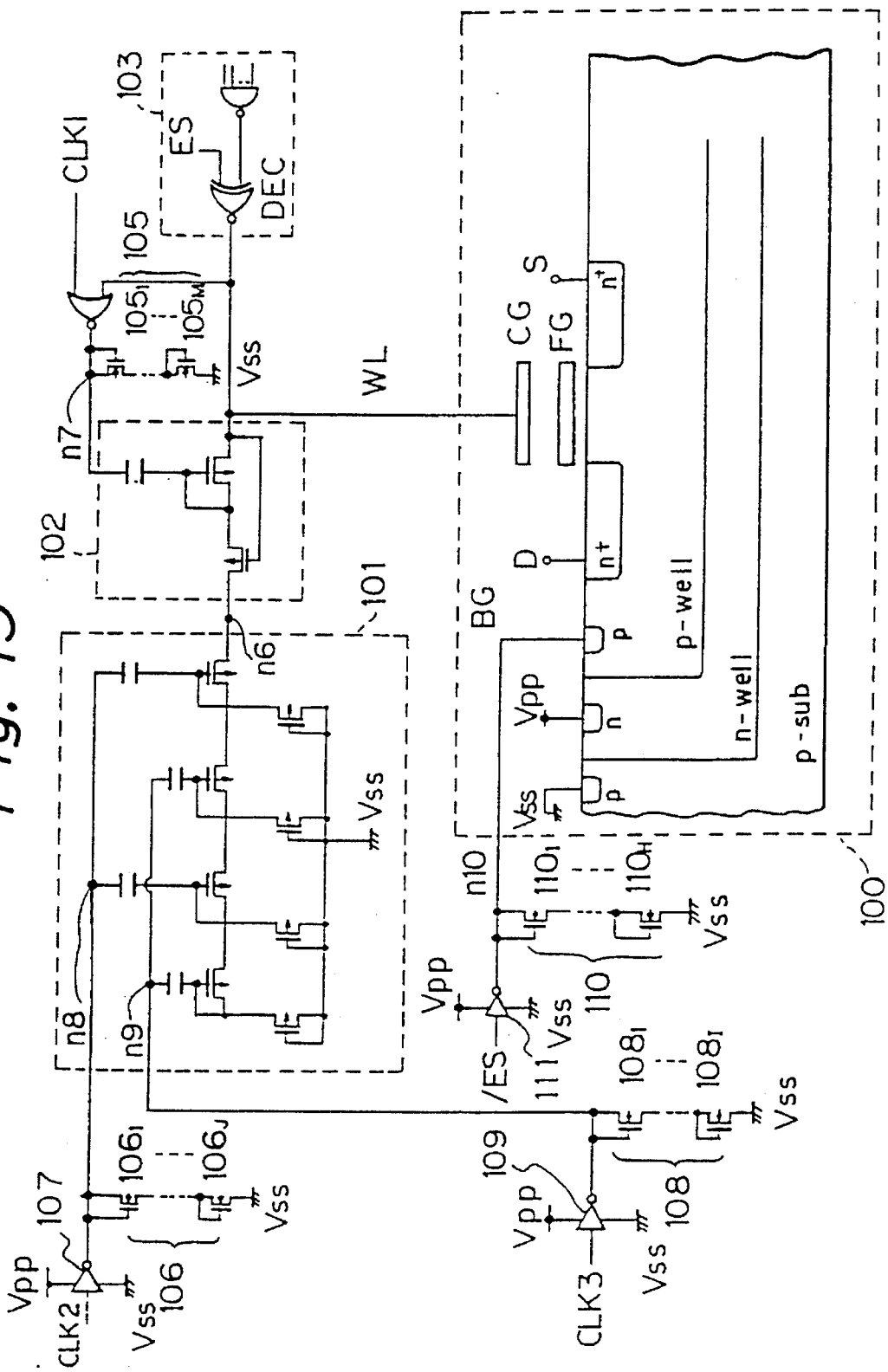
FIG. 19 shows a circuitry of the fifth embodiment.

FIG. 19 shows the fifth embodiment of a channel erasing method.

In FIG. 19, reference numeral 101 denotes a negative voltage charge pump circuit; 102 denotes a negative voltage bias circuit; 103 denotes a decoder; 107, 109, and 111 denote inverters; 100 denotes a cell transistor; 105, 106, 108, and 110 are n-channel enhancement field-effect transistor arrays; n6 to n10 denote nodes; WL denotes a word line; D denotes a drain; S denotes a source; BG denotes a well contact; CLK1 to CLK3 denote clock signals; ES denotes an erase select signal; /ES denotes an erase power switching signal; Vpp denotes an external supply voltage; and Vss denotes a ground voltage.

Next, the operations of the foregoing circuitry will be described.

For reading, the erase select signal ES is held low, the erase power switching signal /ES is held high, and the clock signals CLK1 to CLK3 are held high. The well contact BG is biased with Vss by the inverter 111. The decoder 103 outputs a high signal when the word line WL is selected, and a low signal when the word line WL is unselected. When WL is low, the NOR gate 104 can receive the clock signal CLK1. The clock signal CLK1 is held high. The negative voltage bias circuit 102 therefore does not operate. Since the clock signals CLK2 and CLK3 are also held high, the negative voltage charge pump circuit 101 does not generate $V_{BB}$. Negative voltage is therefore not applied to WL.

For erasing, the erase select signal ES is driven high and the erase power switching signal /ES is driven low. Clock signals are fed to the clocks CLK1 to CLK3. The clock signals CLK2 and CLK3 are mutually 180° out of phase. The decoder 103 outputs a low signal when the word line WL is selected, and a high signal when the word line WL is unselected. When WL is low, the NOR gate 104 can receive the clock signal CLK1. The negative voltage bias circuit 102 operates and applies $V_{BB}$ generated by the negative voltage charge pump circuit 101 to the word line WL. At this time, the source S and drain D of the cell transistor 100 are open and the well contact BG is provided with high voltage by the inverter 111. If data has been written in the cell transistor 100, electrons are passed through the control gate CG to the channel due to the tunnel effect. Erasing is thus achieved.

The n6 to n10 and well contact BG are clamped at certain voltages with Vss as a reference voltage by the transistor arrays 105, 106, 108, and 110.

A fluctuation in Vpp will now be discussed.

The value of a voltage $V_{BB}$ generated by the negative voltage charge pump circuit 101 is determined by the amplitude of a signal fed to the negative voltage charge pump circuit 101, the coupling coefficient, and the threshold voltage of a transistor. What is critical about a product is the amplitude of an input signal. In this embodiment, however, since the input terminals n8 and n9 of the negative voltage charge pump circuit 101 are clamped at constant voltages with Vss as a reference voltage, the input terminals n8 and n9 are free from the influence of a fluctuation in Vpp. The output voltage $V_{BB}$ of the negative voltage charge pump circuit 101 is held constant irrelevant of the fluctuation in Vpp. The voltage applied to the well contact BG is also clamped with Vss as a reference voltage, which therefore is constant irrelevant of the fluctuation in Vpp. Even if Vpp fluctuates, the voltage between the control gate CG and channel is held constant.

As mentioned above, even if the external voltage Vpp fluctuates, the voltage between the control gate CG and channel is held constant, so stable erasing characteristics are ensured.

The aforesaid embodiments provide channel erasing methods in which the voltage applied between a control gate and a channel is held constant in order to ensure stable erasing. Even in source erasing, stable erasing is assured by restricting applied voltage in the same manner.

Figure 20:
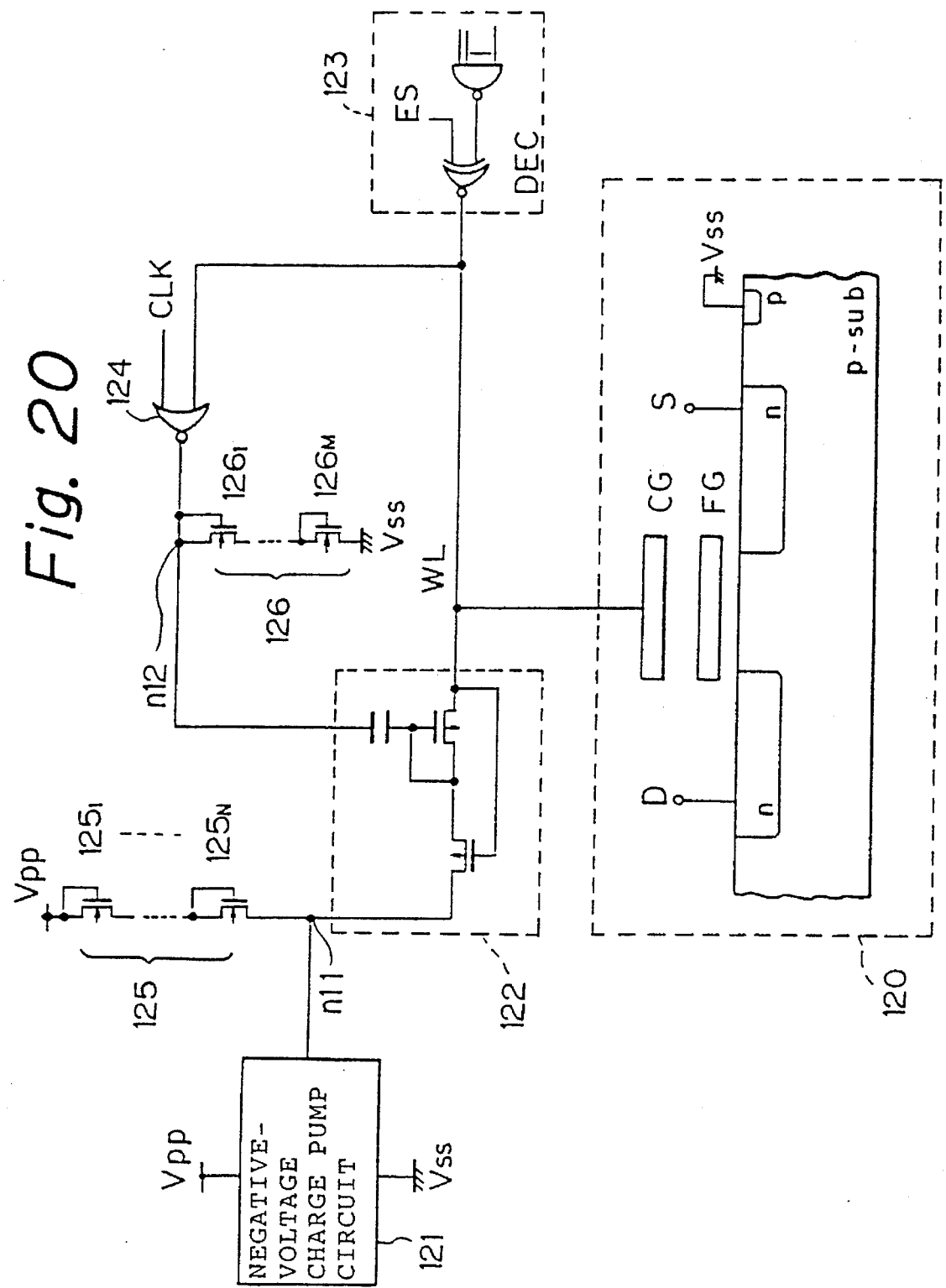
FIG. 20 shows a circuitry of the sixth embodiment.
Figure 21:
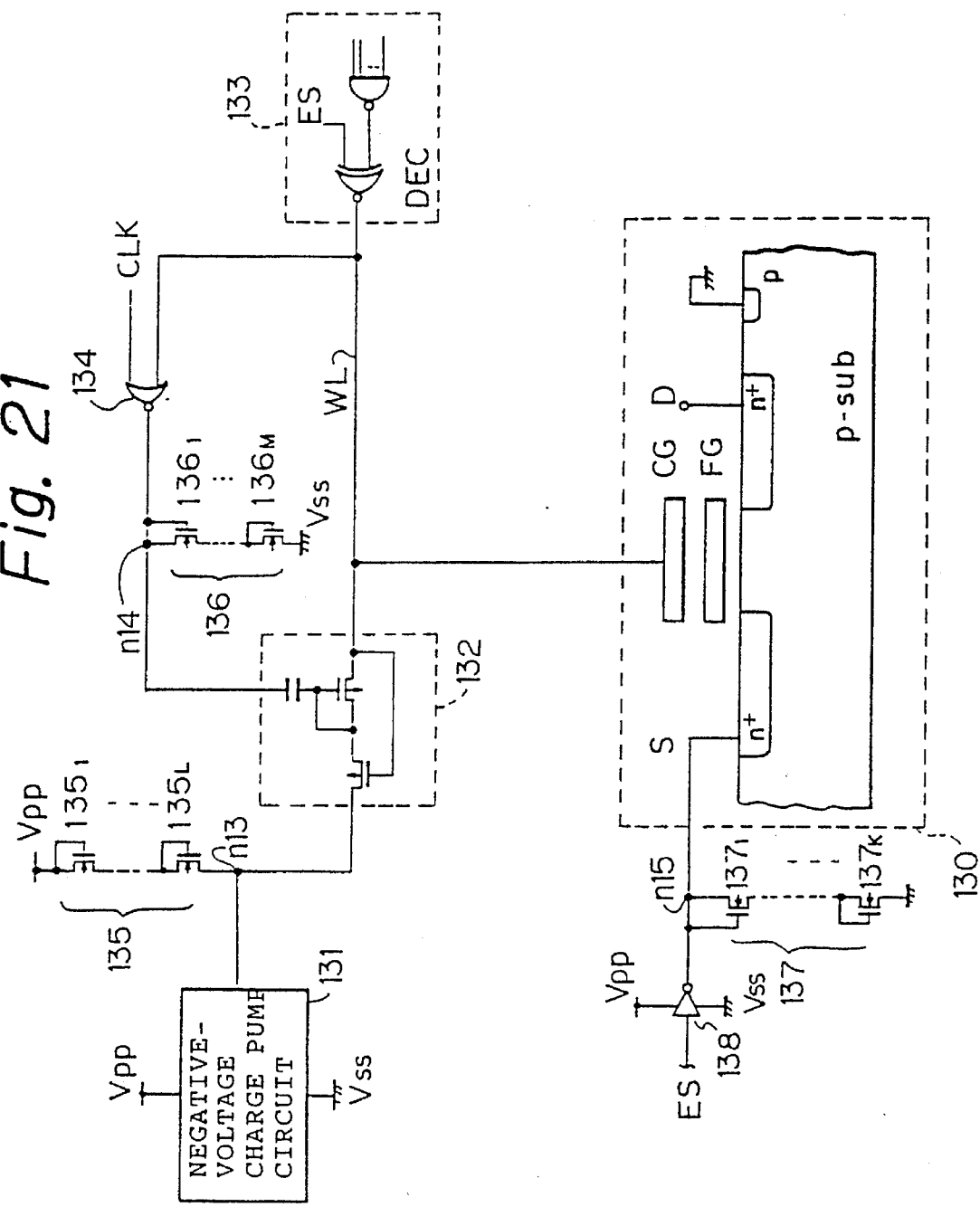
FIG. 21 shows a circuitry of the seventh embodiment.
Figure 22:
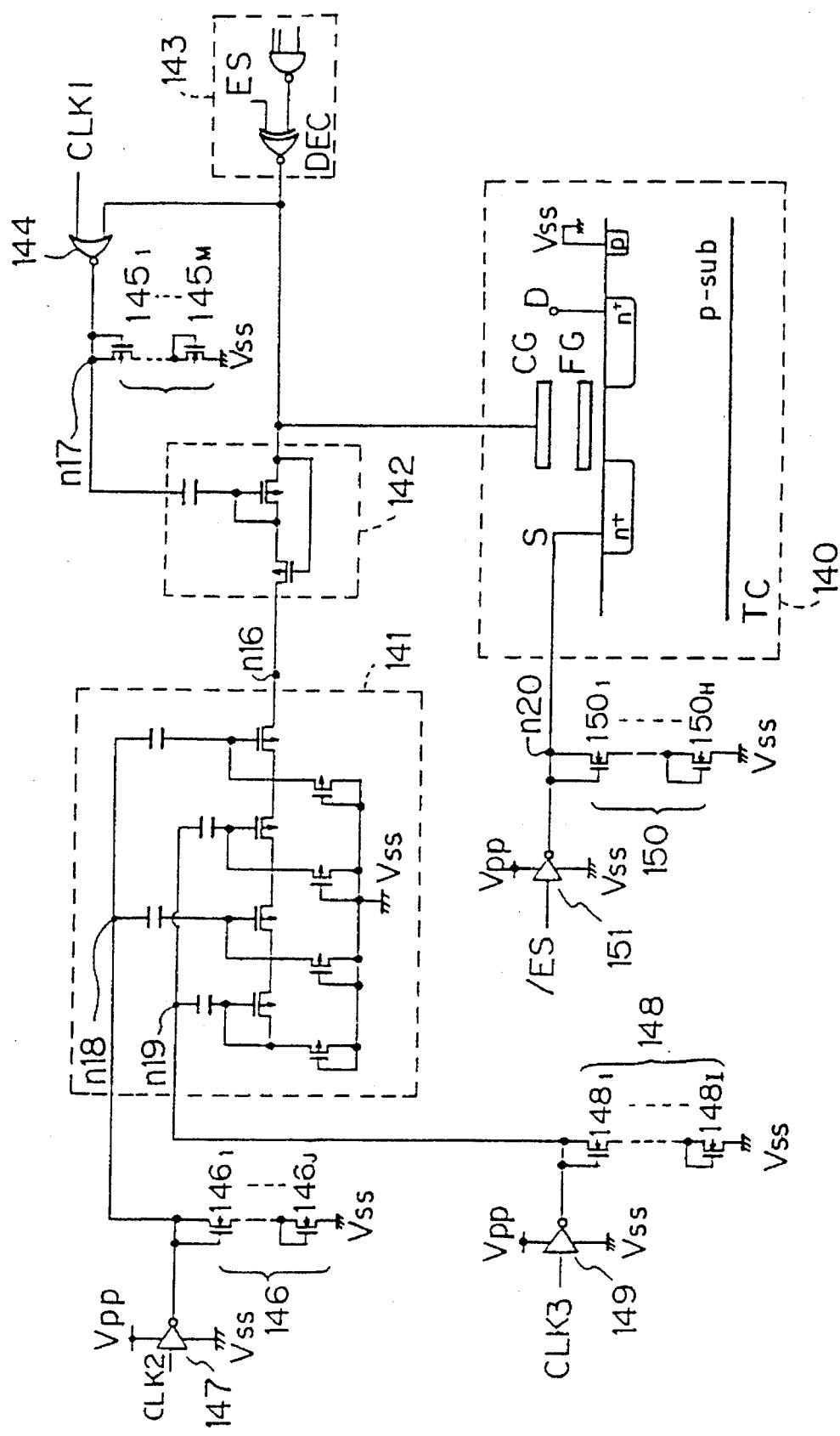
FIG. 22 shows a circuitry of the eighth embodiment.

FIGS. 20 to 22 show the sixth to eighth embodiments permitting stable source erasing. Unlike the channel erasing shown in FIGS. 17 to 19, voltage to be applied to a p well is applied to a source S.

As described previously, in a flash memory based on the second mode of the present invention, a simple row decoder applies negative voltage for erasing. The circuitry is therefore downsized and high integration is realized. Furthermore, stable erasing contributes to an improvement in reliability.

Figure 9:
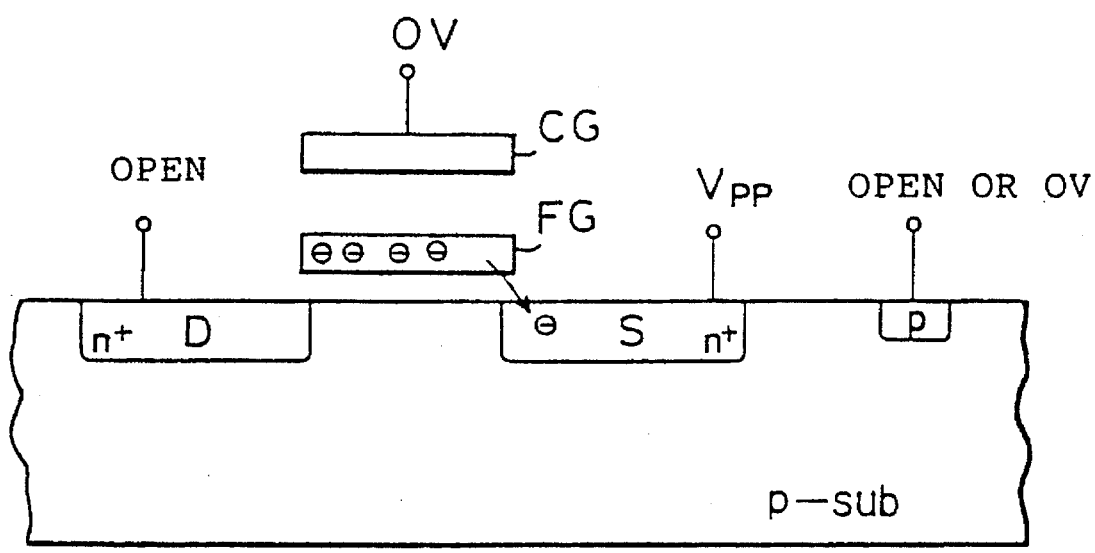
FIG. 9 is an explanatory diagram for source erasing based on high-voltage application.
Figure 10:
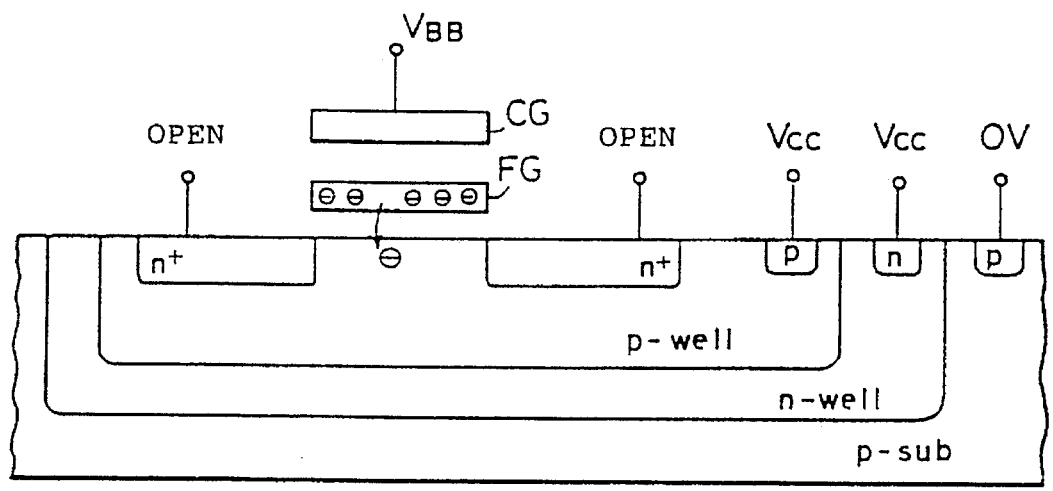
FIG. 10 is an explanatory diagram for channel erasing based on negative-voltage application.
Figure 11:
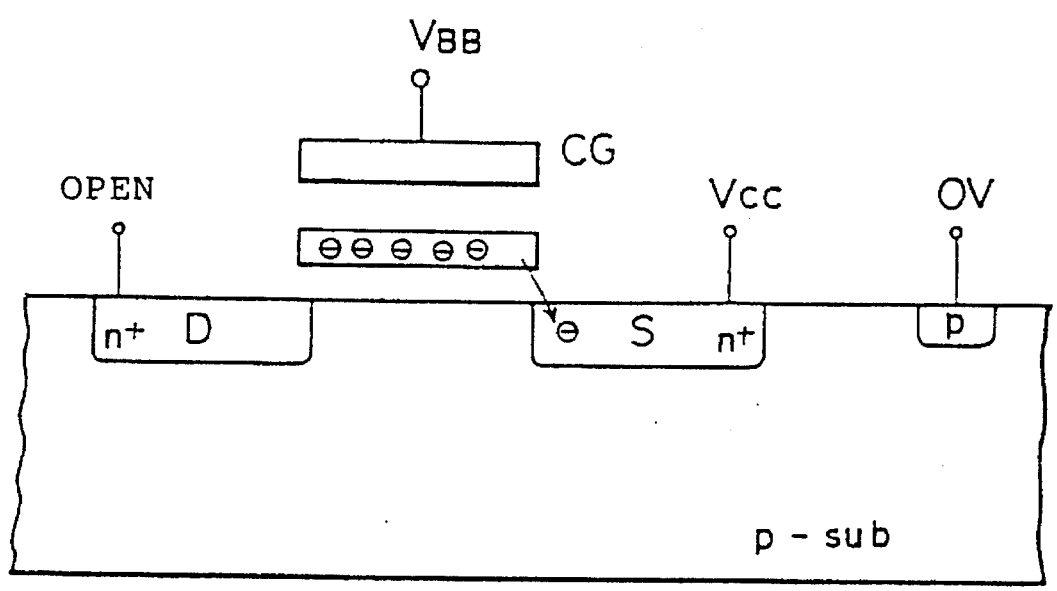
FIG. 11 is an explanatory diagram for source erasing based on negative-voltage application.

An embodiment based on the third mode of the present invention for preventing deterioration of memory cells due to avalanche current will be described. Prior to the description, the current characteristic for erasing in a method of applying positive voltage to a source will be described. Flash memory erasing methods include those shown in FIGS. 8 to 11. The third mode of the present invention applies to a method of feeding a high voltage Vpp to a source S shown in FIG. 9 and thus setting a control gate CG to a ground voltage.

An erasing voltage to be applied to a source terminal during data erasing is generally supplied by a source power circuit (for example, the source power circuit 18 in FIG. 11) installed in a standard flash memory. Data erasing will be described below with reference to FIG. 23.

Figure 23:
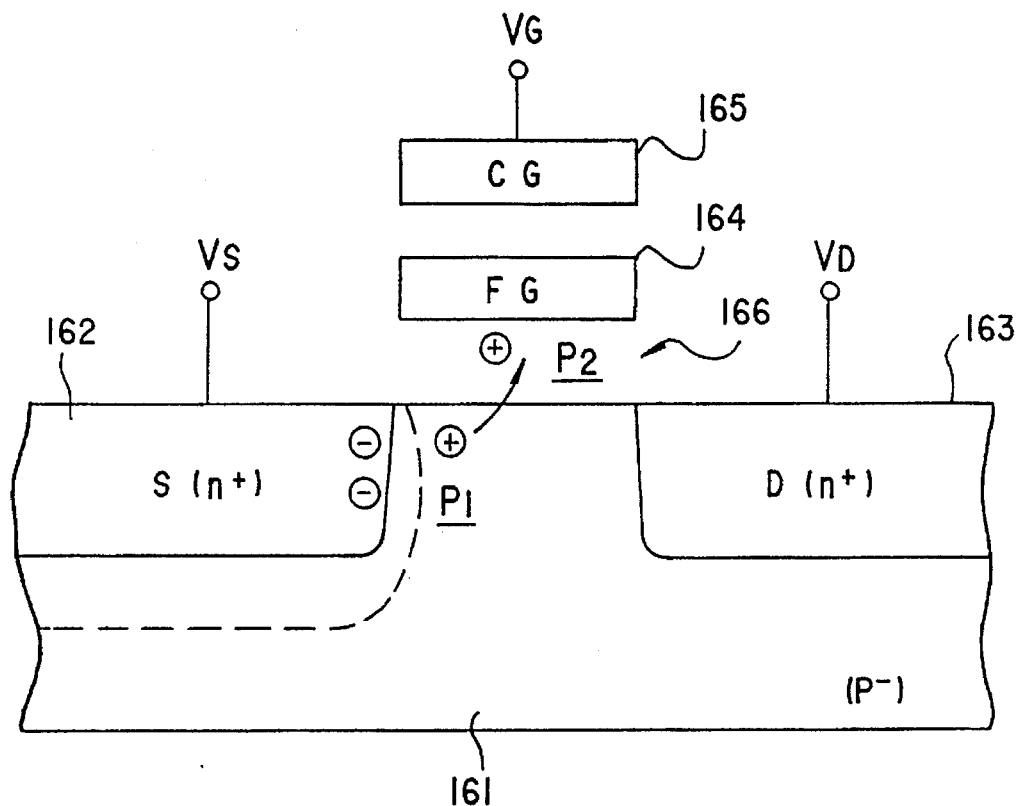
FIG. 23 shows data erasing in a cell in a flash memory.

For erasing (under the conditions that $V_G$=0 V and $V_S$=Vpp), as shown in FIG. 23, a depletion layer in the vicinity of a floating gate (FG) 164 in a source region varies due to charges in the gate FG. An electric field near an area P1 in FIG. 23 intensifies to develop pairs comprised of an electron and a hole. This causes tunneling current to flow between bands. The holes are accelerated by an electric field oriented to the drain, and then injected to an oxide film (area P2 in FIG. 23). As well-known, this deteriorates the characteristics of the cell transistor. As the source voltage goes up, avalanche current flows. The deterioration of characteristics proceeds more markedly.

Figure 24:
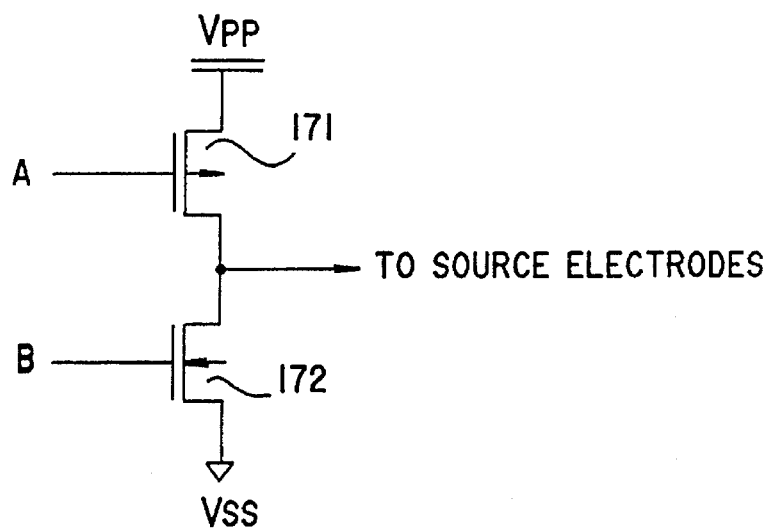
FIG. 24 is a circuit diagram showing the circuitry of a data erasing power circuit as an example of a prior art.

FIG. 24 shows a circuitry of a data erasing power circuit as an example of a prior art.

In FIG. 24, Vpp denotes an erasing voltage line of about 12 V. Vss denotes a supply voltage line of 0 V. A p-channel transistor 171 and an n-channel transistor 172 are connected in series with each other between the power lines Vpp and Vss. The transistors 171 and 172 turn on or off in response to input signals A and B. Erasing voltage is fetched from the drains of the transistors 171 and 172.

In this circuitry, the input signals A and B are set low for data erasing. The n-channel transistor 172 is cut off, while the p-channel transistor 171 is turned on. The erasing voltage Vpp passes through the transistor 171 to the output terminal, and then is supplied to source electrodes.

In the foregoing conventional data erasing power circuit, the components are simple COMS transistors. If the resistivity of a source of a cell deteriorates due to variations among processes and a change in the amount of charges (that is, a voltage) in a floating gate FG, inter-band tunneling current is likely to flow. Avalanche current may also flow in some cases, which deteriorates the characteristics of the cell transistor or destroys the transistor cell. The third mode of the present invention solves these problems. Even if the resistivity of a source in a cell deteriorates, occurrence of an avalanche breakdown is prevented and inter-band tunneling current is minimized. This eventually prevents deterioration of the cell characteristics.

The principle of the third mode of the present invention will now be described with reference to FIG. 25.

Figure 25:
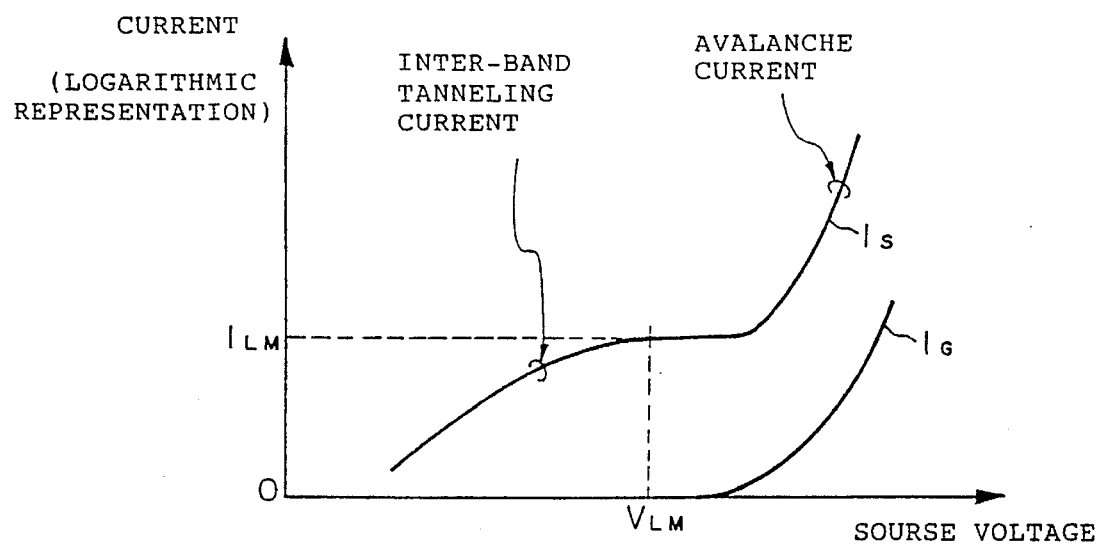
FIG. 25 is a graph showing the characteristics of source voltage vs. current for explaining the principle of the third mode of the present invention.

FIG. 25 shows the current characteristics of a cell with respect to a source voltage. $I_G$ denotes a gate current, and $I_S$ denotes a source current. The gate current $I_G$ represents a current flowing from the source region to the floating gate 164 (in FIG. 23). The gate current is thought to derive from holes injected into an oxide film by an electric field oriented to the drain. To prevent injection of holes into the oxide film, the characteristics shown in FIG. 25 suggest that the source current should be set to a value lower than a specified current value $I_{LM}$ or the source voltage should be set to a value lower than a specified voltage value $V_{LM}$ (that is; to such an extent that a large gate current will not flow). As for the gate current which is largely affected by avalanche current, the specified current value $I_{LM}$ and voltage value $V_{LM}$ may presumably be set to such an extent that an avalanche breakdown will not occur.

In a flash memory comprising a matrix, in which rewritable nonvolatile memory cells are arranged at intersections between multiple word lines and multiple bit lines, and a power circuit that responds to control signals commanding whether or not to erase data and feeds supply voltage to each of the sources of the memory transistors forming the nonvolatile memory cells, a constant current circuit is adopted as the power circuit, and the current value is set to a value equal to or smaller than $I_{LM}$ in FIG. 25. The erasing voltage for data erasing then becomes a value equal to or smaller than the one causing an avalanche breakdown. Injection of holes into the oxide film of a cell can thus be minimized. If the resistivity of the source of the cell deteriorates, occurrence of an avalanche breakdown can be prevented. Interband tunneling current can also be minimized. This helps prevent the deterioration of cell characteristics from occurring during data rewriting.

The ninth embodiment is a flash memory based on the third mode of the present invention, which prevents occurrence of an avalanche breakdown. The overall configuration is shown in FIGS. 1 and 2. A main feature of the ninth embodiment lies in the source power circuit 18 shown in FIGS. 1 and 2.

Figure 26:
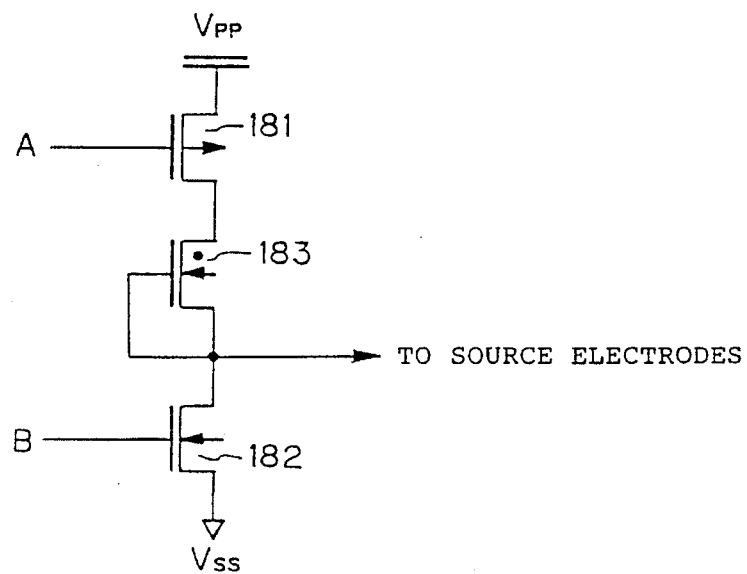
FIG. 26 is a circuit diagram showing an example of circuitry of the portion of the source power circuit relating to the present invention.
Figure 27:
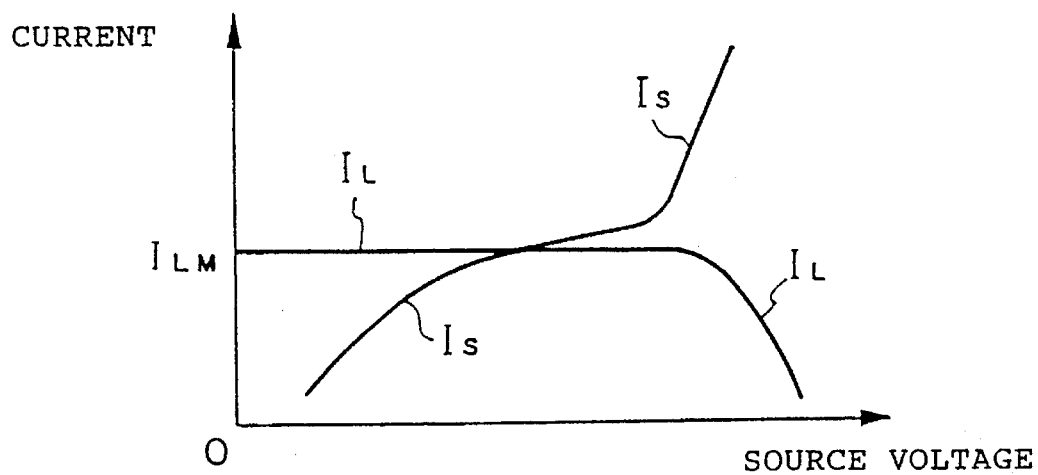
FIG. 27 is a graph showing the characteristics of the circuit in FIG. 26.

FIG. 26 shows circuitry of the portion of the source power circuit 18 relating to this embodiment (that is; a data erasing power circuit). FIG. 27 shows the load characteristics as well as cell characteristics.

The circuit shown in FIG. 26 is identical to the one shown in FIG. 24 (of a prior art) except that a transistor 183 is added. The transistor 183 is a depletion-type n-channel transistor whose gate is connected to a source thereof, and which is connected in series between a p-channel transistor 181 and an n-channel transistor 182. The drain saturation current of the transistor 183 is set to be equal to a specified current value $I_{LM}$. The current value $I_{LM}$ represents, as described previously, a value at which an avalanche breakdown does not occur. In this circuitry, the output voltage (erasing voltage) is fetched from a contact point between the transistors 183 and 182.

In the graph of FIG. 27, $I_L$ denotes a load curve for the circuit shown in FIG. 26, and $I_S$ denotes a cell characteristic curve. As apparent from the characteristic curve in FIG. 27, the cell current is always restricted to a value lower than the specified current value $I_{LM}$. Avalanche current need not be supplied. Furthermore, inter-band tunneling current can be minimized. A problem in prior arts that the cell characteristic deteriorates during data rewriting can be resolved.

Even if the breakdown voltage of a cell transistor fluctuates or the supply voltage $V_{PP}$ for data erasing fluctuates, a maximum of output current (current supplied to a source electrode) of a circuit is the specified current value $I_{LM}$, so stable operations are possible.

The load characteristics shown in FIG. 27 are ideal characteristics. In the circuit in FIG. 26, in practice, the load characteristics become as shown by $I_M$ in FIG. 28 due to the back gate effect of the depletion-type n-channel transistor 183. The circuit in FIG. 26 is not a perfectly constant current circuit, wherein when the current is lower than $I_{MZ}$ (at which point a source voltage-current curve having a constant slope is angled), the voltage becomes $V_{MZ}$.

Figure 28:
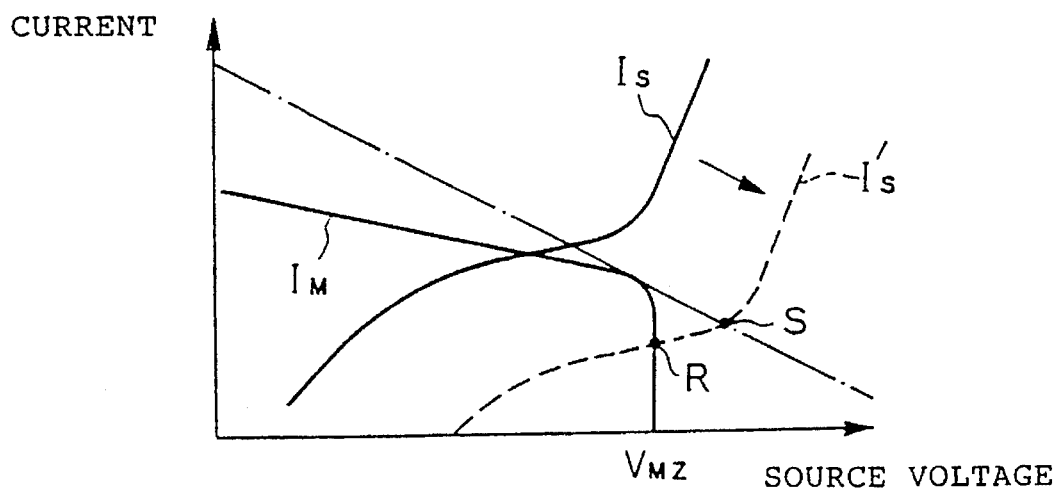
FIG. 28 is an explanatory diagram showing the actual characteristics and effects of the circuit in FIG. 26.

If the amount of charges in a floating gate decrease during erasing, the cell characteristic curve becomes as shown in the right-hand lower part of FIG. 28. If the source power circuit has the load characteristics indicated with a dashed line, the source voltage rises along the cell characteristic curve. Avalanche current then flows. The load characteristics shown by $I_M$ in FIG. 28 restrict a maximum voltage to $V_{MZ}$. The source voltage therefore does not rise, and occurrence of an avalanche breakdown is prevented. The circuit shown in FIG. 26 has the above advantages.

Figure 29:
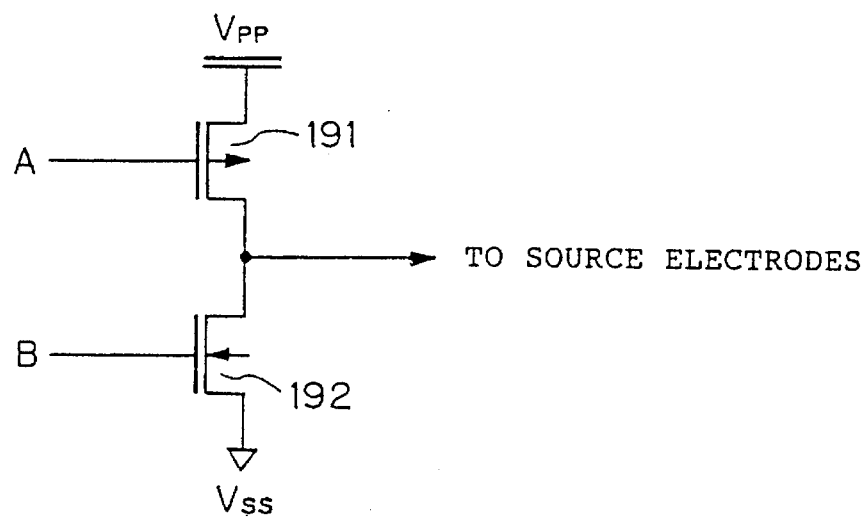
FIG. 29 is a circuit diagram showing a variant of the circuit in FIG. 26.
Figure 30:
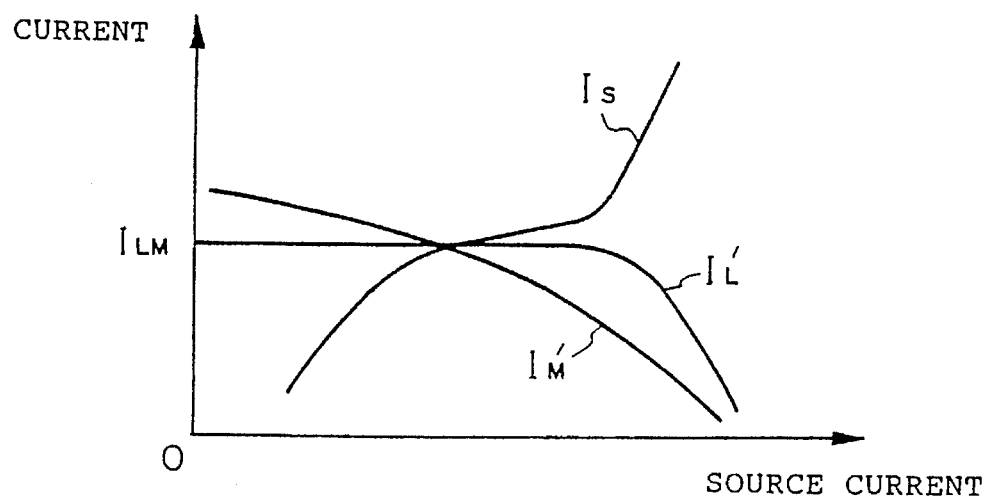
FIG. 30 is a graph showing the characteristics of the circuit in FIG. 29.

FIG. 29 shows a source power circuit in the tenth embodiment which is a variant of the circuit in FIG. 26. FIG. 30 shows the load characteristic and cell characteristic.

The circuit in FIG. 29 is identical to the one (of a prior art) in FIG. 24 in terms of component elements. A difference from the circuit in FIG. 24 is that a p-channel transistor 191 having a specified load characteristic (See FIG. 30) is employed instead of the transistor 171. In other words, the transistor characteristic is defined so that a maximum value of an amount of current supplied by the p-channel transistor 191 will be the specified current value $I_{LM}$.

In the graph in FIG. 30, $I_L'$ denotes an ideal load curve attained when the drain saturation current of the transistor 191 does not depend on the drain-source voltage $V_{DS}$ of a cell; $I_M'$ denotes a load curve attained when the drain saturation current depends on $V_{DS}$; and $I_S$ denotes a cell characteristic curve. For the load curve $I_L'$, the capacity (that is, a capacity for supplying current) of the transistor 191 must be determined on the assumption that the data erasing voltage may be maximum within a use range. For the load curve $I_M'$ (or when a resistive element is used instead of the transistor 191), the capacity of the transistor 191 (or the resistance of the resistive element) must be determined on the assumption that the breakdown voltage of a cell may be a minimum. The capacity of a transistor 183 in the circuitry in FIG. 26 is determined in a similar manner.

As mentioned above, according to the present invention, when circuitry is devised in such a manner that a maximum value of the erase voltage for data erasing will be equal to or lower than an avalanche voltage, injection of holes into an oxide film of a cell can be suppressed. Even if the resistivity of a source of a cell deteriorates, occurrence of an avalanche breakdown can be prevented and inter-band tunneling current can be minimized. This helps prevent deterioration of cell characteristics during data rewriting.

In erasing a flash memory, a problem of excessive erasing in which too many electrons are extracted from a floating gate has already been described. It has also been described that pre-erase writing is performed to alleviate the problem. In practice, however, pre-erase writing cannot perfectly prevent excessive erasing because of the variations among the characteristics of memory cells occurring in manufacturing processes. A excessively-erased memory cell allows leakage current to flow even when unselected, so the memory cell cannot be read correctly.

To prevent excessive erasing, complex control must be extended in the current situation; that is, electrons are extracted little by little from a floating gate during erasing, and a read check is performed. This slows down erasing.

In order to suppress the variations among memory cells, it must be prevented that variations occur among processes; that is, among individual memory cells. On the other hand, a current trend toward a larger storage capacity of a flash memory must be coped with. Under these circumstances, manufacturing itself becomes very hard to do.

Moreover, the test time for each flash memory will increase greatly.

To overcome these obstacles, it is conceivable to add a select transistor such as an EEPROM. The addition of a select transistor, however, causes another problem; that is, an increase in cell size. This method is therefore impractical.

The fourth mode of the present invention intends to suppress an increase in cell size and prevent the ill effect of excessive erasing.

Figure 31:
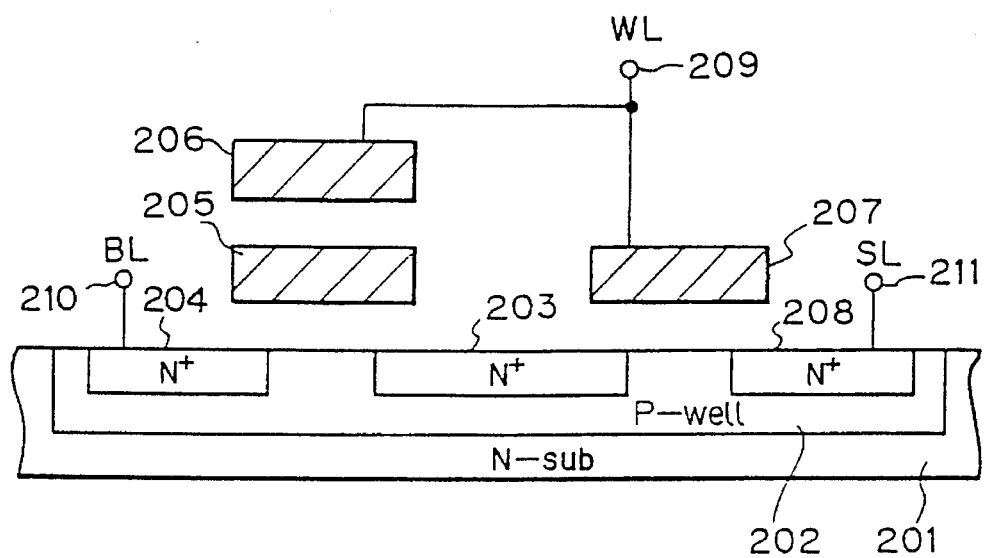
FIG. 31 is a cross-sectional diagram of a memory cell in a flash memory of the eleventh embodiment.
Figure 32:
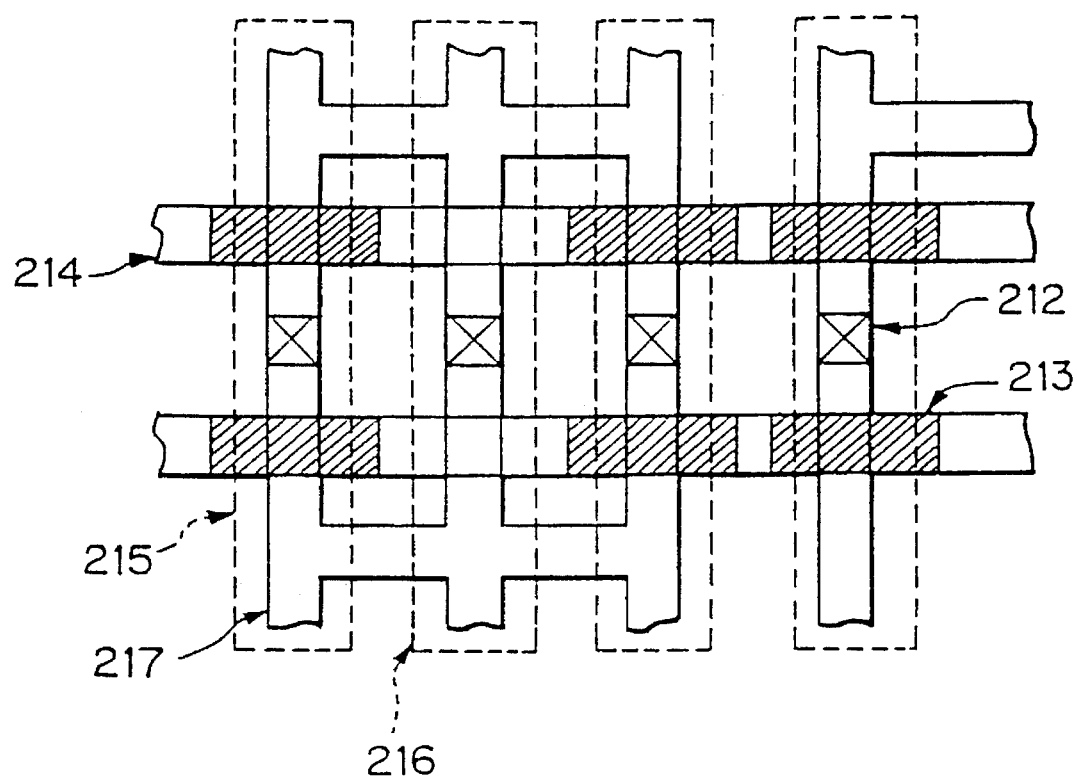
FIG. 32 is a plan view showing the components of the major portion of the eleventh embodiment.
Figure 33:
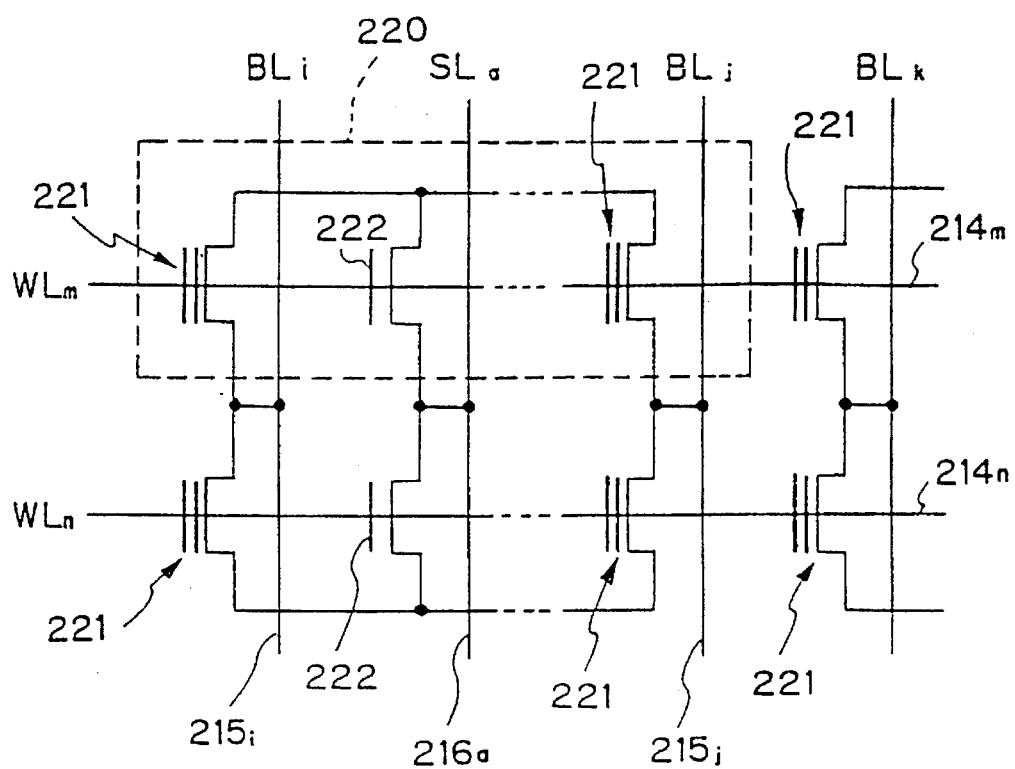
FIG. 33 shows an equivalent circuit for the memory cell in FIG. 32.

FIGS. 31 to 33 shows the eleventh embodiment or an embodiment of a flash memory based on the fourth mode of the present invention.

To begin with, the configuration will be described.

FIG. 31 is a cross-sectional diagram of a memory cell in this embodiment. Reference numeral 203 denotes a source (S); 204 denotes a drain (D); 205 denotes a floating gate (FG); 206 denotes a control gate (CG); 207 denotes a gate of a MOS transistor shown in FIG. 33; 208 denotes an n+ common source; 202 denotes a p-type well; 201 denotes an n-type substrate; 209 and 210 denote a word line (WL) and a bit line (BL) respectively; and 211 denotes a terminal connected to a select line (SL).

In the embodiment shown in FIG. 31, 201 denotes an n-type substrate. Needless to say, an n-type well and a p-type substrate will also do.

FIG. 32 is a plan view showing a major portion of this embodiment. In FIG. 32, reference numeral 212 denotes a contact window; 214 denotes a word line (WL) made of poly-silicon; 215 denotes a bit line made of aluminum (BL); 216 denotes a common source (CS) made of aluminum; 217 denotes a source S that is a diffused layer; and 213 denotes a floating gate (FG).

FIG. 33 shows an equivalent circuit of FIG. 32. In FIG. 33, reference numeral 220 denotes a memory cell group comprising memory cells 221 for one byte or eight bits and a MOS transistor 222.

Next, the operation of the circuit will be described.

In this embodiment, as listed in Table 2, a high voltage Vcc (in this case, 5 V) is applied to a
selected word line (WL) during reading. If electrons have been injected into the floating gate (FG) (data has been written), the circuit in FIG. 33 is cut off.

If electrons have been extracted (data has been erased), the circuit is turned on. It is then detected whether data is low or high.

TABLE 2

| | Voltages in the modes of this embodiment | | | | | | |
|---|---|---|---|---|---|---|---|
| | Selected WL | Unselected WL | Selected BL | Unselected BL | SL | P well | N substrate |
| Reading | Vcc | 0 V | to 1 V | Open | 0 V | 0 V | Vcc |
| Writing | Vpp | 0 V | Vpp | Open | 0 V | 0 V | Vcc |
| Erasing | −Vpp | 0 V | Open | Open | 0 V | 0 V/Vcc | Vcc |

Herein, the sources of a selected memory cell group alone are set to 0 V. Supposing that leakage current is present in an unselected memory cell group 220, the leakage current does not flow because the selected memory cell group is cut off by the MOS transistor (source transistor) 222.

For writing, similarly in a standard EPROM, a high voltage Vpp (in this case, 12 V) is applied to a word line (WL). The high voltage Vpp (in this case, 12 V) is also applied to a bit line (BL), which triggers an avalanche breakdown. Electrons are then injected to the floating gate (FG).

For erasing, a high negative voltage −Vpp (in this case, −7 V) is applied to the word line (WL). This causes tunneling in which electrons are extracted from the floating gate (FG) to the p-type well. In the circuitry of this embodiment, since a high voltage is not applied to a common source (CS) during erasing, a high negative voltage is applied to the floating gate (FG) so that electrons will be discharged from the floating gate (FG) to the n-type substrate.

When an electric field is intensified by increasing the voltage of the well (p well) to Vcc that is the same as the voltage of the substrate (n substrate), the erasing time can be shortened.

As mentioned above, in this embodiment, a single MOS transistor is added to a memory cell group consisting of memory cells for a specified number of bits. Excessive erasing can thus be avoided.

Despite a larger capacity, an area almost the same as that of a conventional cell can be realized. Excessive erasing due to the variations among processes can be prevented.

In this embodiment, memory cells whose sources are connected to one another are grouped in units of eight bits; that is, one byte. Alternatively, memory cells may be grouped in units of, for example, one word. Any unit suitable for a processing system can be adopted.

As described above, the flash memory of the eleventh embodiment based on the fourth mode of the present invention is a semiconductor memory comprising multiple memory cells located at intersections between multiple word lines and bit lines arranged in the form of a matrix, and select lines each used for selecting a specified memory cell group which consists of a specified number of memory cells on the same word line. Specified data previously written in the memory cell groups are erased electrically, and then the semiconductor memory becomes rewritable. The word line in each memory cell group is connected to the gate of a MOS transistor. The source of the MOS transistor and the sources of memory cells in each memory cell group are connected to one another. The memory cell groups including the MOS transistors are formed in a well. When specified data, which are previously written in the memory cell groups, are to be erased electrically, negative voltage is applied to the word lines.

The well in which the memory cell groups including the MOS transistors are formed is preferably divided into at least two portions. When specified data, which are previously written in the memory cell groups, are to be erased electrically, the voltage of the well is set to the same value as a substrate voltage.

In the fourth mode, MOS transistors are included. The word lines of memory cell groups are connected to the gates of the MOS transistors. The source of each MOS transistor and the sources of the memory cells of each memory cell group are connected to one another. For data reading, the sources in a selected memory cell group alone are connected together. If an excessively-erased cell is present in other unselected memory cell groups, since the sources in the unselected memory cell groups are disconnected from the sources in the selected memory cell group, the influence of the excessively-erased cell can be suppressed.

No complex control is needed for erasing. Additional MOS transistors are provided at the rate of one MOS transistor per memory cell group. A total cell area is almost the same as that in a conventional memory.

In short, the negative effect of excessive erasing can be avoided, and an increase in cell size is suppressed.

Next, embodiments based on the fifth mode of the present invention will be described.

As described previously, negative-voltage application in which negative voltage is applied to a control gate during erasing is helpful for downsizing a flash memory. Various methods are conceivable for application of negative voltage to a control gate; that is, application of negative voltage to a word line on which the control gate is connected. For example, a row decoder is used to apply negative voltage to a word line on which a memory cell that is to be erased is connected. Alternatively, a negative voltage source is connected to a word line, and a connection switch circuit is installed to operate complementarily to both pairs of a word line and a row decoder, and a word line and a negative voltage source. The switch circuit disconnects a negative voltage generator in either a write or read mode, and disconnects the row decoder for erasing.

Figure 34:
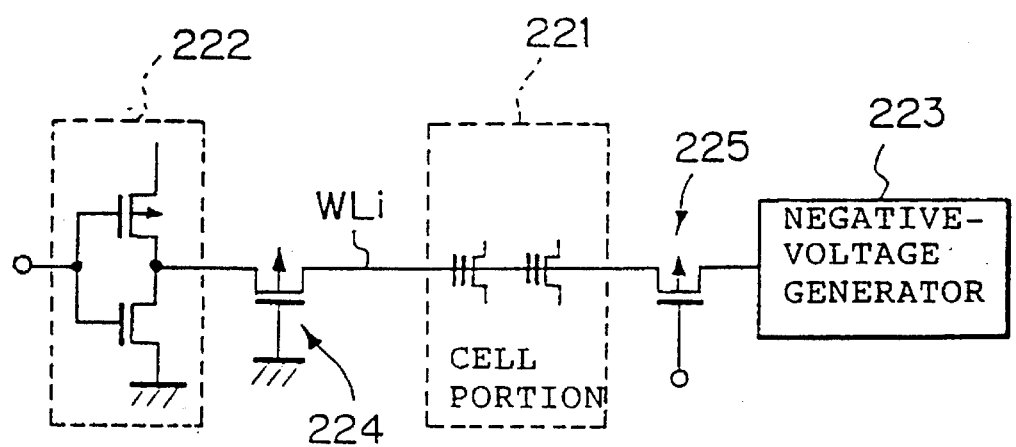
FIG. 34 shows a configuration for applying negative voltage to a word line using an independent negative power supply.

FIG. 34 shows an example of circuitry, wherein a negative-voltage generator 223 is installed on the opposite side of a row decoder 222 with a memory cell array 221 between them. The negative voltage generator 223 is connected to a word line 226. P-channel transistors 224 and 225 are installed as disconnection switches between the row decoder 222 and memory cell array 221, and the memory cell array 221 and negative generator 223.

To apply negative voltage selectively to word lines, a decoder similar to a row decoder must be installed in the negative voltage generator. The overall circuit thus becomes large in scale.

To overcome this drawback, it is thought that a row decoder could be used to apply negative voltage to a word line.

Figure 4:
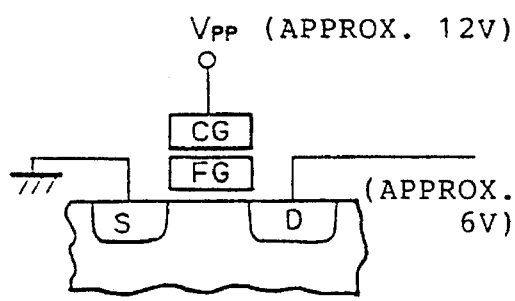
FIGS. 4 to 7 are explanatory diagrams for methods of reading, writing, and erasing a flash memory.
Figure 5:
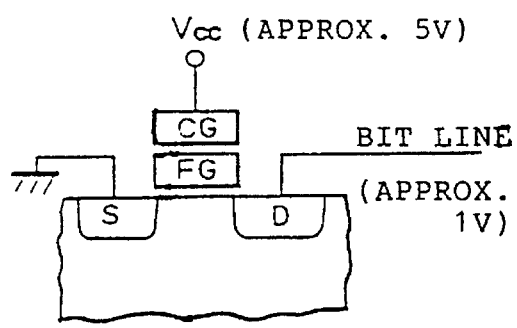
Figure 6:
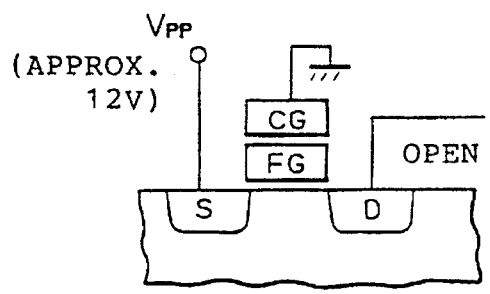

The row decoder applies a voltage indicated in FIG. 4 or 5 to a word line during writing or reading. Specifically, during writing, a high voltage Vpp is applied to a word line on which concerned memory cells are connected (selected word line), and a ground voltage Vss is applied to the other word lines (unselected word lines). About 6 V is applied to a selected bit line. Unselected bit lines are opened. Similarly, during reading, a positive voltage Vcc is applied to a selected word line, while a ground voltage Vss is applied to unselected word lines. About 1 V is applied to a selected bit line. Unselected bit lines are opened. In either case, the ground voltage Vss is applied to sources S. Memory cells are thus accessed independently. Information is then written into or read out from the memory cells.

The row decoder selects a voltage to be applied to a word line from two supply voltages according to a row decode signal. The supply voltage must be changed from writing to reading. Specifically, a high voltage must be applied to a power terminal during writing, while a positive voltage must be applied during reading. The row decode signal to be fed to the row decoder is constant whichever mode is specified; a write or read mode. The row decoder has a level change function for changing a level of a signal to a different voltage level according to a select signal.

Figure 7:
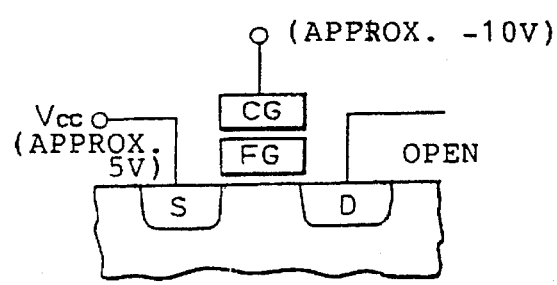
Figure 8:
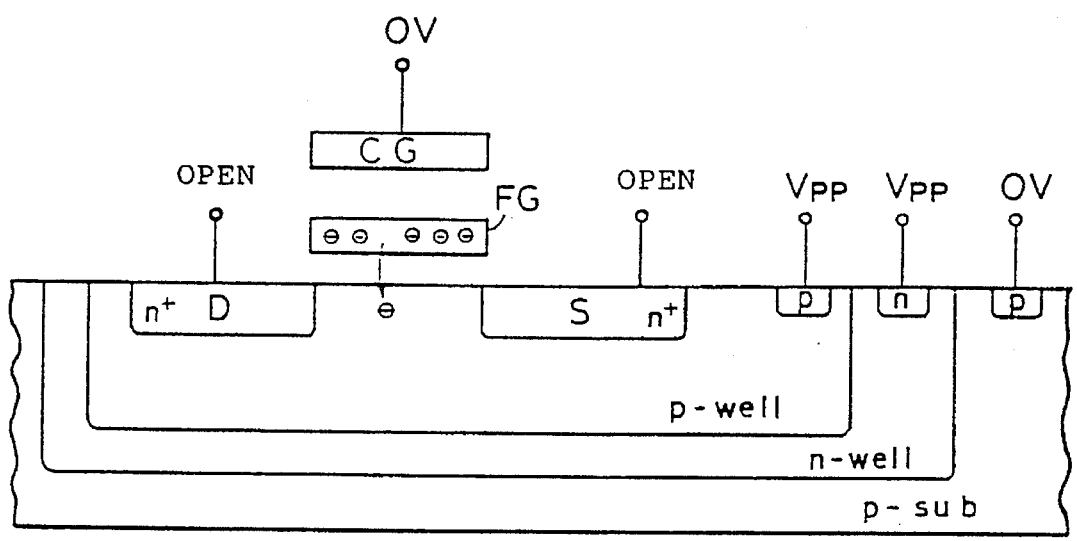
FIG. 8 is an explanatory diagram for channel erasing based on high-voltage application.

The row decoder also applies negative voltage to a selected word line during erasing. For erasing, as shown in FIG. 7, drains D must be opened. A positive voltage Vcc must be applied to sources S, and a negative voltage $V_{BB}$ must be applied to control gates CG. Application of the negative voltage $V_{BB}$ to the control gates CG is performed block by block. The positive voltage Vcc is applied to the word lines in a block which are not subjected to erasing.

In a flash memory, during reading or writing, a positive voltage $V_{CC}$ or a high voltage $V_{FF}$ must be applied to selected word lines WLi, while a ground voltage is applied to unselected word lines WLj (j≠i). During erasing, the selected word lines WLi must be set to a negative voltage, while the unselected word lines WLj must be set to a positive voltage.

In short, the following formula is established for reading or writing:

Voltage for selected word lines WLi>Voltage for unselected word lines WLj

The following formula is established for erasing:

Voltage for selected word lines WLi<Voltage for unselected word lines WLj

The levels of the voltages must be reversed. For supplying negative voltage that is to be applied to a word line, a row decoder must have a conventional level change function as well as a level change function that can change levels between a negative voltage $V_{BB}$ and a positive voltage Vcc, and be able to reverse the levels of voltages to be applied to a word line according to the logic value of "selected" or "unselected."

Figure 35:
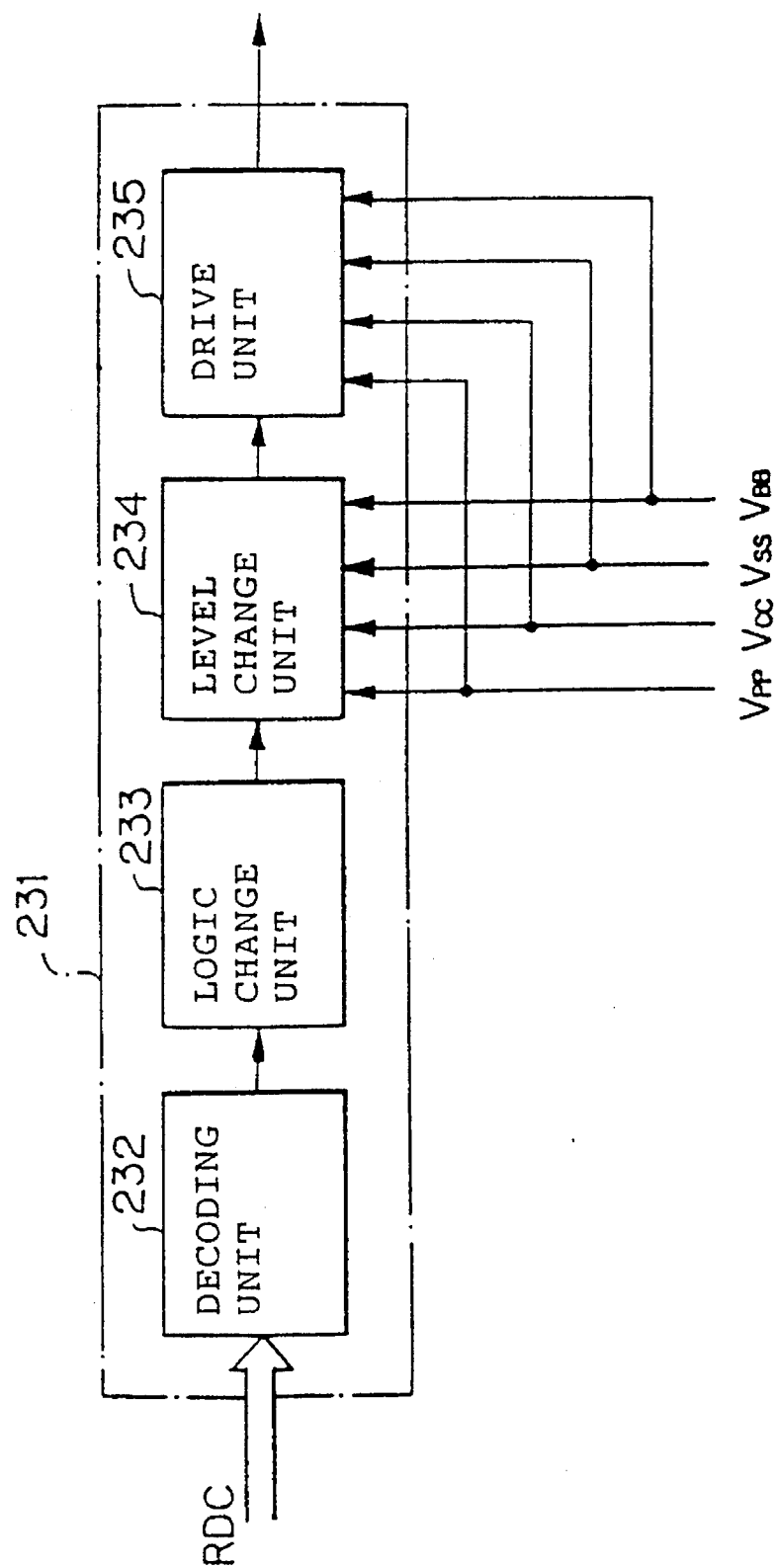
FIG. 35 shows a functional structure of a row decoder when the row decoder applies negative voltage.

FIG. 35 shows a functional structure of a row decoder for applying negative voltage to a word line. As illustrated, a row decoder 231 includes a decoding unit 232, a logic change unit 233, a level change unit 234, and a drive unit 235. The decoding unit 232 decodes a row decode signal RDC, and determines whether a word line connected to the row decoder 231 is selected or unselected. The drive unit 235 provides a large driving force for driving the word line. The decoding unit 232, logic change unit 233, and level change unit 234 except the drive unit can be arranged in any order. For example, the level change unit 234 may be located at a leading position. However, if the level change unit 234 is located at a leading position, the subsequent units must be able to operate at a voltage whose level has been changed. The logic change unit 233 may not be installed in the row decoder 231, but an address signal itself may be changed. In this case, a unit for changing the address signal is necessary.

The row decoder for applying a negative voltage to a word line needs the foregoing functions, resulting in complex circuitry.

Figure 37:
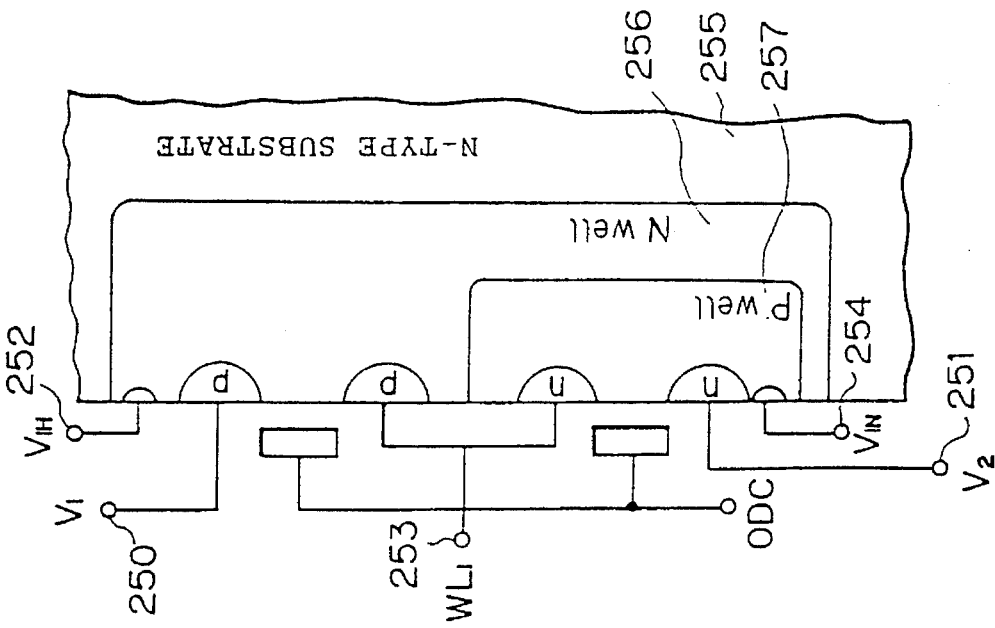
FIG. 37 shows an example of part of the circuitry in FIG. 36.
Figure 36:
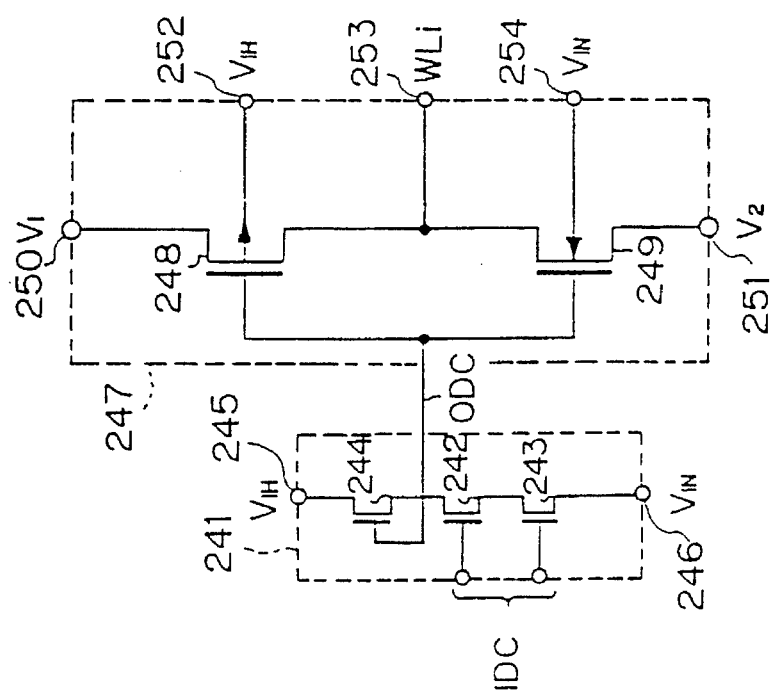
FIG. 36 shows an example of a circuitry of a row decoder in a flash memory according to the fifth mode of the present invention.

FIG. 36 shows an example of a circuitry of a row decoder that is a main feature of a flash memory based on the fifth mode of the present invention. FIG. 37 shows an example of a structure of a drive unit 245 shown in FIG. 36. Referring to these drawings, the basic components of the flash memory based on the fifth mode will be described.

The flash memory based on the fifth mode includes a memory cell array, and decoding units 241 for decoding multiple signals and accessing the memory cell array. The flash memory further includes drive units 247 each of which has a first power terminal 250 and a second power terminal 251, inputs an output of the decoding unit 241, and selectively outputs a voltage applied to the first power terminal 250 or a voltage approximate to the voltage, and a voltage applied to the second power terminal 251 or a voltage approximate to the voltage. The drive unit 247 assumes a first operation mode in which a first voltage is applied to the first power terminal 250 and a second voltage that is lower than the first voltage is applied to the second power terminal 251, and a second operation mode in which a third voltage is applied to the first power terminal 250 and a fourth voltage that is higher than the third voltage is applied to the second power terminal 251. Depending on whether the first or second operation mode is specified, output voltages are changed.

In the flash memory based on the fifth mode, the drive unit 247 in a row decoder performs a logic change. A logic change unit is thus eliminated. This realizes simpler circuitry. The drive unit 247 is designed to selectively output voltages V1 and V2 that are to be applied to the first and second power terminals 250 and 251. The levels of voltages to be applied to the first and second power terminals 250 and 251 are reversed depending on which operation mode is selected.

The requirements for a drive unit to apply negative voltage to word lines will be described briefly.

In FIG. 36, a level change circuit is arranged in front of the decoding unit 241 but not illustrated. voltages $V_{IH}$ and $V_{IN}$ applied to the power terminals 245 and 246 of the decoding unit 241 vary depending on the level determined by the level change circuit. Voltages V1 and V2 are applied to power terminals 250 and 251 in the drive unit 247. The voltages V1 and V2 assume a high voltage Vpp and a zero voltage Vss respectively, a positive voltage Vcc and the zero voltage Vss respectively, or a negative voltage $V_{BB}$ and the positive voltage Vcc respectively depending on whether the writing, reading, or erasing mode is selected. In response to an input signal IDC, when the connected word line is selected, a signal ODC represents the voltage $V_{IN}$. A p-channel transistor 248 is turned on. The voltage V1 is output from the power terminal 250. When the connected word line is unselected, an n-channel transistor 249 is turned on and the voltage V2 is output from the power terminal 251.

The drive unit 247 has, as shown in FIG. 37, a dual-well structure. This structure resolves a problem that when negative voltage is applied to the power terminal 250 of the drive unit 247, a junction between a substrate and a diffused layer is forward-biased so that current flows and the output of a specified voltage is disabled.

Figure 38:
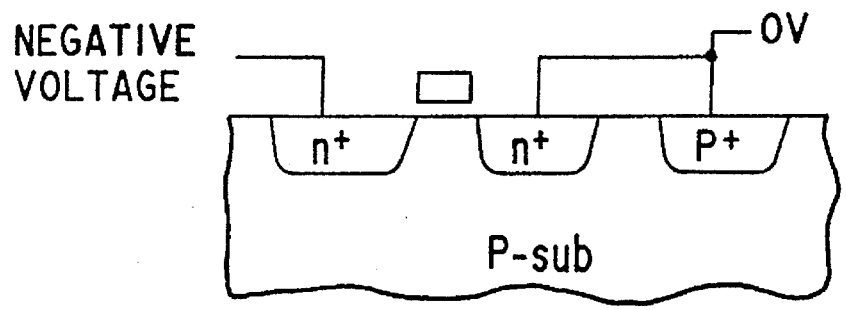
FIGS. 38 and 39 are diagrams for explaining problems occurring when negative voltage is applied to an example of a circuitry of a conventional row decoder.
Figure 39:
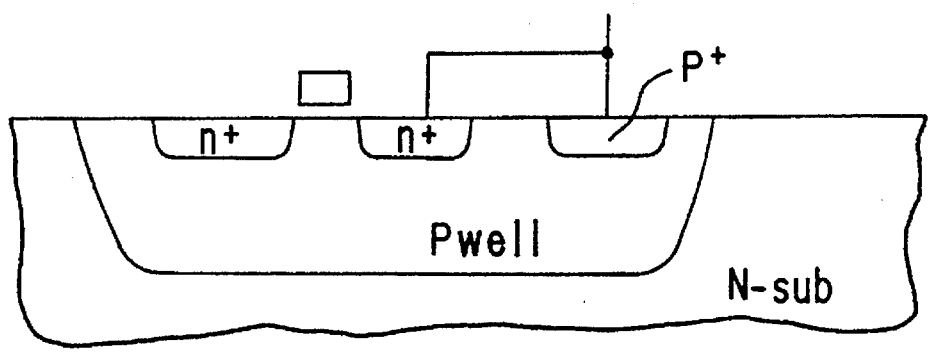

In FIGS. 38 and 39, negative voltage is applied in an example of a structure of a drive unit in a conventional flash memory that does not use a row decoder to apply negative voltage. FIG. 38 shows a structure based on a p-type substrate. FIG. 39 shows a structure based on an n-type substrate having a p well.

In FIG. 38, a p-type substrate is used and an n-type well is formed. In this case, if the voltage applied to the substrate itself decreases, the characteristics of portions operating at a normal voltage vary. This makes it impossible to apply negative voltage to only some portions, so a negative voltage generator must handle a heavy load.

When an n-type substrate is used and a p-type well is formed, as shown in FIG. 39, negative voltage need be applied to only required portions of the p-type well. The above problem can thus be solved. However, the substrate bias of a p-channel transistor cannot be set partly to Vpp for writing.

Figure 40:
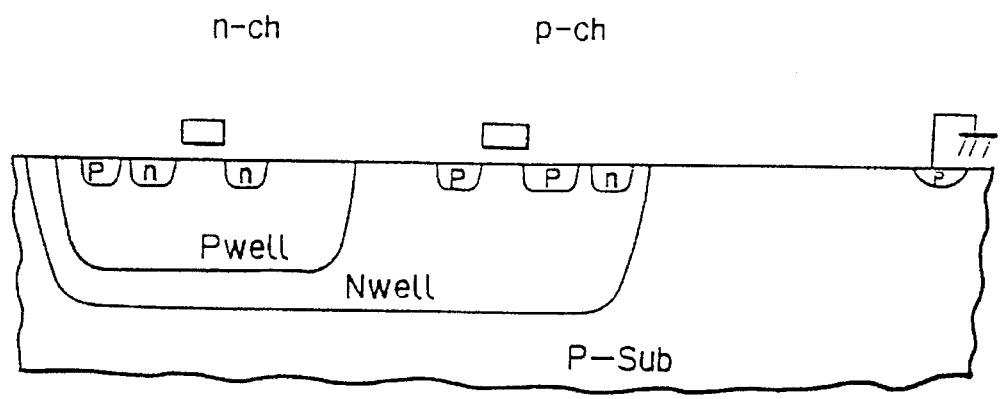
FIGS. 40 and 41 show structures of a drive unit in a row decoder based on the fifth mode.
Figure 41:
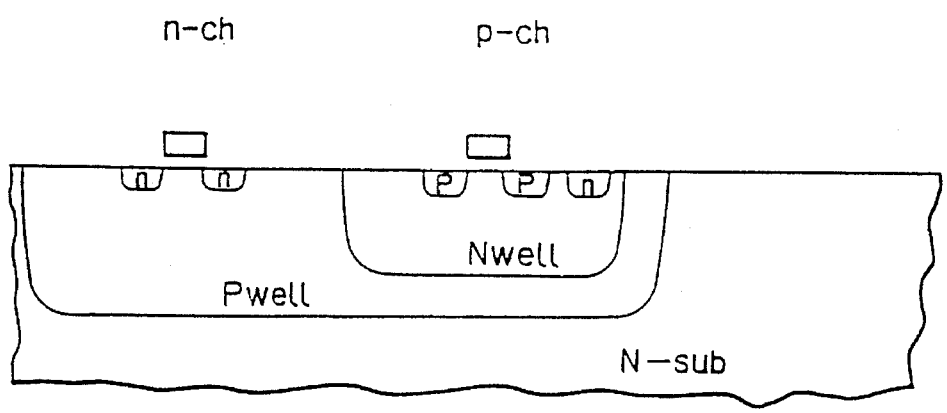

To avoid the above problems, the drive unit 247 for negative-voltage driving must have any of the following structures:

(a) as shown in FIG. 40, a p-well region is formed within an n-well region on a p-type substrate, and an n-channel MOS transistor is formed in the p-well region;

(b) as shown in FIG. 41, an n-well region is formed within a p-well region on an n-type substrate, and a p-channel MOS transistor is formed in the n-well region; or (c) a p-channel transistor and an n-channel transistor are formed on an insulating substrate and a p-well region is biased negatively, which is a silicon-on-insulator (SOI) structure.

These structures enable application of negative voltage to a control gate CG of a memory cell. A drive unit according to the present invention has any of the above structures, which enables a row decoder to perform negative-voltage application.

Figure 42:
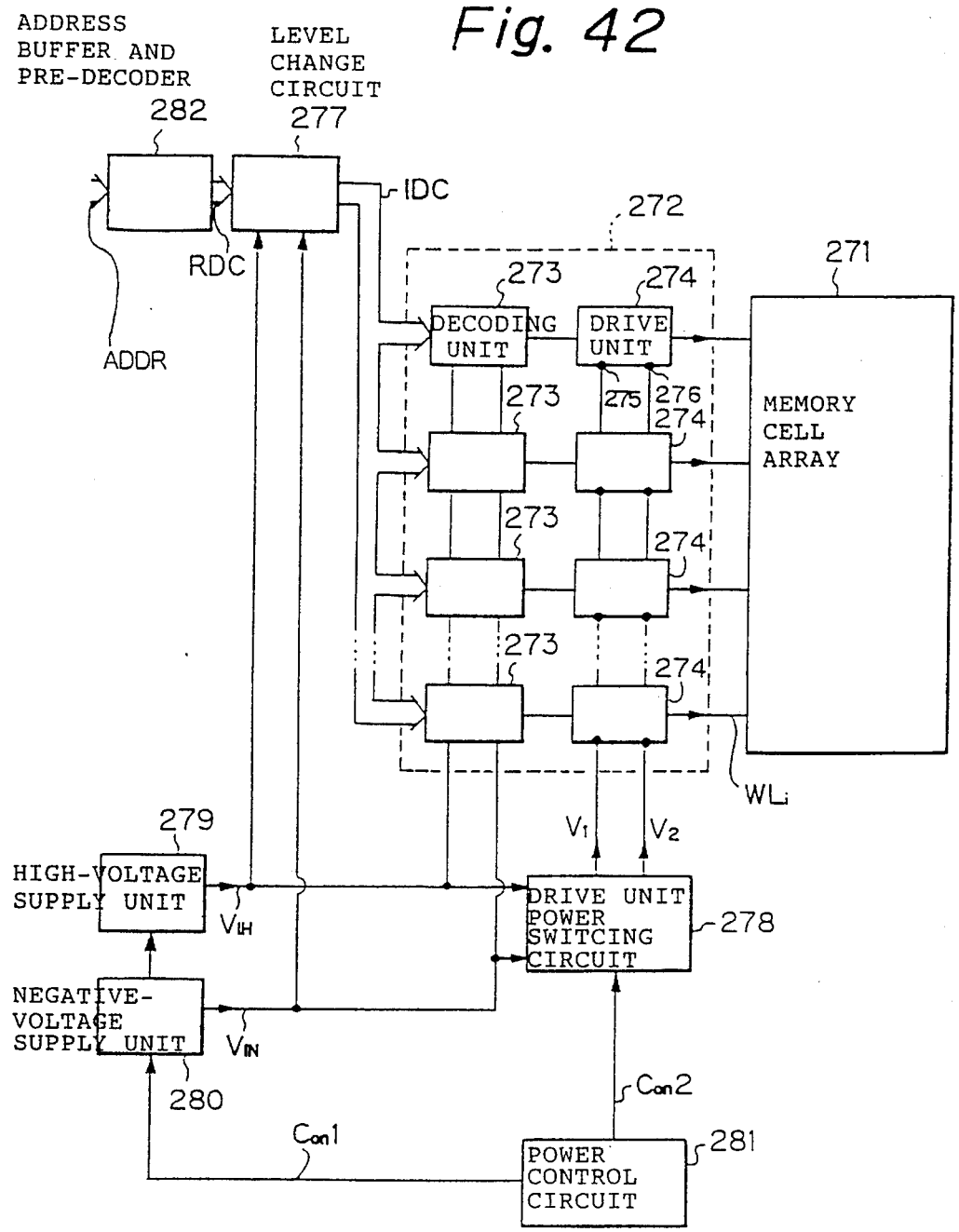
FIG. 42 shows a configuration of a flash memory in the twelfth embodiment.

FIG. 42 shows a configuration of a flash memory in the twelfth embodiment. This embodiment is based on the fifth mode of the present invention.

As shown in FIG. 42, a flash memory of this embodiment comprises a memory cell array 271, a row decoder 272, an address buffer pre-decoder 279, a level change circuit 277, a drive unit power switching circuit 278, a high-voltage supply unit 279, a lower-voltage supply unit 280, and a power control circuit 281. In this embodiment, level change is not performed for each word line. A row decode signal RDC is changed in level by the level change circuit 277, and then input to each of decoding units. The level change circuit 277 can therefore be shared among the decoding units.

Each of memory cells forming the memory cell array 271 has the same structure as a conventional one.

Figure 43:
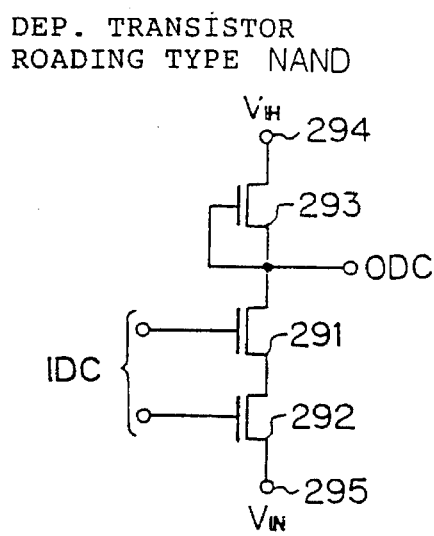
FIGS. 43 and 44 show examples of circuitry for a decoding unit in the twelfth embodiment.
Figure 44:
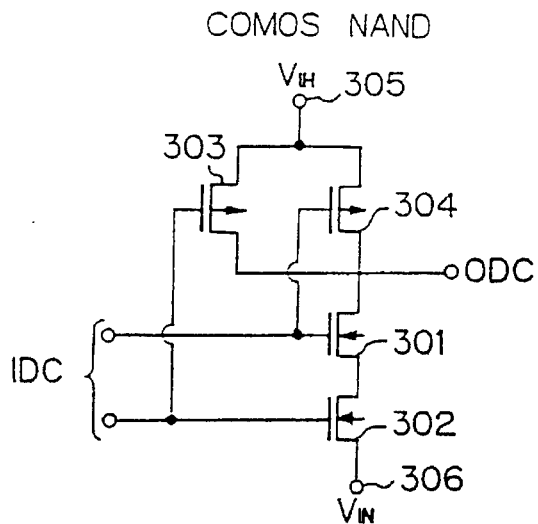
Figure 45:
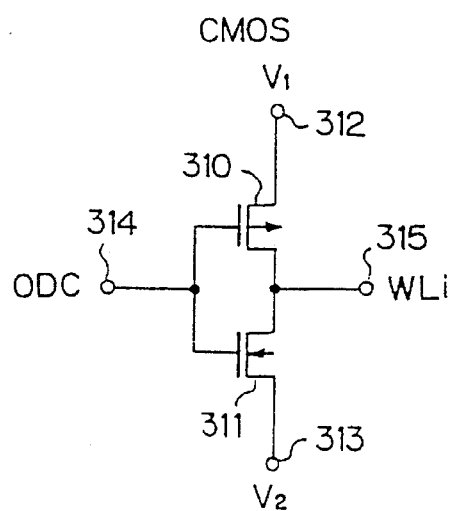
FIG. 45 shows a drive unit in the twelfth embodiment.

The row decoder 272 comprises decoding units 273 and drive units 274 which are associated with word lines WLi. FIGS. 43 and 44 are circuit diagrams of each decoding unit 273. FIG. 43 shows a NAND circuit having a depletion-type transistor 293 as a load. FIG. 44 shows a CMOS NAND circuit. FIG. 45 shows the circuitry of a drive unit 274.

The decoding units 273 decode multiple signals IDC sent from the level change circuit 277 and access the memory cell array 271. Each of the drive units 274 has a first power terminal 275 and a second power terminal 276, inputs an output of the associated decoding unit 273, and selectively outputs a voltage V1 that is to be applied to the first power terminal 275 or a voltage approximately equal to that voltage, and a voltage V2 that is applied to the second power terminal 276 or a voltage approximately equal to that voltage.

The drive unit 274 may have the structure shown in FIG. 40 in which a p-well region is formed within an n-well region on a p-type substrate and an n-channel MOS transistor is formed in the p-well region; the structure shown in FIG. 41 in which an n-well region is formed within a p-well region on an n-type substrate and a p-channel MOS transistor is formed in the n-well region; or the SOI structure in which a p-channel transistor and an n-channel transistor are formed on an insulating substrate, and a p-well region is biased negatively.

Figure 46:
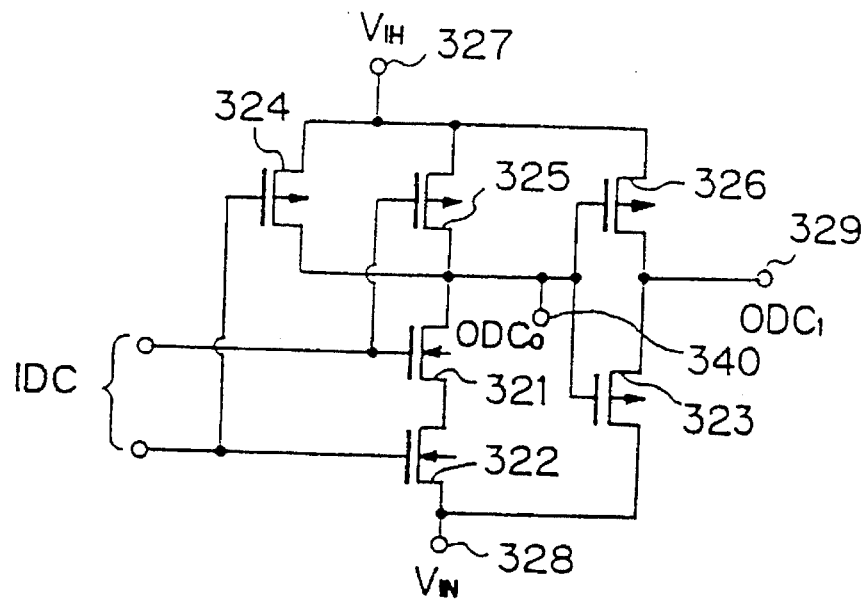
FIG. 46 shows an other example of circuitry of a decoding unit in the twelfth embodiment.
Figure 47:
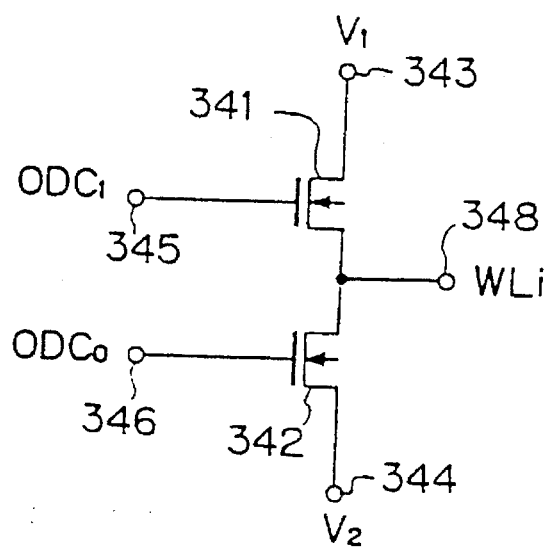
FIG. 47 shows an other example of circuitry of a drive unit in the twelfth embodiment.

The decoding unit 273 provides, as shown in FIG. 46, two outputs ODC0 and ODC1 of different phases which are logically reversed from each other. The decoding unit 273 may consist of transistors 341 and 342 of the same (n) type, wherein the same function as that provided when the decoding unit 273 is composed of transistors of different types is still available. When the ODC0 signal is low, the ODC1 signal goes high, the transistor 341 is turned on, and the transistor 342 is turned off. When the ODC0 signal is high, the ODC1 signal goes low, the transistor 341 is turned off, and the transistor 342 is turned on.

Figure 48:
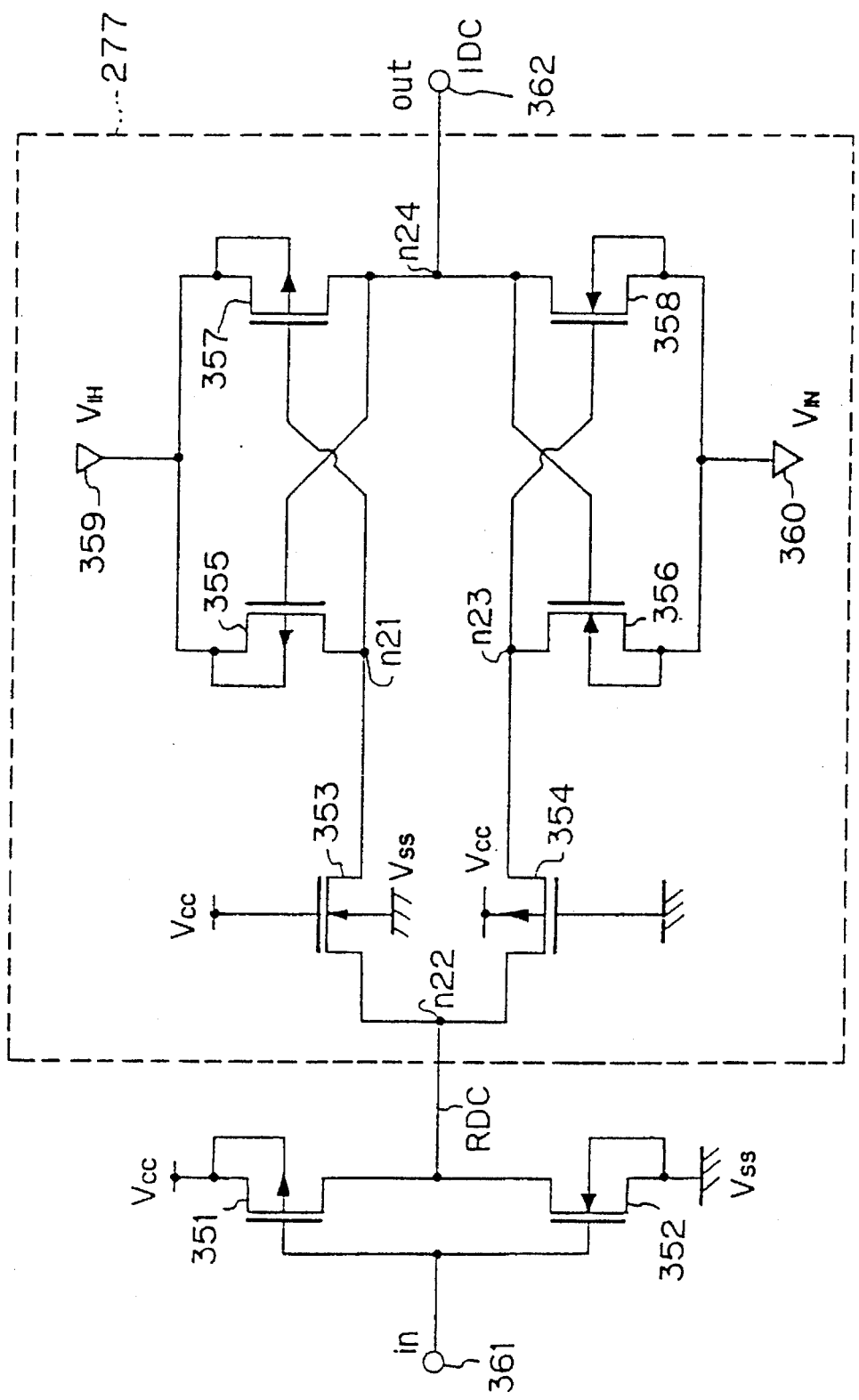
FIG. 48 is a circuit diagram of a level change circuit in the twelfth embodiment.

The high-voltage supply unit 279 selectively supplies a positive voltage Vcc and a high voltage Vpp under the control of a control signal Con1 sent from the power control circuit 281. The negative-voltage supply unit 280 selectively supplies a zero (ground) voltage Vss and a negative voltage $V_{BB}$ under the control signal Con1 sent from the power control circuit 281. The positive voltage Vcc, high voltage Vpp, zero voltage Vss, and negative voltage $V_{BB}$ have the following relationship:

Negative voltage $V_{BB}$<Zero voltage Vss<Positive voltage Vcc<High voltage Vpp The level change circuit 277 changes the voltage level of a signal fed to the decoding unit 273. As shown in FIG. 48, the level change circuit 277 has a first terminal 359 to for inputting an output $V_{IM}$ of the high-voltage supply unit 279 and a second terminal 360 for inputting an output $V_{IN}$ of the negative voltage supply unit 280. The level change circuit 277 further includes n-channel MOS transistors 353, 356, and 358, and p-channel MOS transistors 354, 355, and 357.

The level change circuit 277 outputs the voltage $V_{IM}$, which is to be applied to the first terminal 359, or a voltage approximate to the voltage $V_{IM}$, when the output RDC of the address buffer pre-decoder 282 is high (Vcc<$V_{IM}$). When the input RDC is low (Vss>$V_{IN}$), the level change circuit 277 outputs the voltage $V_{IN}$, which is to be applied to the second terminal 360, or a voltage approximately equal to the voltage $V_{IN}$.

Figure 49:
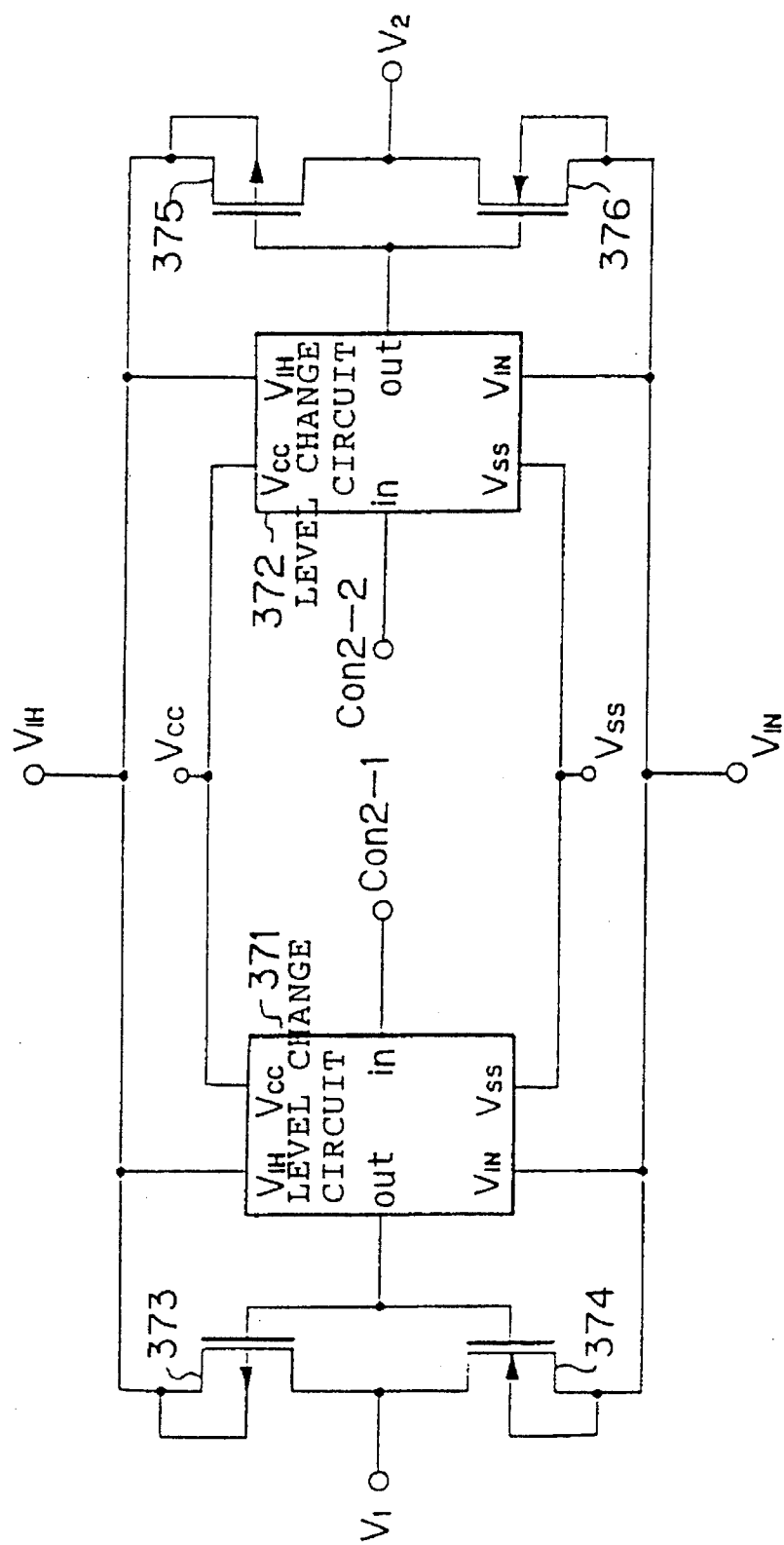
FIG. 49 shows circuitry of a power switching circuit for a drive unit in the twelfth embodiment.

The drive unit power switching circuit 278 switches the levels of supply voltages V1 and V2 which are to be applied to the drive unit 274, and comprises, as shown in FIG. 49, two level change circuits 371 and 372.

Switching the levels of the outputs V1 and V2 is controlled with control signals Con2-1 and Con2-2 sent from the power control circuit 281 to the level change circuits 371 and 372. Specifically, when data is read from the memory cell array 271, the output V1 is set to a positive voltage Vcc and the output V2 is set to a zero voltage Vss. When data is written in the memory cell array 271, the output V1 is changed to a high voltage Vpp and the output V2 is changed to the zero voltage Vss. When data is erased from the memory cell array 271, the output V1 is changed to a negative voltage $V_{BB}$ and the output V2 is changed to the positive voltage Vcc.

In the flash memory of this embodiment, reading from or writing to memory cells is done in a similar manner to that in a conventional memory.

Specifically, for writing, the output voltage V1 of the drive unit power switching circuit 278 is set to the high voltage Vpp, and the output voltage V2 is set to the zero voltage Vss. Word lines WLi are set to Vpp (about 2 V), bit lines BLi are set to about 6 V, and sources S are set to 0 V.

For reading, the output voltage V1 of the drive unit power switching circuit 278 is set to the positive voltage Vcc, and the output voltage V2 is set to the zero voltage Vss. Word lines WLi are set to Vcc (about 5 V), bit lines (BLi) are set to about 1 V, and sources S are set to 0 V.

For erasing information from memory cells, the output voltage V1 of the drive unit power switching circuit 278 is set to the negative voltage $V_{BB}$, and the output voltage V2 is set to the positive voltage Vcc. Word lines WLi are set to $V_{BB}$, bit lines BLi are opened, and sources S are set to Vcc.

The on or off operations of the transistors 310 and 311 in the drive unit 274 in the row decoder 272 are the same as those for reading or writing. In each of selected word lines WLi, the p-channel MOS transistor 310 is on and the n-channel MOS transistor 311 is off. On each of unselected word lines WLj (j≠i), the p-channel MOS transistor 310 is off and the n-channel MOS transistor 311 is on.

A difference from erasing to reading or writing is a voltage applied to a diffused layer (sources) in the opposite side (other end) of the word lines WLi. That is to say, the negative voltage $V_{BB}$ is applied to the sources of the p-channel MOS transistors 310, while the positive voltage Vcc is applied to the sources of the n-channel MOS transistors 311.

On the selected word lines WLi, the p-channel MOS transistors 310 are on. The voltage on the word lines WLi is lower by a threshold voltage Vth of a p-channel MOS transistor 310 than the negative voltage $V_{BB}$. On unselected word lines WLj, the n-channel MOS transistors 311 are on. The voltage on the word lines WLj is lower by the threshold voltage Vth of an n-channel MOS transistor 311 than the positive voltage Vcc.

The negative voltage for erasing need not be equal to $V_{BB}$. The voltage $V_{BB}$ is an internally-generated voltage. The voltage for erasing should therefore be a value with the threshold voltage Vth added so that voltage suitable for erasing will be applied to the word lines WLi. Due to the substrate bias effect, the threshold voltage Vth of a p-channel MOS transistor 310 and the threshold voltage Vth of an n-channel MOS transistor become relatively large values.

The twelfth embodiment has been described above. The level change circuit shown in FIG. 48 will now be described in more detail. In the subsequent description, since potentials are determined by applying voltages with respect to the zero (ground) voltage Vss, potentials Vpp, Vcc, Vss, and $V_{BB}$ are referred to as a high voltage Vpp, a positive voltage Vcc, a zero voltage Vss, and a negative voltage $V_{BB}$.

In this level change circuit, an input signal RDC is converted into an output signal IDC having a voltage reflecting the voltages $V_{IH}$ and $V_{IN}$ applied to the power terminals. When the high voltage Vpp and zero (ground) voltage $V_{BB}$ are fed to the power terminals, a signal whose amplitude varies from the high voltage Vpp to the zero voltage $V_{BB}$ is supplied. When the positive voltage Vcc and negative voltage $V_{BB}$ are fed to the power terminals, a signal whose amplitude varies from the positive voltage Vcc to the negative voltage $V_{BB}$ is supplied.

As shown in FIG. 48, in the level change circuit, the pull-up p-channel transistor 355, the high-voltage cutoff n-channel transistor 353, the negative-voltage cutoff p-channel transistor 354, and the pull-down n-channel transistor 356 are connected in series with one another between the power terminals 359 and 360. The output p-channel transistor 357 and the output n-channel transistor 358 are also connected in series with one another between the power terminals 359 and 360. The gate of the output p-channel transistor 357 is connected to a contact point between the pull-up transistor 355 and high-voltage cutoff transistor 353. The gate of the output n-channel transistor 358 is connected to a contact point between the negative- voltage cutoff transistor 354 and pull-down transistor 356. The contact point between the output p-channel transistor 357 and output n-channel transistor 358 is connected to the gates of the pull-up transistor 355 and pull-down transistor 356. The positive voltage Vcc is applied to the gate of the high-voltage cutoff transistor 353, and the zero (ground) voltage Vss is applied to the channel thereof. The zero voltage Vss is applied to the gate of the low-voltage cutoff transistor 354, and the positive voltage Vcc is applied to the channel thereof. The input signal RDC is input to the contact point between the high-voltage cutoff transistor 353 and low-voltage cutoff transistor 354. The output signal is supplied from the contact point between the output p-channel transistor 357 and output n-channel transistor 358.

Next, the operations of the level change circuit will be described.

Assuming that a signal of the positive voltage Vcc (high) is fed as an input signal RDC to the input terminal 361 and a signal of the zero voltage Vss is output, the output signal IDC assumes the voltage $V_{IH}$ applied to the power terminal 359. If the voltage of the signal applied to the input terminal 361 changes from Vcc to Vss, the voltage of the input signal RDC of the level change circuit 277 changes to the positive voltage Vcc. The low-voltage cutoff transistor 354 is turned on, thus boosting the voltage at a point n23. At this time, the pull-down transistor 356 is on. A point n22 is still connected to the power terminal 360. The current flowing through the point n22 can be limited by lowering the capability of the pull-down transistor 356. The voltage at the point n23 is boosted so as to turn on the output n-channel transistor 358, which causes no problem. When the output n-channel transistor 358 is turned on, the voltage at a point n24 drops, and the pull-up transistor 355 is turned on. The voltage at a point n21 rises to be the voltage $V_{IH}$ corresponding to the voltage applied to the power terminal 359. The output p-channel transistor 357 shifts to the off state. The voltage at the point n24 further drops to approach the voltage $V_{IN}$ of the power terminal 360. Since the voltage at the point n24 drops, the pull-down transistor 356 is turned on. Transition thus terminates, and a stable state is attained. As long as the signal of the positive voltage Vcc is applied to the input terminal 361, this state is maintained.

Contrary to the foregoing procedure, the procedure to be followed when the voltage applied to the input terminal 361 changes from the positive voltage Vcc to the zero voltage Vss begins with the drop of the voltage at the point n1. The above description can also apply, so it will be omitted here.

The level change circuit in FIG. 48 has been described above. As apparent from the description, when one of the output transistors is turned on, the other output transistor is on. The output transistors 357 and 358 are both on instantaneously. At this time, current flows through the transistors. The voltage at the point n24 assumes an intermediate value. The voltage at the point n24 is applied as a gate voltage to each of the pull-up transistor 355 and pull-down transistor 356. The capacities of the transistors must therefore be specified so that the voltages thereof can be changed beyond the thresholds thereof.

The level change circuit 277 in FIG. 48 has a problem that a large current flows therethrough during signal change. Moreover, the capacities of transistors must be set to ensure normal operations, and it is hard to balance the capacities of the transistors. The thirteenth embodiment presents a level change circuit in which the aforesaid problems have been resolved.

Figure 50:
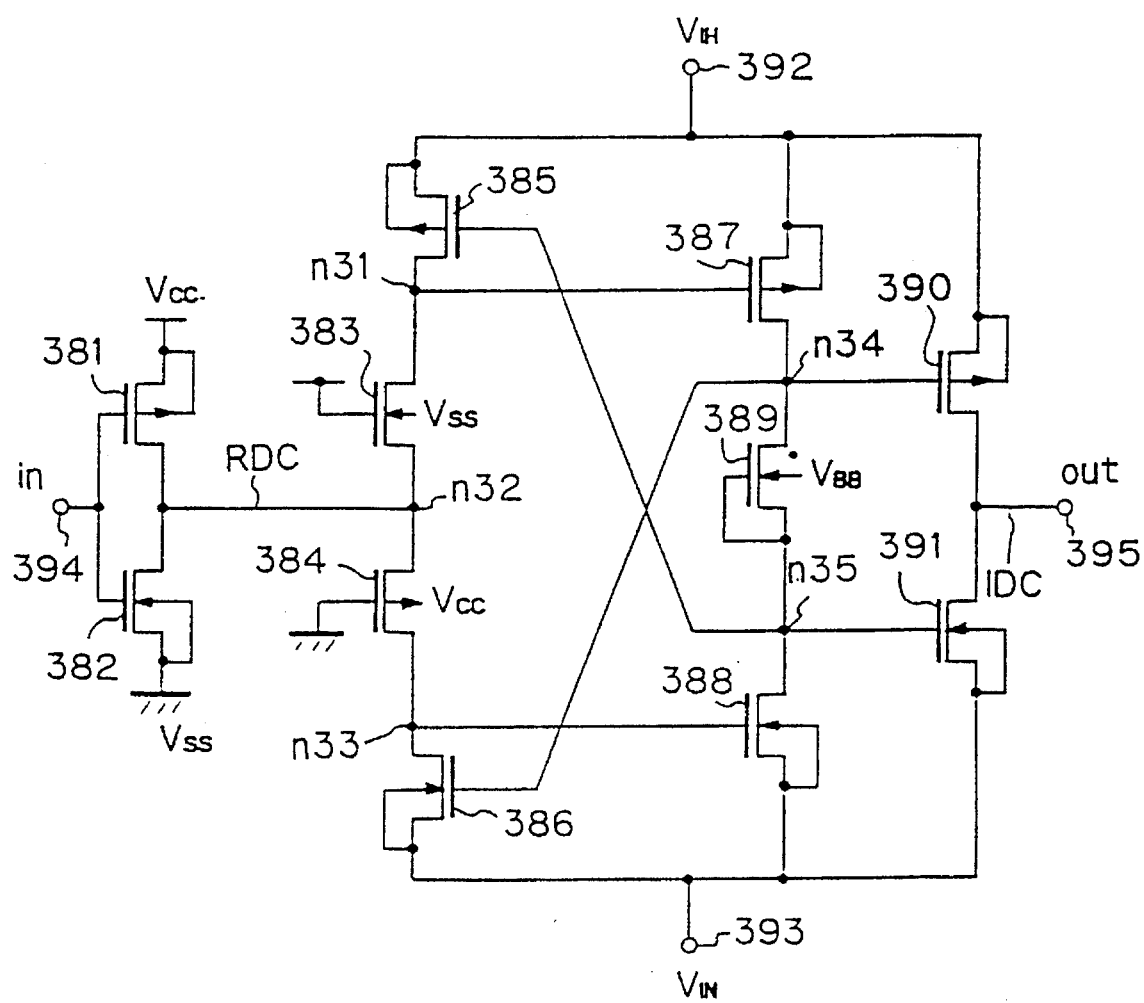
FIG. 50 shows a level change circuit in the thirteenth embodiment.

FIG. 50 shows circuitry of a level change circuit of the thirteenth embodiment. What differs from the circuitry in FIG. 48 is that a depletion-type n-channel transistor 389 is installed as a resistive element component between the output p-channel transistor 387 and output n-channel transistor 388, and that a second output p-channel transistor 390 and a second output n-channel transistor 391 are connected in series with each other as output ports. The gates of the pull-up transistor 385 and second output n-channel transistor 381 are connected to the drain of the output n-channel transistor 388. The gates of the pull-down transistor 386 and second output p-channel transistor 390 are connected to the drain of the output p-channel transistor 387. The output signal at the output terminal 395 in the circuitry in FIG. 50 is 180° out of phase with the output signal IDC in the circuitry in FIG. 48.

The operations of the circuit in FIG. 50 are substantially identical to those of the circuit in FIG. 48. Even when the output p-channel transistor 387 and output n-channel transistor 388 are turned on, the depletion-type transistor 389 restricts the current flowing therethrough. The transistor 389 is of the depletion type, which therefore provide a constant current irrelevant of a potential difference. Consequently, current is prevented from flowing through the transistor 389. The gates of the pull-up transistor 385 and pull-down transistor 386 are connected to points n34 and n35 across the depletion-type transistor 389. The drain-source potential difference in the depletion-type transistor 389 reliably turns on the transistors 385 and 386. The transistors 385 and 386 are actuated in harmony.

In the circuitry in FIG. 50, there is a time difference between the changes of the voltages at the points n34 and n35. The second output p-channel transistor 391 and second output n-channel transistor 390 are therefore not turned on simultaneously. Consequently, current is prevented from flowing through the points n34 and n35.

As apparent from the above description, the depletion-type transistor 389 restricts current flowing through the points n34 and n35 and causes a potential difference between them. This operation can be realized with a resistive element.

As described previously, the level change circuit is used to transfer a signal between circuits of different supply voltages. In the circuitry of the twelfth embodiment in FIG. 42, the level change circuit is used for level change between the address buffer decoder 282 and row decoder 272. As described previously, however, the level change circuit can be installed immediately before the drive units 274 in the row decoder 272. In this case, the normal positive voltage Vcc and zero voltage Vss are applied to the decoding units 273.

Figure 51:
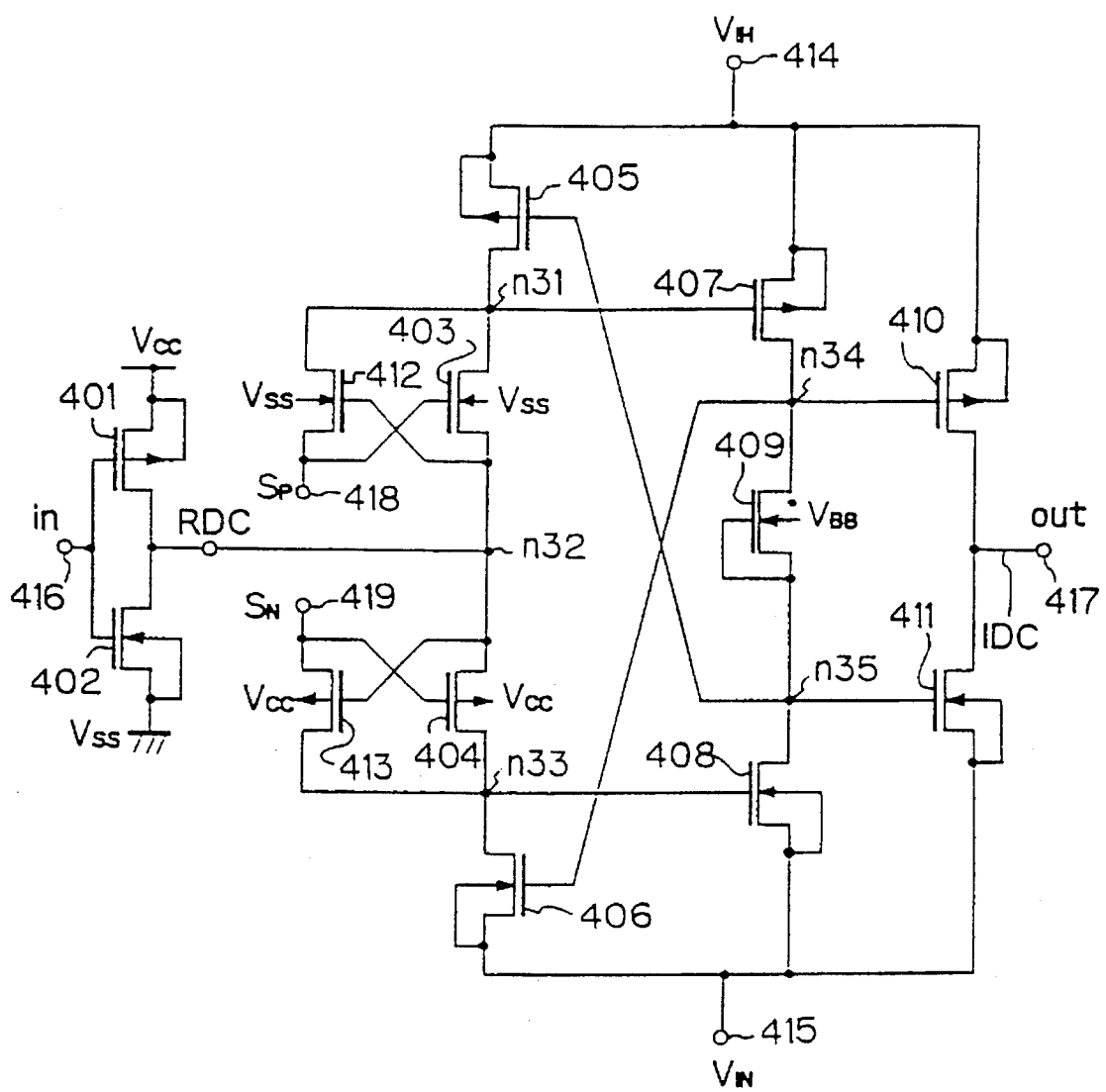
FIG. 51 shows a level change circuit in the fourteenth embodiment.

In a flash memory, when a row decoder is used to apply negative voltage to word lines, the internal logic of the row decoder must be reversed only for negative-voltage application. In the twelfth embodiment, the voltages applied to the power terminals of the drive unit 274 are reversed in phase. A logic change circuit is thus eliminated. However, a logic change circuit may be installed independently to reverse the logic of "selected" or "unselected" of a word line. The fourteenth embodiment enables the circuit shown in FIG. 50 to perform a logic change, and is used as one drive unit 274 in FIG. 42. The circuitry in FIG. 51 is identical to that in FIG. 50 except that an n-channel transistor 412 and a p-channel transistor 413 are added. Complementary signals Sp and $S_N$ applied to logic reverse terminals 418 and 419 are reversed in phase to provide a reversed output. The level change circuit in FIG. 51 includes, as illustrated, an n-channel transistor 412 whose drain is connected to the drain of the high-voltage cutoff transistor 403 in FIG. 50, and whose gate and source are connected to the source and gate thereof, and a p-channel transistor 412 whose drain is connected to the drain of the negative-voltage cutoff transistor 404 and whose gate and source are connected to the source and gate thereof. The gates of the high-voltage cutoff transistor 403 and negative-voltage cutoff transistor 404 are connected to the logic reverse terminals 418 and 419 respectively.

Table 3 is a truth table for the circuit in FIG. 51.

TABLE 3

| Truth table for the operations of the circuits in FIG. 51 | | | |
|---|---|---|---|
| $S_P$ | $S_N$ | in | out |
| Vcc | Vss | Vcc | $V_{IN}$ |
|  |  | Vss | $V_{IH}$ |
| Vss | Vcc | Vcc | $V_{IH}$ |
|  |  | Vss | $V_{IN}$ |

The operations of the circuit in FIG. 51 will now be described.

When the positive voltage Vcc is applied as a select signal $S_P$ to the logic reverse terminal 418 and the zero voltage Vss is applied as a signal $S_N$ to the terminal 419, the n-channel transistor 412 and p-channel transistor 413 are turned off. At this time, the circuitry in FIG. 51 is the same as that in FIG. 50. The same operations as those of the circuit in FIG. 50 are then carried out.

When the signals $S_P$ and $S_N$ applied to the logic reverse terminals 418 and 419 are reversed in phase to assume the zero voltage Vss and positive voltage Vcc respectively, the high-voltage cutoff transistor 403 and negative-voltage cutoff transistor 404 are turned off. The n-channel transistor 412 operates as a transistor for high-voltage cutoff. The p-channel transistor 413 operates as a transistor for negative-voltage cutoff. The operations of the circuit in FIG. 51 are identical to those in FIG. 50 except that either the high-voltage cutoff transistor or negative-voltage cutoff transistor is turned on depending on the level of the signal RDC.

A circuit portion for logically reversing the transistors 418 and 419 can also apply to the circuitry in FIG. 48.

When the circuitry in FIG. 51 is used as one drive unit 274 in the row decoder 272, the driving abilities of the second output p-channel transistor 410 and second output n-channel transistor 411 must be large enough to drive word lines. The voltage levels of the signals $S_P$ and $S_N$ to be supplied to the logic reverse input terminals 418 and 419 are reversed between writing or reading, and erasing. The positive voltage Vcc and zero voltage Vss are supplied to the decoding units 273. The voltage $V_{IH}$ and $V_{IN}$ are supplied from the high-voltage supply unit 13 and negative-voltage supply unit 14 directly to the power terminals 414 and 415 of the level change circuit in FIG. 51 serving as one drive unit 274. The drive unit power switching circuit 278 thus becomes unnecessary.

Next, a simpler level change circuit having a logic reverse function based on the sixth mode of the present invention will be presented as the fifteenth embodiment.

Figure 52:
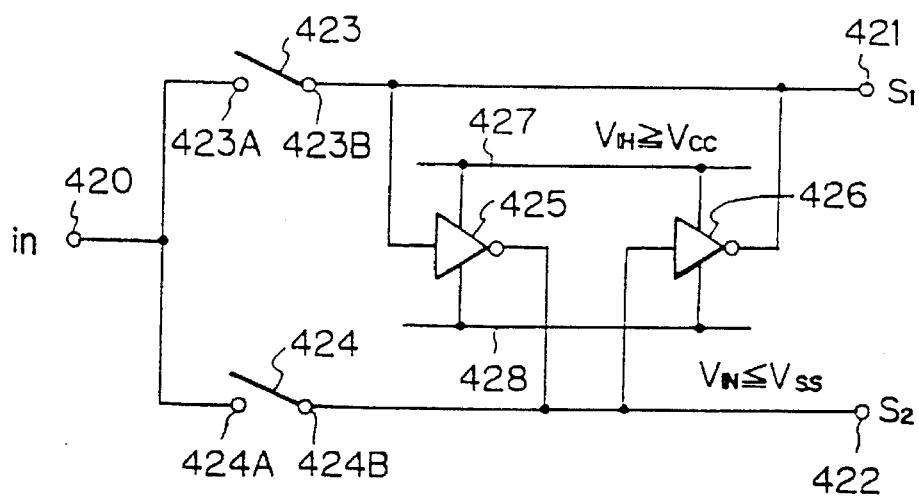
FIG. 52 is a diagram for explaining the principle of a level change circuit based on the sixth mode of the present invention.

FIG. 52 is an explanatory diagram for the principle of the level change circuit in the fifteenth embodiment. In FIG. 52, reference numeral 420 denotes an input terminal for inputting an input signal in; 421 denotes an output terminal for outputting an output signal S1; 422 denotes an output terminal for outputting an output signal S2; 423 and 424 denote connection switch elements; and 425 and 426 denote inverters.

One terminal 423A of the connection switch element 423 is connected to the input terminal 420, and the other terminal 423B thereof is connected to the output terminal 421. One terminal 424A of the connection switch element 424 is connected to the input terminal 420, and the other terminal 424B is connected to the output terminal 422.

The input terminal of the inverter 425 is connected to the terminal 423B of the connection switch element 423, and the output terminal thereof is connected to the output terminal 422. The power terminals of the inverter 425 are connected to a voltage line 427 to which a desired voltage $V_{IH}$ exceeding the supply voltage Vcc is applied and a voltage line 428 to which a desired voltage $V_{IN}$ that is lower than the ground voltage Vss is applied.

The input terminal of the inverter 426 is connected to the terminal 424B of the connection switch element 424, and the output terminal thereof is connected to the output terminal 421. The power terminals of the inverter 426 are connected to the voltage line 427 and the voltage line 428 respectively.

Assuming that the high level of the input signal in is set to the supply voltage Vcc and the low level thereof is set to the ground voltage Vss, since $V_{IH}$ is equal to or larger than Vcc and $V_{IN}$ is equal to or smaller than Vss, the level change circuit based on the sixth mode of the present invention operates, for example, according to the truth table of Table 4.

TABLE 4

| Truth table for the operations of the circuit in FIG. 52 | | | | | |
|---|---|---|---|---|---|
| Connection Switch element 47 | Off | Off | On | On | Off |
| Connection Switch element 48 | On | On | Off | Off | Off |
| Input signal in | Vss | Vcc | Vss | Vcc | X |
| Output signal S1 | $V_{IH}$ | $V_{IN}$ | $V_{IN}$ | $V_{IH}$ | Latch |
| Output signal S2 | $V_{IN}$ | $V_{IH}$ | $V_{IH}$ | $V_{IN}$ | Latch |

The voltages $V_{IH}$ and $V_{IN}$ are set to desired values within the range where $V_{IH}$ is equal to or larger than Vcc and $V_{IN}$ is equal to or smaller than Vss. The on or off states of the connection switch elements 423 and 428 are controlled properly, whereby signals of desired voltages can be supplied within the range where $V_{IH}$ is equal to or larger than Vcc and $V_{IN}$ is equal to or smaller than Vss. Moreover, a mode in which a level change is not performed can also be set up.

In particular, when the switch elements 423 and 428 are turned off, a current state can be latched. After the connection switch elements 423 and 428 are turned off to latch a current state, the voltages $V_{IH}$ and $V_{IN}$ may be varied to provide outputs of desired voltages.

The level change circuit according to the present invention can be composed of two connection switch elements 423 and 428, and two inverters 425 and 426. The employment of this level change circuit for a flash memory realizes reduction of a chip area.

Referring to FIGS. 53 to 61, the particular circuitry and operations of a level change circuit of the fifteenth embodiment will be described in that order.

Figure 53:
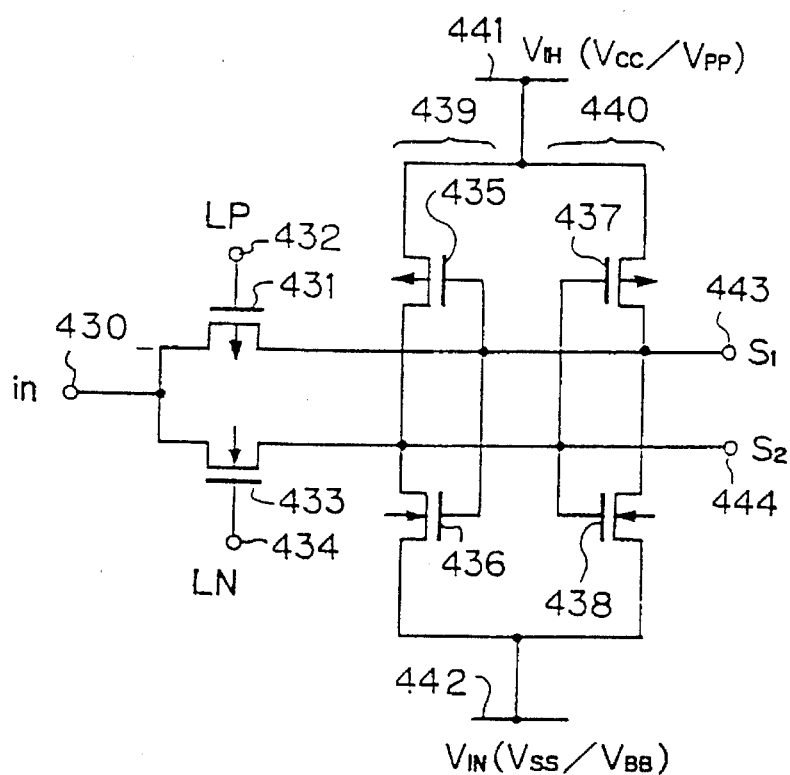
FIG. 53 is a circuit diagram showing a level change circuit in the fifteenth embodiment.

FIG. 53 shows circuitry of a level change circuit in the fifteenth embodiment. Reference numeral 430 denotes an input terminal for inputting an input signal in; 431 denotes a pMOS transistor serving as a connection switch element; and 432 denotes a control signal input terminal for inputting a control signal LP that controls the on or off operation of the pMOS transistor 431.

Reference numeral 433 denotes an nMOS transistor serving as a connection switch element; and 434 denotes a control signal input terminal for inputting a control signal LN that controls the on or off operation of the nMOS transistor 433.

Reference numerals 439 and 440 denote inverters; 435 and 437 denote pMOS transistors; and 436 and 438 denote nMOS transistors. The input terminal of the inverter 439 is connected to the output terminal of the inverter 440. The output terminal of the inverter 439 is connected to the input terminal of the inverter 440.

Reference numeral 441 denotes a V1 voltage line on which a positive voltage Vcc or high voltage Vpp is applied as a voltage $V_{IH}$; 442 denotes a V2 voltage line on which a zero voltage Vss or a negative voltage $V_{BB}$ is applied as a voltage $V_{IN}$; and 443 denotes an output terminal for outputting an output signal S1. 444 denotes an output terminal for outputting an output signal S2.

The voltage $V_{IH}$ is applied to the substrates (wells) of the pMOS transistors 431, 435, and 437. The voltage $V_{IN}$ is applied to the substrates (wells) of the nMOS transistors 433, 436, and 438.

Next, the operations of the circuit shown in FIG. 53 will be described.

Table 5 is a truth table showing the operations of the level change circuit. FIGS. 54 to 61 are circuit diagrams showing the operations of the level change circuit.

TABLE 5

Truth table for the operations of the circuit in FIG. 53

|  | $V_{IH}$ | $V_{IN}$ | LP | LN | in | S1 | S2 |
|---|---|---|---|---|---|---|---|
| Non-change mode | Vcc | Vss | Vcc | Vcc | L(Vss) | H(Vcc) | L(Vss) |
|  |  |  |  |  | H(Vcc) | L(Vss) | H(Vcc) |
| Reverse mode | Vcc | Vss | Vss | Vss | L(Vss) | L(Vcc) | H(Vcc) |
|  |  |  |  |  | H(Vcc) | H(Vcc) | L(Vss) |
| High-Voltage Change mode | Vpp | Vss | Vpp | Vcc | L(Vss) | Vpp | Vss |
|  |  |  |  |  | H(Vcc) | Vss | Vpp |
| Negative-voltage change mode | Vcc | $V_{BB}$ | Vss | $V_{BB}$ | L(VSS) | $V_{BB}$ | Vcc |
|  |  |  |  |  | H(Vcc) | Vcc | $V_{BB}$ |
| Latch mode | Vcc or Vpp | Vss or $V_{BB}$ | $V_{IH}$ | $V_{IN}$ | X | Latch | Latch |

Figure 54:
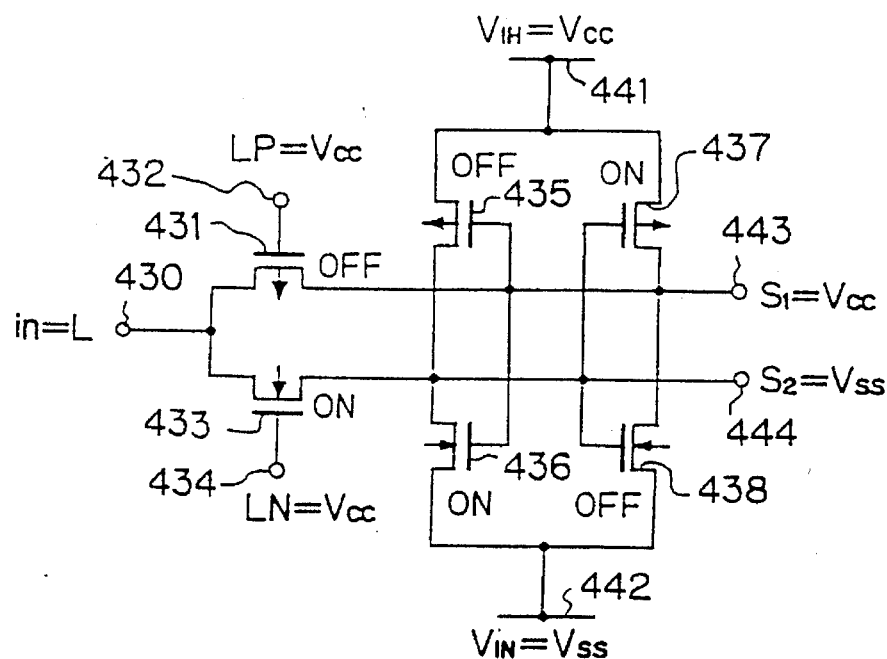
FIG. 54 is a circuit diagram showing an operation (no-change mode) of the level change circuit in FIG. 53.

The level change circuit permits a non-change mode, a reverse mode, a high-voltage change mode, a negative-voltage change mode, and a latch mode. First of all, in the non-change mode, as shown in FIG. 54, the voltage $V_{IH}$ is Vcc, the voltage $V_{IN}$ is Vss, the control signal LP is Vcc, the pMOS transistor 431 is off, and the nMOS transistor 433 is on.

If the input signal in is low, the pMOS transistor 437 is on, the nMOS transistor 438 is off, the pMOS transistor 435 is off, the nMOS transistor 436 is on, the output signal S1 is Vcc, and the output signal S2 is Vss.

Figure 55:
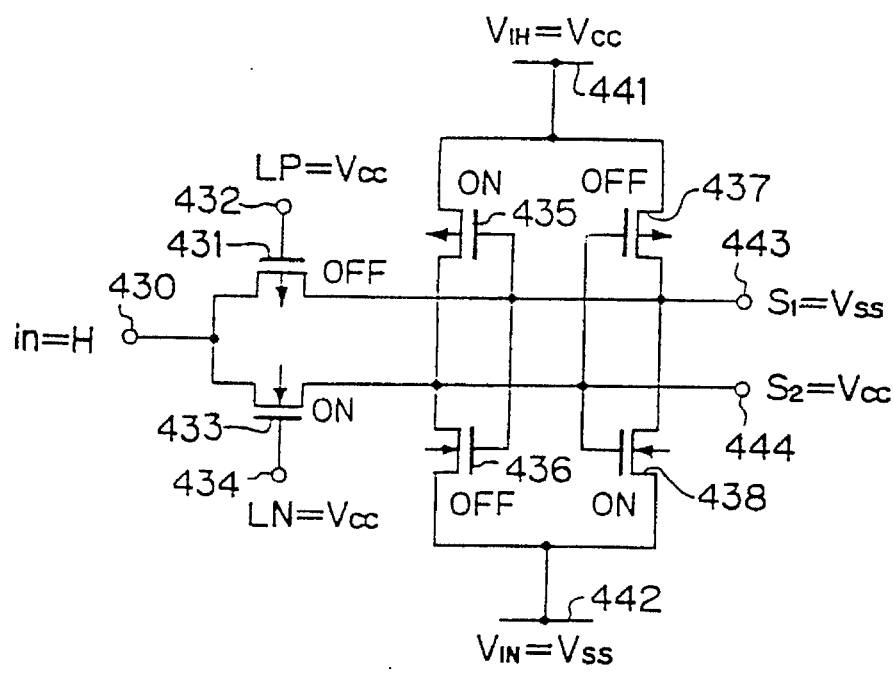
FIG. 55 is a circuit diagram showing an operation (no-change mode) of the level change circuit in FIG. 53.

In contrast, if the input signal in is high, as shown in FIG. 55, the pMOS transistor 437 is off, the nMOS transistor 438 is on, the pMOS transistor 435 is on, the nMOS transistor 436 is off, the output signal S1 is Vss, and the output signal S2 is Vcc.

Figure 56:
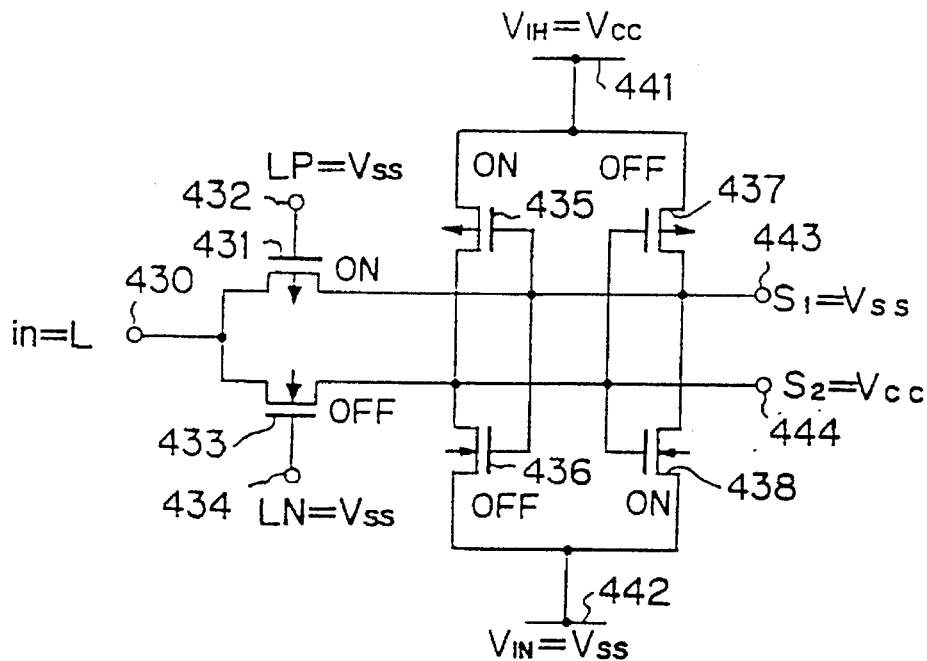
FIG. 56 is a circuit diagram showing an operation (reverse mode) of the level change circuit in FIG. 53.

In the reverse mode, as shown in FIG. 56, the voltage $V_{IH}$ is Vcc, the voltage $V_{IN}$ is Vss, the control signal LP is Vss, the the control signal LN is Vss, the pMOS transistor 431 is on, and the nMOS transistor 433 is off.

If the input signal in is low, the pMOS transistor 435 is on, the nMOS transistor 436 is off, the pMOS transistor 437 is off, the nMOS transistor 436 is off, the output signal S1 is Vss, and the output signal S2 is Vcc.

Figure 57:
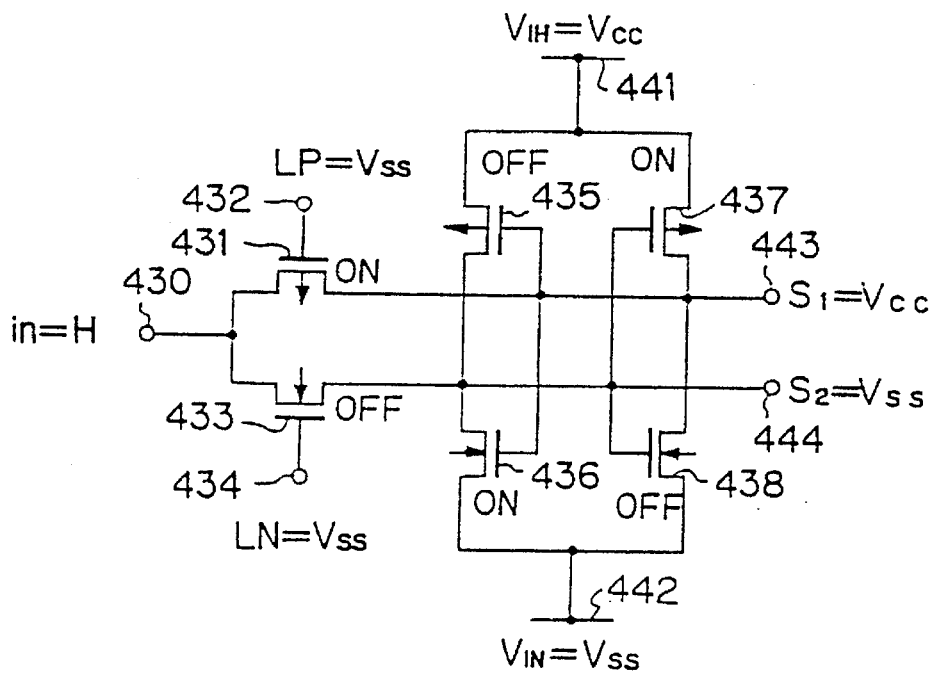
FIG. 57 is a circuit diagram showing an operation (reverse mode) of the level change circuit in FIG. 53.

In contrast, if the input signal in is high, as shown in FIG. 57, the pMOS transistor 435 is off, the nMOS transistor 436 is on, the pMOS transistor 437 is on, the nMOS transistor 438 is off, the output signal S1 is Vcc, and the output signal S2 is Vss.

Figure 58:
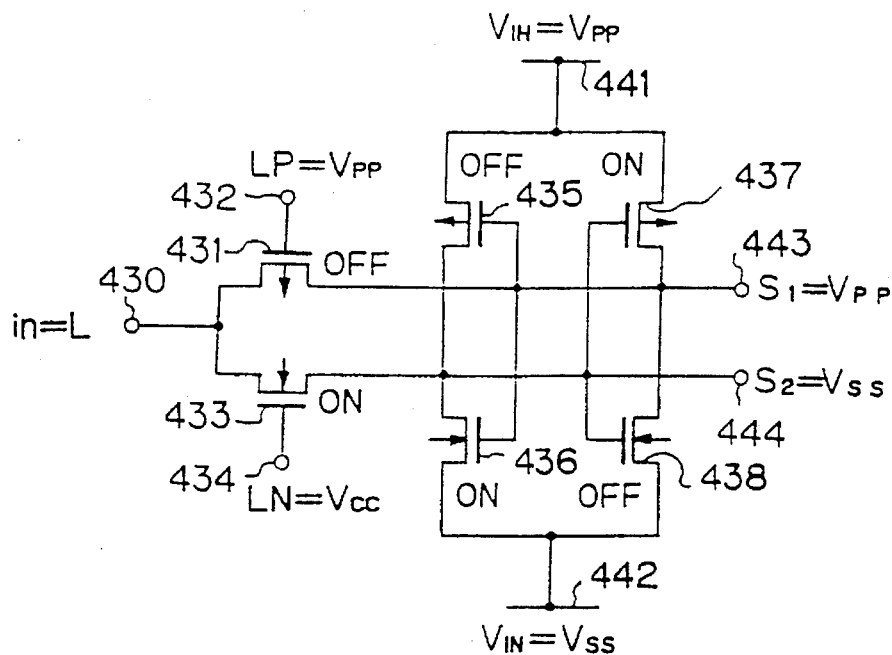
FIG. 58 is a circuit diagram showing an operation (high-voltage change mode) of the level change circuit in FIG. 53.

In the high-voltage change mode, as shown in FIG. 58, the voltage $V_{IH}$ is Vpp, the voltage $V_{IN}$ is Vss, the control signal LP is Vpp, the control signal LN is Vcc, the pMOS transistor 431 is off, and the nMOS transistor 433 is on.

If the input signal in is low, the pMOS transistor 437 is on, the nMOS transistor 438 is off, the pMOS transistor 435 is off, the nMOS transistor 436 is on, the output signal S1 is Vpp, and the output signal S2 is Vss.

Since the control signal LP is Vpp, the pMOS transistor 431 is not turned on. Current will therefore not flow back from the output terminal of the inverter 440 to the input terminal 430.

Figure 59:
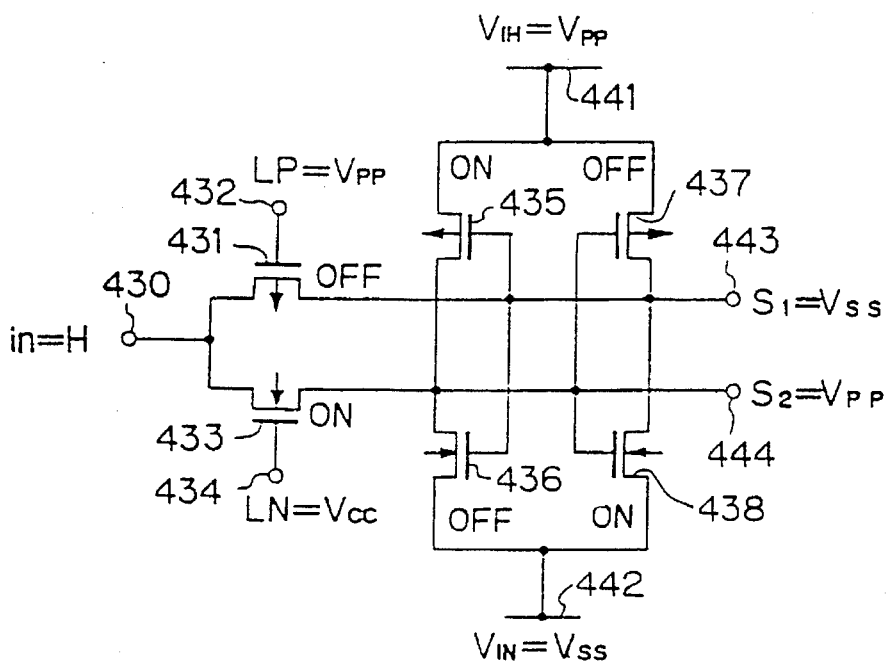
FIG. 59 is a circuit diagram showing an operation (high-voltage change mode) of the level change circuit in FIG. 53.

In contrast, if the input signal in is high, as shown in FIG. 59, the pMOS transistor 437 is off, the nMOS transistor 438 is on, the pMOS transistor 435 is on, the nMOS transistor 436 is off, the output signal S1 is Vss, and the output signal S2 is Vpp. In this case, since the control signal LN is Vcc, the voltage Vpp of the output signal S2 will not be applied to the input terminal 430.

Figure 60:
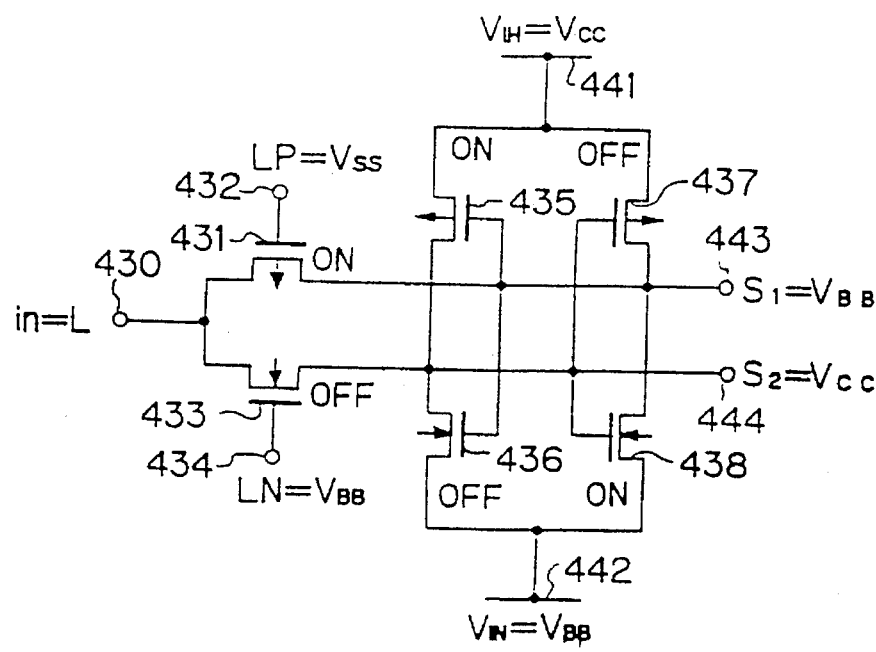
FIG. 60 is a circuit diagram showing an operation (negative-voltage change mode) of the level change circuit in FIG. 53.

In the negative-voltage change mode, as shown in FIG. 60, the voltage $V_{IH}$ is Vcc, the voltage $V_{IN}$ is $V_{BB}$, the control signal LP is Vss, the the control signal LN is $V_{BB}$, the pMOS transistor 431 is on, and the nMOS transistor 433 is off.

If the input signal in is low, the pMOS transistor 435 is on, the nMOS transistor 436 is off, the pMOS transistor 437 is off, the nMOS transistor 438 is on, the output signal S1 is $V_{BB}$, and the output signal S2 is Vcc.

Figure 61:
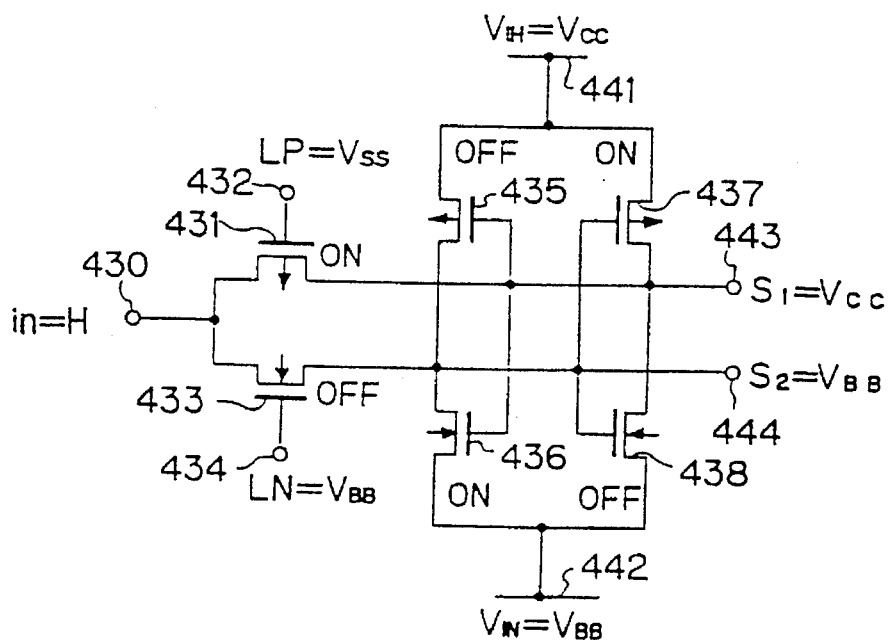
FIG. 61 is a circuit diagram showing an operation (negative-voltage change mode) of the level change circuit in FIG. 53.

In contrast, if the input signal in is high, as shown in FIG. 61, the pMOS transistor 435 is off, the nMOS transistor 436 is on, the pMOS transistor 437 is on, the nMOS transistor 438 is off, the output signal S1 is Vcc, and the output signal S2 is $V_{BB}$.

In this case, since the control signal LN is $V_{BB}$, the nMOS transistor 433 is not turned on. Current will therefore not flow back from the input terminal 430 to the output terminal 444. Moreover, since the control signal LP is Vss, current will not flow back due to the potential difference between the input terminal 430 and output terminal 443.

When the voltage $V_{IH}$ is Vcc or Vpp, the voltage $V_{IN}$ is Vss or $V_{BB}$, the control signal LP is V1, and the control signal LN is V2, if the pMOS transistor 431 is turned off and the nMOS transistor is turned off, a current state can thus be latched.

After the pMOS transistor 431 is turned off and the nMOS transistor is turned off to latch a current state, if the voltage V1 or V2 is fluctuated, the voltage of the output signal S1 or S2 can be varied.

As mentioned above, the level change circuit in FIG. 53 can be composed of three pMOS transistors 431, 435, and 437 and three nMOS transistors 433, 436, and 438. The number of transistors required is limited. When this level change circuit is employed for a flash memory that requires a level change circuit, a reduction in a chip area can be realized.

The level change circuit in the fifteenth embodiment has a logic reverse function and can be used as a drive unit in a row decoder.

When the level change circuit in FIG. 53 is used as the drive unit 274 in FIG. 42, the high-voltage supply unit 279 and negative-voltage supply unit 280 apply supply voltage directly to the power input terminals $V_{IH}$ and $V_{IN}$. The drive unit power switching circuit 278 thus becomes unnecessary.

Figure 62:
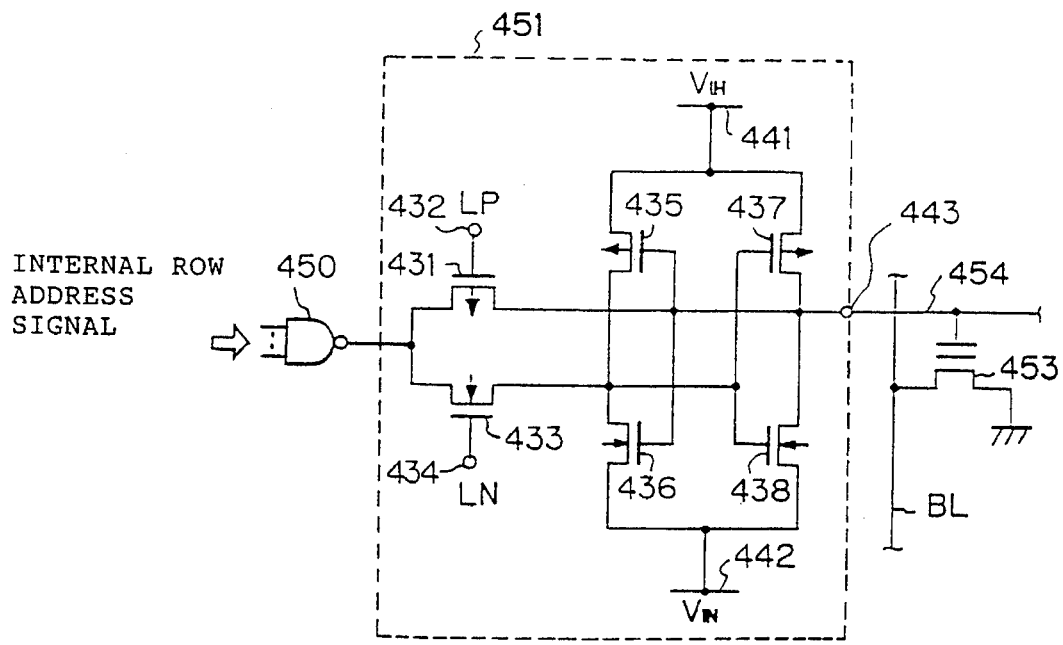
FIG. 62 is a circuit diagram showing circuitry for employing the level change circuit in FIG. 53 for a row decoder in a flash memory.

FIG. 62 shows circuitry of the level change circuit of the fifteenth embodiment employed for a row decoder in a flash memory. Components identical to those in FIG. 53 bear the same reference numerals.

In FIG. 62, reference numeral 450 denotes a NAND circuit for decoding an internal row address signal fetched from a row address buffer (not shown); 451 denotes a level change circuit for changing the level of the output of the NAND circuit 450; 454 denotes a word line WL; and 455 denotes a bit line BL. In this example, the word line WL is connected to an output terminal 443 of the level change circuit 451.

Table 6 is a truth table showing the operations of the row decoder. FIGS. 63 to 68 are circuit diagrams showing the operations of the row decoder.

TABLE 6

Truth table for the circuit in FIG. 62

|  | $V_{IH}$ | $V_{IN}$ | LP | LN | Output of the NAND circuit "450" | Word line WL |
|---|---|---|---|---|---|---|
| Reading | Vcc | Vss | Vcc | Vcc | L(Vss) | H(Vcc) |
|  |  |  |  |  | H(Vcc) | L(Vss) |
| Writing | Vpp | Vss | Vpp | Vcc | L(Vss) | Vpp |
|  |  |  |  |  | H(Vcc) | Vss |
| Erasing | Vcc | $V_{BB}$ | Vss | $V_{BB}$ | L(Vss) | $V_{BB}$ |
|  |  |  |  |  | H(Vcc) | Vcc |
| Latch mode | Vcc or Vpp | Vss or $V_{BB}$ | $V_{IH}$ | $V_{IN}$ | X | Latch |

Figure 63:
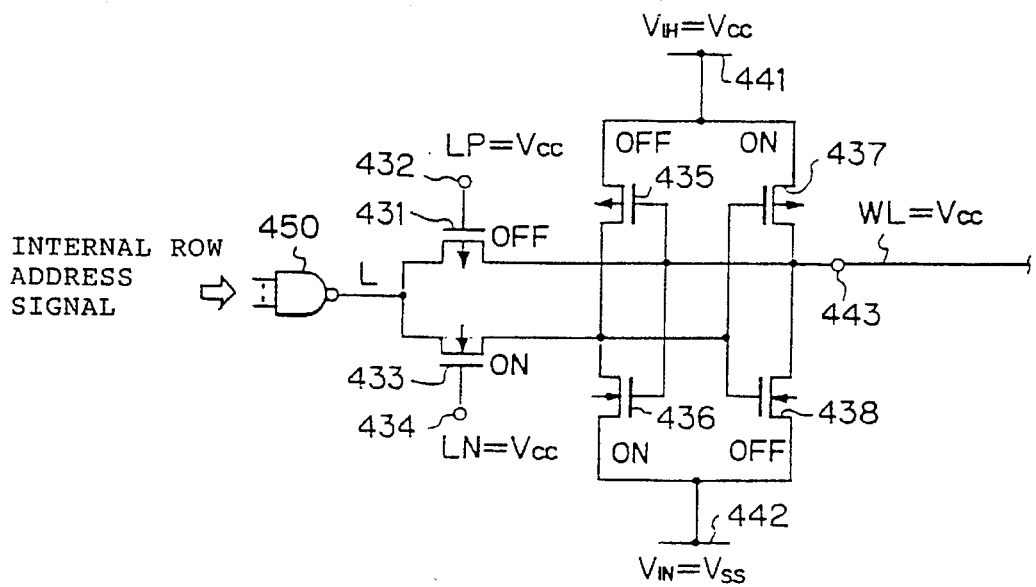
FIG. 63 is a circuit diagram showing an operation (selected mode during reading) of the row decoder in FIG. 62.

In this row decoder, for reading, as shown in FIG. 63, the voltage $V_{IH}$ is Vcc, the voltage $V_{IN}$ is Vss, the control signal LP is Vcc, and the control signal LN is Vcc. The pMOS transistor is turned off and the nMOS transistor is turned on.

When the row decoder is selected, the output of the NAND circuit 450 goes low. The pMOS transistor 437 is turned on, the nMOS transistor 438 is turned off, the pMOS transistor 435 is turned off, and the nMOS transistor 436 is turned on. The voltage at the output terminal 443 becomes Vcc which is then supplied to the word line WL.

Figure 64:
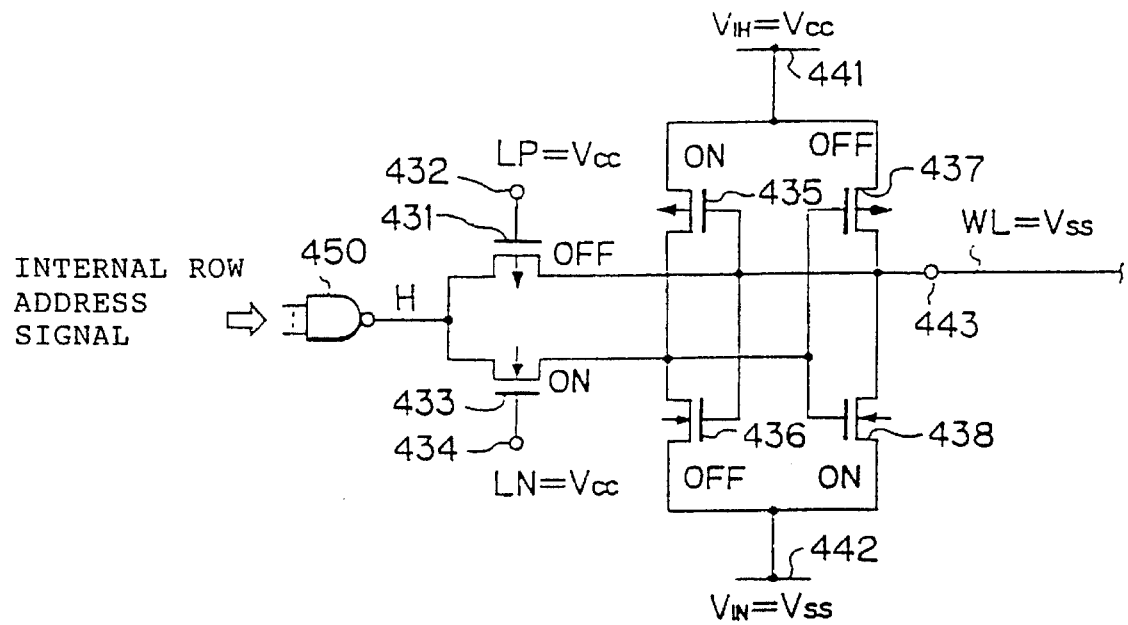
FIG. 64 is a circuit diagram showing an operation (unselected mode during reading) of the row decoder in FIG. 62.

In contrast, when the row decoder is unselected, as shown in FIG. 64, the output of the NAND circuit 450 goes high. The pMOS transistor 437 is turned off, the nMOS transistor 438 is turned on, the pMOS transistor 435 is turned on, and the nMOS transistor 436 is turned off. The voltage at the output terminal 443 becomes Vss which is then supplied to the word line WL.

Figure 65:
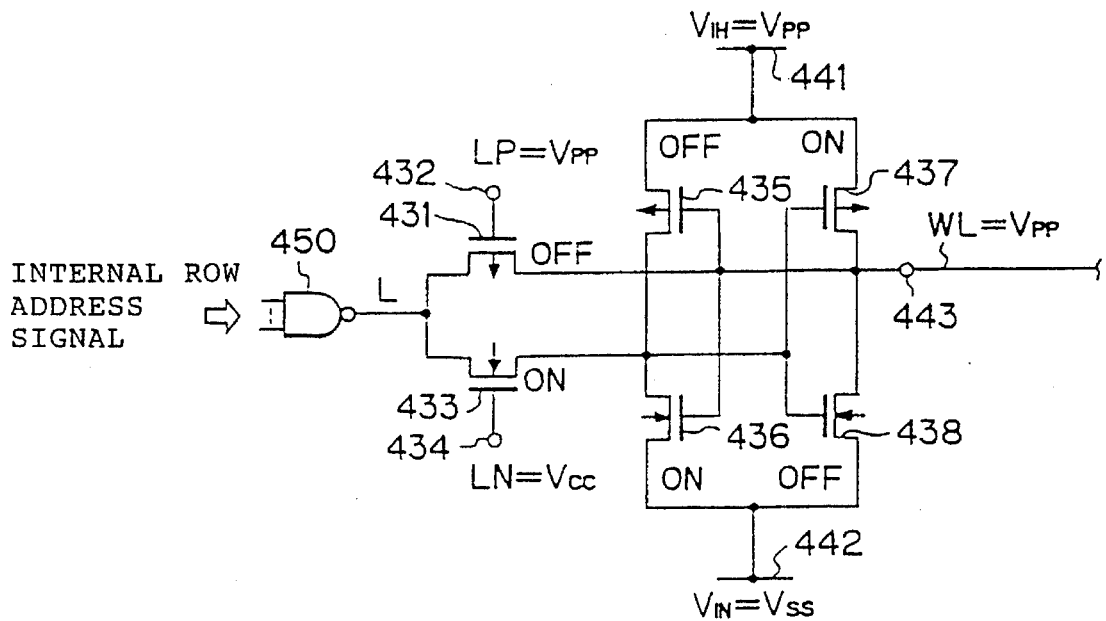
FIG. 65 is a circuit diagram showing an operation (selected mode during writing) of the row decoder in FIG. 62.

For writing, as shown in FIG. 65, the voltage $V_{IH}$ is Vpp, the voltage $V_{IN}$ is Vss, the control signal LP is Vpp, and the control signal LN is Vcc. The pMOS transistor is turned off and the nMOS transistor is turned on.

When the row decoder is selected, the output of the NAND circuit 450 goes low. The pMOS transistor 437 is turned on, the nMOS transistor 438 is turned off, the pMOS transistor 435 is turned off, and the nMOS transistor 436 is turned on. The voltage at the output terminal 443 becomes Vpp which is then supplied to the word line WL.

In this case, since the control signal LP is Vpp, the pMOS transistor 431 is not turned on. Current will therefore not flow back from the output terminal of the inverter 440 to the NAND circuit 450.

Figure 66:
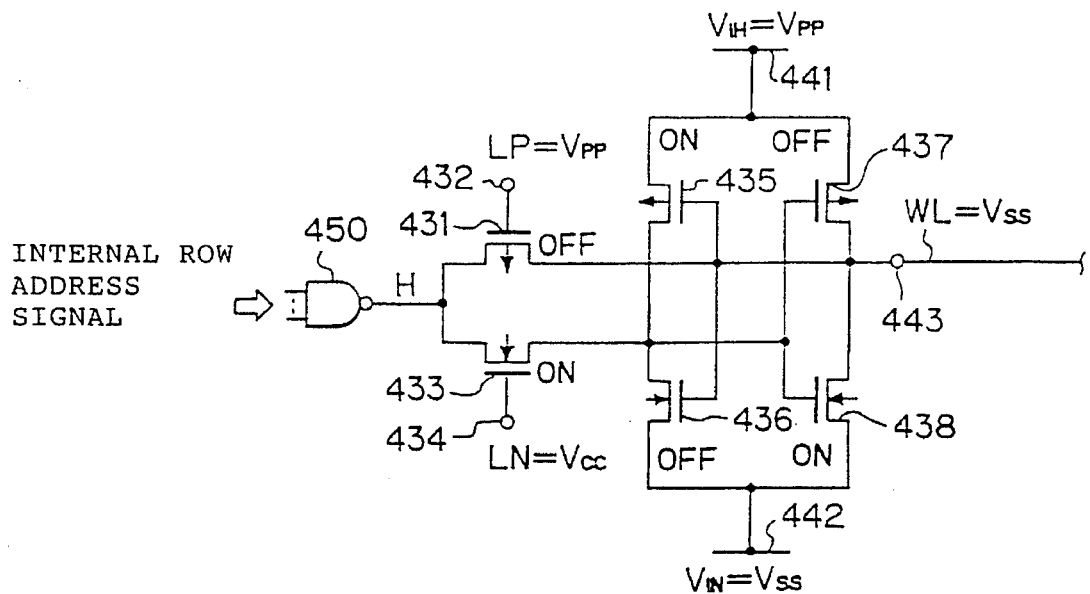
FIG. 66 is a circuit diagram showing an operation (unselected mode during writing) of the row decoder in FIG. 62.

In contrast, when the row decoder is unselected, as shown in FIG. 66, the output of the NAND circuit 450 goes high. The pMOS transistor 437 is turned off, the nMOS transistor 438 is turned on, the pMOS transistor 435 is turned on, and the nMOS transistor 436 is turned off. The voltage at the output terminal 443 becomes Vss which is then supplied to the word line WL.

Figure 67:
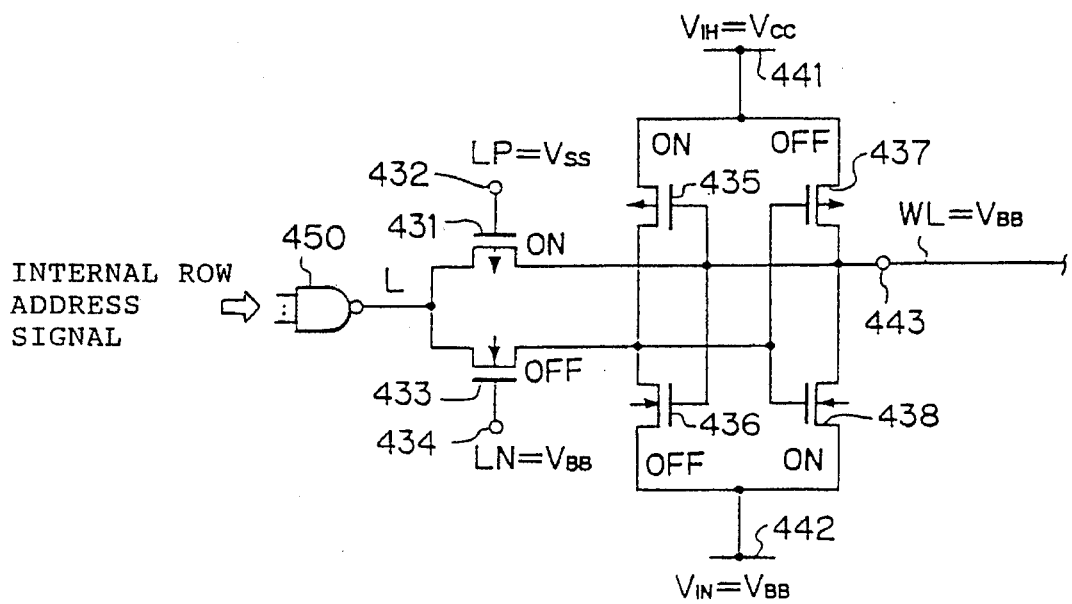
FIG. 67 is a circuit diagram showing an operation (selected mode during erasing) of the row decoder in FIG. 62.

For writing, as shown in FIG. 67, the voltage $V_{IH}$ is Vcc, the voltage $V_{IN}$ is Vss, the control signal LP is Vss, and the control signal LN is $V_{BB}$. The pMOS transistor is turned on and the nMOS transistor is turned off.

When the row decoder is selected, the output of the NAND circuit 450 goes low. The pMOS transistor 435 is turned on, the nMOS transistor 436 is turned off, the pMOS transistor 437 is turned off, and the nMOS transistor 438 is turned on. The voltage at the output terminal 443 becomes $V_{BB}$ which is then supplied to the word line WL.

Figure 68:
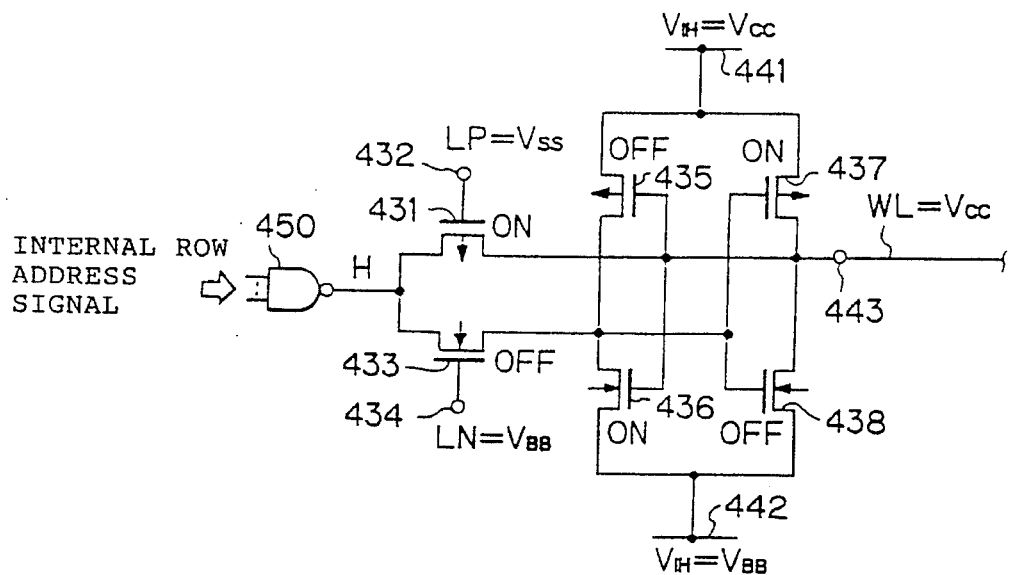
FIG. 68 is a circuit diagram showing an operation (unselected mode during erasing) of the row decoder in FIG. 62.

In contrast, when the row decoder is unselected, as shown in FIG. 68, the output of the NAND circuit 450 goes high. The pMOS transistor 435 is turned off, the nMOS transistor 436 is turned on, the pMOS transistor 437 is turned on, and the nMOS transistor 438 is turned off. The voltage at the output terminal 443 becomes Vcc which is then supplied to the word line WL.

As mentioned above, according to this row decoder, the positive voltage Vcc, zero (ground) voltage Vss, high voltage Vpp, or negative voltage $V_{BB}$ can be supplied to the word line W1 when needed.

When the voltage $V_{IH}$ is Vcc or Vpp, the voltage is Vss or $V_{BB}$, the control signal LP is $V_{IH}$, and the control signal LN is $V_{IN}$, the pMOS transistor 431 is turned off and the nMOS transistor 433 is turned off. A current state can then be latched.

After a current state is latched by turning off the pMOS transistor 431 and the nMOS transistor 433, when the voltage $V_{IH}$ or $V_{IN}$ fluctuates, the voltage to be applied to the word line WL can be varied.

As mentioned above, when the level change circuit shown in FIG. 53 is employed for a row decoder in a flash memory, since the level change circuit 451 in the row decoder is composed of three pMOS transistors 431, 435 and 437 and three nMOS transistors 433, 436 and 438, the area occupied by row decoders can be limited to realize reduction in a chip area.

As mentioned above, the level change circuit of the fifteenth embodiment shown in FIG. 53 can be used as is as a drive unit in a row decoder. An output of a second inverter drives a word line. In the sixteenth and seventeenth embodiments, since a word line has a large load, the word line is not driven directly by the inverter is but driven by a driver dedicated to driving a word line.

Figure 69:
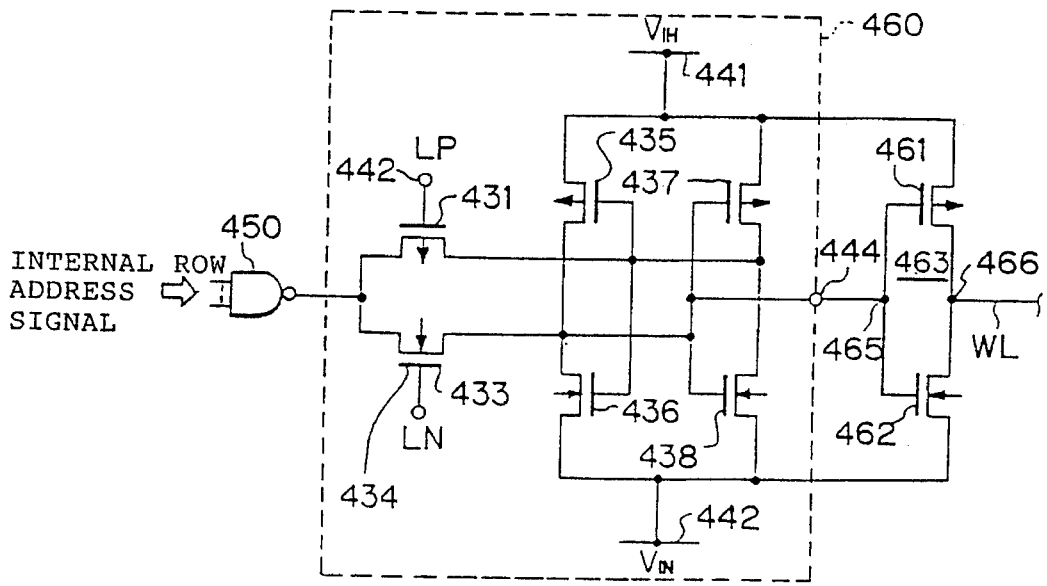
FIG. 69 is a circuit diagram showing a major section (row decoder) of a flash memory in the sixteenth embodiment.

FIG. 69 is a circuit diagram showing a major portion of a flash memory in the sixteenth embodiment; that is, one row decoder. Components identical to those in FIGS. 53 and 62 bear the same reference numerals.

In FIG. 69, reference numeral 460 denotes a level change circuit for changing the level of an output of the NAND circuit 450. The level change circuit 460 is based on an embodiment of the level change circuit in FIG. 53.

Reference numeral 461 denotes a pMOS transistor; and 462 denotes an nMOS transistor. The pMOS transistor 461 and nMOS transistor 462 constitute an inverter 463 serving as a word line driver.

The source of the pMOS transistor 461 is connected to a $V_{IH}$ voltage line 441. The source of the nMOS transistor 462 is connected to a $V_{IN}$ voltage line 442. The gates of the pMOS transistor 461 and nMOS transistor 462 are connected to the output terminal 444 of the level change circuit 460 at a contact point 465 thereof. The drains of the pMOS transistor 461 and nMOS transistor 462 are connected to the word line WL at a contact point 466 thereof. The output of a first inverter is input to the inverter 463 serving as a word line driver.

The truth table for the operations of the row decoder is the same as the one in Table 6. In this row decoder, the positive voltage Vcc, zero voltage Vss, high voltage Vpp, or negative voltage $V_{BB}$ can be applied to the word line WL when needed. Latching can also be done.

According to the flash memory in the sixteenth embodiment, the level change circuit 460 is composed of three pMOS transistors 431, 435, and 437 and three nMOS transistors 433, 436, and 438. Even the flash memory includes word line drivers, and since the area occupied by row decoders is limited, chip area can be reduced.

Figure 70:
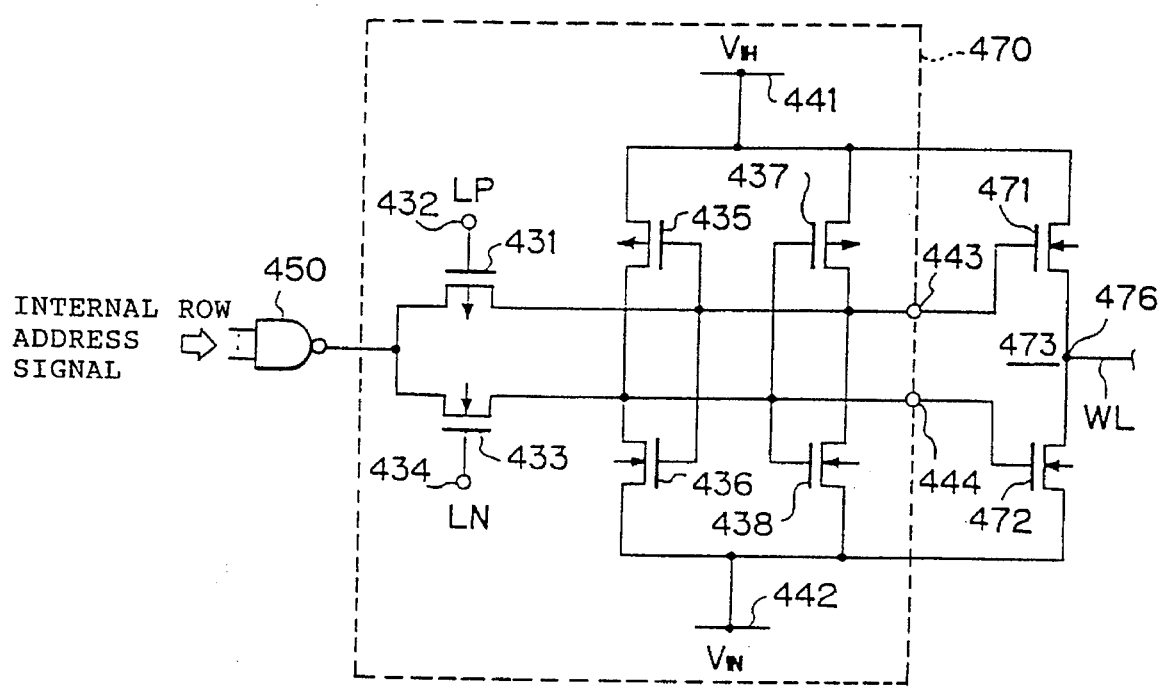
FIG. 70 is a circuit diagram showing a major section (row decoder) of a flash memory in the seventeenth embodiment.

FIG. 70 is a circuit diagram showing a major portion of a flash memory in the seventeenth embodiment; that is, one row decoder. Components identical to those in FIGS. 53 and 62 bear the same reference numerals.

In FIG. 70, reference numeral 470 denotes a level change circuit for changing the level of the output of the NAND circuit. The level change circuit 470 is based on an embodiment of the level change circuit according to the present invention in FIG. 53.

Reference numerals 471 and 472 denote nMOS transistors, constituting a push-pull circuit 473 serving as a word line drive circuit.

In this example, the drain of the nMOS transistor 471 is connected to the $V_{IH}$ voltage line 441. The source of the nMOS transistor 472 is connected to the $V_{IN}$ voltage line 442. The gate of the nMOS transistor 471 is connected to the output terminal 443 of the level change circuit 470. The gate of the nMOS transistor 472 is connected to the output terminal 444 of the level change circuit 470. The source of the nMOS transistor 471 and the drain of the nMOS transistor 472 are connected to the word line WL at a contact point 476 thereof.

The truth table showing the operations of the row decoder is the same as the one in Table 4. In this row decoder, the supply voltage Vcc, zero (ground) voltage Vss, high voltage Vpp, or negative voltage $V_{BB}$ can be applied to the word line WL when needed. Latching can also be done.

According to the flash memory in the seventeenth embodiment, the level change circuit 470 is composed of three pMOS transistors 431, 435 and 437 and three nMOS transistors 433, 436 and 438. Even in a flash memory including word line drivers, the area occupied by row decoders can be limited and the chip area can be reduced.

Figure 71:
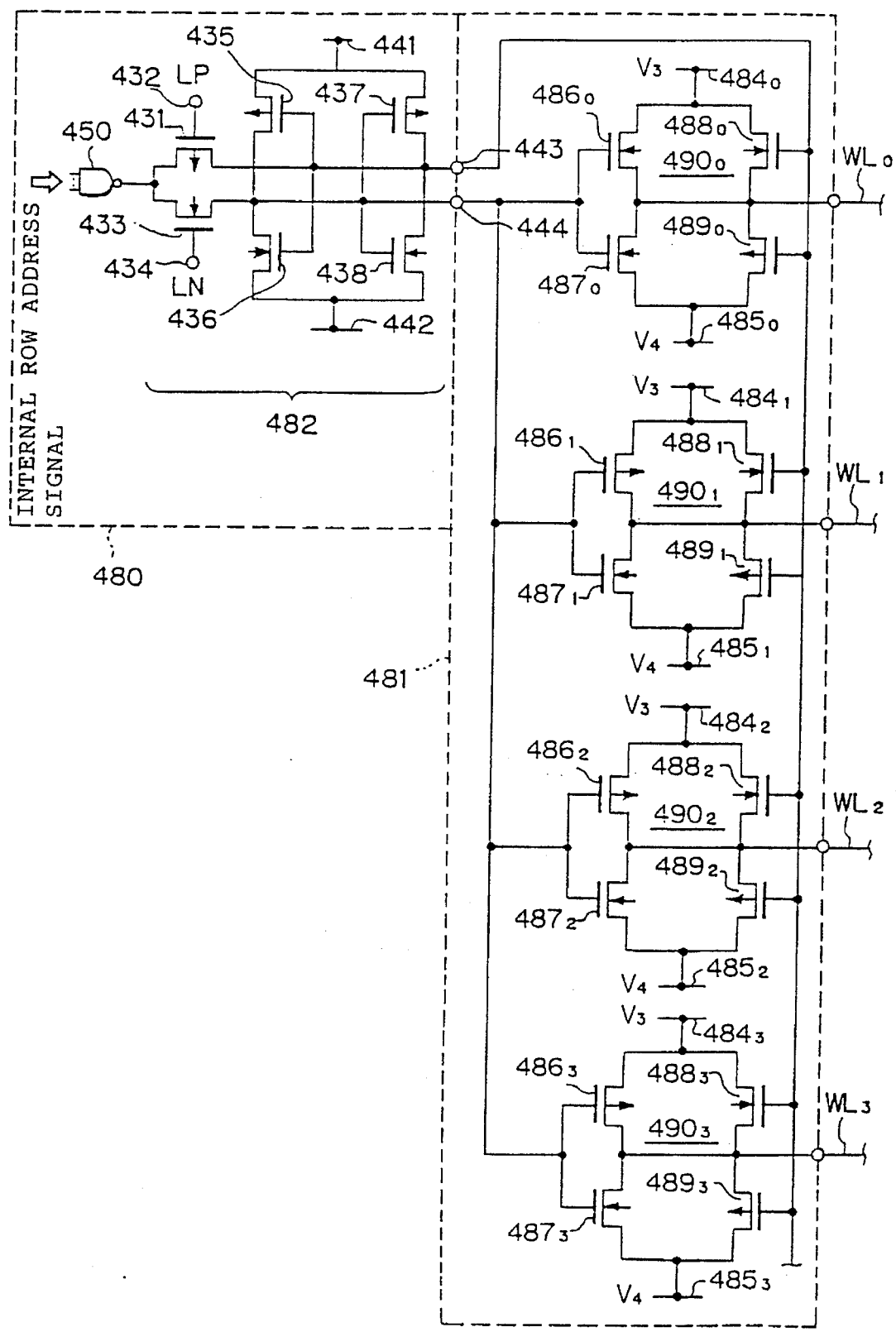
FIG. 71 is a circuit diagram showing a major section (row decoder) of a flash memory in the eighteenth embodiment.

FIG. 71 is a circuit diagram showing a major portion of a flash memory in the eighteenth embodiment; that is, one row decoder. Components identical to those in FIGS. 53 and 62 bear the same reference numerals.

In this eighteenth embodiment, a row decoder comprises a main row decoder 480 and a sub-row decoder 481. Alphanumeric characters WL0 to Wl3 denote word lines.

In the main row decoder 480, reference numeral 482 denotes a level change circuit for changing the level of the output of the NAND circuit 450. The level change circuit 482 is based on an embodiment of the level change circuit according to the present invention shown in FIG. 53.

In the sub-row decoder 481, reference numerals $490_0$ to $480_3$ denote word line drive circuits; $484_0$ to $484_3$ denote V3 voltage lines for carrying a positive voltage Vcc, high voltage Vpp, or ground voltage Vss; $485_0$ to $485_3$ denote V4 voltage lines for carrying a ground voltage Vss, negative voltage $V_{BB}$, or Supply voltage Vcc; $486_0$ to $486_3$, and $489_0$ to $489_3$ denote pMOS transistors; and $487_0$ to $487_3$ and $488_0$ to $488_3$ denote nMOS transistors. The output terminal 443 of the level change circuit 482 is connected to the gates of the pMOS transistors $489_0$ to $489_3$ and nMOS transistors $488_0$ to $488_3$. The output terminal 444 of the level change circuit 482 is connected to the gates of the pMOS transistors $486_0$ to $486_3$ and nMOS transistors $487_0$ to $487_3$. In this example, for reading, any of the V3 voltage lines $484_0$ to $484_3$ is set to Vcc, and the other V3 voltage lines are set to Vss. The voltage lines $485_0$ to $485_3$ are set to Vss.

For writing, any of the V3 voltage lines $484_0$ to $484_3$ is set to Vpp, and the other V3 voltage lines are set to Vss. The V4 voltage lines $485_0$ to $485_3$ are set to Vss.

For erasing, the V3 voltage lines $484_0$ to $484_3$ are set to Vcc. Any of the V4 voltage lines $485_0$ to $485_3$ is set to $V_{BB}$, and the other V4 voltage lines are set to Vcc.

Table 7 is a truth table showing the operations of the level change circuit 482. FIGS. 72 to 77 are circuit diagrams showing the operations of the row decoder.

TABLE 7

Truth table for the level change circuit in FIG. 71

| | $V_{IH}$ | $V_{IN}$ | LP | LN | Output of the NAND circuit 450 | Output terminal 443 | Output terminal 444 |
|---|---|---|---|---|---|---|---|
| Reading | Vcc | Vss | Vcc | Vcc | L(Vss) H(Vcc) | H(Vcc) L(Vss) | L(Vss) H(Vcc) |
| Writing | Vpp | Vss | Vpp | Vcc | L(Vss) H(Vcc) | Vpp Vss | Vss Vpp |
| Erasing | Vcc | $V_{BB}$ | Vss | $V_{BB}$ | L(Vss) H(Vcc) | $V_{BB}$ Vcc | Vcc $V_{BB}$ |
| Latch mode | Vcc or Vpp | Vss or $V_{BB}$ | $V_{IH}$ | $V_{IN}$ | X | Latch | Latch |

Figure 72:
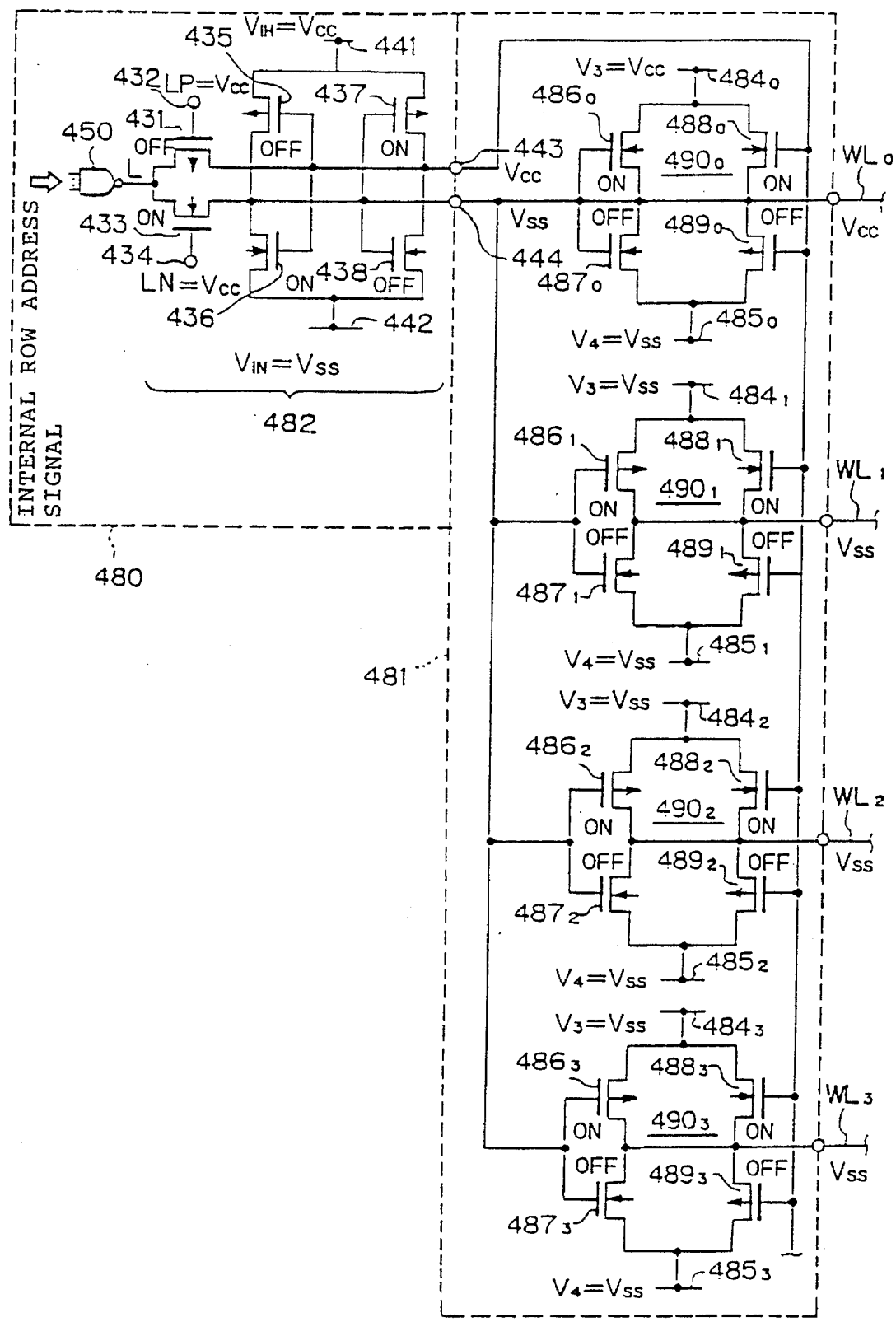
FIG. 72 is a circuit diagram showing an operation (selected mode during reading) of the row decoder in FIG. 71.

In this row decoder, for reading, as shown in FIG. 72, the voltage $V_{IH}$ is Vcc, the voltage $V_{IN}$ is Vss, the control signal LP is Vcc, and the control signal LN is Vcc. The pMOS transistor 431 is off, and the nMOS transistor 433 is on.

When the row decoder is selected, the output of the NAND circuit 450 goes low. The pMOS transistor 437 is turned on, the nMOS transistor 438 is turned off, the pMOS transistor 435 is turned off, and the nMOS transistor 436 is turned on. The voltage at the output terminal 433 is Vcc, and the voltage at the output terminal 444 is Vss.

As a result, the nMOS transistors $488_0$ to $488_3$ are turned on, the pMOS transistors $489_0$ to $489_3$ are turned off, the pMOS transistors $486_0$ to $486_3$ are turned on, and the nMOS transistors $487_0$ to $487_3$ are turned off.

For selecting the word line WL0, the V3 voltage line $484_0$ is set to Vcc, the V3 voltage lines $484_1$ to $484_3$ are set to Vss, and the V4 voltage lines $485_0$ to $485_3$ are set to Vss. As a result, the word line WL0 is set to Vcc, and the word lines WL1 to WL3 are set to Vss.

Figure 73:
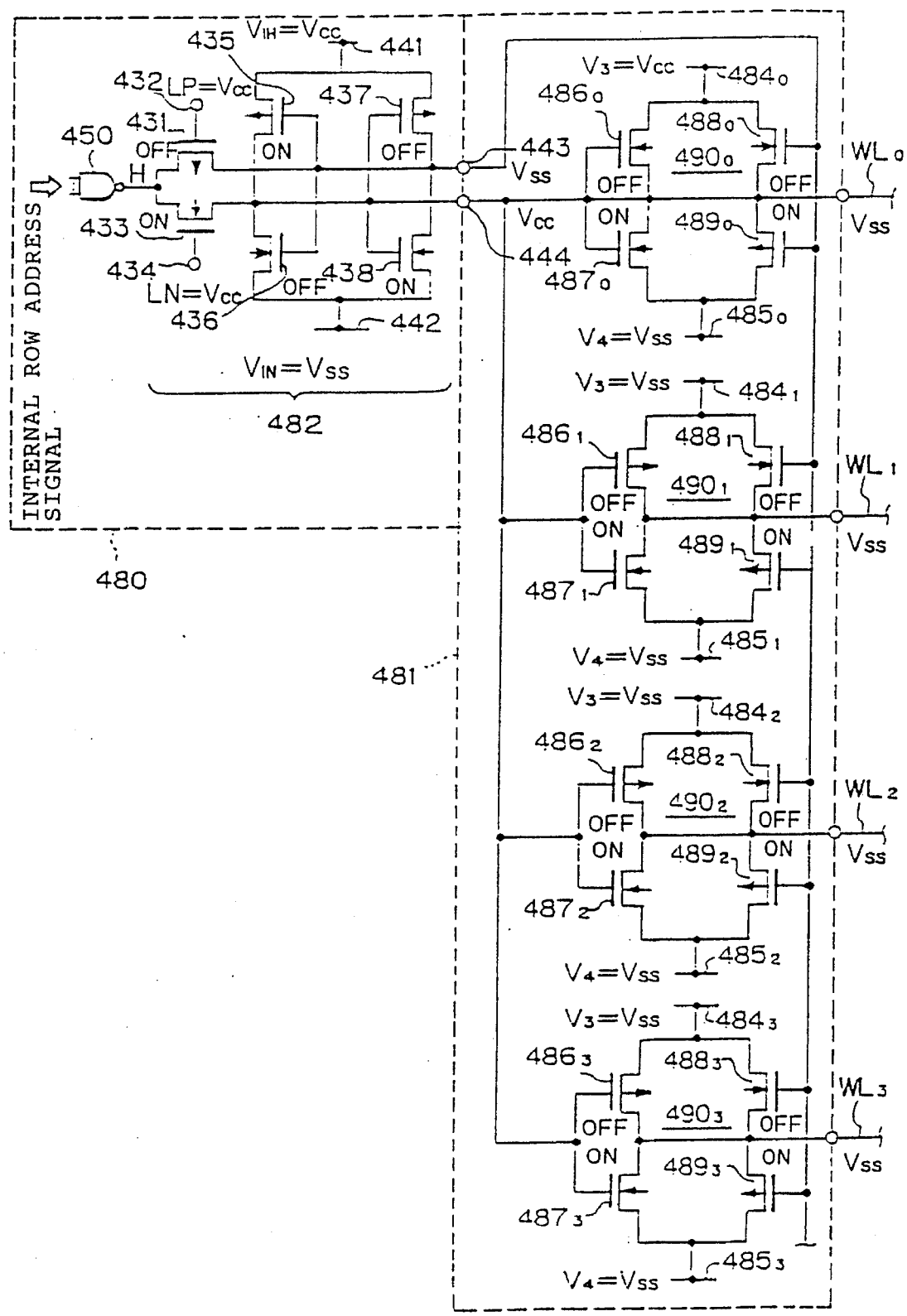
FIG. 73 is a circuit diagram showing an operation (unselected mode during reading) of the row decoder in FIG. 71.

In contrast, when the row decoder is unselected, as shown in FIG. 73, the output of the NAND circuit 450 goes high. The pMOS transistor 437 is turned off, the nMOS transistor 438 is turned on, the pMOS transistor 435 is turned on, and the nMOS transistor 436 is turned off. The voltage at the output terminal 433 is Vss, and the voltage at the output terminal 444 is Vcc.

As a result, the nMOS transistors $488_0$ to $488_3$ are turned off, the pMOS transistors $489_0$ to $489_3$ are turned on, the pMOS transistors $486_0$ to $486_3$ are turned off, and the nMOS transistors $487_0$ to $487_3$ are turned on.

Even when, for example, the V3 voltage line $484_0$ is set to Vcc, the V3 voltage lines $484_1$ to $484_3$ are set to Vss, and the V4 voltage lines $485_0$ to $485_3$ are set to Vss, the word lines WL0 to WL3 are set to Vss.

Figure 74:
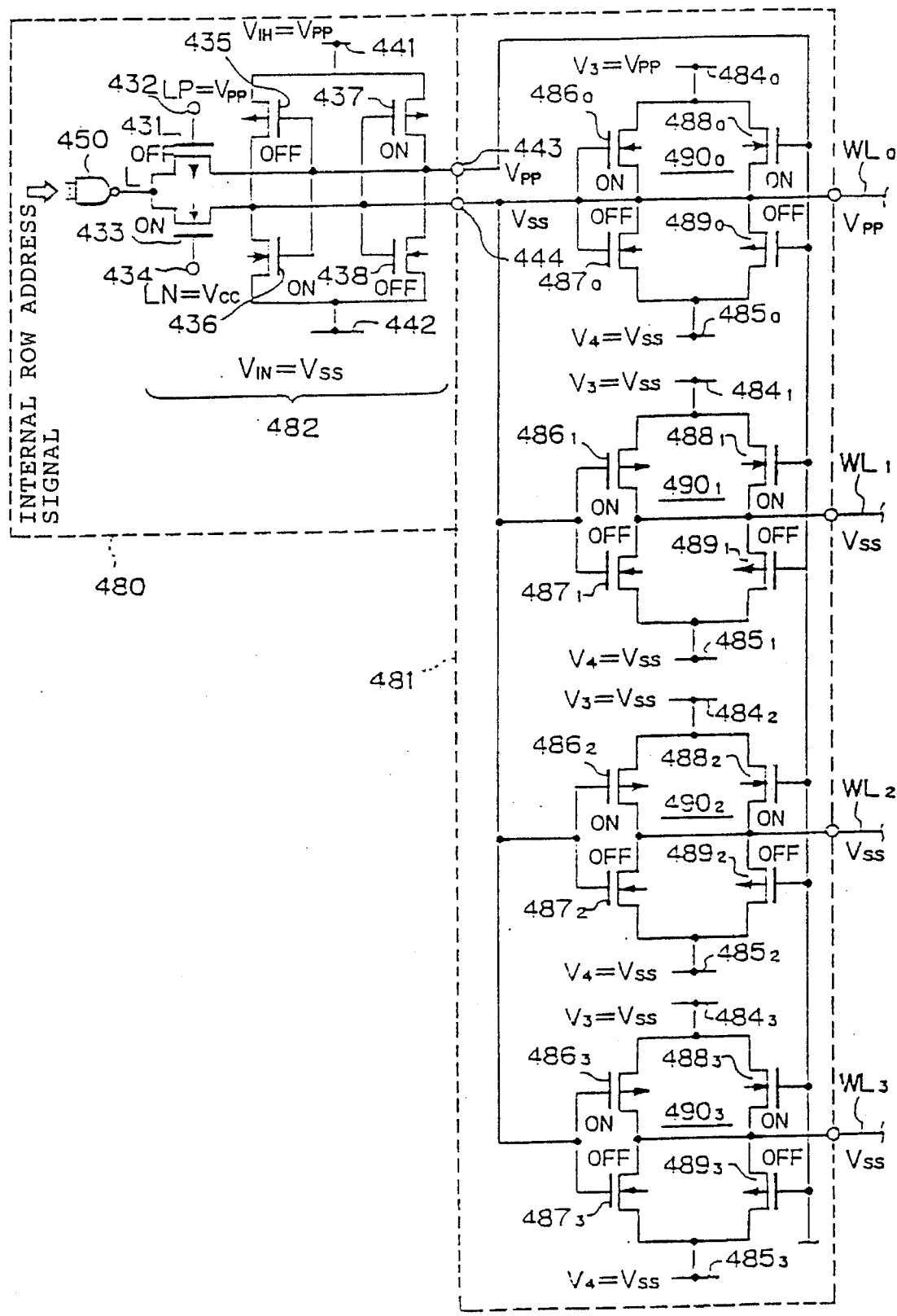
FIG. 74 is a circuit diagram showing an operation (selected mode during writing) of the row decoder in FIG. 71.

For writing, as shown in FIG. 74, the voltage $V_{IH}$ is Vpp, the voltage $V_{IN}$ is Vss, the control signal LP is Vpp, and the control signal LN is Vcc. The pMOS transistor 431 is off, and the nMOS transistor 433 is on.

When the row decoder is selected, the output of the NAND circuit 450 goes low. The pMOS transistor 437 is turned on, the nMOS transistor 438 is turned off, the pMOS transistor 435 is turned off, and the nMOS transistor 436 is turned on. The voltage at the output terminal 433 is Vpp, and the voltage at the output terminal 444 is Vss.

As a result, the nMOS transistors $488_0$ to $488_3$ are turned on, the pMOS transistors $489_0$ to $489_3$ are turned off, the pMOS transistors $486_0$ to $486_3$ are turned on, and the nMOS transistors $487_0$ to $487_3$ are turned off.

For selecting the word line WL0, the V3 voltage line $484_0$ is set to Vpp, the V3 voltage lines $484_1$ to $484_3$ are set to Vss, and the V4 voltage lines $485_0$ to $485_3$ are set to Vss. As a result, the word line WL0 is set to Vpp, and the word lines WL1 to WL3 are set to Vss.

Figure 75:
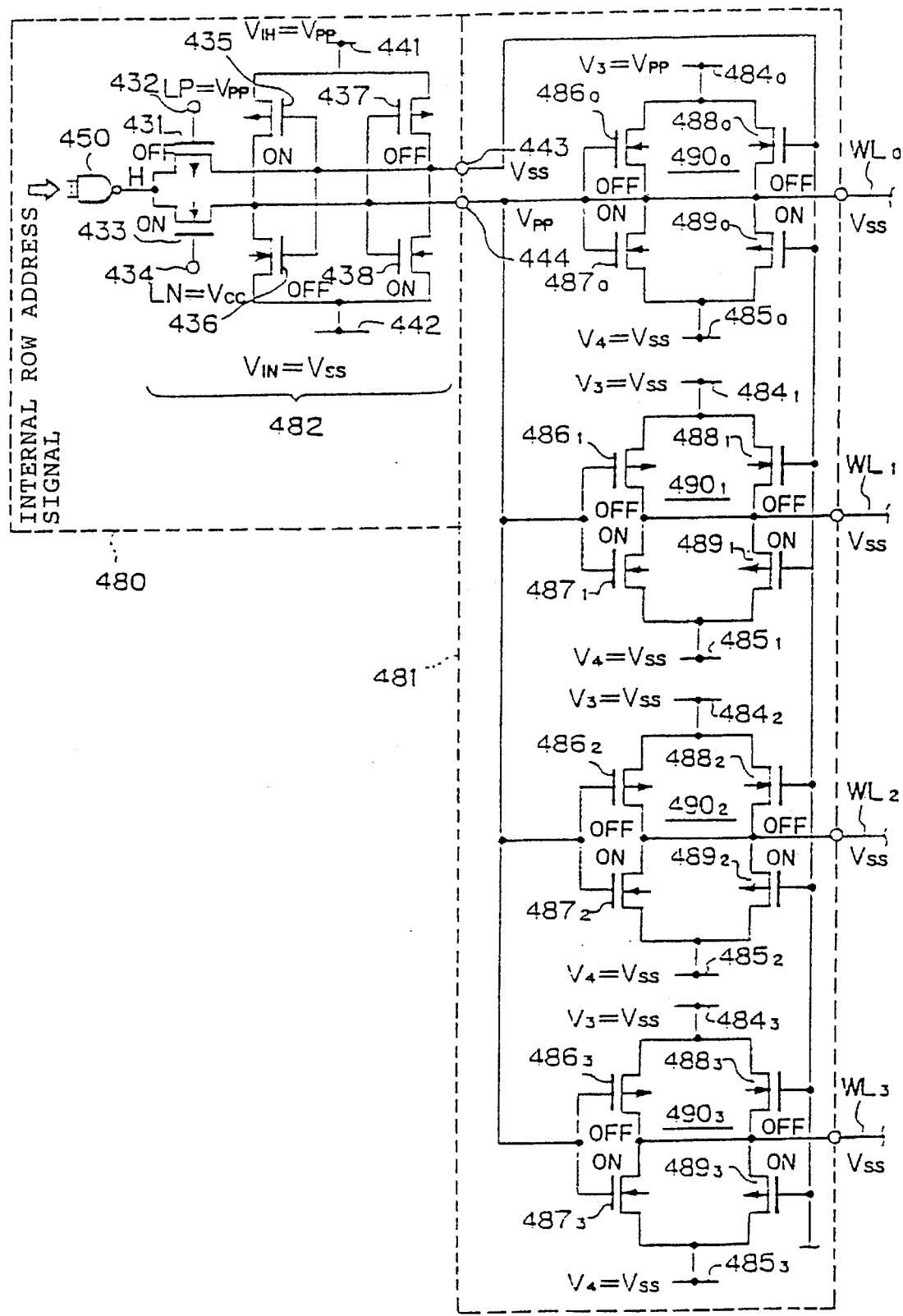
FIG. 75 is a circuit diagram showing an operation (unselected mode during writing) of the row decoder in FIG. 71.

In contrast, when the row decoder is unselected, as shown in FIG. 75, the output of the NAND circuit 450 goes high. The pMOS transistor 437 is turned off, the nMOS transistor 438 is turned on, the pMOS transistor 435 is turned on, and the nMOS transistor 436 is turned off. The voltage at the output terminal 433 is Vss, and the voltage at the output terminal 444 is Vpp.

As a result, the nMOS transistors $488_0$ to $488_3$ are turned off, the pMOS transistors $489_0$ to $489_3$ are turned on, the pMOS transistors $486_0$ to $486_3$ are turned off, and the nMOS transistors $487_0$ to $487_3$ are turned on.

Even when, for example, the V3 voltage line $484_0$ is set to Vpp, the V3 voltage lines $484_1$ to $484_3$ are set to Vss, and the V4 voltage lines $485_0$ to $485_3$ are set to Vss, the word lines WL0 to WL3 are set to Vss.

Figure 76:
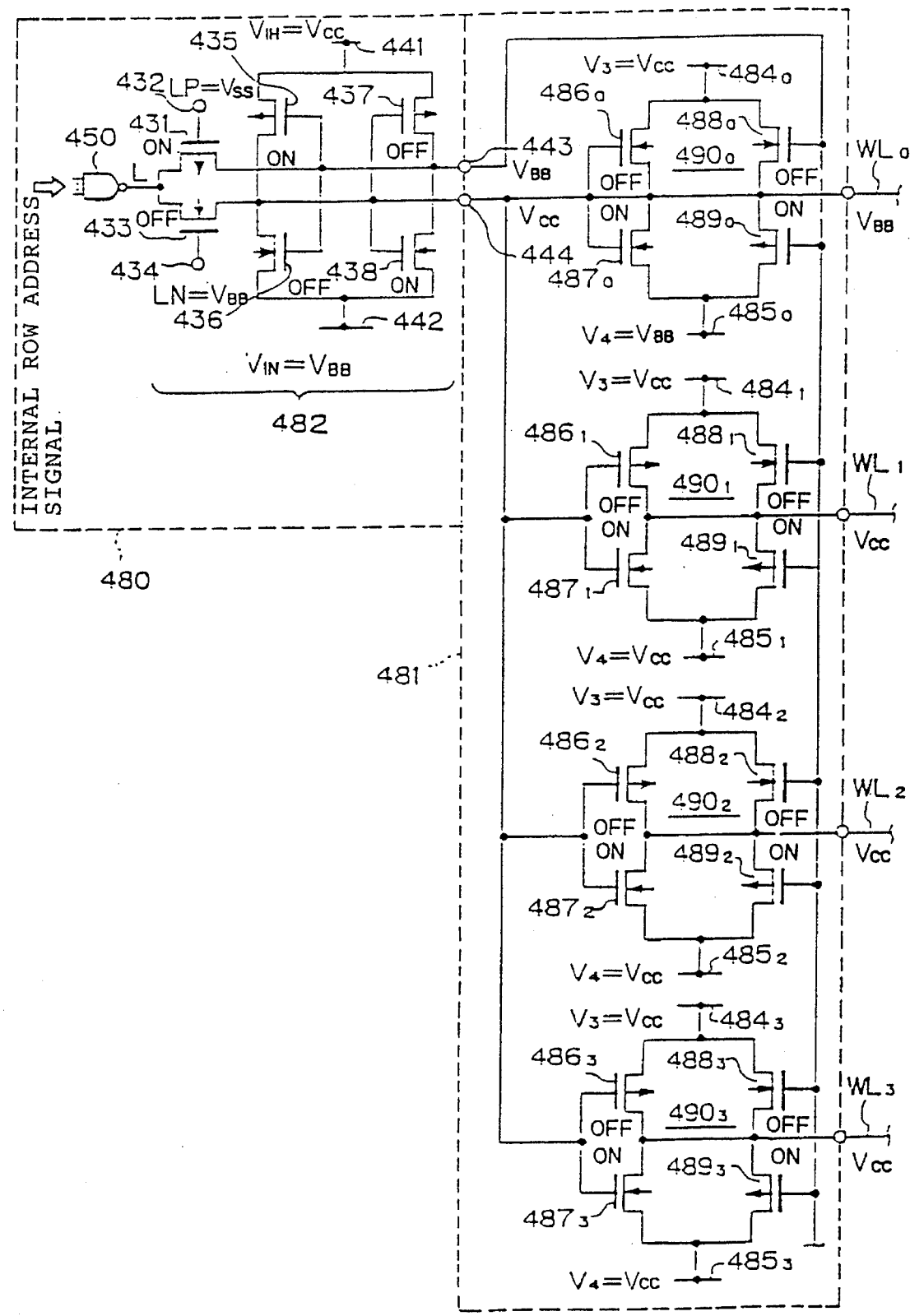
FIG. 76 is a circuit diagram showing an operation (selected mode during erasing) of the row decoder in FIG. 71.

For erasing, as shown in FIG. 76, the voltage $V_{IH}$ is Vcc, the voltage $V_{IN}$ is $V_{BB}$, the control signal LP is Vss, and the control signal LN is $V_{BB}$. The pMOS transistor 431 is on, and the nMOS transistor 433 is off.

When the row decoder is selected, the output of the NAND circuit 450 goes low. The pMOS transistor 435 is turned on, the nMOS transistor 436 is turned off, the pMOS transistor 437 is turned off, and the nMOS transistor 438 is turned on. The voltage at the output terminal 433 is $V_{BB}$, and the voltage at the output terminal 444 is Vcc.

As a result, the nMOS transistors $488_0$ to $488_3$ are turned off, the pMOS transistors $489_0$ to $489_3$ are turned on, the pMOS transistors $486_0$ to $486_3$ are turned off, and the nMOS transistors $487_0$ to $487_3$ are turned on.

When the word line WL0 is to be selected, the V3 voltage lines $484_0$ to $484_3$ are set to Vcc, the V4 voltage line $485_0$ is set to $V_{BB}$, and the V4 voltage lines $485_1$ to $485_3$ are set to Vcc.

As a result, the word line WL0 is set to $V_{BB}$, and the word lines WL1 to WL3 are set to Vcc.

Figure 77:
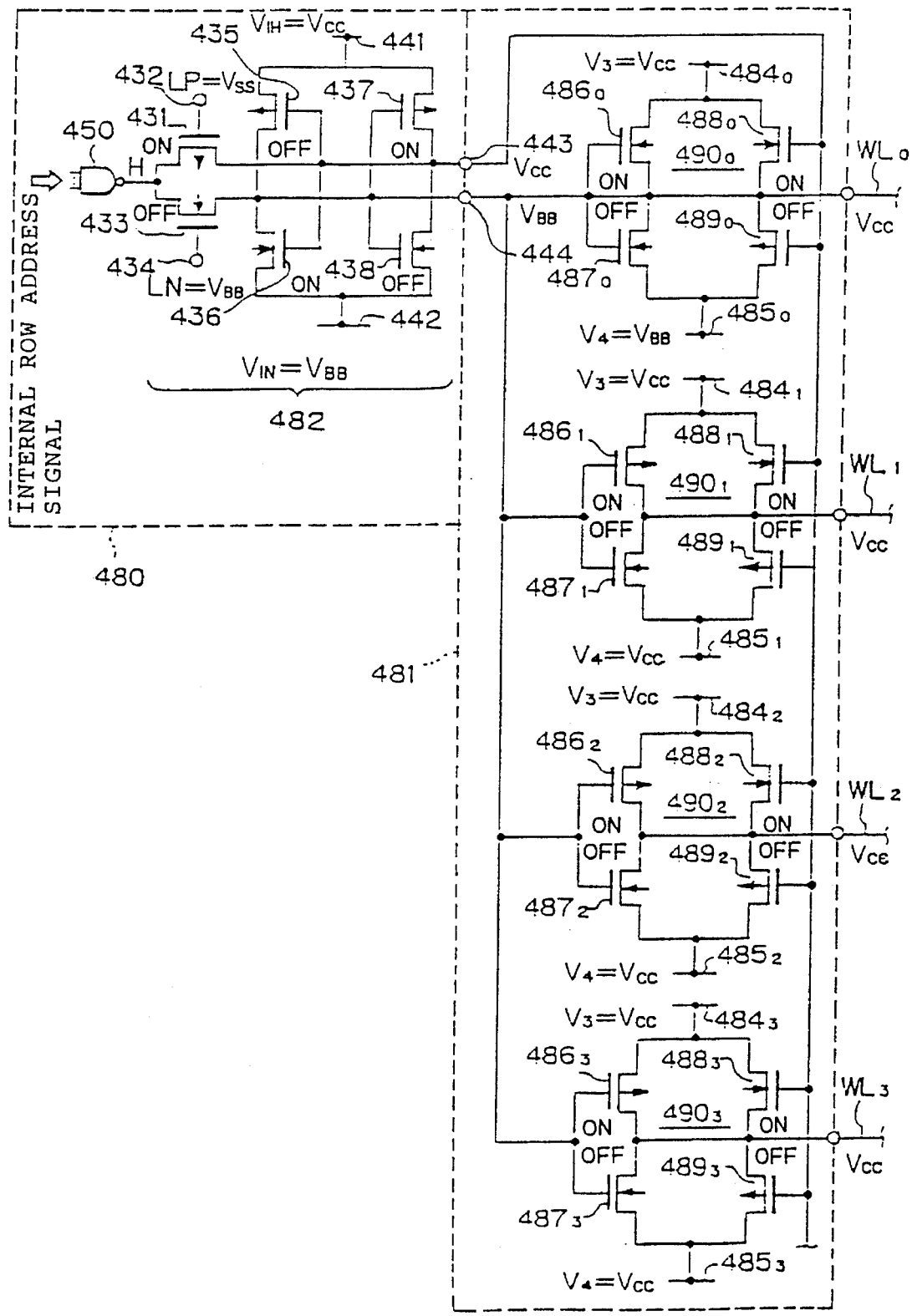
FIG. 77 is a circuit diagram showing an operation (unselected mode during erasing) of the row decoder in FIG. 71.

In contrast, when the row decoder is unselected, as shown in FIG. 77, the output of the NAND circuit 450 goes high. The pMOS transistor 437 is turned on, the nMOS transistor 438 is turned off, the pMOS transistor 435 is turned off, and the nMOS transistor 436 is turned on. The voltage at the output terminal 433 is Vcc, and the voltage at the output terminal 444 is $V_{BB}$.

As a result, the nMOS transistors $488_0$ to $488_3$ are turned on, the pMOS transistors $489_0$ to $489_3$ are turned off, the pMOS transistors $486_0$ to $486_3$ are turned on, and the nMOS transistors $487_0$ to $487_3$ are turned off.

Even when, for example, the V3 voltage lines $484_0$ to $484_3$ are set to Vcc, the V4 voltage line $485_0$ is set to $V_{BB}$, and the V4 voltage lines $485_1$ to $485_3$ are set to Vcc, the word lines WL0 to WL3 are set to Vcc.

In this row decoder, the positive voltage Vcc, ground voltage Vss, high voltage Vpp, or negative voltage $V_{BB}$ can be applied to the word lines WL0 to WL3 when needed.

When the voltage $V_{IH}$ is Vcc or Vpp, the voltage $V_{IN}$ is Vss or $V_{BB}$, the control signal LP is $V_{IH}$, and the control signal LN is $V_{IN}$, the pMOS transistor 431 and nMOS transistor are turned off. A current state is then latched.

After a current state is latched by turning off the pMOS transistor 431 and the nMOS transistor, when the voltage $V_{IH}$ or $_{IN}$ is fluctuated, the voltage to be supplied to the word lines WL can be varied.

When all row decoders are put into selected states, if all V3 voltage lines are set to Vcc, Vcc is applied to all word lines. All cells then enter read-enabled states. When all the row decoders are put into the selected states, if all the V3 voltage lines are set to Vpp, Vpp is applied to all the word lines. All the cells then enter write-enabled states. When all the row decoders are put into the selected states, if all V4 voltage lines are set to $V_{BB}$, $V_{BB}$ is applied to all the word lines. All the cells then enter erase-enabled states.

When all the row decoders are put into the selected states, all the V3 voltage lines are set to Vcc. After Vcc is applied to all the word lines, the level change circuit 482 is put into a latch mode. Thereafter, when the all the V3 voltage lines are set to Vpp, Vpp is applied to all the word lines. All the cells then enter the write-enabled states.

When all the row decoders are put into the selected states, all the V3 voltage lines are set to Vcc. After Vcc is applied to all the word lines, the level change circuit 482 is put into a latch mode. Thereafter, when all the V4 voltage lines are set to $V_{BB}$, $V_{BB}$ is applied to all the word lines. All the cells then enter the erase-enabled states.

According to the flash memory of the eighteenth embodiment, the level change circuit 482 in the main row decoder 480 is composed of three pMOS transistors 431, 435, and 437 and three nMOS transistors 433, 436, and 438. In a flash memory having row decoders each of which consists of a main row decoder and a sub-row decoder, the area occupied by the row decoders can be limited and the chip area can be reduced.

Next, a flash memory in which the number of transistors constituting a sub-row decoder in the eighteenth embodiment is reduced will be presented as the nineteenth embodiment.

Figure 78:
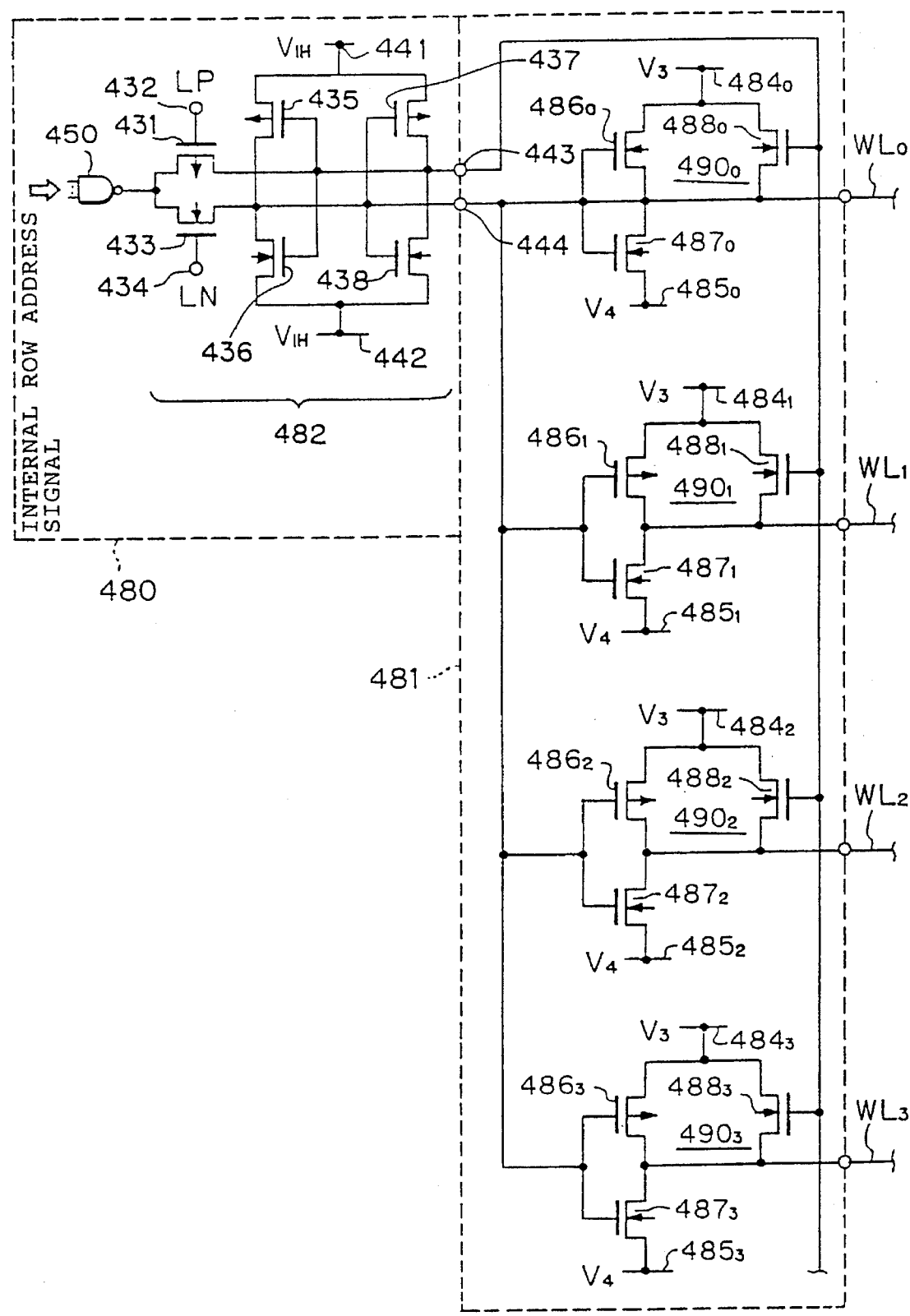
FIG. 78 is a circuit diagram showing a major section (row decoder) of a flash memory in the nineteenth embodiment.

FIG. 78 is a circuit diagram showing a major portion of a flash memory in the nineteenth embodiment; that is, one row decoder. Components identical to those in FIGS. 53, 62, and 71 bear the same reference numerals.

In FIG. 78, reference numeral 481 denotes a sub-row decoder. The sub-row decoder 481 does not include the pMOS transistors $489_0$ to $489_3$ which are installed in the sub-row decoder 481 shown in FIG. 71. The other components are the same as those in the sub-row decoder 481 in FIG. 71.

In this row decoder, the supply voltage Vcc, zero voltage Vss, high voltage Vpp, or negative voltage $V_{BB}$ can be applied to the word lines WL0 to WL3 when needed. Latching and all-cell selection can be performed in the similar manner as those in the row decoder shown in FIG. 71.

According to the flash memory in this embodiment, the level change circuit 482 in the main row decoder 491 is composed of three pMOS transistors 431, 435, and 437 and three nMOS transistors 433, 436, and 438. The number of transistors forming a sub-row decoder is smaller than that in the sub-row decoder 481 in FIG. 71. In a flash memory having row decoders each of which consists of a main row decoder and a sub-row decoder, the area occupied by the row decoders can be made smaller than that in FIG. 71. Consequently, the chip area can be reduced.

Figure 79:
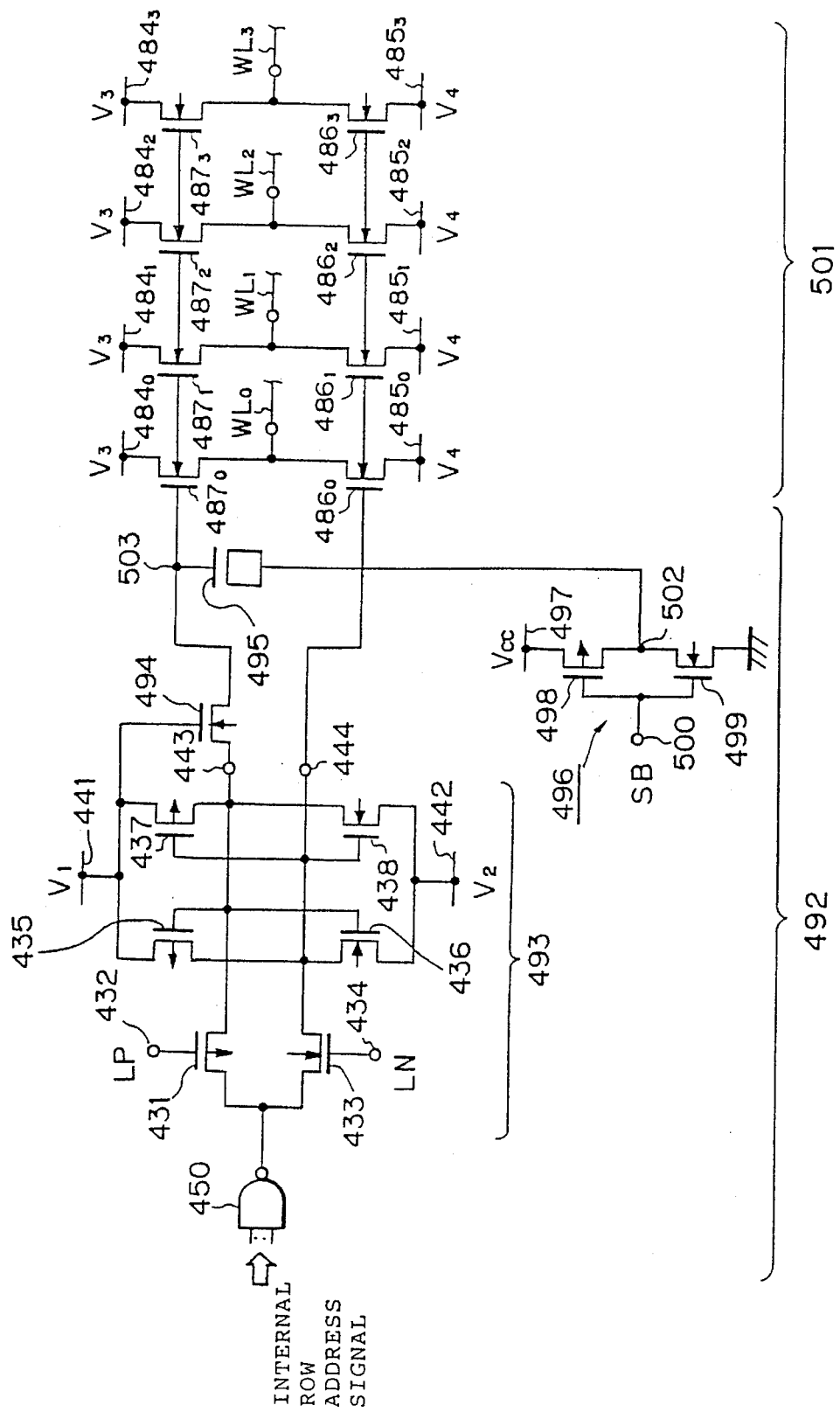
FIG. 79 is a circuit diagram showing a major section (row decoder) of a flash memory in the twentieth embodiment.

FIG. 79 is a circuit diagram showing a major portion of a flash memory in the twentieth embodiment; that is, one row decoder. Components identical to those in FIGS. 53, 62, and 71 bear the same reference numerals as those in FIG. 71.

In FIG. 79, reference numeral 492 denotes a main row decoder; 494 denotes an nMOS transistor serving as a transfer gate; 495 denotes a capacitor realized with an nMOS transistor; and 496 denotes an inverter.

In the inverter 496, reference numeral 497 denotes a Vcc power line. 498 denotes a pMOS transistor. 499 denotes an nMOS transistor. 500 denotes a control signal input terminal for inputting a control signal SB whose level is driven low for reading.

Reference numeral 501 denotes a sub-row decoder. The sub-row decoder 501 does not include the pMOS transistors $486_0$ to $486_3$ and $489_0$ to $489_3$ which are installed in the sub-row decoder 481 in FIG. 71. The other components are identical to those in the sub-row decoder 481 in FIG. 71.

In this embodiment, the gate of the nMOS transistor 494 is connected to the V1 power line 441. The output terminal 443 of the level change circuit 492 is connected to the nMOS transistors $486_0$ $486_3$ via the nMOS transistor 494. The output terminal 502 of the inverter 496 is connected to the gates of the nMOS transistors $488_0$ to $488_3$ via the capacitor 495.

In this row decoder, for reading, the level change circuit 493 applies Vcc to the gates of the nMOS transistors $486_0$ to $486_3$. At this time, the control signal SB is driven low. The voltage at the output terminal 502 of the inverter 496 is therefore driven high.

As a result, the voltage at a node 503 is boosted to a value higher than Vcc, for example, Vcc+Vth due to the coupling by the capacitor 495. The boosted voltage is applied to the gates of the nMOS transistors $488_0$ to $488_3$. At this time, the nMOS transistor 494 is turned off. Current will not flow from the node 503 to the level change circuit 493.

In this row decoder, for reading, the voltage of a selected word line can be set to Vcc instead of Vcc−Vth (threshold voltage of an nMOS transistor).

The row decoder fundamentally operates in the same manner as that shown in FIG. 71 except for the above operation. The row decoder can therefore apply the supply voltage Vcc, ground voltage Vss, high voltage Vpp, or negative voltage $V_{BB}$ to the word lines WL0 to WL3 when the voltage is needed. Latching and all-cell selection can also be done in the same manner as in the row decoder shown in FIG. 71.

According to the flash memory of the twentieth embodiment, the level change circuit 493 in the main row decoder 492 is composed of three pMOS transistors 431, 435 and 437 and three nMOS transistors 433, 436 and 438. In a flash memory having row decoders each of which consists of a main row decoder and a sub-row decoder, the area occupied by the row decoders can be limited and the chip area can be reduced.

As described above, any of the level change circuits in the fifteenth to twentieth embodiments can be composed of two connection switch elements and two inverters. When the level change circuit is employed for a flash memory, the chip area can be reduced.

If the level change circuit is used as a row decoder in a flash memory, the area occupied by row decoders can be limited and the chip area can be reduced.

However, the level change circuits employed in the fifteenth to twentieth embodiment have problems, e.g., that a large current flows through a circuit for the same reason as the one in the level change circuit of FIG. 48 and that it is hard to actuate transistors in harmony. The twenty-first and twenty-second embodiments represent level change circuits in which the above problems have been solved.

Figure 80:
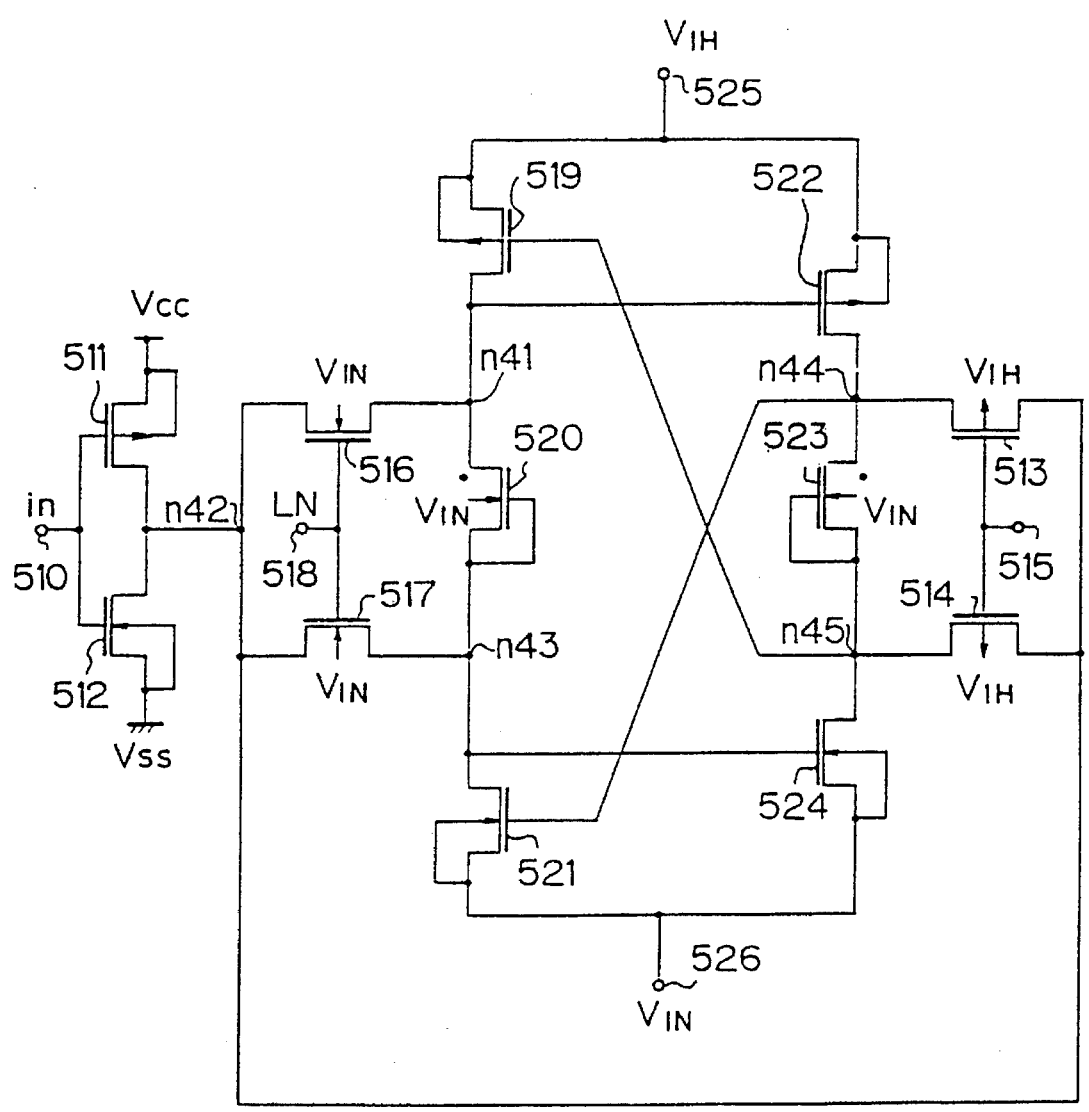
FIG. 80 shows a level change circuit in the twenty-first embodiment.

FIG. 80 shows a level change circuit of the twenty-first embodiment. As apparent from FIG. 80, the circuit in FIG. 80 is identical to that in FIG. 53 except that a first depletion-type transistor 520 is interposed between the p-channel transistor 519 and n-channel transistor 521 which constitute the first inverter, and that a second depletion-type transistor 523 is interposed between the p-channel transistor 522 and n-channel transistor 524 which constitute the second inverter. The input signal is fed across the first depletion-type transistor 520 via two n-channel transistors 516 and 517 whose sources are connected to the input terminal and whose gates are connected to the control terminal LN. The input signal is also fed across the second depletion-type transistor 523 via two p-channel transistors 513 and 514 whose sources are connected to the input terminal and whose gates are connected to the control terminal LP.

The operation of the depletion-type transistors 520 and 523 is identical to that of the depletion-type transistor 389 in the level change circuit in the thirteenth embodiment shown in FIG. 50. The other components are identical to those in FIG. 53. Detailed description of the circuit in FIG. 30 will therefore be omitted. Table 8 is a truth table for the circuit in FIG. 80.

TABLE 8

Truth table for the circuit in FIG. 80

| | $V_{IH}$ | $V_{IN}$ | LN | LP | in | Output (n44) |
|---|---|---|---|---|---|---|
| High-voltage application | Vpp | Vss | Vcc | Vpp | H | Vpp |
| | | | | | L | Vss |
| Negative voltage application | Vcc | $V_{BB}$ | $V_{BB}$ | Vss | H | $V_{BB}$ |
| | | | | | L | Vcc |

Figure 81:
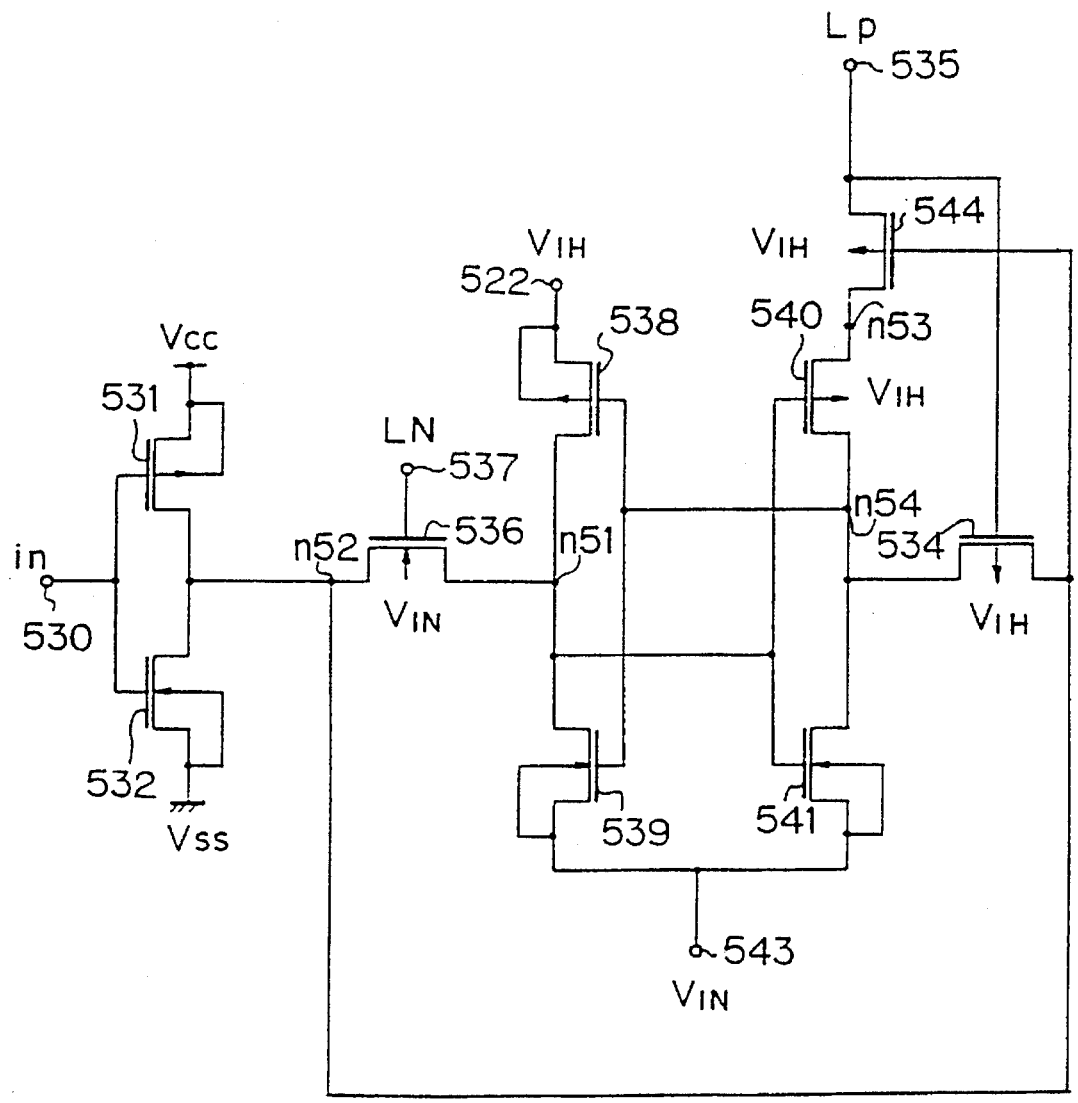
FIG. 81 shows a level change circuit in the twenty-second embodiment.

FIG. 81 shows a level change circuit of the twenty-second embodiment. The level change circuit is identical to that in FIG. 53 except that the source of a p-channel transistor 540 comparable to the p-channel transistor 437 is connected to the control terminal 535 via an additional p-channel transistor 544. The gate of the additional p-channel transistor 544 is connected to a point n52 comparable to the input terminal 430.

The additional p-channel transistor 544 disconnects the source of the p-channel transistor 540 with a change in an input signal before the p-channel transistor 540 serving as the second inverter changes from the conducting state to the nonconducting state with a fluctuation in voltage to be applied to the gate. This prevents current from flowing through the second inverter. The voltage at a point n54 will therefore not be changed to an intermediate voltage, and the circuit operates more reliably. The truth table for the circuit in FIG. 81 is identical to that for the circuit in FIG. 81; that is, Table 8.

In the twelfth to twenty-second embodiments, a row decoder is used to apply negative voltage to a word line for erasing. As shown in FIG. 34, the negative-voltage generator may be installed independently. In this case, during negative-voltage application, row decoders are disconnected so that the negative voltage generator can apply negative voltage to word lines. As described previously, it is, however, hard to apply negative voltage selectively to word lines.

In the seventh mode of the present invention, negative voltage from a negative-voltage generator, which is installed independently, is applied selectively to word lines in response to signals sent from row decoders. Row decoders for specifying word lines need not be installed in the negative voltage generator. The negative voltage generator can therefore be reduced in scale. To begin with, an embodiment of a negative-voltage bias circuit for realizing a flash memory based on the seventh mode of the present invention will be described.

FIG. 82 is an explanatory diagram for the principle of a negative-voltage bias circuit based on the seventh mode of the present invention. Reference numeral 550 denotes a capacitor; 551 and 552 denote p-channel metal insulator semiconductor (pMIS) field-effect transistors (hereinafter, pMIS transistor); 553 denotes a voltage line for applying a negative voltage $V_{BB}$; and 554 denotes a negative-voltage output terminal for outputting the negative voltage $V_{BB}$. During negative-voltage output, a clock pulse CLK is fed to one terminal of the capacitor 550.

A negative-voltage bias circuit based on this mode comprises the capacitor 550 one of whose ends 550A inputs the clock pulse CLK during negative-voltage output, the pMIS depletion-type transistor 551 whose drain is connected to the negative-voltage output terminal 554 and whose gate and source are connected to the other terminal 550B of the capacitor 550, and the pMIS transistor 552 whose drain is connected to the source of the pMIS transistor 551, whose gate is connected to the negative-voltage output terminal 554, and whose source is provided with the negative voltage $V_{BB}$.

In the foregoing negative-voltage bias circuit, when the clock pulse CLK shown in FIG. 83A is applied to the terminal 55aA of the capacitor 550, the levels at a node 555 and the negative-voltage output terminal vary as shown in FIGS. 83B and 83C. The negative voltage $V_{BB}$ is induced in the negative-voltage output terminal 554, which imitates a state in which the negative voltage $V_{BB}$ is applied to the negative-voltage output terminal 554.

When the clock pulse CLK applied to the terminal 55A of the capacitor 550 reverses in polarity from positive to negative, the level at the node 555 drops due to capacitive coupling. As a result, the pMIS transistor 551 is turned on. Charges then move from the negative-voltage output terminal 554 to the node 555 until the level at the negative-voltage output terminal 554 equals to the level at the node 555.

When the clock pulse CLK reverses in polarity from negative to positive, the level at the node 555 rises due to capacitive coupling. As a result, the pMIS transistor 551 is turned off and the pMIS transistor 552 is turned on. Charges then move from the node 555 onto the voltage line 553 until the difference in level between the node 555 and voltage line 553 becomes equal to the threshold voltage of the pMIS transistor 552.

When the above operation is repeated, the negative voltage $V_{BB}$ is induced in the negative-voltage output terminal 554, which is equivalent to a state in which the negative voltage $V_{BB}$ is applied to the negative-voltage output terminal 554. More particularly, the condition under which the negative-voltage bias circuit of the present invention operates normally is represented as the expression (1):

$$Vs > |Vth1 + Vth2| \qquad (1)$$

where, Vs is the amplitude at the node 555, and Vth1 and Vth2 are the threshold voltages of the pMIS transistors 551 and 552.

As the levels at the negative-voltage output terminal 554 and node 555 decrease, Vth1 and Vth2 increase due to what is referred to as a "back-gate effect." When an enhancement pMIS transistor is used as the pMIS transistor 551, the conditional expression of expression (1) is not satisfied in some states.

In contrast, when a depletion-type pMIS transistor is used as the pMIS transistor 551, even if Vth1 and Vth2 increase due to the back-gate effect, in no state is the conditional expression of expression (1) satisfied. It is therefore a must that a depletion-type pMIS transistor be used as the pMIS transistor 551.

However, in this case, the pMIS transistor 551 is always on at the start of operation. The rise time of the clock pulse CLK for going high must be very short so that the amplitude at the node 555 will not be lower than an absolute value of the threshold voltage of the pMIS transistor 552.

When the levels at the negative-voltage output terminal 554 and node 555 decrease to some extent, the threshold voltage of the pMIS transistor 551 varies due to the back-gate effect. The pMIS transistor 551 functions like an enhancement pMIS transistor, whereby no current flows back from the pMIS transistor 551, and More charges move from the node 555 to the voltage line 553.

When the capacitor 550 is realized with an enhancement n-channel MIS field-effect transistor (hereinafter, nMIS transistor), the gate-source voltage is usually 0 V or lower. In the meantime, no channel is formed.

When no channel is formed, the capacity of the gate of a MIS transistor is about 30% of the capacity when a channel is formed. It is therefore not impossible but not preferable that an enhancement nMIS transistor is used as the capacitor 550.

When the capacitor 550 is realized with an enhancement pMIS transistor, the gate-source voltage exceeds the threshold voltage of the pMIS transistor for some period. No channel is formed for that period. The amplitude of a clock pulse CLK can therefore not be transmitted to the node 555 efficiently. It is therefore not impossible but not preferable that an enhancement pMIS transistor is used as the capacitor 550.

When the capacitor 550 is realized with a depletion-type nMIS transistor, if the level at the node 555 becomes lower than a certain value, the gate-source voltage of the nMIS transistor becomes lower than the threshold voltage. As a result, no channel is formed. The amplitude of a clock pulse CLK can therefore not be transmitted efficiently. It is therefore not impossible but not preferable that a depletion-type nMIS transistor is used as the capacitor 550.

When the capacitor 550 is realized with a depletion-type pMIS transistor, whatever level is set at the node 555, the gate-source voltage will not exceed the threshold value. A channel is always formed. The amplitude of a clock pulse CLK can therefore be transmitted to the node 555 efficiently. It is therefore preferable that a depletion-type pMIS transistor is used as the capacitor 550.

When a negative voltage is output, the pMIS transistors 551 and 552 may be cut off due to the back-gate effect. However, if the bias voltage of a well or substrate in which the pMIS transistors 551 and 552 are formed is set to a ground voltage Vss, an electric field applied to the oxide film at the gates of the pMIS transistors 551 and 552 is alleviated to eliminate the possibility that the pMIS transistors 551 and 552 may be cut off due to the back-gate effect.

Even when a negative voltage is not output, the clock pulse CLK is fed to the terminal 550A of the capacitor. Only when negative voltage is output, is a negative voltage $V_{BB}$ applied to the source of the pMIS transistor 552. When a negative voltage is not output, even if the ground voltage Vss is applied to the source of the pMIS transistor 552, the same operation and advantages as those provided by the negative-voltage bias circuit in FIG. 82 are available.

An embodiment in which the aforesaid negative-voltage bias circuit is implemented in a flash memory will be described next.

The twenty-third embodiment will be described in conjunction with FIGS. 84 to 87.

Figure 84:
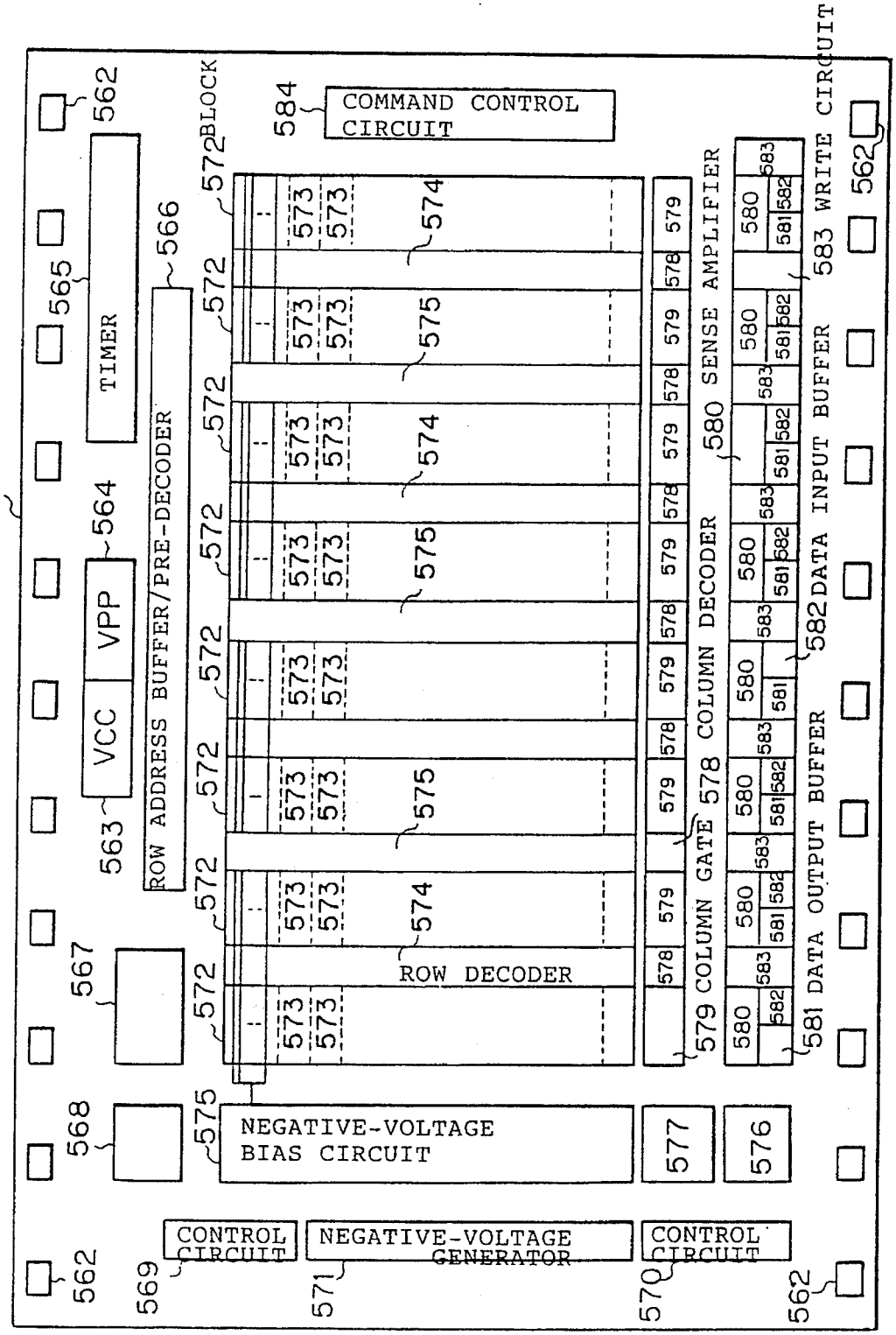
FIG. 84 is a block diagram showing a major section of a flash memory in the twenty-third embodiment.

FIG. 84 is a block diagram showing a major portion of a flash memory of this embodiment. Reference numeral 561 denotes a chip body; 562 denotes a pad; 563 denotes a Vcc (supply voltage) power circuit; 564 denotes a Vpp (high voltage for writing) power circuit; 565 denotes an internal control timer; 566 denotes a row address buffer/pre-decoder; 567 denotes a row decoder power circuit; and 568 denotes a clock signal generator.

Reference numerals 569 and 570 denote control circuits. 571 denotes a negative-voltage generator; 572 denotes a block of a divided cell array made up of cell transistors which are set in an array; 573 denotes a region called a "sector" or one of segments of the block 572; 574 denotes a row decoder; and 575 denotes negative-voltage bias circuits.

Reference numeral 576 denotes a column power circuit; 577 denotes a column address buffer/pre-decoder; 578 denotes a column decoder; 579 denotes a column gate; 580 denotes a sense amplifier; 581 denotes a data output buffer; 582 denotes a data input buffer; 583 denotes a write circuit; and 584 denotes a command control circuit.

Figure 85:
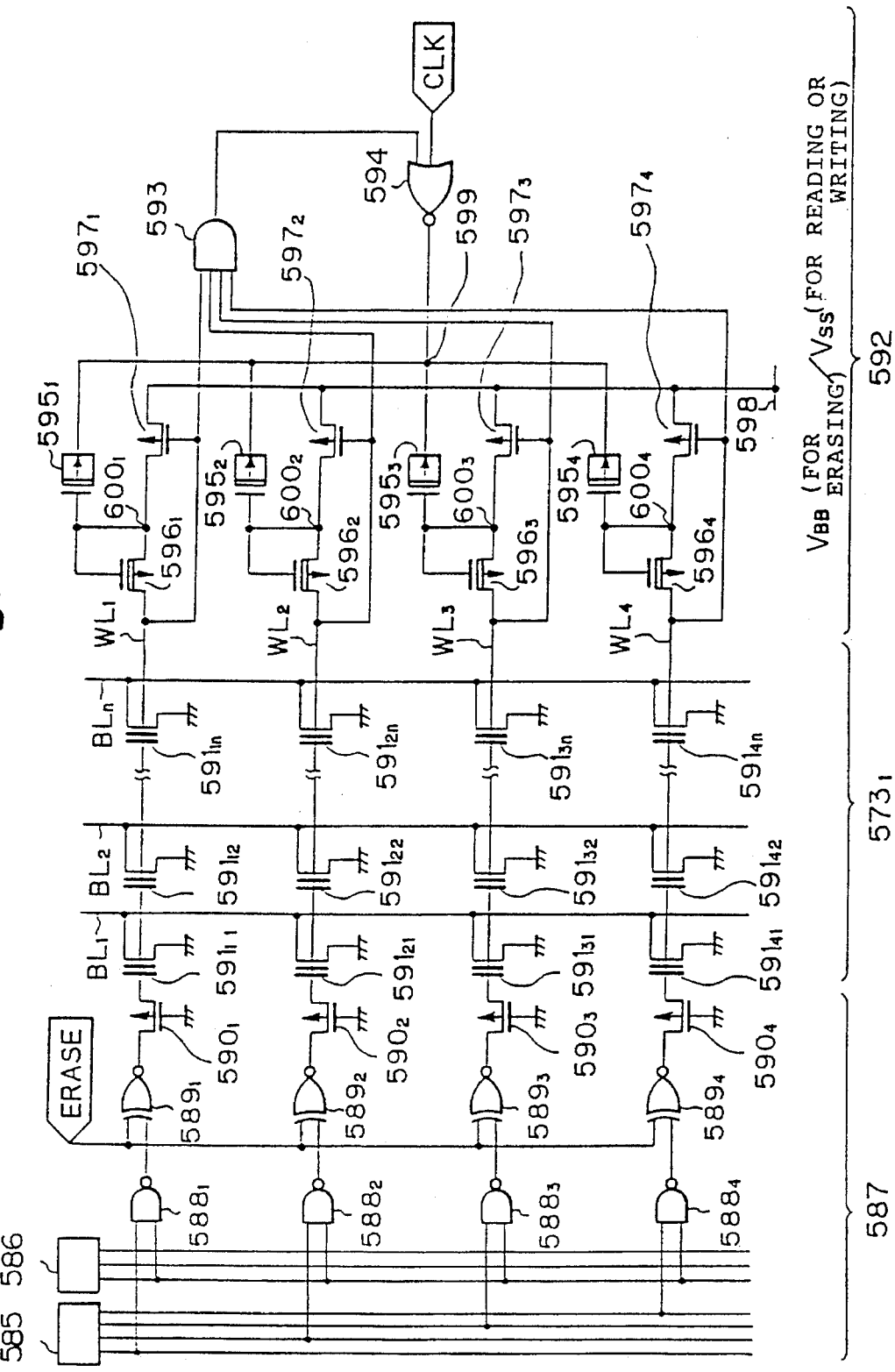
FIG. 85 is a circuit diagram showing part of the twenty-third embodiment in more detail.

FIG. 85 shows a section of FIG. 84 in more detail. In the figures, 585 and 586 denote pre-decoders in the row address buffer/pre-decoder 566 (See FIG. 84); 587 denotes part of the row decoder 574 (See FIG. 84). $588_1$ to $588_4$ denote NAND circuits; and $589_1$ to $589_4$ are exclusive-NOR circuits.

Reference numerals $590_1$ to $590_4$ denote p-channel MOS field-effect transistors (hereinafter, pMOS transistor), and ERASE denotes an erase signal. The erase signal ERASE is driven low for reading or writing, and high for erasing.

Reference numerals $573_1$ is one sector of 573. In the sector $573_1$, $591_{11}$ to $591_{4n}$ denote cell transistors; $WL_1$ to $WL_4$ denote word lines; and $BL_1$, $BL_2$, and $BL_nB$ denote bit lines. The cell transistors $591_{11}$ to $591_{4n}$ have the same circuitry as that shown in FIG. 3.

Reference numeral 592 denotes a negative-voltage bias circuit that is one of the negative-voltage bias circuits 575 (See FIG. 84); 593 denotes an AND circuit; and 594 denotes a NOR circuit. The clock pulse CLK shown in FIG. 87A is fed to the NOR circuit 594.

Reference numerals $595_1$ to $595_4$ are capacitors formed from depletion-type pMOS transistors; $596_1$ to $596_4$ are depletion-type pMOS transistors; and $597_1$ to $597_4$ are enhancement pMOS transistors.

Reference numerals 598 denotes a voltage line over which a negative voltage $V_{BB}$ is applied to the sources of the pMOS transistors $597_1$ to $597_4$ during erasing, and a ground (zero) voltage Vss is applied during reading or writing.

Figure 86:
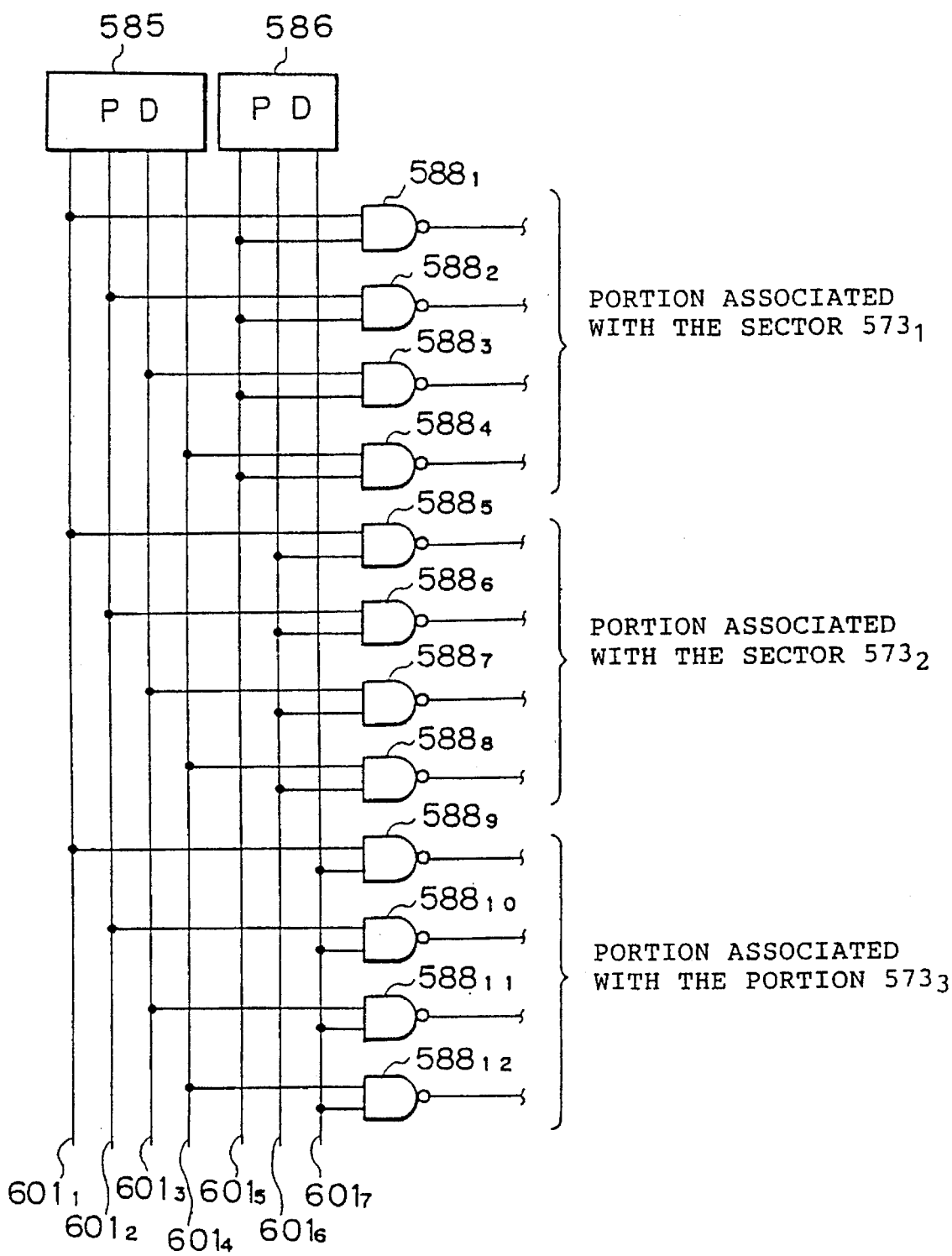
FIG. 86 is a circuit diagram showing the connection between pre-decoders and NAND circuits forming a row decoder in the twenty-third embodiment.

FIG. 86 is a circuit diagram showing the connection between the pre-decoders 585 and 586, and the NAND circuits $588_1$ to $588_{12}$ forming the row decoder 587. In the figure, $601_1$ to $601_4$ denote parts of signal lines extending from the pre-decoder 585; $601_5$ to $601_7$ denote parts of signal lines extending from the pre-decoder 586; $588_5$ to $588_8$ denote NAND circuits associated with the sector $573_2$; and $588_9$ to $588_{12}$ denote NAND circuits associated with the sector $573_3$.

When any of the word lines in the sectors $573_1$ to $573_3$ are to be selected for reading or writing, the pre-decoder 585 drives appropriate ones of the signal lines $601_1$ to $604_4$ high and the others low. The output of the NAND circuit associated with a word line to be selected is thus driven low and the outputs of the other NAND circuits are driven high.

When any of the sectors $573_1$ to $573_3$ are to be selected for erasing, the pre-decoder 585 drives all the signal lines $601_1$ to $601_4$ high. The pre-decoder 586 drives appropriate ones of the signal lines $601_5$ to $601_7$ high and the others low. The output of the NAND circuit associated with a word line in a sector to be selected is driven low. The outputs of the other NAND circuits are driven high.

In this twenty-third embodiment, the erase signal ERASE in FIG. 85 is driven low for reading. For example, if the word line $WL_1$ is selected, the output of the NAND circuit $588_1$ is driven low and the outputs of the NAND circuits $588_2$ and $588_3$ are driven high. The word line $WL_1$ is set to high, and the word lines $WL_2$ to $WL_4$ are set to low.

As a result, the output of the AND circuit 593 goes low. The NOR circuit 594 passes the clock pulses CLK. The voltage line 598 supplies the ground voltage Vss. The circuit consisting of the capacitors $595_1$ to $595_4$ and pMOS transistors $596_1$ to $596_4$ and $597_1$ to $597_4$ need not induce the negative voltage $V_{BB}$ in the word lines $WL_1$ to $WL_4$.

In contrast, for erasing, the ERASE signal is driven high. The negative voltage $V_{BB}$ is applied instead of the ground voltage Vss to the sources of the pMOS transistors $597_1$ to $597_4$ over the voltage line 598.

For example, when the word lines $WL_1$ to $WL_4$ are unselected; that is, erasing is not performed on the cell transistors $591_{11}$ to $591_{4n}$, the outputs of the NAND circuits $588_1$ to $588_1$ are driven high.

In this case, the word lines $WL_1$ to $WL_4$ are driven high and the output of the AND circuit 593 is also driven high. The output of the NOR circuit 594 is always low. The passage of the clock pulses CLK through the NOR circuit 594 is cut off. The word lines $WL_1$ to $WL_4$ are held high.

On the other hand, when the word lines $WL_1$ to $WL_4$ are to be selected; that is, erasing is to be performed on the cell transistors $591_{11}$ to $591_{4n}$, the pre-decoders 585 and 586 select the sector $573_1$. The outputs of the NAND circuits $588_1$ to $588_4$ are driven high.

In this case, if the word line $WL_1$ is low, the pMOS transistor $590_1$ is off, and The word line $WL_1$ is held low. If the word line $WL_1$ is high, the pMOS transistor $590_1$ is turned on, and The word line $WL_1$ is driven low.

As a result, the output of the AND circuit 593 goes low. The NOR circuit 594 reverses the polarity of the clock CLK and passes the clock CLK. The level at the node 599 and the levels on the word lines $WL_1$ to $WL_4$ represent the waves shown in FIGS. 87B and 87C.

Consequently, the negative voltage $V_{BB}$ is induced in the word lines $WL_1$ to $WL_4$, which is equivalent to a state in which the negative voltage $V_{BB}$ is applied to the word lines $WL_1$ to $WL_4$. Channel erasing can be performed on the cell transistors $591_1$ to $591_{4n}$ connected to the word lines $WL_1$ to $WL_4$. According to the twenty-third embodiment, the negative-voltage bias circuit 592 for applying the negative voltage $V_{BB}$ to selected word lines is realized with simple circuitry. Channel erasing can therefore be achieved with simple overall circuitry.

Furthermore, since depletion-type pMOS transistors are used as the pMOS transistors $596_1$ to $596_4$. Even if the threshold voltages of the pMOS transistors $596_1$ to $596_4$ and $597_1$ to $597_4$ increase due to the back-gate effect, the negative-voltage bias circuit 592 operates normally.

The capacitors $595_1$ to $595_4$ are depletion-type pMOS transistors. Whatever levels are set at the nodes $600_1$ to $600_4$, the gate-source voltages of the capacitors $595_1$ to $595_4$ will not exceed the threshold voltages. Channels are thus formed all the time. The amplitude of the clock pulse CLK can be transmitted to the nodes $600_1$ to $600_4$ efficiently.

Figure 88:
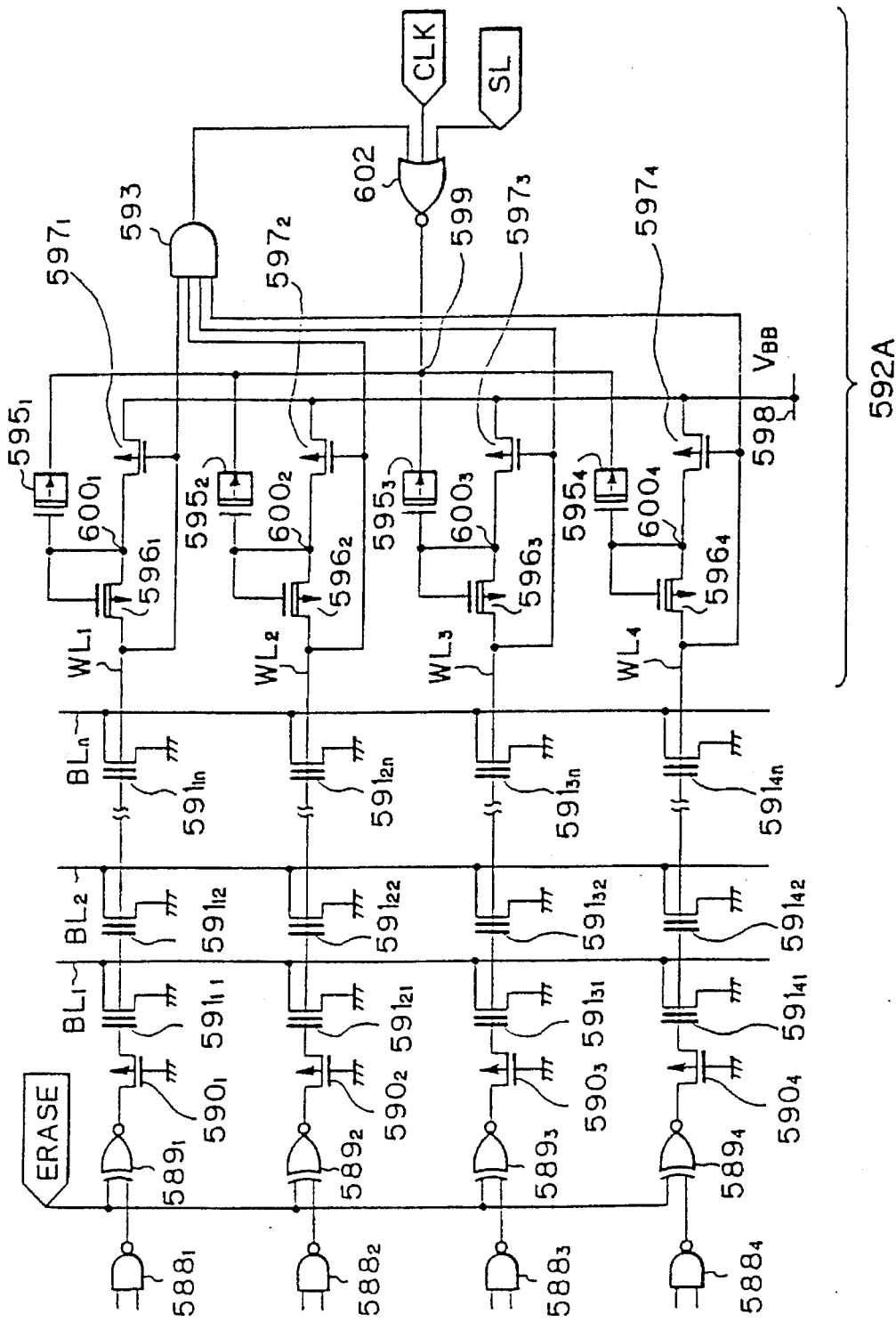
FIG. 88 is a circuit diagram showing a major section of the twenty-fourth embodiment.

FIG. 88 is a circuit diagram showing a major portion of the twenty-fourth embodiment. In the twenty-fourth embodiment, the dual-input NOR circuit 594 shown in FIG. 85 is replaced with a triple-input NOR circuit 602. The output of the AND circuit 593, clock signal CL, and select signal SL that goes low only for erasing are supplied to the NOR circuit 602. Only the negative voltage $V_{BB}$ is applied to the voltage line 598. A negative-voltage bias circuit 592A has the same circuitry as the negative-voltage bias circuit 592 in FIG. 85. The other components are identical to those in the twenty-third embodiment shown in FIG. 85.

FIGS. 89A to 89D show waveforms for explaining the operations of the twenty-fourth embodiment performed when the output of the NAND circuit $588_1$ is driven low and the outputs of the NAND circuits $588_2$ to $588_4$ are driven high so that erasing will be executed for the cells $591_{11}$ to $591_{4n}$. FIG. 89A shows the wave of the select signal SL. FIG. 89B shows the wave of the clock pulse CLK. FIG. 89C shows the wave representing the level at the node 599. FIG. 89D shows the wave representing the level on any of the word lines $WL_1$ to $WL_4$.

In this twenty-fourth embodiment, similarly to the twenty-third embodiment, a negative-voltage bias circuit 592A for applying negative voltage to selected word lines is realized with simple circuitry. Channel erasing can therefore be performed with simple overall circuitry.

Similarly to the twenty-third embodiment, even if the threshold voltages of the pMOS transistors $596_1$ to $596_4$ and $597_1$ to $597_2$ increase due to the back-gate effect, the negative-voltage bias circuit 592A operates normally. The amplitude of the clock pulse CLK can be transmitted to the nodes $600_1$ to $600_4$ efficiently.

Figure 90:
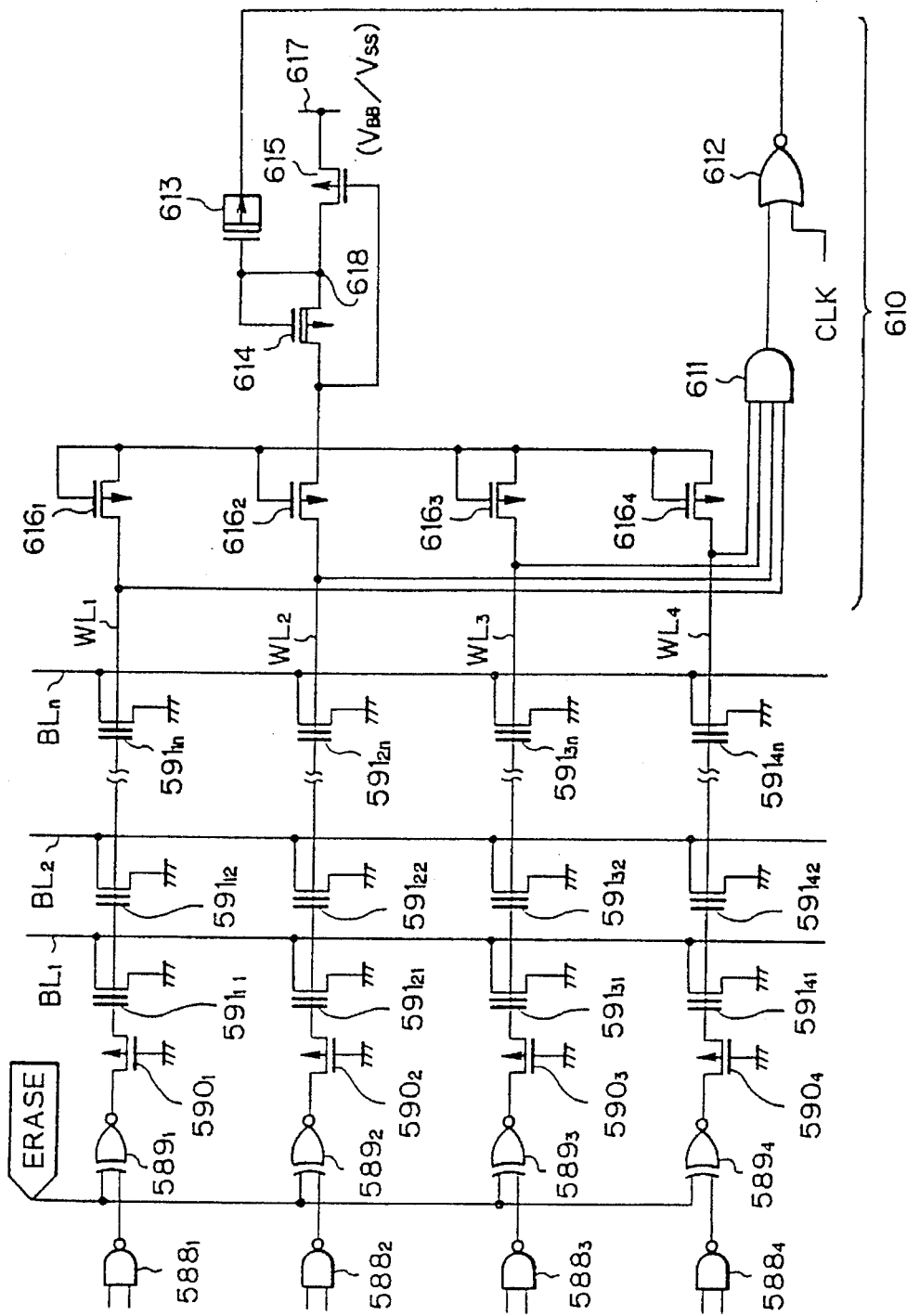
FIG. 90 is a circuit diagram showing a major section of the twenty-fifth embodiment.

FIG. 90 is a circuit diagram showing a major portion of the twenty-fifth embodiment. The twenty-fifth embodiment includes a negative-voltage bias circuit 601 whose circuitry differs from that of the negative-voltage bias circuit 592 of the twenty-third embodiment in FIG. 85. The other components are identical to those of the twenty-third embodiment shown in FIG. 85.

In the negative-voltage bias circuit 610, reference numeral 611 denotes an AND circuit; 612 denotes a NOR circuit. 613 denotes a capacitor that is a depletion-type pMOS transistor; 614 denotes a depletion-type pMOS transistor; and 615, and $616_1$ to $616_4$ denote enhancement pMOS transistors.

Reference numeral 617 denotes a voltage line over which a negative voltage $V_{BB}$ is supplied for erasing and a ground voltage Vss is supplied for reading or writing. For erasing, the negative voltage $V_{BB}$ is applied to the source of the pMOS transistor 615. For reading or writing, the ground voltage Vss is applied to the source of the pMOS transistor 615.

The pMOS transistors $616_1$ to $616_4$ are installed to prevent the word lines $WL_1$ to $WL_4$ from short-circuiting when any of the word lines $WL_1$ to $WL_4$ are selected and driven high.

Even in the twenty-fifth embodiment, similarly to the twenty-third embodiment, the negative-voltage bias circuit 610 for applying negative voltage to selected word lines for erasing is realized with simple circuitry. Channel erasing can therefore be performed with simple overall circuitry.

In the twenty-fifth embodiment, a depletion-type pMOS transistor is used as the pMOS transistor 614. Even if the threshold voltages of the pMOS transistors 614 and 615 increase due to the back-gate effect, the negative-voltage bias circuit 610 operates normally.

The capacitor 613 is realized with a depletion-type pMOS transistor. Whatever level is set at the node 618, the gate-source voltage of the capacitor 613 will not exceed the threshold voltage. A channel is formed all the time, so the amplitude of the clock pulse CLK can be transmitted to the node 618 efficiently.

Figure 91:
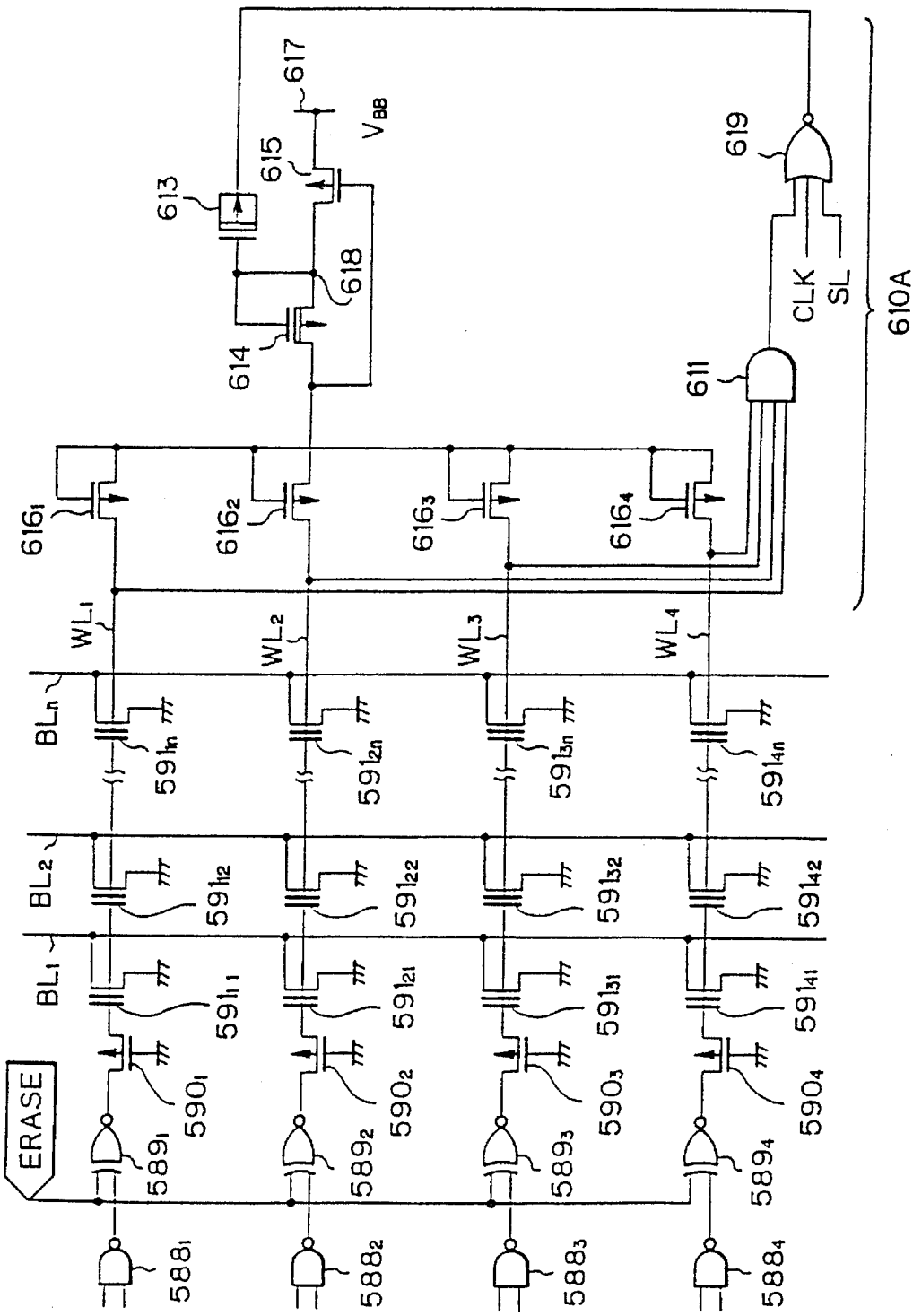
FIG. 91 is a circuit diagram showing a major section of the twenty-sixth embodiment.

FIG. 91 is a circuit diagram showing a major portion of the twenty-sixth embodiment. In the twenty-sixth embodiment, the dual-input NOR circuit 612 shown in FIG. 90 is replaced with a triple-input NOR circuit 619. A negative-voltage bias circuit 610A in the twenty-sixth embodiment supplies the output of the AND circuit 611, clock pulse CLK, and select signal SL that goes low only for erasing to the NOR circuit 619, and places only a negative voltage $V_{BB}$ on the voltage line 617. The other components of the negative-voltage bias circuit 610A are identical to those of the negative-voltage bias circuit 610 shown in FIG. 90. The other components in the twenty-sixth embodiment are identical to those in the twenty-fifth embodiment.

Even in the twenty-sixth embodiment, similarly to the twenty-fifth embodiment, the negative-voltage bias circuit 610A for applying negative voltage to selected word lines for erasing is realized with simple circuitry. Channel erasing can be performed with simple overall circuitry.

Similarly to the twenty-fifth embodiment, even if the threshold voltages of the pMOS transistors 614 and 615 increase due to the back-gate effect, the negative-voltage bias circuit 610A operates normally, and The amplitude of the clock pulse CLK can be transmitted to the node 618 efficiently.

Figure 92:
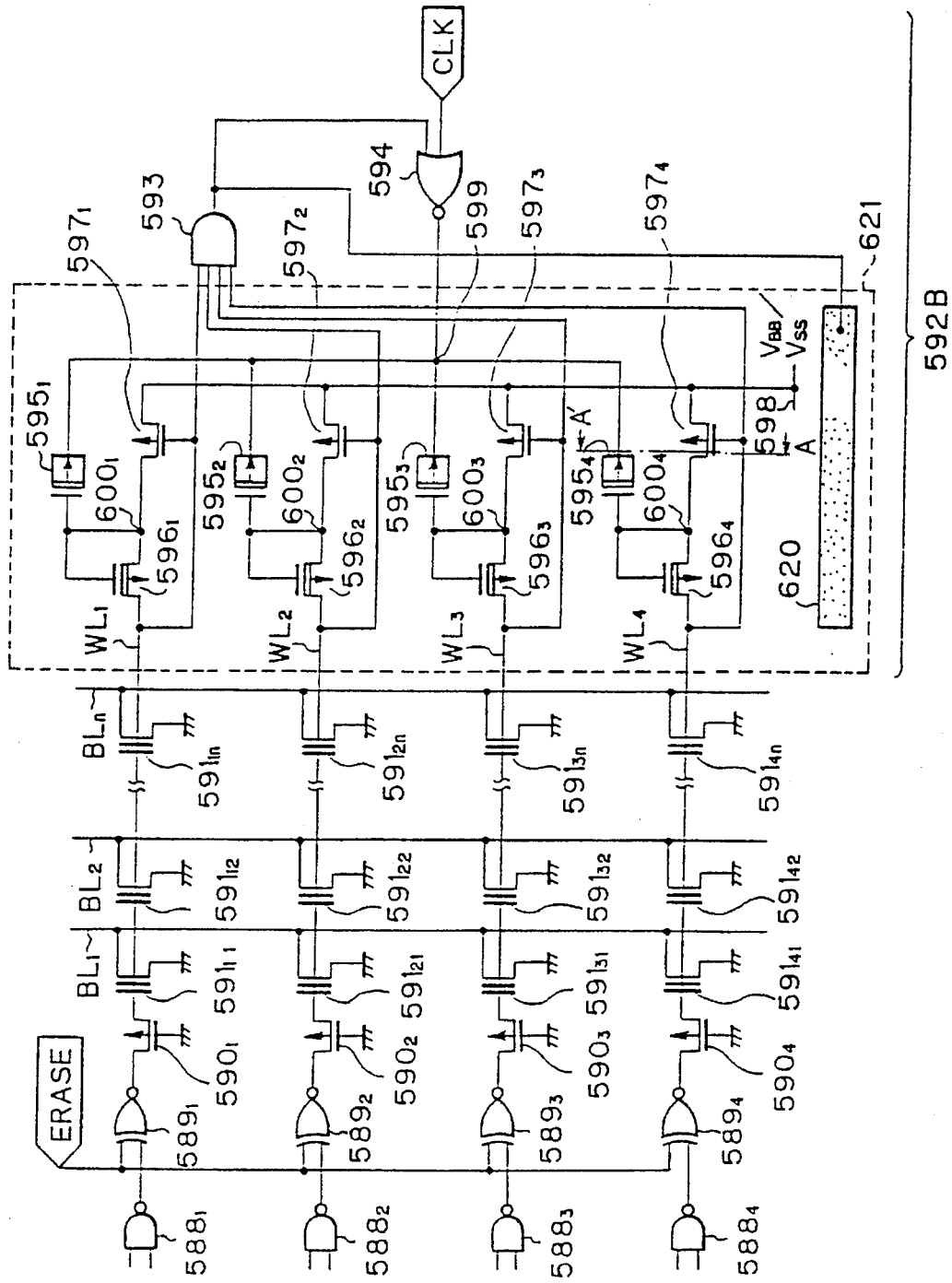
FIG. 92 is a circuit diagram showing a major section of the twenty-seventh embodiment.

FIG. 92 is a circuit diagram showing a major portion of the twenty-seventh embodiment of a semiconductor memory according to the present invention. The twenty-seventh embodiment has a negative-voltage bias circuit 592B in which the output terminal of an AND circuit 593 is connected to an n-type well 621 including capacitors $595_1$ to $595_4$ and pMOS transistors $596_1$ to $596_4$ and $597_1$ to $597_4$. The other components of the negative-voltage bias circuit 592B are identical to those of the negative-voltage bias circuit 592 shown in FIG. 85. The other components of the twenty-seventh embodiment are identical to those of the twenty-third embodiment shown in FIG. 85.

Figure 93:
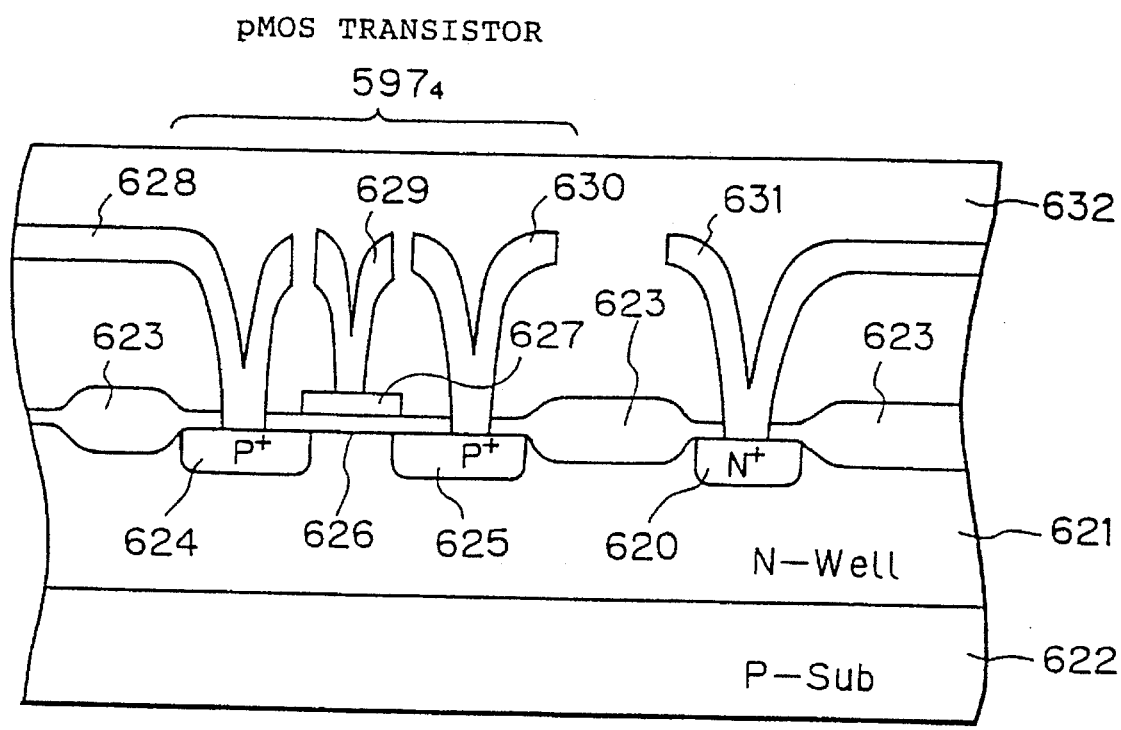
FIG. 93 shows an A—A' cross section of FIG. 92.

FIG. 93 shows an A—A' cross section of FIG. 92. In FIG. 93, reference numeral 622 denotes a p-type silicon substrate; 623 denotes a field oxide film; 624 denotes a drain that is a $p^+$-type diffused layer; 625 denotes a source that is a $p^+$-type diffused layer; 626 denotes a gate oxide film; 627 denotes a gate made of poly-silicon; 628 to 631 denote wiring layers made of aluminum; and 732 denotes an insulating layer.

According to the twenty-seventh embodiment, similarly to the twenty-third embodiment, the negative-voltage bias circuit 592B for applying negative voltage to selected word lines for erasing has simple circuitry. Channel erasing can therefore be performed with simple overall circuitry.

Similarly to the twenty-third embodiment, even if the threshold voltages of the pMOS transistors $596_1$ to $596_4$ and $597_1$ to $597_4$ increase due to the back-gate effect, the negative-voltage generator 592B operates normally. The amplitude of the clock pulse CLK can therefore be transmitted to the nodes $600_1$ to $600_4$ efficiently.

According to the twenty-seventh embodiment, the bias voltage for the n-type well 621 in which the capacitors $595_1$ to $595_4$ and pMOS transistors $596_1$ to $596_4$ and $597_1$ to $597_4$ are formed is set to the ground voltage Vss with the output of the AND circuit 593. Electric fields arising in the oxide film at the gates of the pMOS transistors $596_1$ to $596_4$ and $597_1$ to $197_4$ are therefore alleviated to eliminate a possibility that the pMOS transistors $596_1$ to $596_4$ and $597_1$ to $597_4$ may be cut off due to the back-gate effect.

Figure 94:
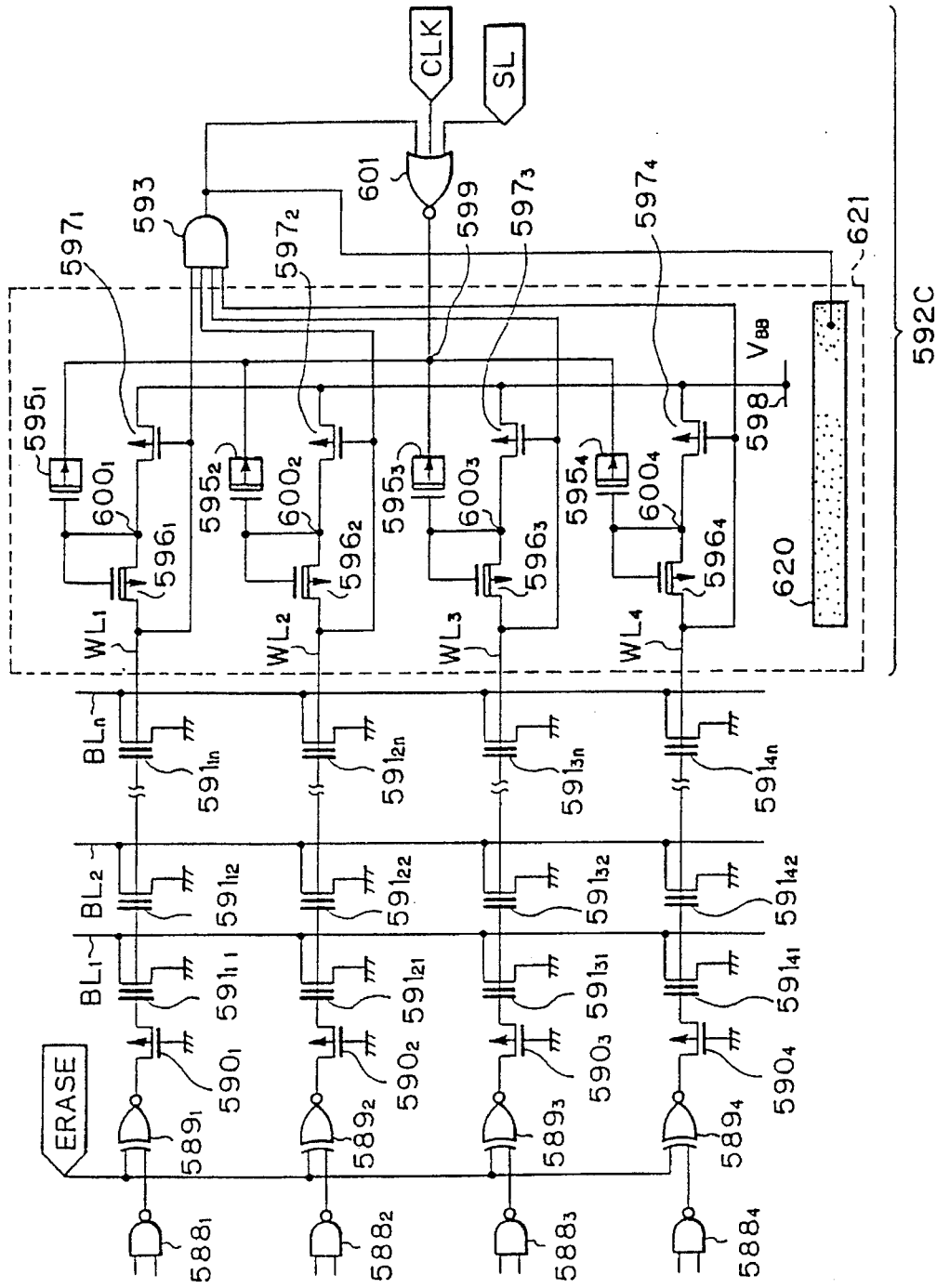
FIG. 94 is a circuit diagram showing a major section of the twenty-eighth embodiment.

FIG. 94 is a circuit diagram showing a major portion of the twenty-eighth embodiment. The twenty-eighth embodiment includes a negative-voltage bias circuit 592C in which a triple-input NOR circuit 601 is installed instead of the dual-input NOR circuit 594 shown in FIG. 92, and the output of the AND circuit 593, clock pulse CLK, and select signal SL that is driven low only for erasing are supplied to the NOR circuit 601. The other components of the negative-voltage bias circuit 592C are identical to those in the negative-voltage bias circuit 592B shown in FIG. 92. The other components of the twenty-eighth embodiment are identical to those of the twenty-seventh embodiment shown in FIG. 92.

Even in the twenty-eighth embodiment, similarly to the twenty-seventh embodiment, the negative-voltage bias circuit 592C for applying negative voltage to selected word lines is realized with simple circuitry. Channel erasing can therefore be performed with simple overall circuitry.

Similarly to the twenty-seventh embodiment, even if the threshold voltages of the pMOS transistors $596_1$ to $596_4$ and $597_1$ to $597_4$ increase due to the back-gate effect, the negative-voltage bias circuit 592C operates normally. The amplitude of the clock pulse CLK can therefore be transmitted to the nodes $600_1$ to $600_4$.

In the twenty-eighth embodiment, electric fields arising in the oxide film at the gates of the pMOS transistors $c596_1$ to $596_4$ and $597_1$ to $597_4$ are alleviated to eliminate the possibility of the pMOS transistors $596_1$ to $596_4$ and $597_1$ to $597_4$ being cut off.

As described above, according to the negative-voltage bias circuit based on the seventh mode of the present invention, negative voltage can be applied with simple circuitry. When the negative-voltage bias circuit is used as a negative-voltage bias circuit for biasing word lines negatively in, for example, a channel-erasing type flash memory, channel erasing can be performed with simple overall circuitry.

When a depletion-type pMIS transistor is used as a capacitor, the gate-source voltage will not exceed the threshold voltage. A channel is formed in the transistor all the time. The amplitude of a clock pulse CLK can therefore be transmitted to a node efficiently.

When the bias voltage for a well or substrate in which pMIS transistors 11 and 12 are formed is set to a ground voltage, electric fields arising in the oxide film at the gates of the pMIS transistors are alleviated to eliminate the possibility of the pMIS transistors being cut off due to the back-gate effect.

Using a flash memory based on the sixth mode of the present invention, since a negative-voltage bias circuit is used to negatively bias word lines for specifying cell transistors, channel erasing can be performed with simple overall circuitry.

As apparent from the previous description, in a flash memory, the electrode voltages of a memory cell transistor differ from the read mode to the write (or erase) mode. Therefore, the internal supply voltage must be changed for each mode.

Figure 95:
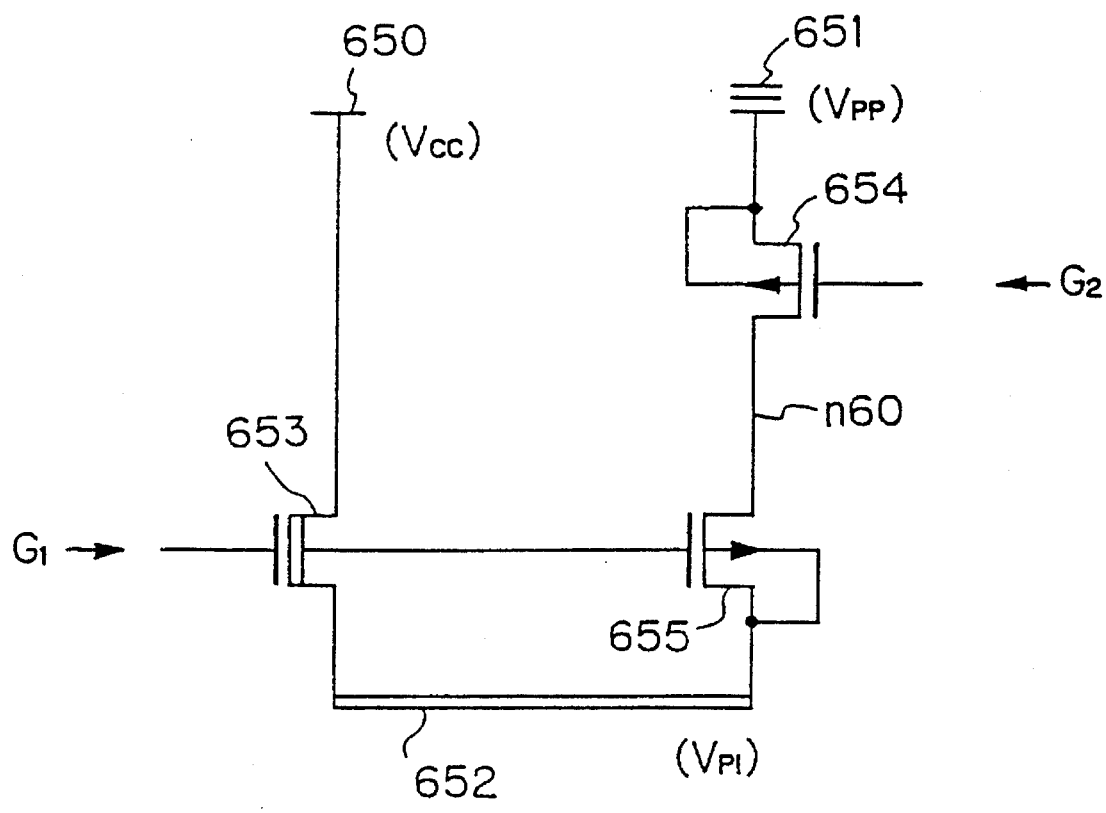
FIG. 95 shows an example of a conventional internal power switching circuit.

FIG. 95 shows the components of a typical internal power switching circuit of a prior art.

Reference numeral 650 denotes a power line (hereinafter, external power line) on which an external power supply Vcc of, for example, +5 V is placed. 651 denotes a power line (hereinafter, external power line) on which an external power supply Vpp of, for example, +12 V is placed; and 652 denotes a power line (hereinafter, internal power line) for an internal power supply $V_{PI}$ that is connected to a control electrode of a memory cell transistor via a row decoder which is not shown.

AMOS transistor 653, which is turned on when a signal G1 is high, is connected between the external power line 650 and internal power line 652. AMOS transistor 654, which is turned on when a signal G2 is low, and a MOS transistor 655, which is complementary to the transistor 653, that is, which turned on when the transistor 653 is off, are connected in series with each other via a node n60. The MOS transistor 653 is of the n-channel depletion type, and the MOS transistors 654 and 655 are of the p-channel enhancement type. The well (n type) of the transistor 654 is connected to the external power line 651, and the well (n type) of the transistor 655 is connected to the internal power line 652.

According to the foregoing circuitry, when the signals G1 and G2 are driven high, the transistor 653 is turned on and the transistors 654 and 655 are turned off. The voltage (Vcc of +5 V) of the external power line 650 is reflected in the internal power line 652. On the contrary, when the signals G1 and G2 are driven low, the transistor 653 is turned off and the transistors 654 and 655 are turned on. The voltage (Vpp of +12 V) of the external power line is reflected in the internal power line 652. When the levels of the signals G1 and G2 are controlled for each of read and write modes, an internal supply voltage $V_{PI}$ representing a voltage (Vcc or Vpp) suitable for each mode can be generated.

Figure 96:
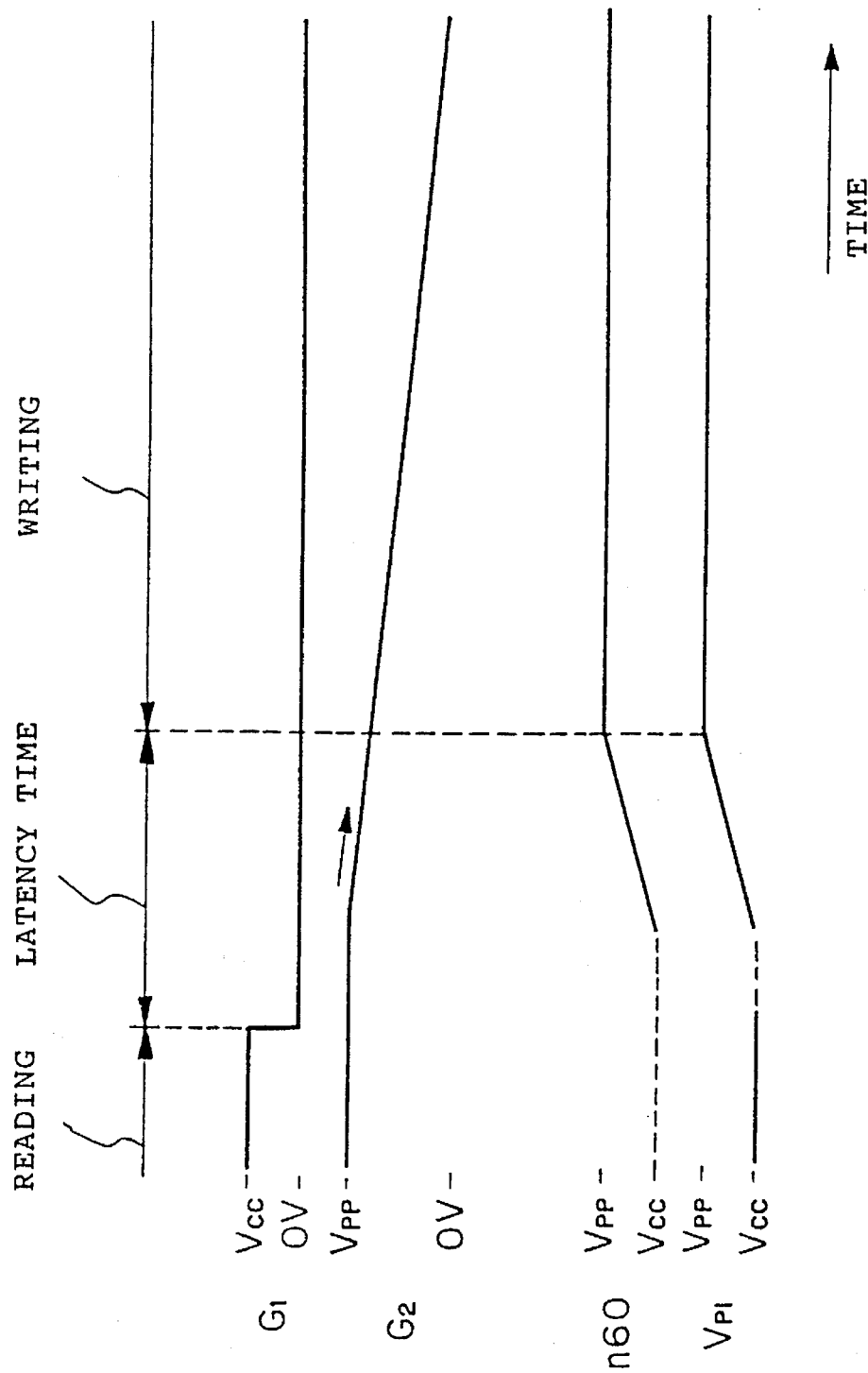
FIG. 96 shows waveforms showing the operations of FIG. 95.

FIG. 96 is an actual timing chart of a prior art. In read mode, the signal G1 is high (Vcc of +5 V) and the signal G2 is high (Vpp of +12 V). As a result, equals to Vcc (+5 V).

For transition to the write mode, first, the signal G1 is driven low. This turns off the transistor 653 and turns on the transistor 655. Thereafter, the level of the signal G2 is decreased gradually to be low. The voltage at the node n60 becomes $V_{PI}$ (+5 V) because the transistor 655 is turned on. After time elapses, when the level of the signal G2 decreases to such an extent that the transistor 654 is turned on, the external power line 651 and node n60 are connected to each other via the transistor 654. The node n60 is connected to the internal power line 652 via the transistor 655 which has already been turned on. Current therefore flows from the external power line 651 to the internal power line 652. Eventually, $V_{PI}$ is switched to Vpp (+12 V).

In transition to the write mode, the level of the signal G2 is decreased gradually. The reason will be described below. That is to say, when the level of the signal G2 (gate level of the transistor 654) is driven low (0 V) quickly, an enormous channel current $i_{ch2}$ proportional to a difference between the Vpp (+12 V) and gate level (0 V) flows through the transistor 654. At this time, only a limited channel current $i_{ch3}$ proportional to a relatively small difference between the voltage at the node n60 (+5 V) and gate level (0 V) flows through the transistor 655. A residual current $(i_{ch2}-i_{ch3})$ flows from the p-channel diffused layer in the source region (node n60) of the transistor 655 into the n-type well. A large substrate current then develops.

As a result, a parasitic pnpn thyristor is turned on, and a MOS device is held at low impedance. Thus a fatal phenomenon; that is, a latch-up phenomenon is likely to occur.

Figure 97:
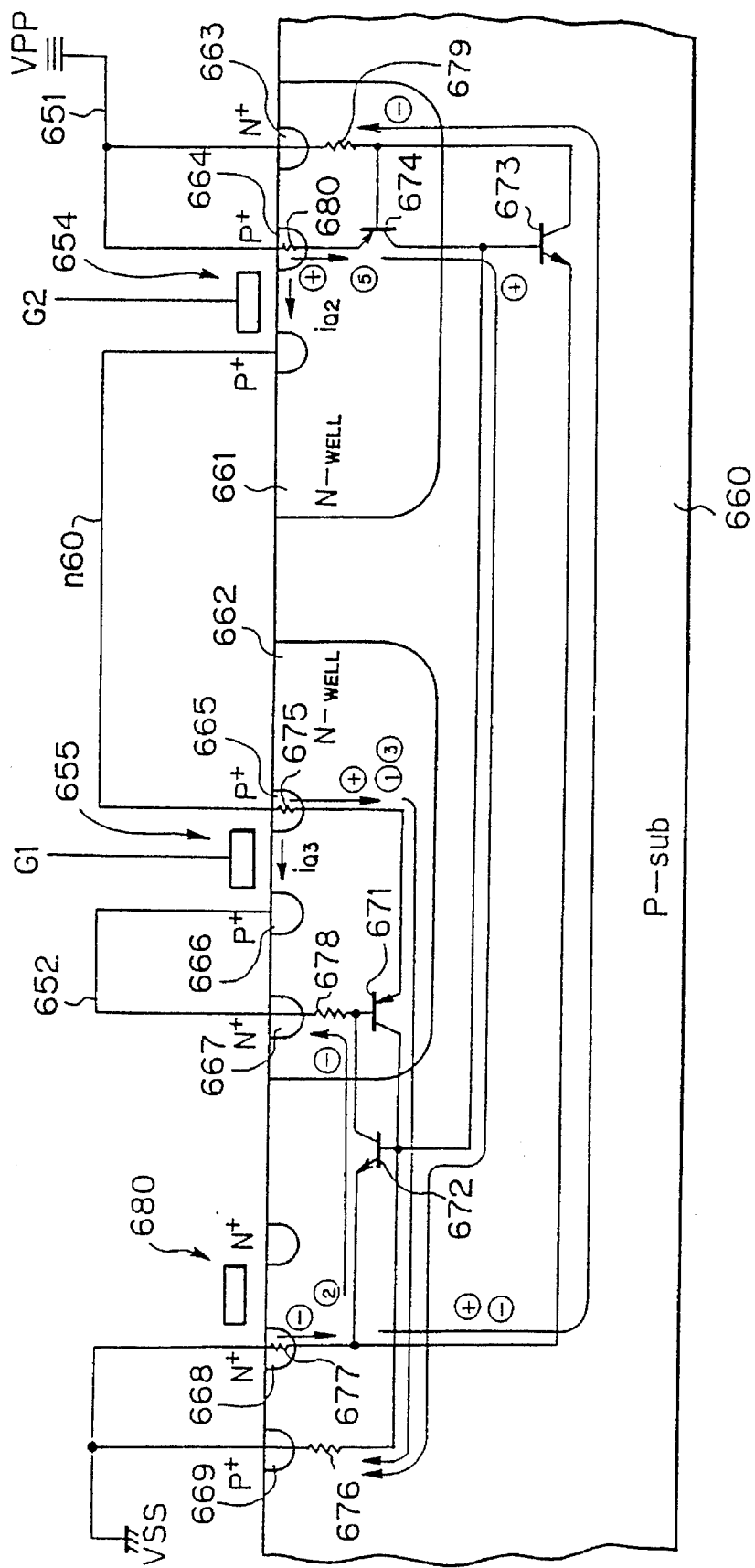
FIG. 97 is an explanatory diagram for occurrence of a latch-up.
Figure 98:
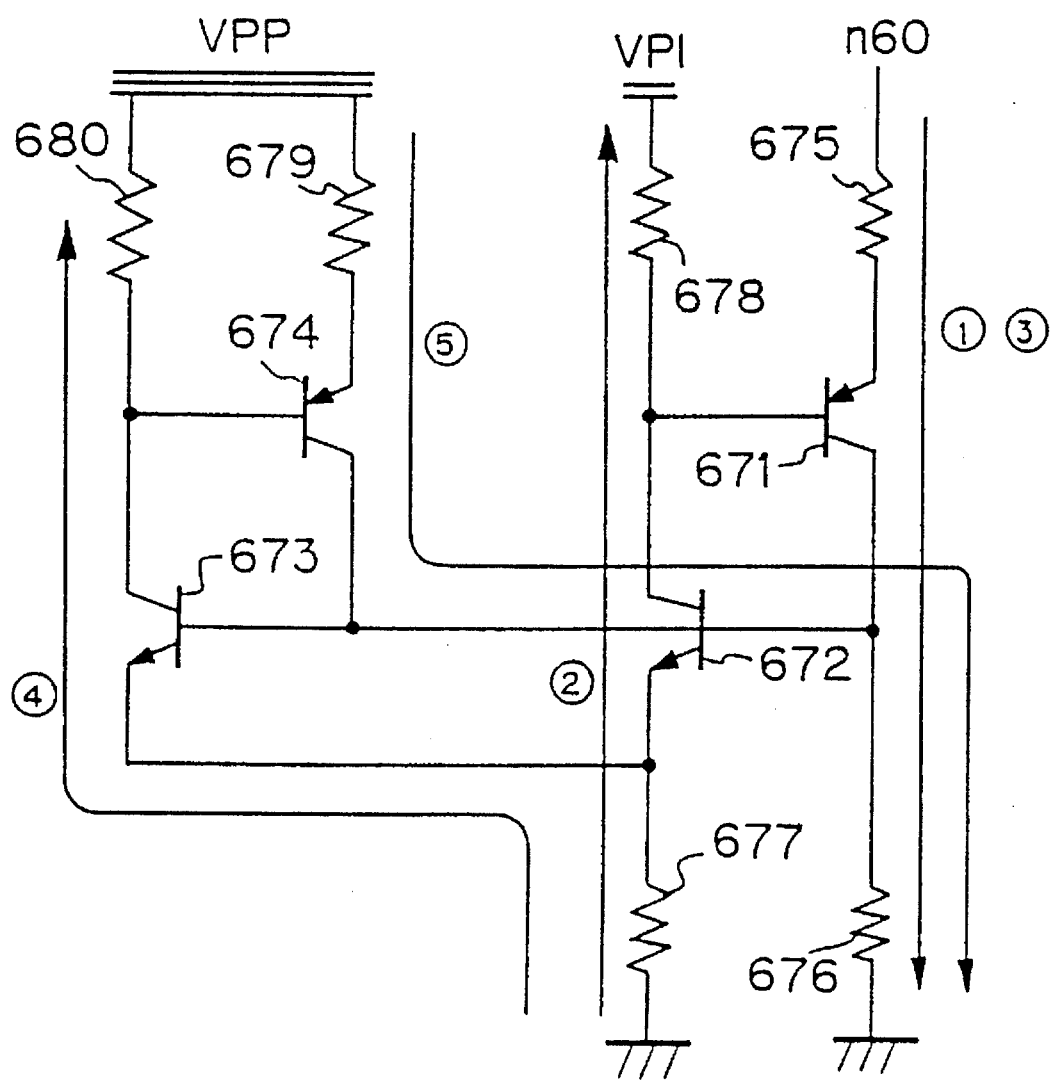
FIG. 98 is an equivalent circuit of FIG. 97.

A mechanism for causing a latch-up will be described briefly. FIG. 97 shows the structure of that portion of the internal power switching circuit in FIG. 95 corresponding to the transistors 654 and 655. FIG. 98 shows an equivalent circuit. The same components in FIGS. 97 and 98 bear the same reference numerals. Referring to FIG. 98, a mechanism of occurrence of a latch-up will be described. In FIG. 98, − denotes an electron, and + denotes a hole.

When the signal G1 is 0 V, the signal G2 changes from Vpp to 0 V. Currents $i_{Q2}$ and $i_{Q3}$ flow. When the node n60 floats by about 0.7 V or more from the n-type well 662 whose voltage is $V_{PI}$, the p$^+$n junction is biased in the forward direction. Holes are injected from the p$^+$-type region into the n-type well 662 along a route 1. The holes are minority carriers within the n-type well. When diffused, the holes reach the well boundary and flow into the p-type substrate 660. Within the p-type substrate 660, the holes behave as majority carriers and flow into a p$^+$-type contact 669.

At this time, a resistor 676 placed between the p$^+$-type contact 669 and a source n$^+$ 668 of an n-channel transistor 680 located on the other periphery causes the substrate voltage to partly rise. When the substrate voltage arising near the source n$^+$ 668 rises by about 0.7 V, the n$^+$p junction is biased in the forward direction. As a result, electrons are injected from the source n$^+$ 668 to the p-type substrate 660 as indicated with 2. When diffused, the electrons reach the well boundary and flow into a contact n$^+$ 667 of the n-type well 662. The voltage drop resulting from the current and resistance of the resistor 678 causes the voltage of the n-type well near a source p$^+$ 665 of a p-channel transistor 655 to decrease. The p$^+$n junction is then biased in the forward direction. Holes are injected again from the source p$^+$ 665 into the n-type well 662. This increases substrate current. Positive feedback is thus repeated.

Due to the rise in substrate voltage, electrons injected from the n$^+$-type source 668 to the p-type substrate 660 are diffused to move within the p-type substrate, and then flow into the n-type well 661 whose voltage is $V_{PP}$. Within the n-type well 661, electrons flow as majority carriers into an n$^+$-type source 663. The voltage of the n-type well 661 partly decreases because of a voltage drop caused by a resistor 679 located between the contact of the n$^+$-type source 663 and the p$^+$-type source 664 of a p-channel transistor 654. When the voltage of the n-type well 661 in the vicinity of the p$^+$-type source 664 drops by about 0.7 V, the p$^+$n junction is biased in the forward direction. As a result, holes are injected from the p$^+$-type source 664 to the n-type well 660 as indicated by 5. The holes reach the well boundary while diffusing, and then flow into the contact of the p-type substrate 660 with the p$^+$-type source 669. The current and resistance of the resistor 676 boost the substrate voltage.

Consequently, the n$^+$p junction is biased in the forward direction. Electrons are injected from the n$^+$-type source to the p-type substrate again as indicated with 4. Positive feedback is thus repeated.

As a result, overcurrent steadily flows from the external power supply line Vpp to $V_{SS}$. This causes a latch-up.

In prior arts, the level of the signal G2 is decreased gradually in order to avoid an abrupt increase in channel current $i_{ch2}$. Substrate current is thus minimized to prevent occurrence of a latch-up phenomenon.

However, in this kind of conventional internal power switching circuit for a semiconductor memory, a latency time must be present between the read and write modes in order to avoid a latch-up phenomenon. The latency time includes the time constant for decreasing the level of the signal $G_1$ and the time for absorbing a manufacturing error of each transistor. Mode change cannot be speeded up, which has obstructed realization of a high-speed external memory that is freely rewritable.

An internal power switching circuit based on the eighth mode of the present invention resolves the aforesaid problems and proves effective for a flash memory or any other semiconductor memory in which the voltage levels of an internal power supply are switched.

Figure 99:
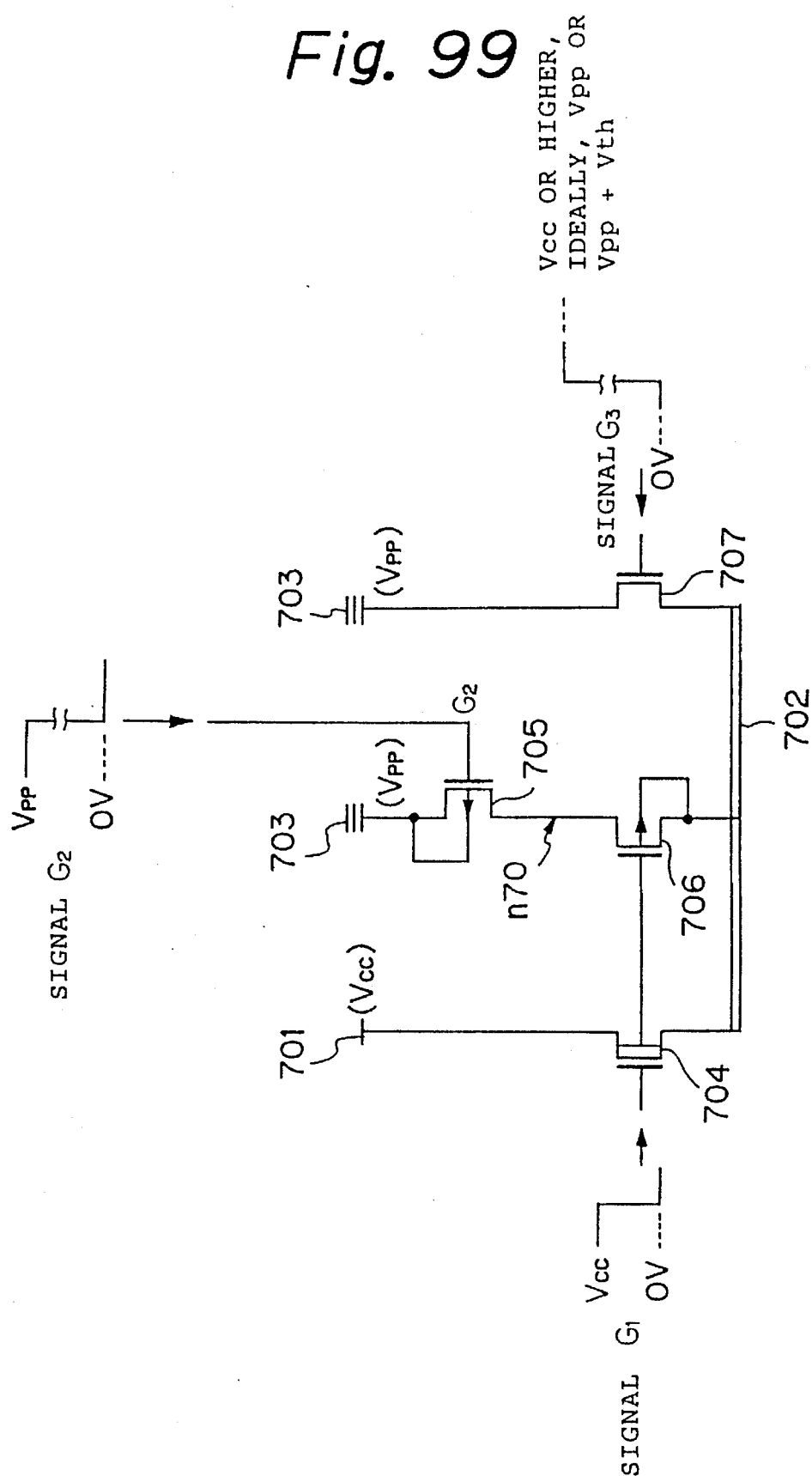
FIG. 99 is a configurational diagram showing the principle of the twenty-ninth embodiment.

FIG. 99 is an explanatory diagram for the principle of the internal power switching circuit based on the eighth mode of the present invention. As shown in FIG. 1, the internal power switching circuit based on the eighth mode of the present invention comprises a first n-channel MOS transistor 704 one of whose drain and source electrodes is connected to a first power line 701, and the other one of whose drain and source electrodes is connected to a second power line 702, a second p-channel MOS transistor 705 one of whose drain and source electrodes as well as whose well are connected to a third power line 703 of a voltage Vpp that is higher than the voltage Vcc of the first power line 701, and the other of whose drain and source electrodes is connected to a node n70, and a third p-channel MOS transistor 706 one of whose drain and source electrodes is connected to the node n70 and the other of whose drain and source electrodes as well as whose well are connected to the second power line 702. The internal power switching circuit further includes a fourth n-channel MOS transistor 707 one of whose drain and source electrodes is connected to the third power line 703 and the other of whose drain and source electrodes is connected to the second power line 702.

In the foregoing circuit, if the n-channel transistor 707 is turned on during transition from the read mode to write mode, the voltage $V_{PI}$ of the second power line 702 is lifted via the n-channel transistor 707 and exceeds the voltage Vcc of the first power line 702 (the lift-up voltage depends on the gate voltage of the n-channel transistor 707). The lifted $V_{PI}$ is transmitted to the node n70 via the p-channel transistor 706 that is on.

During mode transition, the voltage at the node n70 is boosted to exceed at least Vcc. The drain-source voltage (equivalent to a potential difference between the n70 and Vpp) can therefore be decreased to minimize the channel current of the p-channel transistor 705. Furthermore, the gate-source voltage (equivalent to a potential difference between G1 and n1) of the p-channel transistor 706 can be increased to expand the channel current-carrying capacity of the p-channel transistor 706. As a result, the channel current in the p-channel transistor 706 is balanced with the channel current in the p-channel-transistor 705. Consequently, substrate current is minimized to prevent occurrence of a latch-up phenomenon reliably.

In the internal power switching circuit based on the eighth mode, even when the gate level of the p-channel transistor 705 is driven low abruptly, a latch-up phenomenon does not occur. The latency time at the time of mode transition can be minimized to be equal to the time required to lift up the level of the node n70. The eighth mode can thus provide an internal power switching art helpful in realizing a high-speed external memory that can be freely rewritable.

The twenty-ninth embodiment based on the eighth mode of the present invention will be described in conjunction with the drawings.

FIGS. 100 to 108 show this embodiment in which the present invention is implemented in a flash memory.

Figure 100:
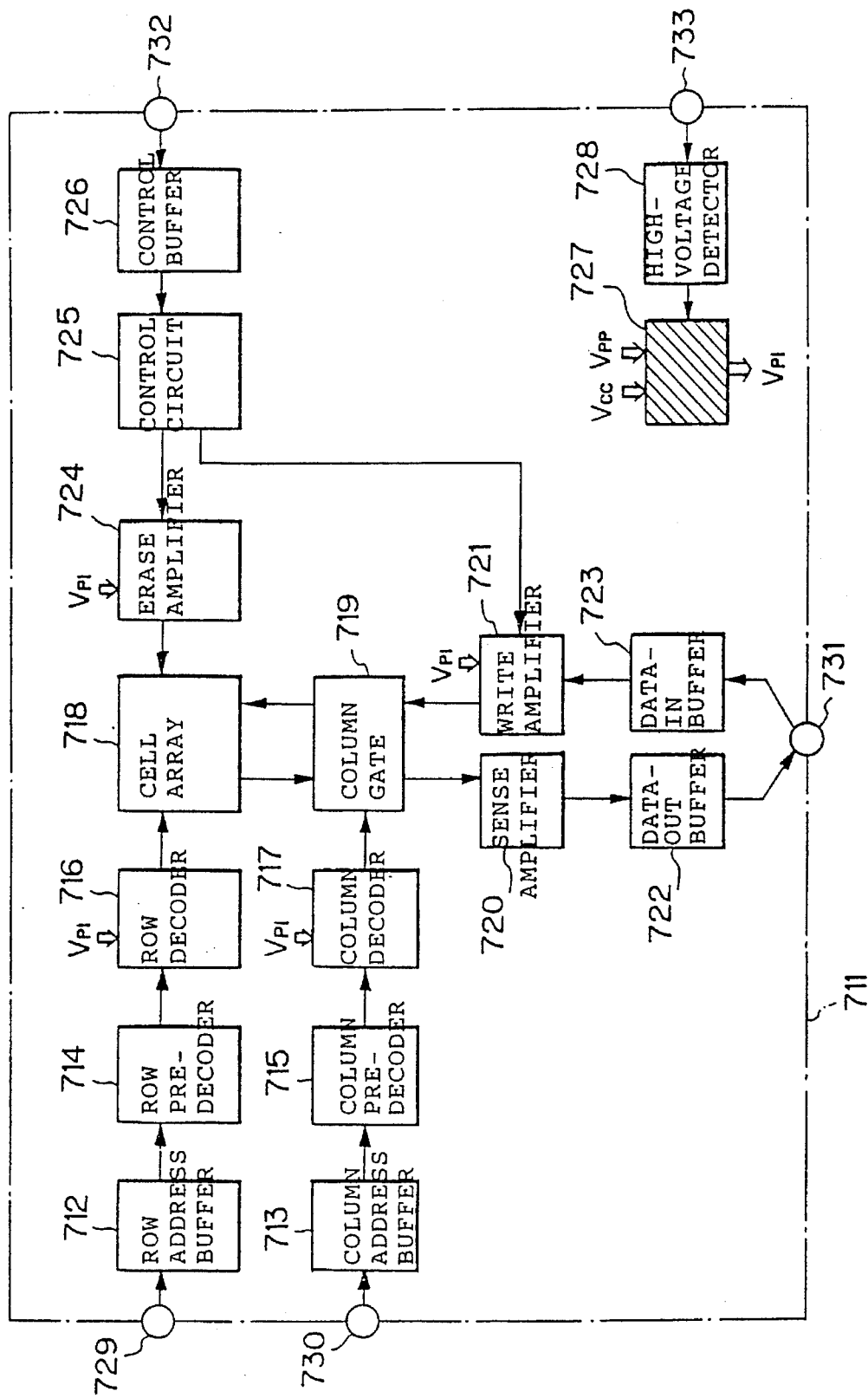
FIG. 100 is an overall block diagram showing a flash memory of the twenty-ninth embodiment.

To begin with, the configuration will be described. In FIG. 100, reference numeral 711 denotes a flash memory (hereinafter, EEPROM). The EEPROM 711 comprises a row address buffer 712, a column address buffer 713, a row pre-decoder 714, a column pre-decoder 715, a row decoder 716, a column decoder 717, a memory cell array 718, a column gate 719, a sense amplifier 720, a write amplifier 721, a data-out buffer 722, a data-in uffer 723, an erase amplifier 723, a control circuit 725, a control buffer 726, an internal power switching circuit 727, and a high-voltage detector 728. Also in the figure, 729 denotes a row address signal terminal for handling multiple bits; 730 denotes a column address signal terminal for handling multiple bits; 731 denotes a data-in/out terminal; 732 denotes a control signal terminal for handling various control signals; and 733 denotes a high-voltage power (Vpp) terminal for writing.

The internal power switching circuit 727 selects either of external supply voltages Vcc and Vpp according to the output of the high-voltage detector 728, and outputs the selected voltage as an internal supply voltage $V_{PI}$. In this example, the internal supply voltage $V_{PI}$ is supplied to each of the row decoder 716, column decoder 717, write amplifier 721, and erase amplifier 724.

Figure 101:
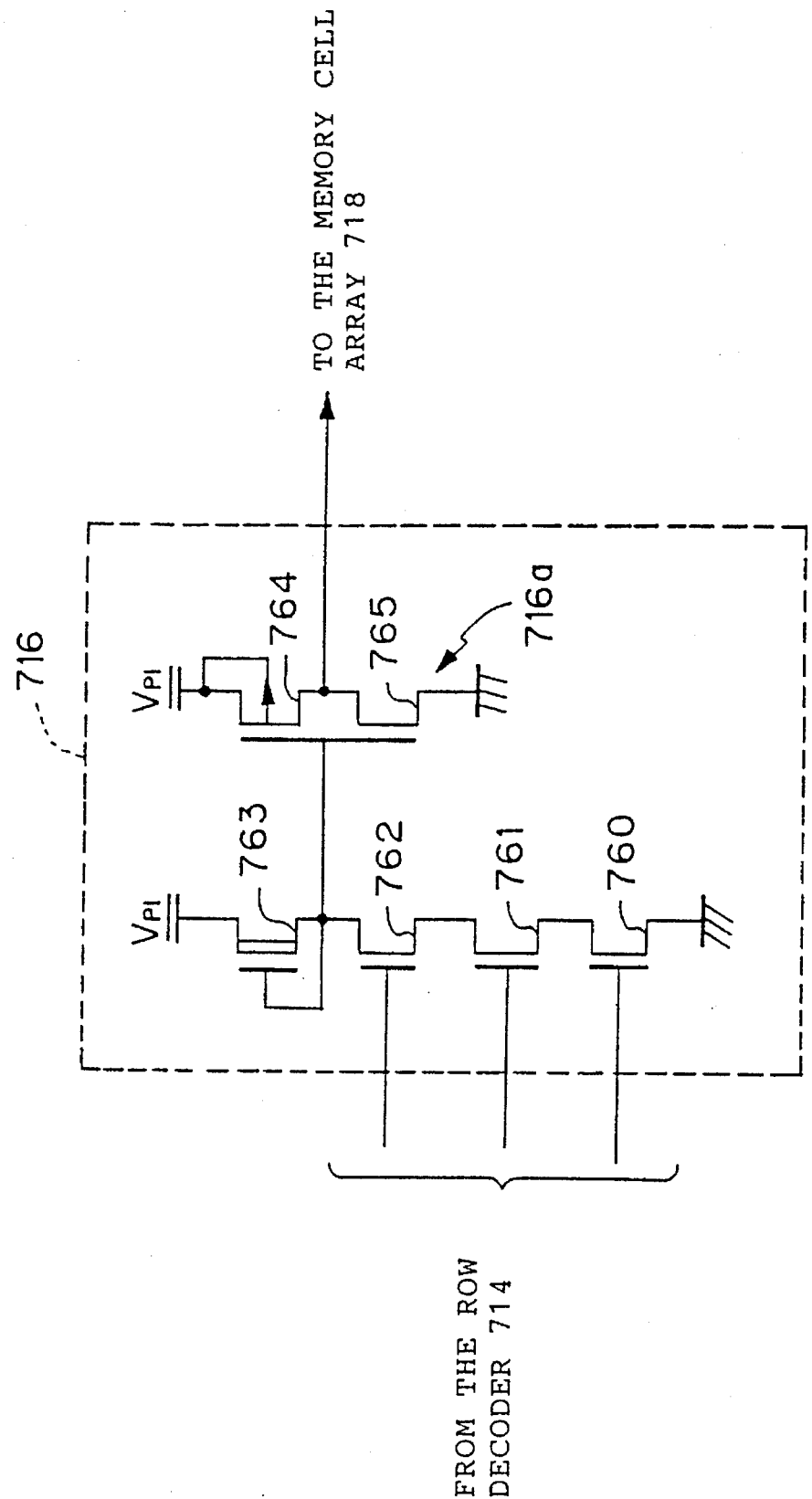
FIG. 101 shows components of a row decoder in the twenty-ninth embodiment.

FIG. 101 shows components of the row decoder 716. In the row decoder 716, multiple n-channel MOS (hereinafter, nMOS) transistors 760 to 762, which receive signals from the row pre-decoder 714 to the gates thereof, and an nMOS transistor 763 serving as a load element are connected between the internal supply voltage ($V_{PI}$) terminal and ground (0 V) terminal. When the transistors 760 to 762 are all on; that is, when the signals from the row pre-decoder 714 are all high, the output of a CMOS inverter gate 716a made up of a p-channel MOS (hereinafter, pMOS) transistor 764 and an nMOS transistor 765 represents the internal supply voltage $V_{PI}$. The output ($V_{PI}$ or 0 V) of the CMOS inverter gate 716a is connected to a word line in a memory cell array 718, and supplied to control gates of memory transistors, which are arranged in a row in the memory cell array 718, via the word line.

Figure 102:
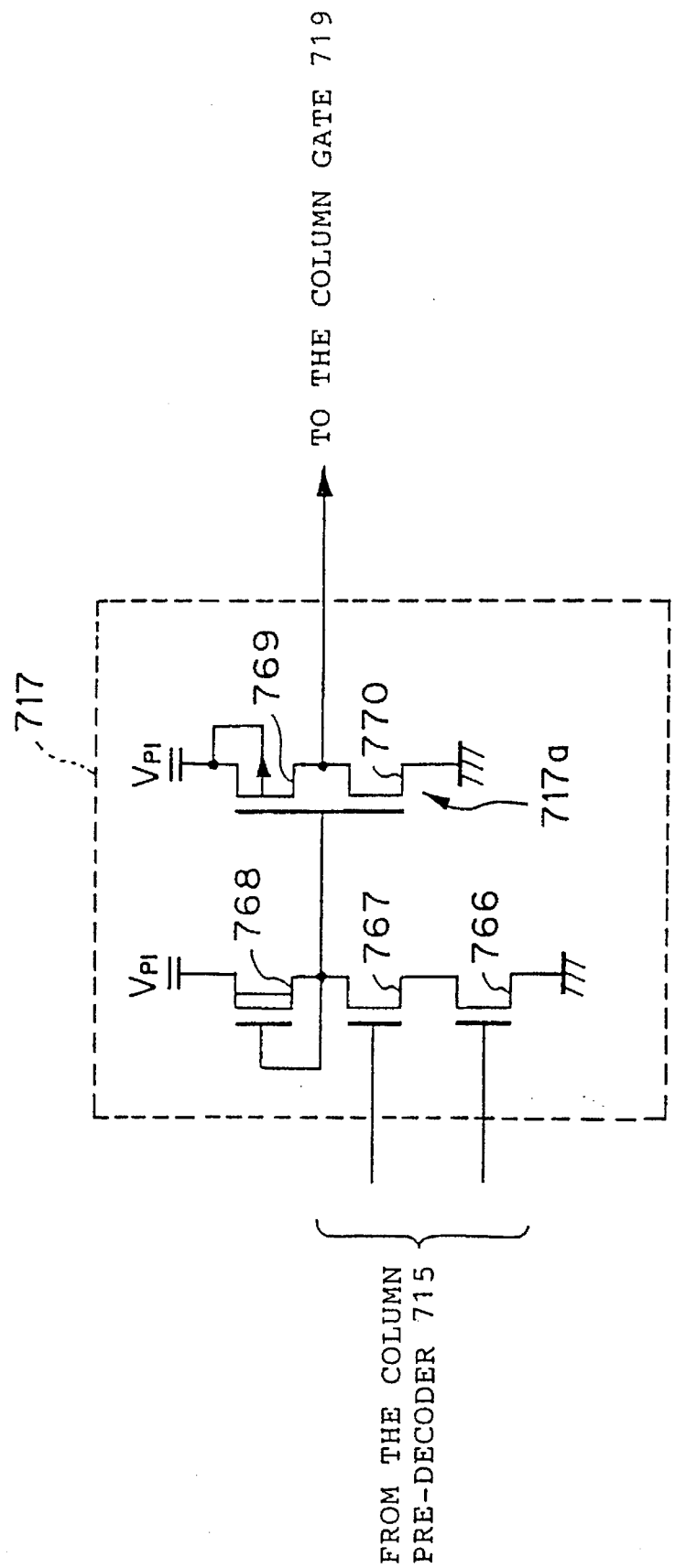
FIG. 102 shows components of a column decoder in the twenty-ninth embodiment.

FIG. 102 shows components of the column decoder 717. In the column decoder 717, multiple nMOS transistors 766 and 767, which receive signals from the column pre-decoder 715 to the gates thereof, as well as a nMOS transistor 768 serving as a load element are connected between the internal supply voltage ($V_{PI}$) terminal and ground (0 V) terminal. When the nMOS transistors 766 and 767 are all on; that is, the signals from the column pre-decoder 715 are all high, the output of a CMOS inverter gate 717a made up of a pMOS transistor 769 and an nMOS transistor 770 represents the internal supply voltage $V_{PI}$. The output of the CMOS inverter gate 717a ($V_{PI}$ or 0 V) is supplied to the gate of a transistor for selecting a bit line in the column gate 719.

Figure 103:
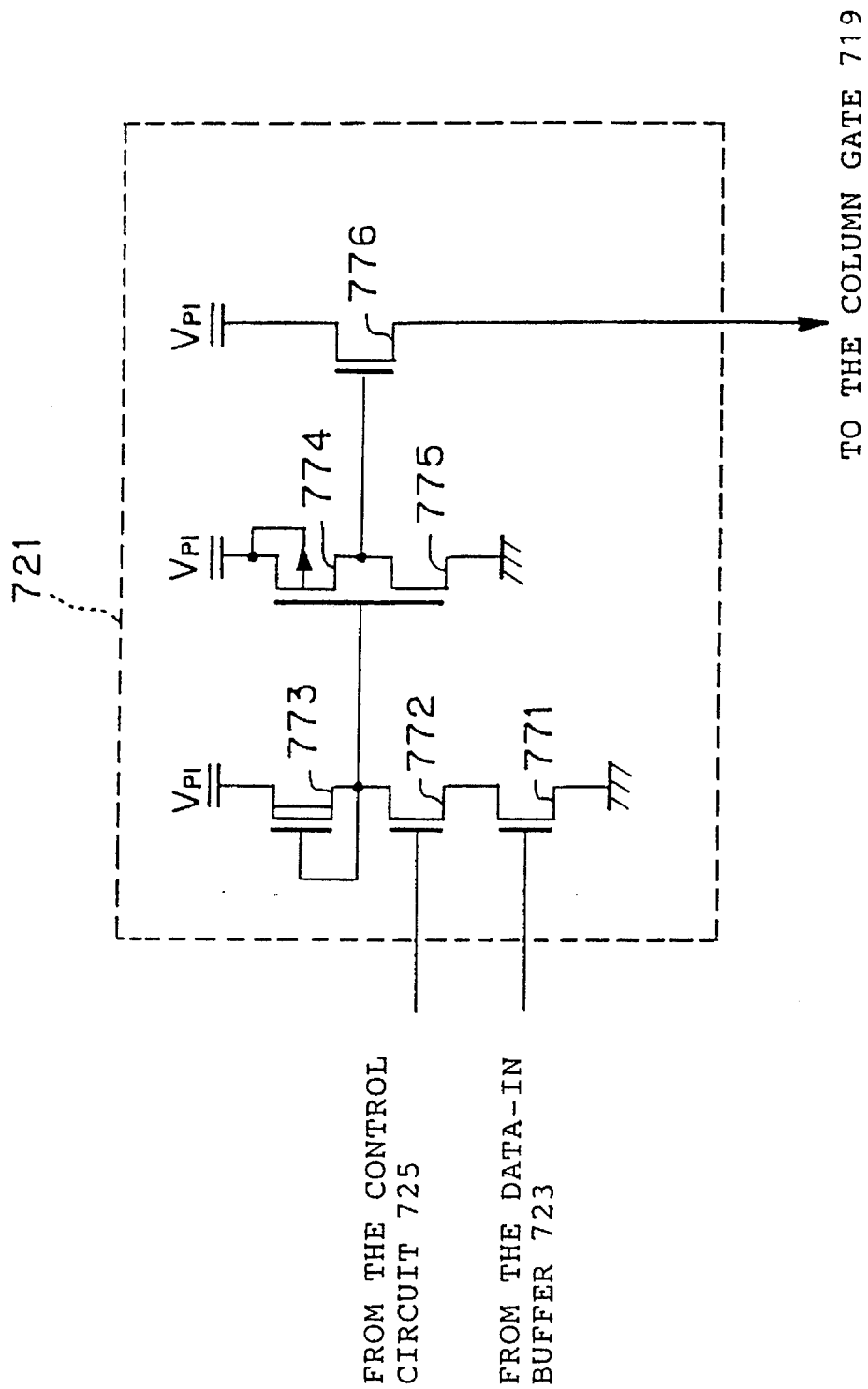
FIG. 103 shows components of a write amplifier in the twenty-ninth embodiment.

FIG. 103 shows components of the write amplifier 721. In the write amplifier 721, two nMOS transistors 771 and 772, which are turned on when a signal sent from the control circuit 725 to represent a write mode and write data fetched from the data-in buffer 723 are both high, and an nMOS transistor 773 serving as a load element are connected between the internal supply voltage ($V_{PI}$) terminal and ground (0 V) terminal. The write amplifier 721 further includes a CMOS inverter gate 721a made up of a pMOS transistor 774 and an nMOS transistor 775, and an nMOS transistor for output. When the two nMOS transistors 771 and 772 are turned on, the internal supply voltage $V_{PI}$ is supplied to a bit line specified by the column gate 719 via the output transistor 776.

Figure 104:
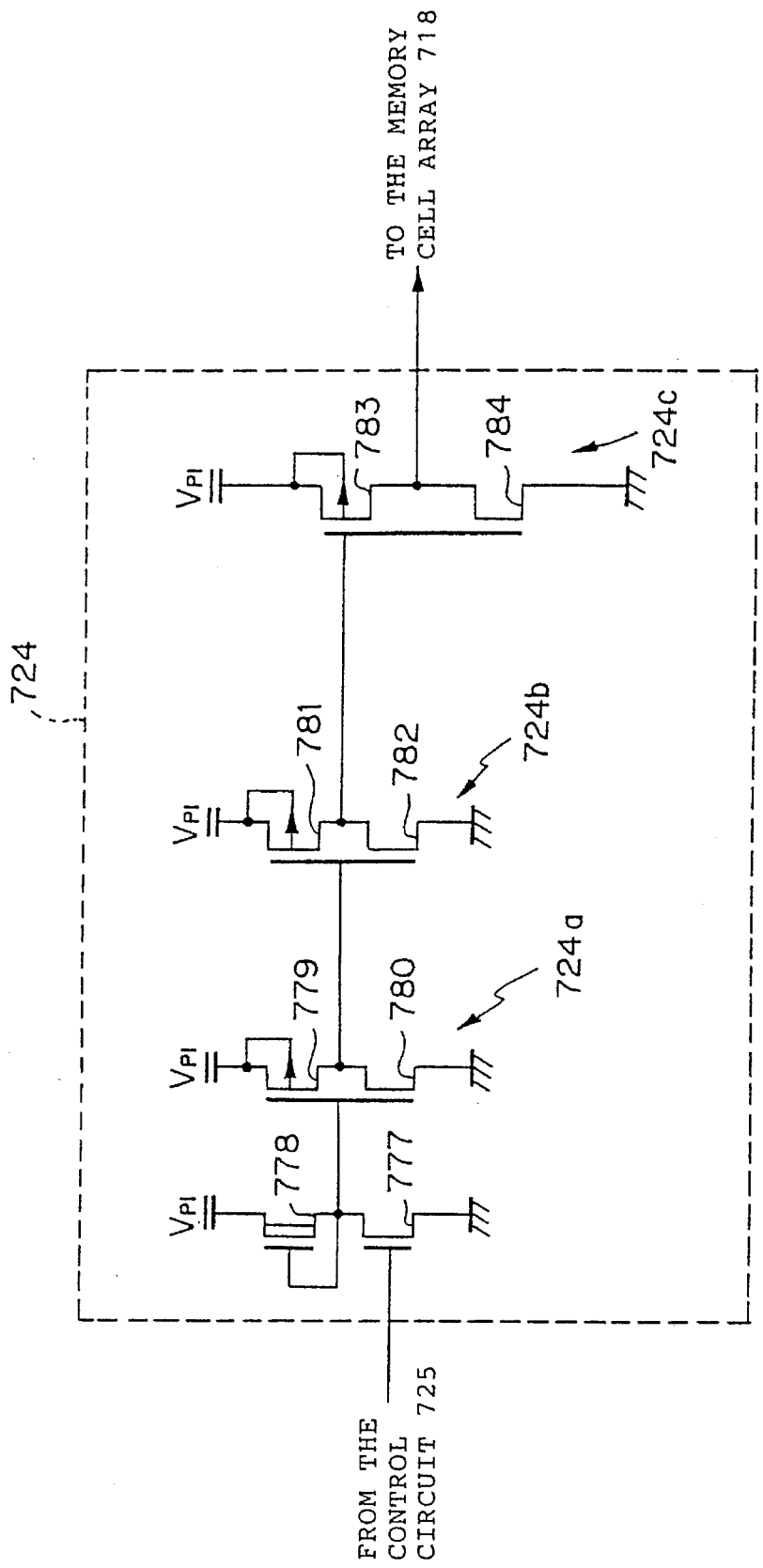
FIG. 104 shows components of an erase amplifier in the twenty-ninth embodiment.

FIG. 104 shows components of the erase amplifier 724. In the erase amplifier 724, an nMOS transistor 777, which is turned on in response to a high-level signal that is sent from the control circuit 725 and represents an erase mode, and an nMOS transistor 778 serving as a load element are connected between an internal supply voltage ($V_{PI}$) terminal and a ground (0 V) terminal. A CMOS inverter gate 724a made up of a pMOS transistor 779 and an nMOS transistor 780, a CMOS inverter gate 724b made up of a pMOS transistor 781 and nMOS transistor 782, and a CMOS inverter gate 724c made up of a pMOS transistor 783 and an nMOS transistor 784 are connected between the internal supply voltage ($V_{PI}$) terminal and ground (0 V) terminal. When the nMOS transistor 777 is on, the internal supply voltage $V_{PI}$ is supplied to all source electrodes of memory cell transistors in the memory cell array 718.

Figure 105:
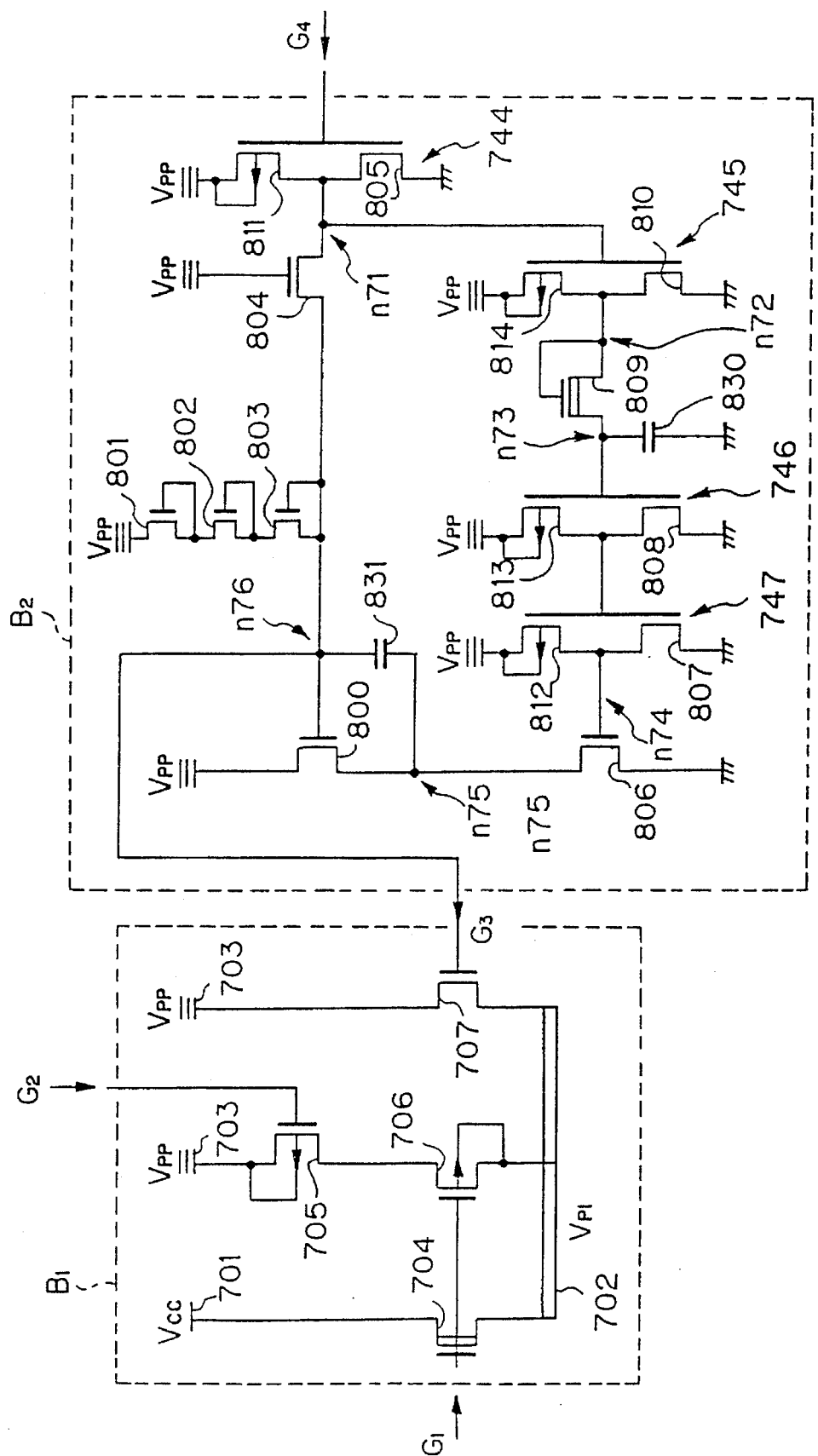
FIG. 105 shows components of blocks B1 and B2 of an internal power switching circuit in the twenty-ninth embodiment.
Figure 106:
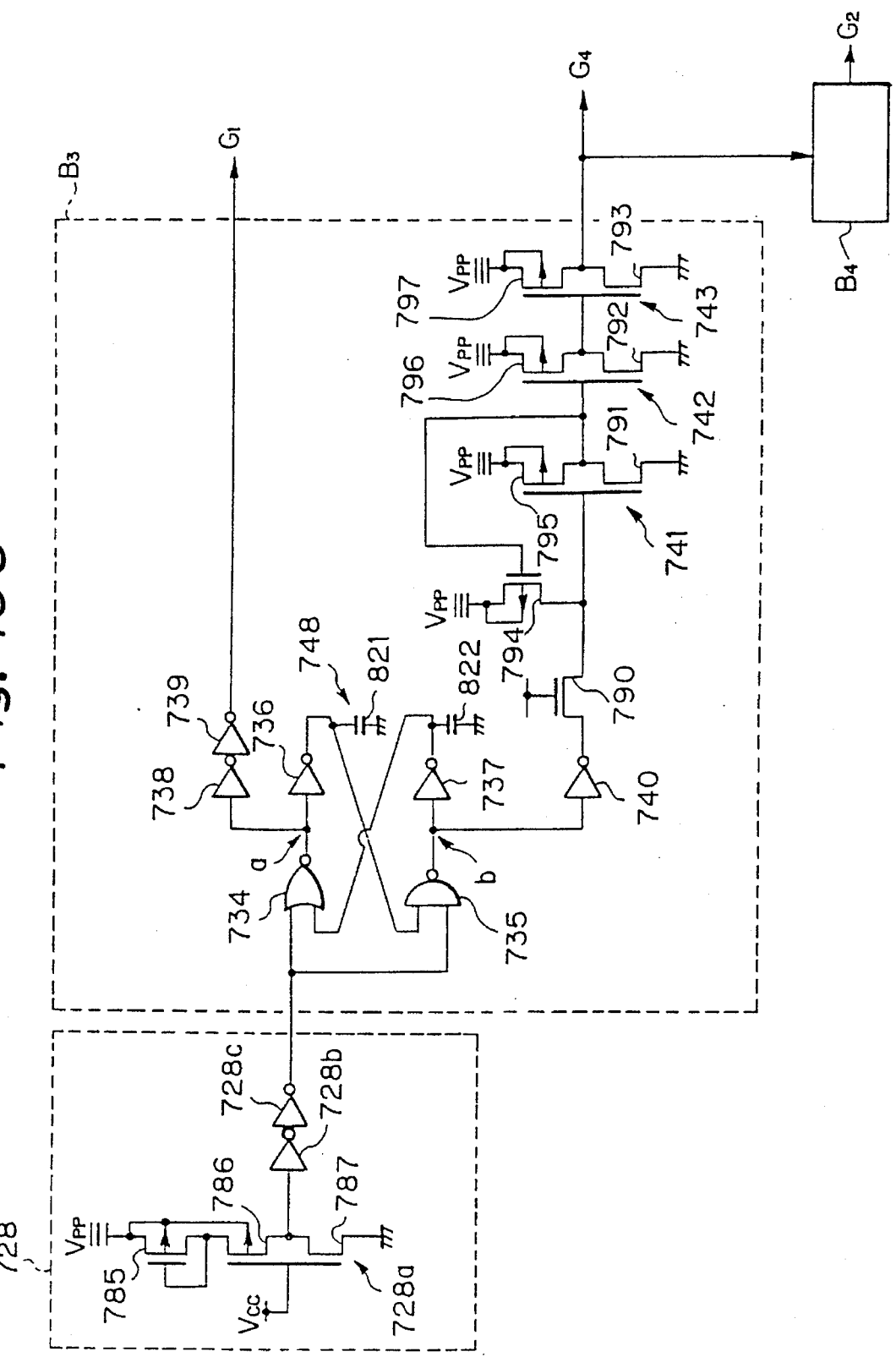
FIG. 106 shows components of blocks B3 and B4 of the high-voltage detector and internal power switching circuit in the twenty-ninth embodiment.
Figure 107:
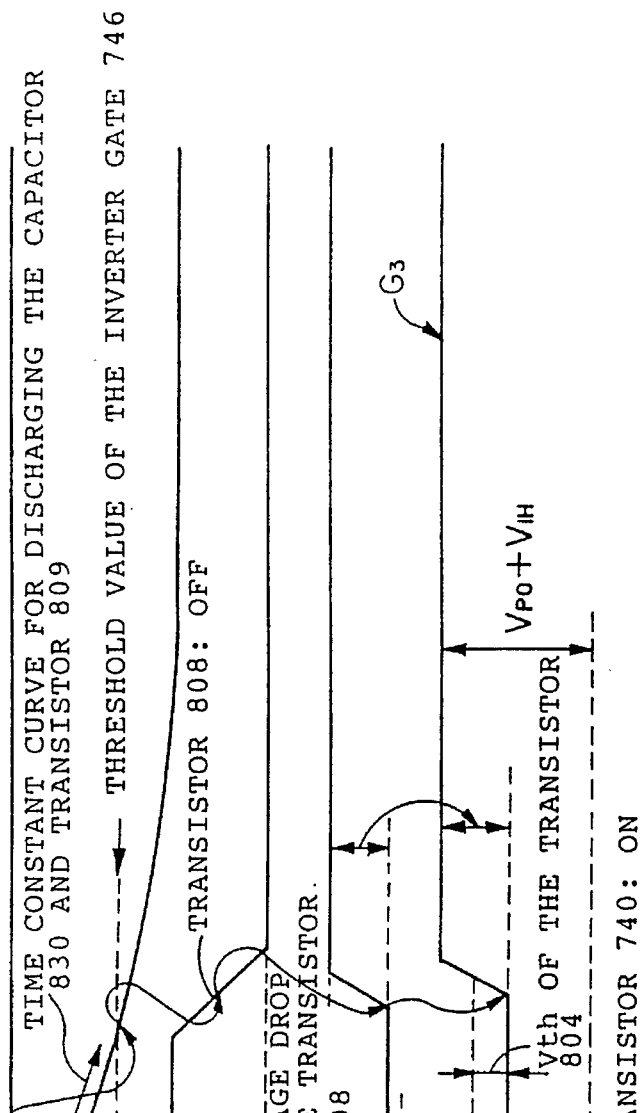
FIGS. 107A to 107G show waves indicating the process of producing a signal G3 in the block B2 of the internal power switching circuit in the twenty-ninth embodiment.

FIGS. 105 and 106 show components of the internal power switching circuit 727 and high-voltage detector 728 respectively. B1 and B2 in FIG. 105, as well as B3 and B4 in FIG. 106 denote four blocks constituting the internal power switching circuit 727. The block B1 has the same circuitry as that in FIG. 99. The same reference numerals as those in FIG. 99 are used.

Reference numeral 701 denotes a power line (first power line) for an external power supply Vcc; 702 denotes a power line (second power line) for an internal power supply $V_{PI}$; 703 denotes a power line for an external power supply Vpp (where, Vpp>Vcc); 704 denotes a first n-channel MOS transistor one of whose drain and source electrodes is connected to the first power line 701, and the other of whose drain and source electrodes is connected to the second power line 702; 703 denotes a second p-channel MOS transistor one of whose drain and source electrodes and whose well are connected to a third power line 703, and the other of whose drain and source electrodes is connected to a node n70; 706 denotes a third p-channel MOS transistor one of whose drain and source electrodes is connected to the node n70 and the other of whose drain and source electrodes and whose well are connected to the second power line 702; and 707 denotes a fourth n-channel MOS transistor one of whose drain and source electrodes is connected to the third power line 703 and the other of whose drain and source electrodes is connected to the second power line 702. The fourth n-channel MOS transistor 707 is a key circuit element in this embodiment.

The blocks B2 to B4 generate signals G1, G2, and G3 for controlling the on or off operations of the MOS transistors 704 to 707. The block B3 generates the signal G1 whose logical amplitude ranges from 0 V to Vcc and the signal G4 whose logical amplitude ranges from 0 V to Vpp in response to an output of the high-voltage detector 728. The block B4 generates a delay signal G2 for the signal G4.

When the voltage Vpp exceeds the voltage Vcc at least by the sum of a threshold voltage Vth of a pMOS transistor 785 and a threshold voltage Vth of a pMOS transistor 786 (Vpp>Vcc), the high-voltage detector 728 provides a high-level signal equivalent to Vpp–2Vth as an output of a CMOS inverter gate 728a made up of the pMOS transistor 786 and nMOS transistor 787, and outputs the high-level signal via two-stage inverter gates 728b and 728c with the phase unchanged.

When the output of the high-voltage detector 728 is high; that is, Vpp is larger than Vcc, the block B3 provides a low-level signal for two output node a and b of a state hold circuit 748 made up of a NOR gate 734, a NAND gate 735, inverter gates 736 and 737, and capacitors 821 and 822. The block B3 then fetches a signal from the node a via two-stage inverter gates 738 and 739 with the phase unchanged, and outputs the signal as a signal $G_1$. The block B3 also fetches another signal from the other node b via four-stage inverter gates 740 to 743 with the phase unchanged, and outputs the signal as a signal $G_4$. 790 to 793 denote nMOS transistors. In the figure, 794 to 797 denote pMOS transistors.

The supply voltage of the inverter gate 739 is Vcc or ground (0 V). The logical amplitude of the signal G1 ranges from 0 V to Vcc. The supply voltage of the inverter gate 741, 742, or 743 is Vpp or ground. The logical amplitude of the signal G4 ranges from 0 V to Vpp. The logical amplitude of a signal G2 fetched from the block B4 which is not shown also ranges from 0 V to Vpp. When Vpp is larger than Vcc, the signals G1, G2, and G4 are all 0 V. When Vpp is not larger than Vcc, the signal G1 is equivalent to Vcc and the signals G2 and G4 are equivalent to Vpp.

The block B2 constitutes a known bootstrap circuit, and generates a signal G3 whose logical amplitude is an extended one of the logical amplitude of the signal G4 ranging from 0 V to Vpp (180° out of phase). In FIG. 105, 800 to 810 denote D240S transistors; 811 to 814 denote pMOS transistors; 830 and 831 denote capacitors; 744 denotes an inverter gate made up of transistors 805 and 811; 745 denotes an inverter gate made up of transistors 810 and 814; 746 denotes an inverter gate made up of transistors 808 and 813; and 747 denotes an inverter gate made up of transistors 807 and 812.

FIGS. 107A to 107G show wave forms indicating a process of generating a signal, G3 in the block B2. In these waveforms, when the signal G4 drops, the voltage at the output node n71 of the inverter gate 744 rises to Vpp. At the same time, the voltage at the output node n72 of the inverter gate 745 drops to 0 V. With the voltage fluctuation at the node n71, the voltage at the node n76 rises to Vpp–Vth (Vth denotes a threshold voltage of the transistor 804). A capacitor 831 is charged with the voltage. On the other hand, charges are released from a capacitor 830 with the voltage fluctuation (VPP to 0 V) at the node n72. The voltage at the node n73 starts decreasing along the time constant curve defined by the capacitance of the capacitor 830 and the channel resistance of the transistor 809. When the voltage at the node n73 becomes lower than the threshold value of the inverter gate 746, the voltage at the node n74 decreases to 0 V and the transistor 806 is turned off.

When the transistor 806 is turned off, the voltage at the node n75 rises to Vpp–2Vth (2Vth denotes a threshold voltage of the transistors 804 and 800). This causes the voltage at the node n76 to rise to a voltage to which a voltage across the voltage capacitor 831 at the node n75 is added. That is to say, when the voltage at the node n76 rises, the voltage at the node n75 rises to a value provided by subtracting Vth (Vth denotes a threshold voltage of the transistor 800) from the voltage at the node n76. Eventually, the voltage at the node n75 becomes Vpp and the voltage at the node n76 rises to a voltage provided by adding a voltage across the capacitor 831 to the voltage at the node n75. As a result, the signal G3 whose logical amplitude is an extended one of the logical amplitude of the signal G4 ranging from 0 V to Vpp (herein, 0 V to Vpp+Vth) is generated.

Figure 108:
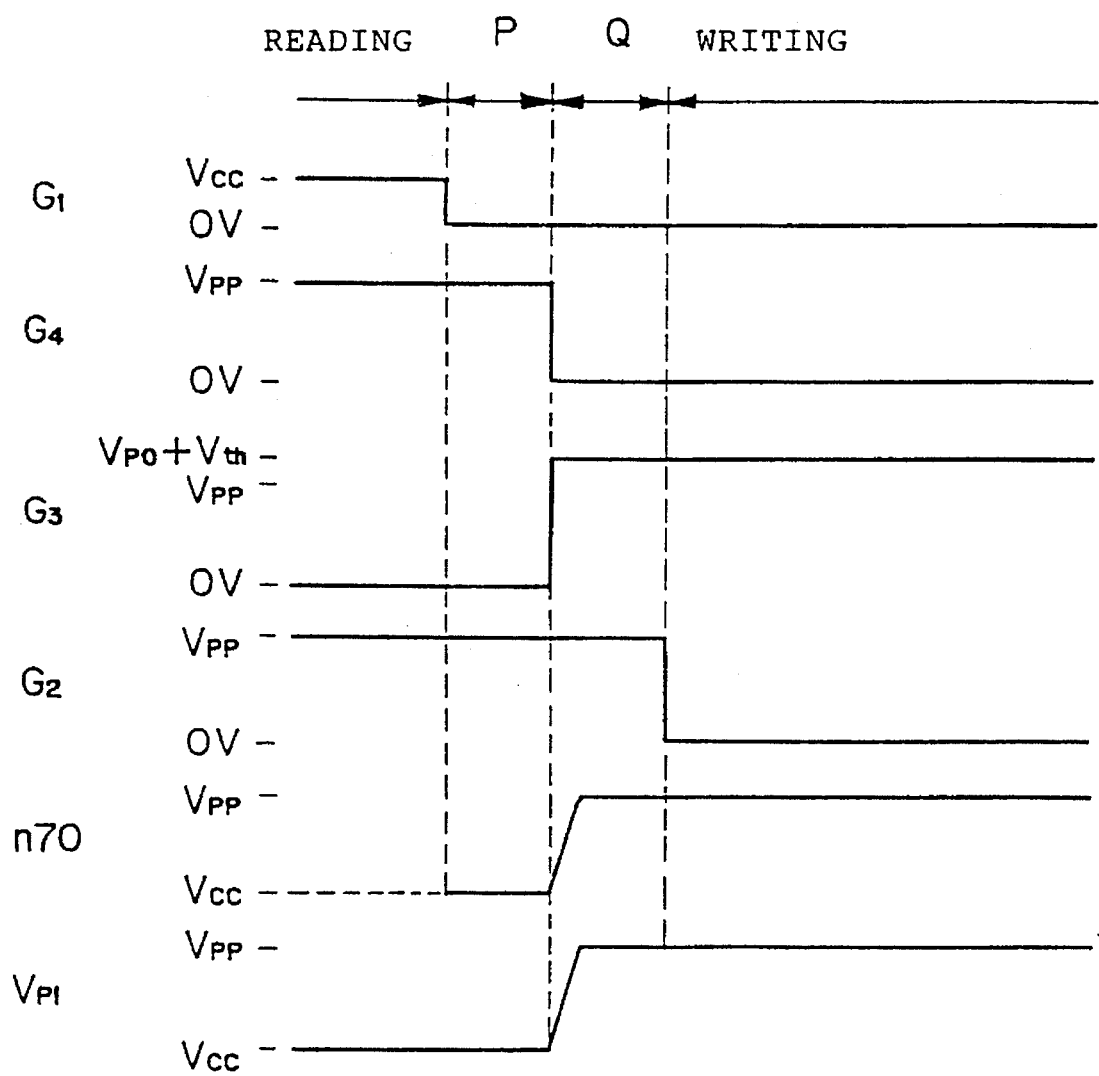
FIG. 108 shows waveforms representing the operations of the block B1 of the internal power switching circuit in the twenty-ninth embodiment.

FIG. 108 shows wave forms representing an operation of the block B1; that is, a process of switching the level of an internal supply voltage $V_{PI}$ at the time of transition from the read mode to write mode.

In FIG. 108, during the read-mode period, the signal G1 is Vcc, the signal G2 is Vpp, and the signal G3 is 0 V. Only the transistor 704 is on. During the read-mode period, $V_{PI}$ is therefore equal to Vcc.

For shifting to the write mode, during the P period, the signal G1 is set to 0 V, the transistor 704 is turned off, and the transistor 706 is turned on, and $V_{PI}$ thus remains equal to Vcc. The voltage at the node n70 is raised to Vpp (=Vcc) via the transistor 706. During the Q period, the signal G4 is set to 0 V, the signal G3 is raised to Vpp+Vth, and the transistor 707 is turned on. This causes current to flow from the third power line 703 to the second power line 702. The voltage at the transistor 707 rises to $V_{PI}$+Vpp for the Q period.

The voltage at the node n70 during the Q period is $V_{PI}$; that is, Vpp. The potential difference between the source and drain of the transistor 705 is 0 V. Even when the signal G2 is set to 0 V, a large current will not flow through the transistor 705 immediately. The potential difference between the p-channel diffused layer and n-type well in the source (node n70) of the transistor 706 becomes 0 V. Substrate current that causes a latch-up phenomenon does not flow, either. With the signal G2 held at 0 V, if writing of a memory cell is actually started, the cell current flows uninterruptedly from the third power supply 703 through the transistor 705, node n70, transistor 706, second power supply, etc., to the memory cell array 718.

As mentioned above, in this embodiment, even if the gate level of the transistor 705 is decreased to 0 V abruptly, there is no possibility that a latch-up phenomenon will occur. The latency time required for transition from the read mode to write mode (equivalent to P+Q in FIG. 108) can be minimized to be as short as that required for stable operations of devices. This results in an internal power switching art permitting fast mode change and contributing to realization of a high-speed external memory that can be freely rewritable.

In the aforesaid embodiments, the high-voltage level of the signal G3 is set to Vpp+Vth so that the $V_{PI}$ value will become a maximum voltage Vpp during the Q period. The high-voltage level of the signal G3 is not limited to Vpp+Vth. Alternatively, the high-voltage level of the signal G3 may be Vcc+Vth, Vcc+Vth to Vpp+Vth, or Vpp+Vth or more, as long as the $V_{PI}$ value will be higher than Vcc during the Q period.

The internal power switching circuit based on the eighth mode has the aforesaid circuitry, whereby the latency time occurring at the transition from the read mode to write mode can be minimized. This results in, for example, an internal power switching art that contributes to realization of a high-speed external memory which can be rewritten freely.

As apparent from the previous description, in a semiconductor memory such as a flash memory, bias voltage is applied to a substrate or well. The ninth mode of the present invention relates to a substrate (well) voltage control circuit.

When a row decoder is used to apply negative voltage, as described previously (See FIGS. 38 and 39), the substrate or well of a drive unit is biased with negative voltage in order to prevent forward-bias current from flowing between a diffused layer and the substrate or well. However, during writing or reading, the substrate or well is set to a supply voltage Vss because negative voltage is not used.

Figure 109:
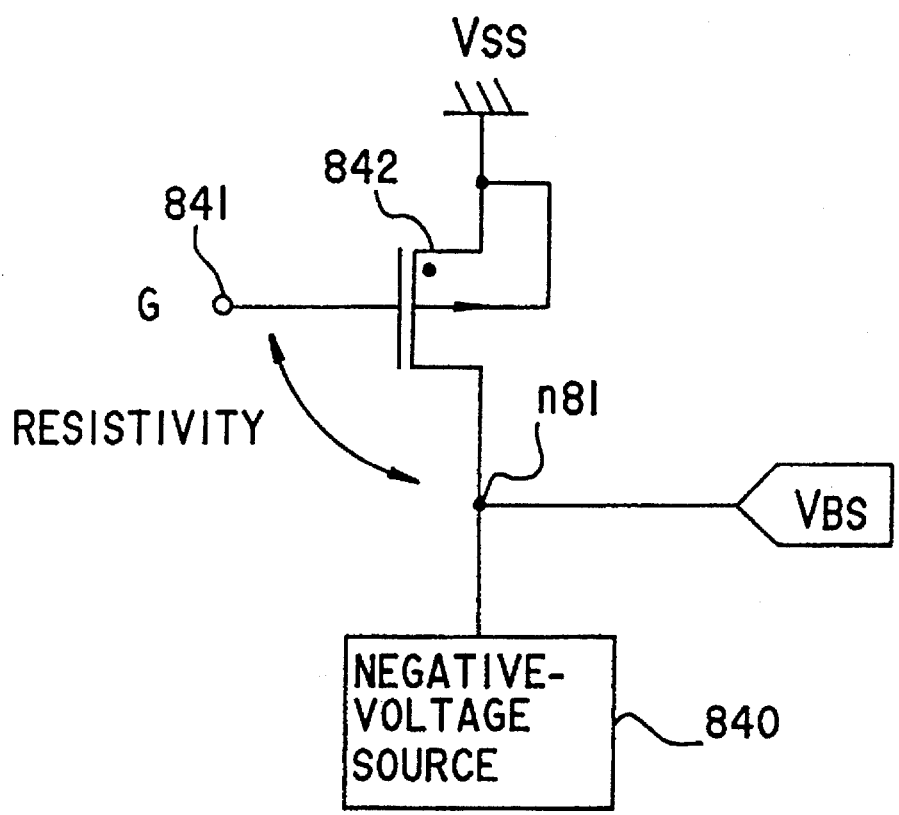
FIG. 109 shows an example of a conventional substrate (well) voltage control circuit.

A circuit shown in FIG. 109 has been used as a control circuit for the foregoing substrate (well) voltage in the past. In the circuit shown in FIG. 109, $V_{BS}$ denotes a substrate (well) voltage line. A p-channel depletion-type transistor 842 is employed to switch the voltage to be applied to the substrate (well) voltage line $V_{BS}$ from a negative voltage $V_{BB}$ provided by a negative voltage source 840 to a zero (ground) voltage Vss. When the gate voltage of the transistor 842 is switched between the normal supply voltage Vss and Vcc, voltages to be applied to the substrate voltage line Vss are changed. When the zero voltage Vss is placed on the substrate power line $V_{BS}$, the negative voltage source 840 becomes inoperative and does not output the negative voltage $V_{BB}$.

In the circuit shown in FIG. 109, the p-channel depletion-type transistor 842 is used to switch supply voltages. When the threshold voltage Vth of the transistor 842 is set to an intermediate value between the zero voltage Vss and positive voltage Vcc, if a control signal G is high (Vcc, the transistor 842 is off. If the control signal is low (Vss), the transistor 842 is on. Table 9 shows a truth table for the circuit in FIG. 109.

TABLE 9

| | Truth table for the circuit in FIG. 109 | | |
|---|---|---|---|
| G | Transistor 842 | $V_{BS}$ | Negative-voltage generator |
| Vss | On | Vss | No output |
| Vcc | Off | $V_{BB}$ | Output |

The control circuit for a substrate (well) voltage shown in FIG. 109 has the advantage of a simple circuitry but poses the following problems:

(1) Another process is needed to manufacture a p-channel depletion region, resulting in complex processes;

(2) The threshold voltage Vth of a p-channel depletion-type transistor must be controlled precisely, resulting in demanding process management;

(3) A p-channel transistor is larger in area than an n-channel transistor, resulting in a large-scale circuit; and (4) When the negative voltage $V_{BB}$ is applied to the substrate (well) power line $V_{BS}$, the positive voltage Vcc is applied to the gate of the transistor 842. A difference between the positive voltage Vcc and negative voltage $V_{BB}$ is therefore applied between the gate and drain of the transistor 842. This increases an applied voltage, making it necessary to intensify the resistivity between the gate and drain of the transistor 842. To intensify the resistivity, the gate oxide film must be made thicker. This results in an increased area.

Figure 110:
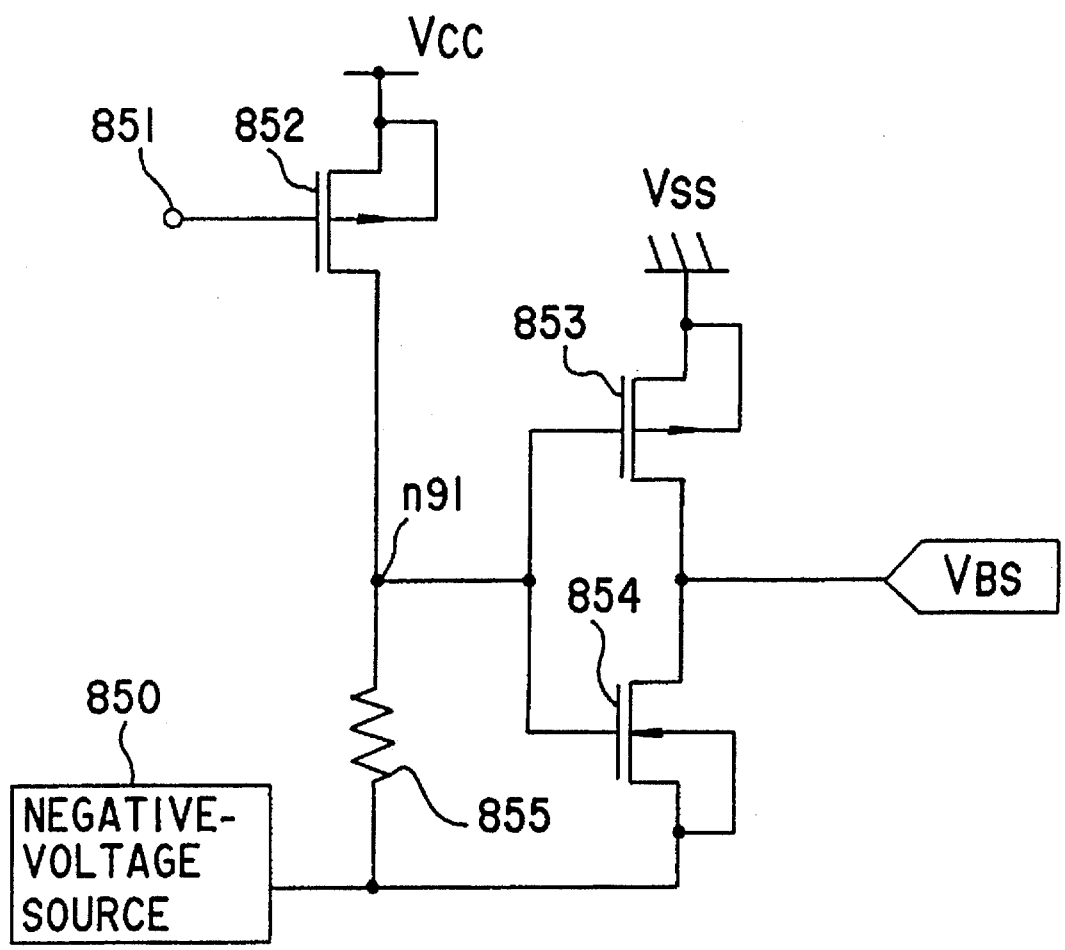
FIG. 110 shows other example of a conventional substrate (well) voltage control circuit.

A circuit shown in FIG. 110 has been employed as a substrate (well) voltage control circuit using no p-channel depletion-type transistor in the past. Table 10 is a truth table for the circuit in FIG. 110.

TABLE 10

| | Truth table for the circuit in FIG. 110 | | | | |
|---|---|---|---|---|---|
| G1 | Node 91 | Transistor 852 | Transistor 853 | Transistor 854 | $V_{BS}$ |
| Vcc | $V_{BB}$ | Off | On | Off | Vss |
| Vss | Vcc | On | Off | On | $V_{BB}$ |

The circuit shown in FIG. 110 uses enhancement transistors alone. Another process is therefore unnecessary. When the substrate (well) power line $V_{BS}$ is set to the zero voltage Vss, the voltage at a point n91 must be held negative. To achieve this purpose, the negative voltage source 850 must output negative voltage all the time. The negative voltage source 840 must therefore be operative all the time. This results in increased power consumption. The above problem (3) of a large-scale circuit and problem (4) that a high resistivity is needed are not resolved.

As mentioned above, the conventional substrate (well) voltage control circuit has such problems as a large chip area, a large power consumption in a standby state, and complex manufacturing processes. A circuit without these problems has been awaited.

Figure 111:
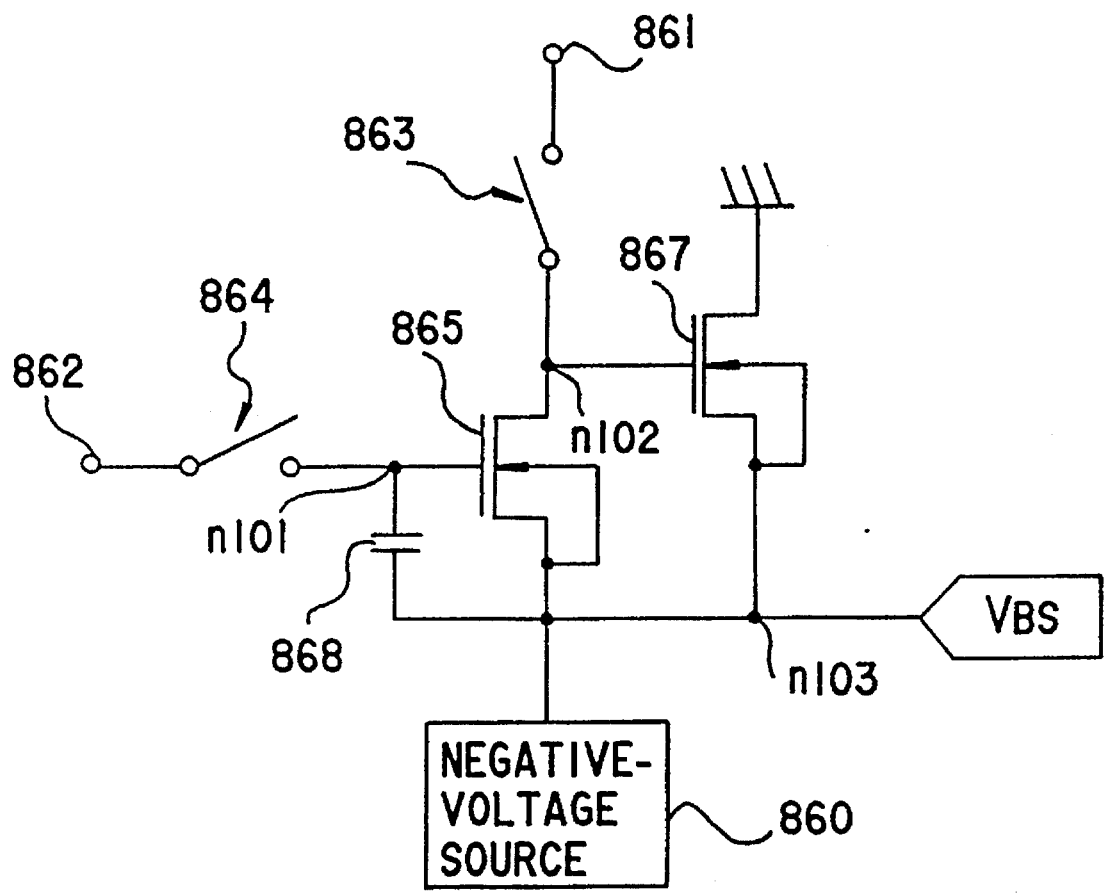
FIG. 111 is a configurational diagram showing the principle of a substrate (well) potential control circuit based on the ninth mode of the present invention.

FIG. 111 is a configurational diagram for the principle of a substrate (well) voltage control circuit based on the ninth embodiment of the present invention which solves the above problems.

Figure 113:
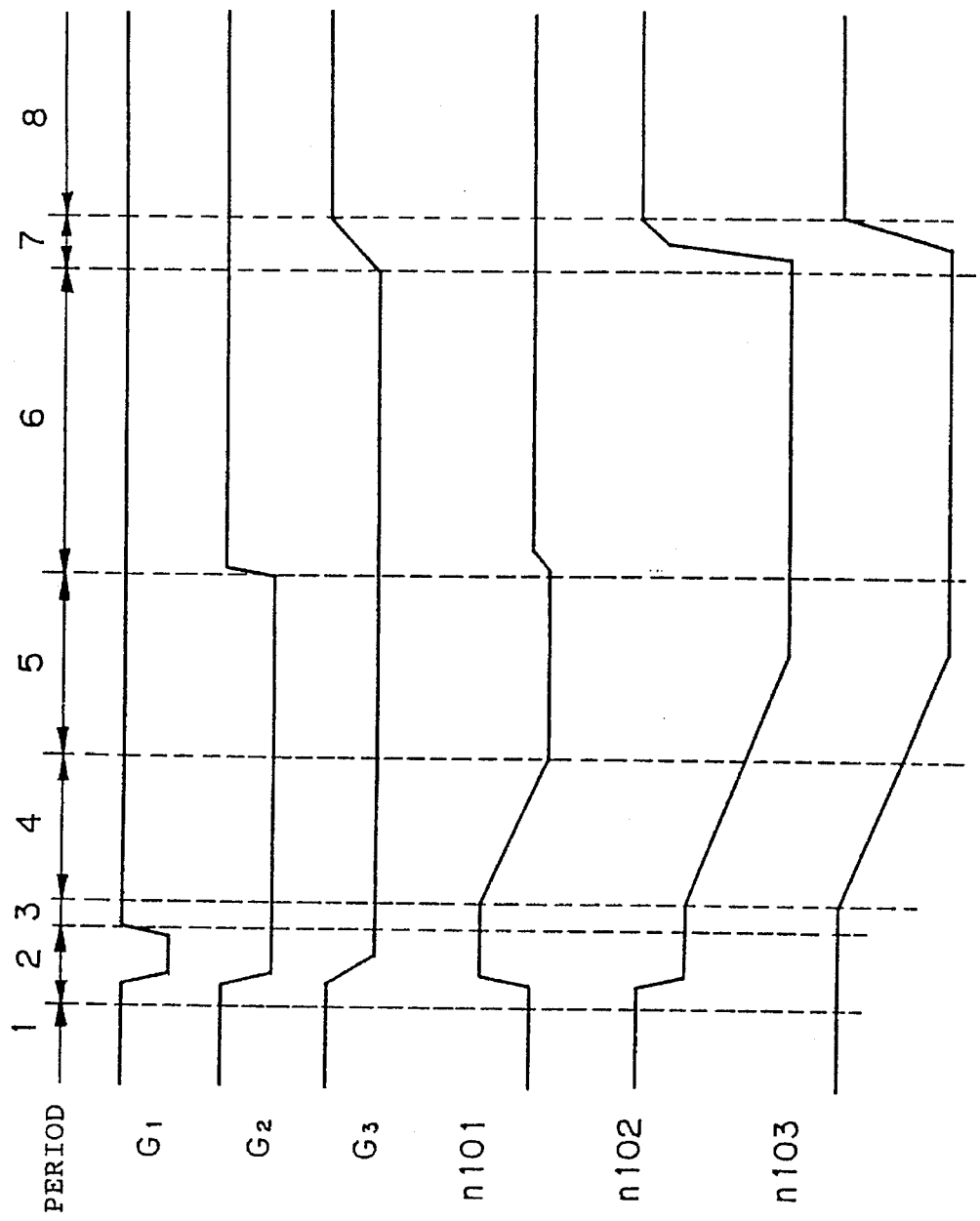
FIG. 113 is a timing chart showing the operations of the circuit in FIG. 112.

As shown in FIG. 111, the substrate (well) voltage control circuit of the present invention comprises a negative voltage source 860 for outputting negative voltage to a power line $V_{BS}$ connected to a component whose voltage is to be controlled, a first n-channel transistor 867 whose substrate or well, and source are connected to the negative power line $V_{BS}$ and whose drain is connected to a power supply for outputting a zero voltage Vss, a second n-channel transistor 865 whose substrate or well and source are connected to the negative power line $V_{BS}$ and whose drain is connected to the gate of the first n-channel transistor 867, a first switch 863 placed between the gate of the first n-channel transistor 867 and a power supply for outputting a positive voltage Vcc, a second switch 864 for selecting whether the gate of the second n-channel transistor 865 is connected to the power supply for outputting the positive voltage Vcc or the power supply for outputting the zero voltage Vss, or opened, and a capacitive element 868 connected between the gate and source of the second n-channel transistor 865. When negative voltage is not applied, the negative voltage source 860 is put into a non-output state, the first switch 863 is made, and the second switch 864 is connected to the zero-voltage terminal. When negative voltage is applied, the first switch 863 is opened. The second switch 864 is connected to the positive-voltage terminal at the same time. Thereafter, the second switch 864 is opened, and the negative voltage source 860 is put into an output state.

the principle of the circuit in FIG. 111. FIG. 113 and Table 12 indicate the operations of the circuit. FIG. 113 shows voltage fluctuations at components, and Table 12 is a truth table. The step numbers of state transition in the truth table correspond to those on the temporal axis of the graph in FIG. 113.

TABLE 11

Truth table for the circuit in FIG. 111

| State of $V_{BS}$ | 862 | Switch 864 | 861 | Switch 863 | Node n101 | Transistor 865 | Node n102 | Transistor 867 | Negative-Voltage generator |
|---|---|---|---|---|---|---|---|---|---|
| Vss | Vss | On | Vcc | On | Vss | Off | Vcc | On | Stopped |
| Ready for negative boosting | Vcc | Off | — | Off | Vcc (=Vc) | On | Vss | Off | Still Stopped |
| Start of negative boosting | — | Off | — | Off | Vc | On | ↓ | Off | Operation start |
| Transition period | — | Off | — | Off | $V_{BB} + V_c$ | On | ↓ | Off | ↓ $V_{BB}$ |
| Negative boosting ($V_{BB}$) | — | Off | — | Off | $V_{BB} + V_C$ | On | $V_{BB}$ | Off | Operation |

Table 11 is a truth table for FIG. 111. Under the control shown in Table 11, the voltage at a point n101 at which negative voltage is applied is held at Vcc with respect to the

TABLE 12

Figure 112:
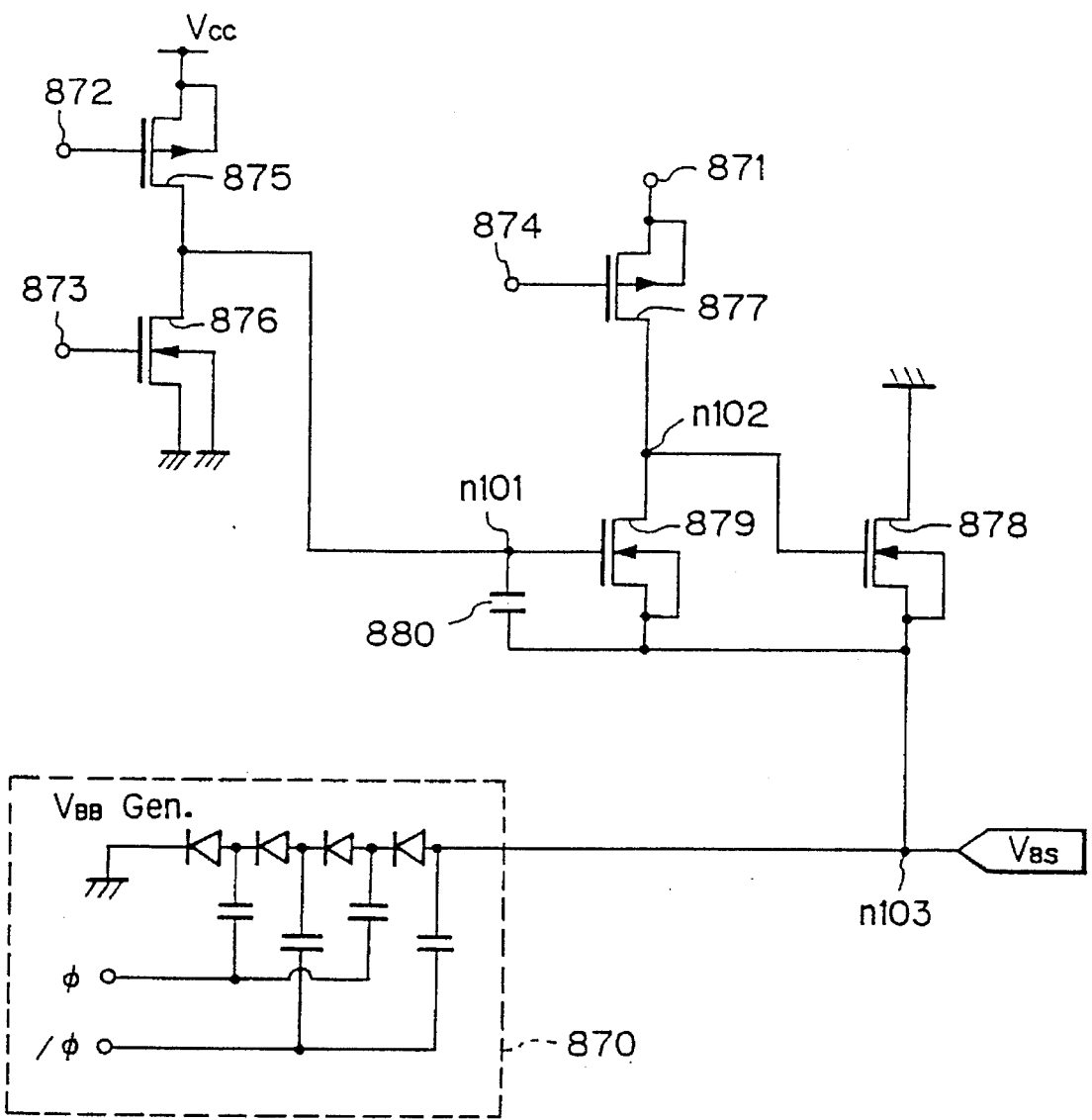
FIG. 112 shows a substrate (well) voltage control circuit in the thirtieth embodiment.

Thrush table for the circuit in FIG. 112

| No. | State | G1 | G2 | G3 | Terminal 871 | Node n101 | Tr 879 | n102 | Tr 878 | $V_{BB}$-Gen. |
|---|---|---|---|---|---|---|---|---|---|---|
| 1 | $V_{BS} = V_{SS}$ | High | High | Low | Vcc | To low | OFF | To high | On | Stopped |
| 2 | Ready for negative boosting | Low | Low | Low | $V_{SS}$ | To high | ON | To low | Off | Still Stopped |
| 3 | Start of negative boosting | High | — | — | — | Vcc | — | $V_{BS}$ | — | Operation Started |
| 4 | Transition | — | — | — | — | $V_{BS} + Vcc$ | — | — | — | $V_{BS} \succ Vcc$ |
| 5 | | — | — | — | — | $-Vth$ (Tr876) | — | — | — | $V_{SS} \leftarrow Vcc$ |
| 6 | Negative Boosting | — | High | — | — | $V_{SS}$ | — | — | — | Operation |
| 7 | End of negative boosting | — | — | Low | Vcc | $V_{SS}$ | On | To high | On | Operation Stopped |
| 8 | $V_{BS} = V_{SS}$ | High | High | — | Vcc | To low | Off | To high | ON | Stopped | substrate (well) of the transistor 865 owing to charges retained in the capacitive means C. The on state of the transistor 865 is maintained without a large potential difference. The switching transistor 867 is turned off. When the zero voltage Vss is applied, the transistor 865 is turned off, and the transistor 867 is turned on. The substrate (well) power line is then set to the zero voltage Vss.

The circuit in FIG. 111 can be composed of enhancement transistors alone, which therefore is small in scale and has no problem concerning resistivity.

FIG. 112 shows a circuitry of the thirtieth embodiment embodied according to the configurational diagram showing In the circuit of FIG. 112, a first switch 863 is realized by switching source voltages of a p-channel transistor 877. The circuit further includes a p-channel transistor 875 and an n-channel transistor 876 that are connected in series with each other between a positive power supply Vcc and a zero voltage source Vss and that are used to make or break a second switch 864 and to switch voltages for the terminal of the second switch 864. The gates of the transistors 875 and 876 serve as control terminals which are controlled with amplitude signals G1 and G2 that are a positive voltage Vcc and a zero voltage Vss. Reference number 870 denotes a negative voltage generator, which generates negative voltage with complementary clock signals received through terminals o and /o. A transistor 878 has a large driving capacity for driving a power line $V_{BS}$.

The operations of the circuit in FIG. 112 will be described in conjunction with FIG. 113 and Table 12. During the first period, the signals G1 and G2 are driven high. A voltage signal S3 applied to a terminal 871 is then changed to Vss. The voltage at a node n101 is then driven high; that is, boosted to Vcc. A transistor 879 is turned on. The transistor 877 is turned off because the signal S3 is changed to Vss.

The voltage at a node n102 is then driven low; that is, decreased to Vss. The transistor 878 is then turned off.

During the third period, the level of the signal G1 is changed to high. The negative voltage generator 870 then starts operating. The node n101 is then disconnected. The voltage of the power line $V_{BS}$ drops toward $V_{BB}$ during the fourth and fifth periods. The voltage at the node n101 also decreases because the node n101 is connected to the power line $V_{BS}$ via a capacitor 880. In the meantime, the transistor 879 is on, the voltage at a node n102 decreases, and the transistor 878 remains off.

The voltage at the node n101 remains higher by a voltage determined by charges retained in the capacitor 880 than that on the power line $V_{BS}$, and decreases with a voltage drop on the power line $V_{BS}$. However, when the voltage at the node n101 becomes slightly negative with respect to Vss and reaches the threshold voltage of the transistor 876, the voltage does not decrease any longer.

The sixth period correspond to a duration of generative voltage application, during which the signal G2 is driven high.

When negative voltage application terminates, the generative-voltage generator 870 stops operating. The voltage signal S3 applied to the terminal 871 is changed to Vcc. The transistor 877 is then turned on, and the voltage at the node n102 starts rising. Accordingly, the voltage on the power line $V_{BS}$ starts rising. At this time, the voltage at the node n101 is Vss. The transistor 879 is therefore off. When the voltage at the node n102 rises, the transistor 878 is turned on and the power line $V_{BS}$ is connected to the zero voltage source Vss.

Figure 114:
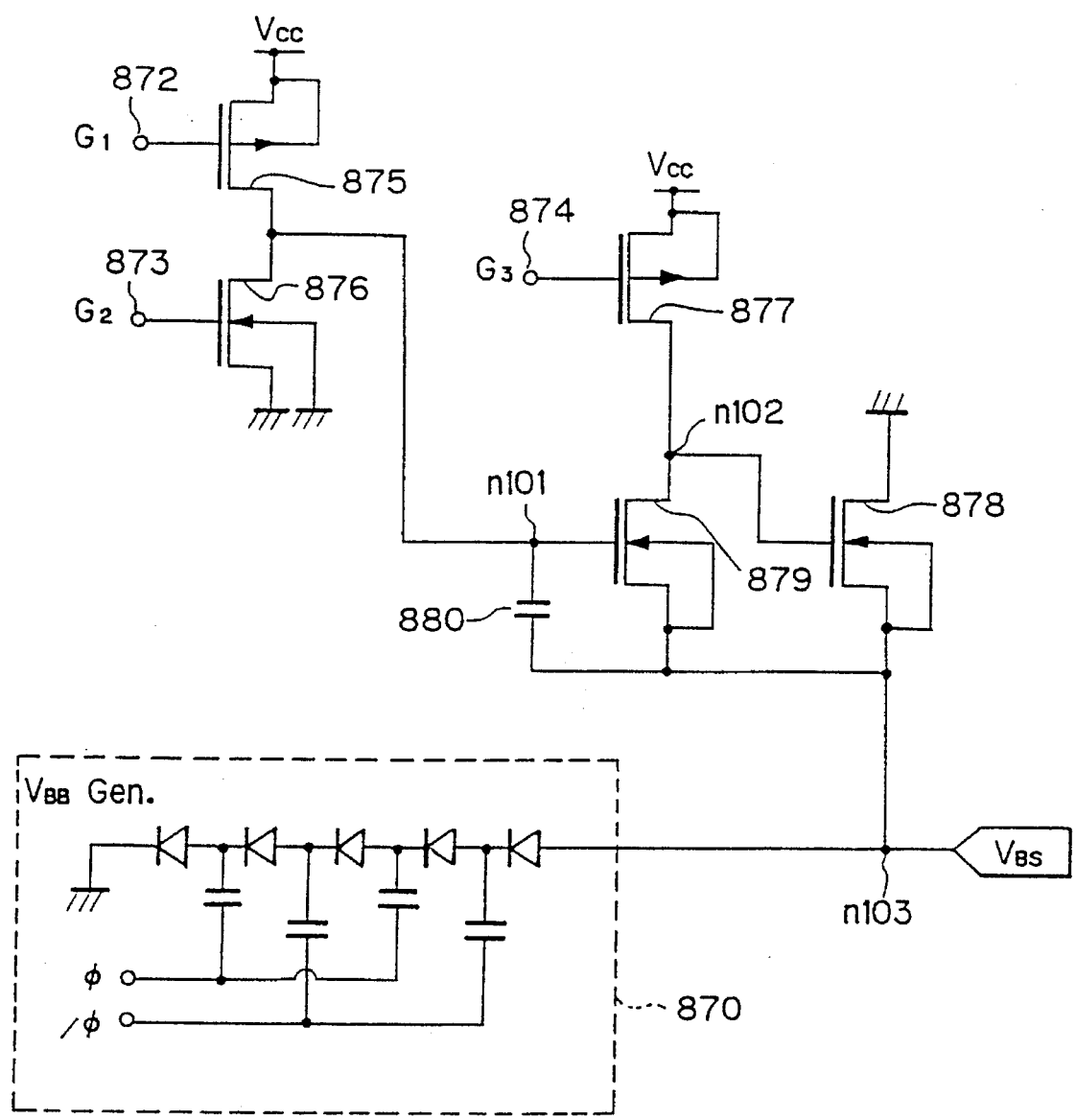
FIG. 114 shows a substrate (well) voltage control circuit in the thirty-first embodiment.

FIG. 114 shows a circuitry of a substrate (well) voltage control circuit of the thirty-first embodiment. The circuit of the thirty-first embodiment is identical to that shown in FIG. 112 except that the source of the transistor 877 is fixed to a power supply for outputting a positive voltage Vcc and the gate voltage of the transistor 877 is controlled. An operation different from that of the circuit in FIG. 112 is that the voltage applied to the source of the transistor 877 is not changed to Vss but the transistor 877 is turned off. Except for this point, the circuit in FIG. 114 operates identically to that in FIG. 112. Table 13 is a truth table for the operations of the circuit in FIG. 114.

TABLE 13

Thrush table for the circuit in FIG. 114

| No. | State | G1 | G2 | G3 | Node n101 | Transistor 879 | Node n102 | Transistor 878 | $V_{BB}$ – gen. |
|---|---|---|---|---|---|---|---|---|---|
| 1 | $V_{BS} = V_{SS}$ | High | High | Low | To low | Off | To high | On | Stopped |
| 2 | Ready for negative boosting | Low | Low | High | To high | On | To low | Off | Still stopped |
| 3 | Start of negative boosting | High | — | — | $V_{CC}$ | — | $V_{BS}$ | — | Operation Started |
| 4 | Transition | — | — | — | $V_{BS} + V_{cc}$ | — | — | — | $V_{BS} \succ V_{cc}$ |
| 5 |  | — | — | — | –Vth (transistor 876) | — | — | — | $V_{BS} \prec V_{cc}$ |
| 6 | Negative boosting | — | High | — | Vss | — | — | — | Operation |
| 7 | End of negative boosting | — | — | Low | Vss | on | To high | On | Operation stopped |
| 8 | $V_{BS} = V_{ss}$ | High | High | — | To low | Off | To high | On | Stopped |

Figure 115:
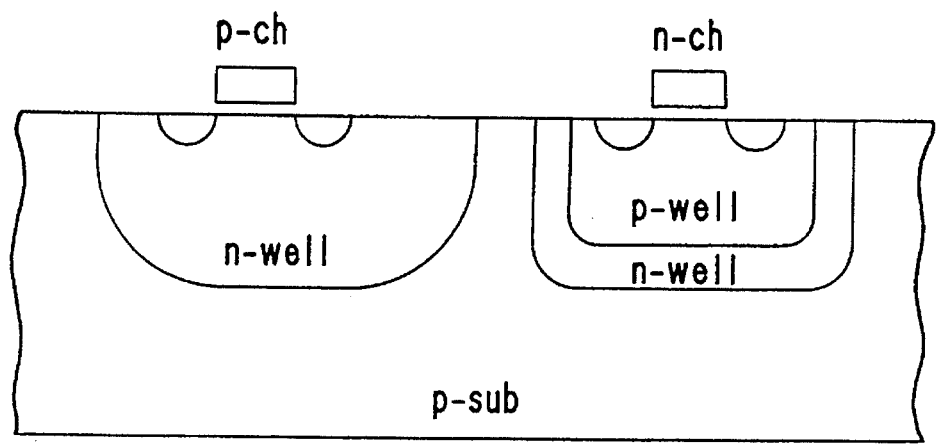
FIG. 115 shows an example of a conventional structure for forming a substrate (well) voltage control circuit.
Figure 116:
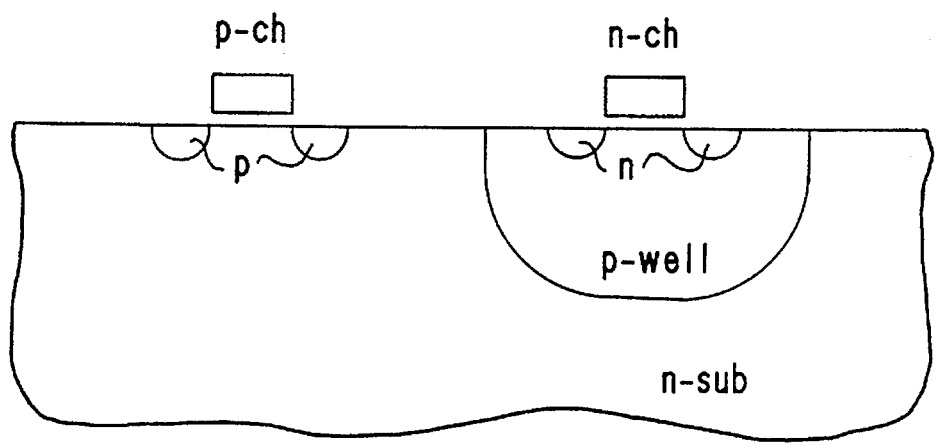
FIG. 116 shows an example of a structure of the substrate (well) voltage control circuit in FIG. 114.

For realizing the circuit in FIG. 114, a triple-well structure shown in FIG. 115 may be employed to prevent occurrence of forward bias current between a substrate or well and a diffused layer. For the circuit in FIG. 114, an n-substrate p-well structure shown in FIG. 116 can be employed.

In the aforesaid thirtieth and thirty-first embodiments, a capacitor is used as shown in the configuration diagram showing the principle of a circuit in FIG. 111 in order to prevent the gate-source voltage of the transistor 865 from exceeding a specified value (Vcc). This obviates the need of intensifying the gate-source resistivity. Even when the gate voltage is controlled without using a capacitor, the same advantage is available. An example is presented in the thirty-second embodiment.

Figure 117:
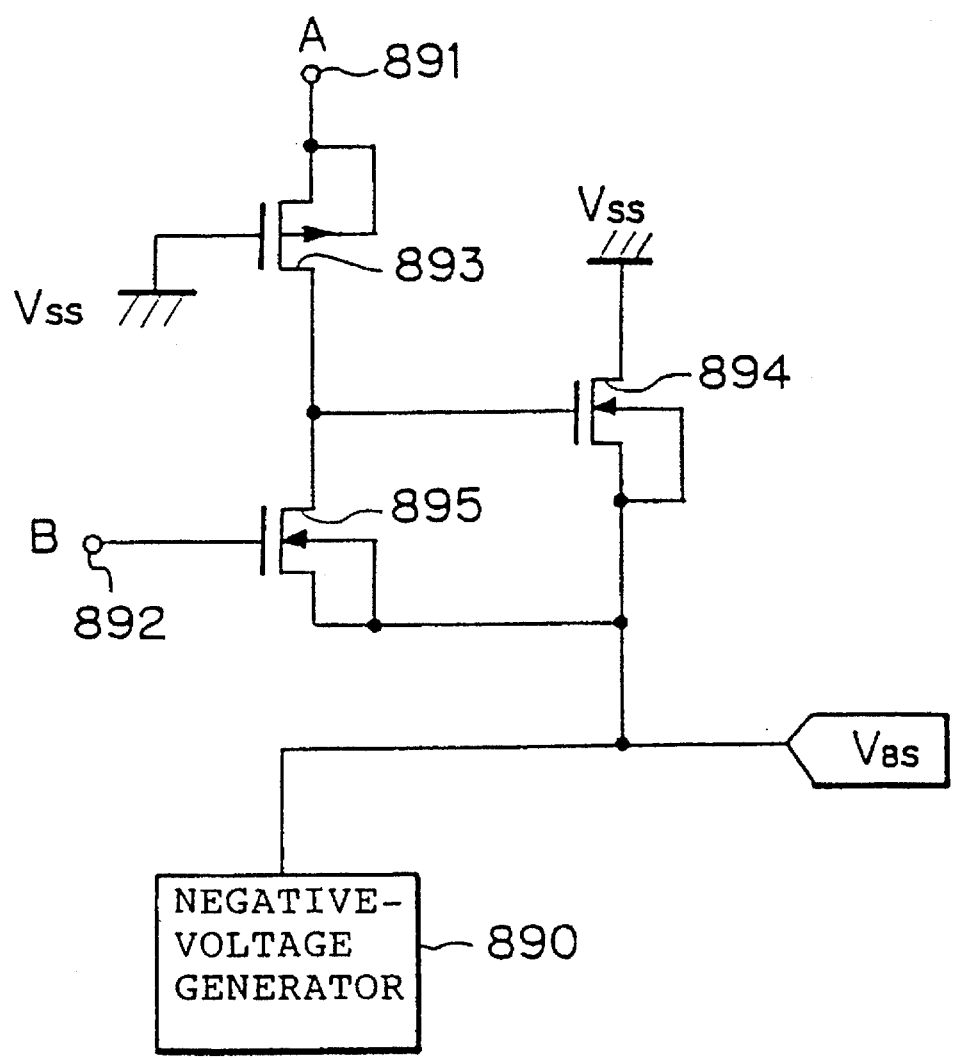
FIG. 117 shows a substrate (well) voltage control circuit in the thirty-second embodiment.
Figure 118:
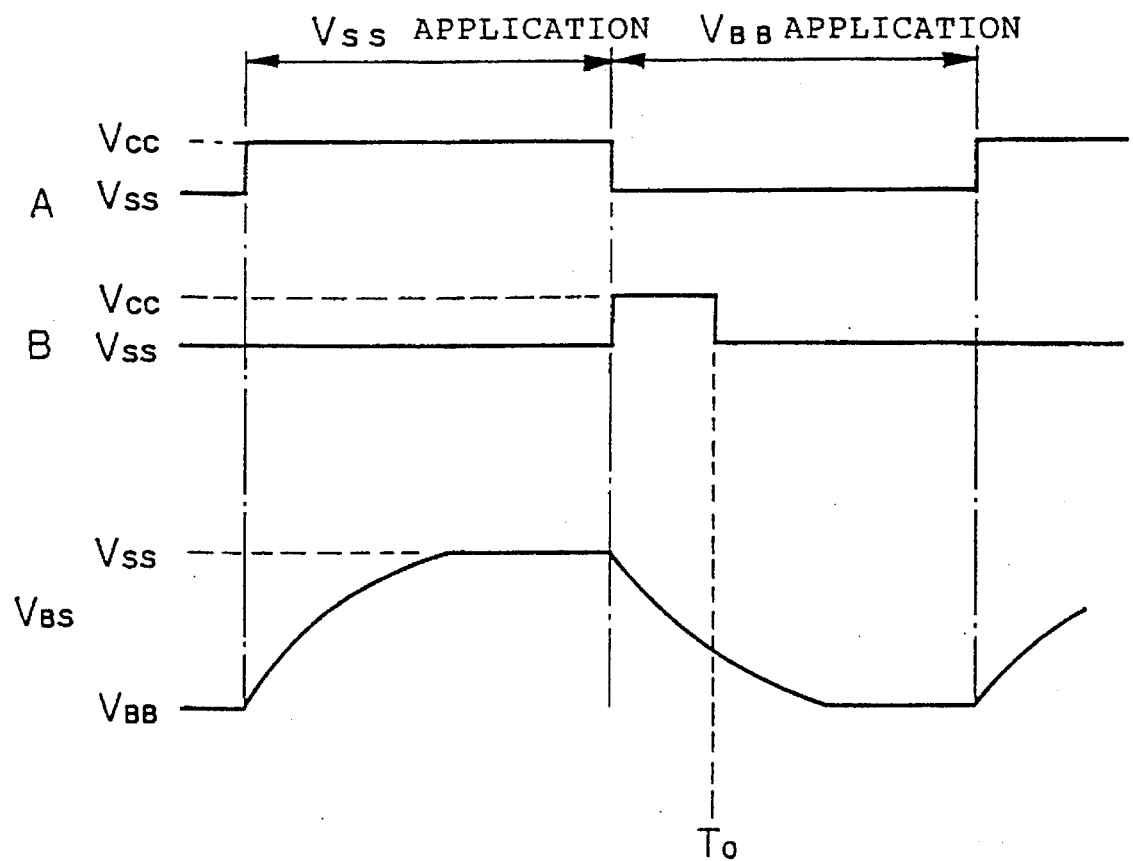
FIG. 118 is a timing chart showing the control and operations of the circuit in FIG. 117.

FIG. 117 shows a circuitry of a substrate (well) voltage control circuit of the thirty-second embodiment. FIG. 118 shows control signals supplied by the substrate (well) voltage control circuit and voltage fluctuations on a power line $V_{BS}$.

The circuit in FIG. 117 has substantially the same circuitry as the one in FIG. 111 except that the capacitative means 868 is excluded. Reference numerals 891 and 892 denote control terminals. Signals A and B whose logical levels are Vss and Vcc are applied to the control terminals 891 and 892. The operations of the circuit in FIG. 117 will be described in conjunction with the graph in FIG. 118.

As shown in FIG. 118, during Vss application, the signal A is set to Vcc and the signal B is set to Vss. The p-channel transistor 893 is turned on, and the n-channel transistor 895 is turned off. The gate voltage of the transistor 894 therefore becomes Vcc. The transistor 894 is turned on. Vss is then output to the power line $V_{BS}$.

During $V_{BB}$ application, the voltage of the signal A is switched to Vss and the voltage of the signal B is switched to Vcc. This causes the transistors 893 and 894 to turn off, and the transistor 895 to turn on. When the negative-voltage generator is actuated, the voltage on the power line $V_{BS}$ decreases gradually. When the voltage becomes lower than the threshold voltage of the transistor 895, the signal B is changed to Vss. The transistor 895 is still on. The voltage on the power line $V_{BS}$ decreases. Even when the voltage on the power line $V_{BS}$ decreases to be $V_{BB}$, the gate-source voltage of the transistor 895 is Vss–$V_{BB}$; that is, –$V_B$ which is much lower than that in prior arts.

As described above, the substrate (well) voltage control circuits in the thirtieth to thirty-second embodiments do not use any depletion-type transistors. Another manufacturing process is therefore unnecessary. An area occupied by n-channel transistors is smaller than the one occupied by depletion-type transistors. Furthermore, resistivity improves. Downsizing of devices and reduction in the number of processes realize upgrading of a yield, improvement of reliability, and cutting of costs.

As shown in FIG. 85 and others, a semiconductor integrated circuit includes exclusive OR and exclusive NOR circuits. A smaller-scale integrated circuit can be realized by downsizing these individual circuits.

The tenth mode of the present invention relates to an exclusive OR/exclusive NOR circuit that can be downsized.

Figure 119:
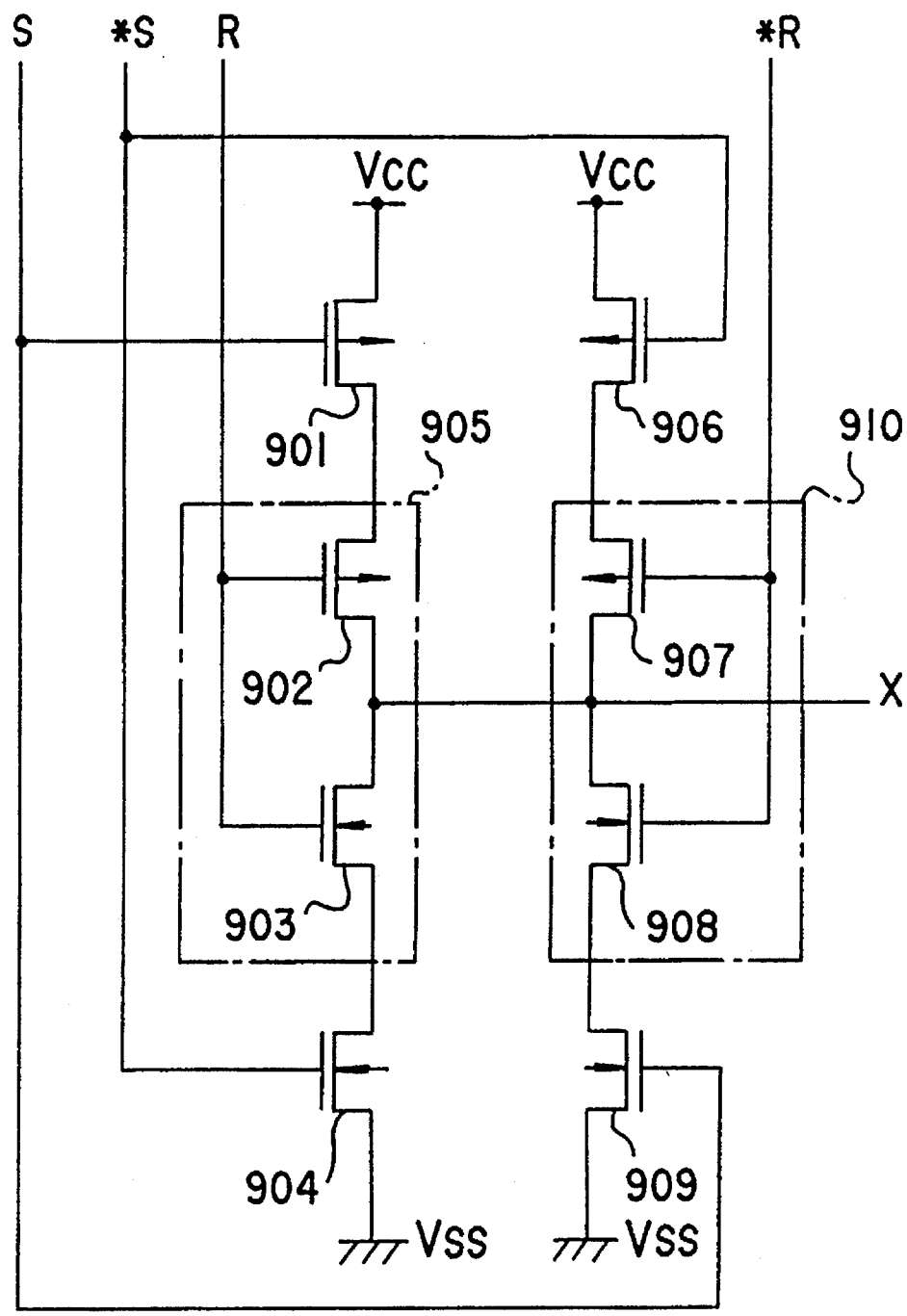
FIG. 119 shows a conventional exclusive OR/exclusive NOR circuit.

FIG. 119 shows a conventional exclusive OR/exclusive NOR circuit.

In this circuit, a pMIS transistor 902 is connected to a high-voltage power supply line Vcc via a pMIS transistor 901. An nMIS transistor 903 is connected to a low-voltage power supply line Vss via an nMIS transistor 904. The pMIS transistor 902 and nMIS transistor 903 constitute a CMIS inverter 905. A pMIS transistor 907 is connected to the high-voltage power supply line Vcc via a pMIS transistor 906. An nMIS transistor 908 is connected to the low-voltage power supply line Vss via an MIS transistor 909. The pMIS transistor 907 and nMIS transistor 908 constitute a CMIS inverter 910.

An input R is fed to the input terminal of the CMIS inverter 905. An input *R that has a reverse polarity of the input R is fed to the input terminal of the CMIS inverter 910. The gates of the pMIS transistor 901 and nMIS transistor 909 are connected to each other, to which an input S is fed. The gates of the nMIS transistor 904 and pMIS transistor 906 are connected to each other, to which an input *S that has a reverse polarity of the input S is fed. The output terminals of the CMIS inverter 905 and CMIS inverter 910 are connected to each other, from which an output X is fetched.

In the above circuitry, when the input S represents 1 (high level) and the input *S represents 0 (low level), the pMIS transistor 901 and nMIS transistor 904 are turned off and the pMIS transistor 906 and nMIS transistor 909 are turned on. The output X is the input *R whose polarity is reversed by the CMIS inverter 910; that is, is equal to the input R.

When the input S represents 0 and the input *S represents 1, the pMIS transistor 901 and nMIS transistor 904 are turned on, while the pMIS transistor 906 and nMIS transistor 909 are turned off. The output X is the input R whose polarity is reversed by the CMIS inverter 905; that is, is equals to the input *R.

The output X is therefore the exclusive OR of the inputs *R and *S, and the exclusive NOR of the inputs R and S at the same time.

For using the circuit in FIG. 119 as a dual-input exclusive OR circuit for the inputs *R and *S, not only the input *R and *S but also the input R and S are necessary. When either the inputs *R and *S or the inputs R and S are unavailable, two CMIS inverters are needed to produce the other inputs. Similarly, for using the circuit in FIG. 119 as a dual-input exclusive NOR circuit for the inputs R and S, since not only the inputs R and S but also the inputs *R and *S are necessary, if either the inputs R and S or the inputs *R and *S are unavailable, two CMIS inverters are needed to produce the other inputs.

In a semiconductor integrated circuit including numerous exclusive OR or exclusive NOR circuits, when the circuit in FIG. 119 is adopted, the integrated circuit becomes large in scale. This contradicts improvement of integration.

Figure 120:
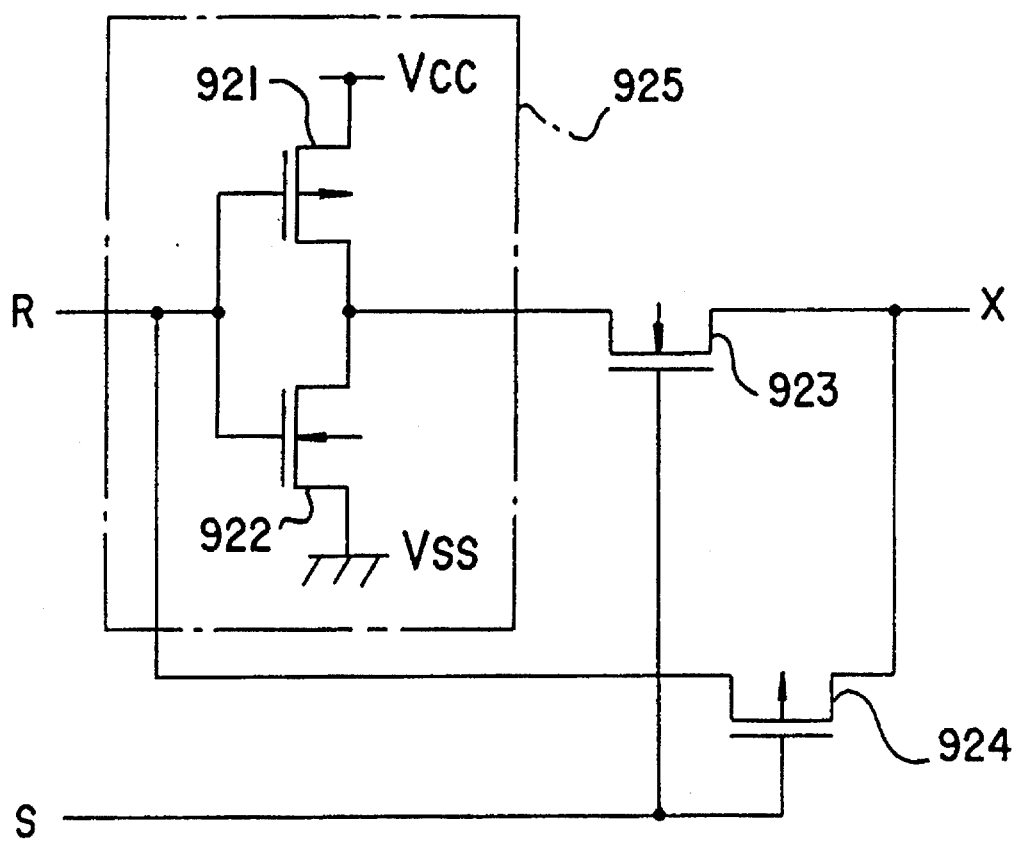
FIG. 120 shows an exclusive OR circuit in the thirty-third embodiment.

FIG. 120 shows an exclusive OR circuit of the thirty-third embodiment.

The exclusive OR circuit of this embodiment, as illustrated, comprises a first CMIS inverter 925 in which the source of a first pMIS transistor 921 is connected to a high-voltage power supply line, the source of a first nMIS transistor 922 is connected to a low-voltage power supply line, and the gates of the first pMIS transistor 921 and first nMIS transistor 922 are connected to each other to serve as an input terminal, the drains of the first pMIS transistor 921 and first nMIS transistor 922 are connected to each other to serve as an output terminal; a second pMIS transistor 924 whose source is connected to the input terminal of the first CMIS inverter 925 and provided with a first input R; and a second nMIS transistor 923 whose drain is connected to the output terminal of the first CMIS inverter 925, whose source is connected to the drain of the second pMIS transistor 924, and whose gate is connected to the gate of the second pMIS transistor 924 and provided with a second input S. The exclusive OR, X, of the first input R and second input S is output from the contact point between the drain of the second pMIS transistor 924 and the source of the second nMIS transistor 923.

In the foregoing circuitry, when the input S represents 1, the nMIS transistor 923 is turned on and the pMIS transistor is turned off. The output X becomes equal to the input R whose polarity is reversed by the CMIS inverter 925. When the input S represents 0, the nMIS transistor 923 is turned off and the pMIS transistor 924 is turned on. The output X equals to the input R. The output X is therefore the exclusive OR of the inputs R and S. When the inputs R and S are low, the second nMIS transistor 923 and the second pMIS transistor 924 turn OFF, therefore, the output X becomes floating. The output X is floating between 0 V and Vth of the second pMIS transistor 924. The floating state of the output X can be determined to be low by setting a condition of an inverter which is provided to receive the output X. Therefore, in practical circuits, no problem occurs.

The exclusive OR circuit of the thirty-third embodiment has four circuit elements which is a half of the number of elements in the circuit in FIG. 119. Moreover, since the negative signal *R of the first input R and the negative signal *S of the second input S are unnecessary, two CMIS inverters, which are required when the inputs *R and *S are unavailable, need not be additionally installed. Using this exclusive OR circuit, the integration of a semiconductor integrated circuit can be improved.

Figure 121:
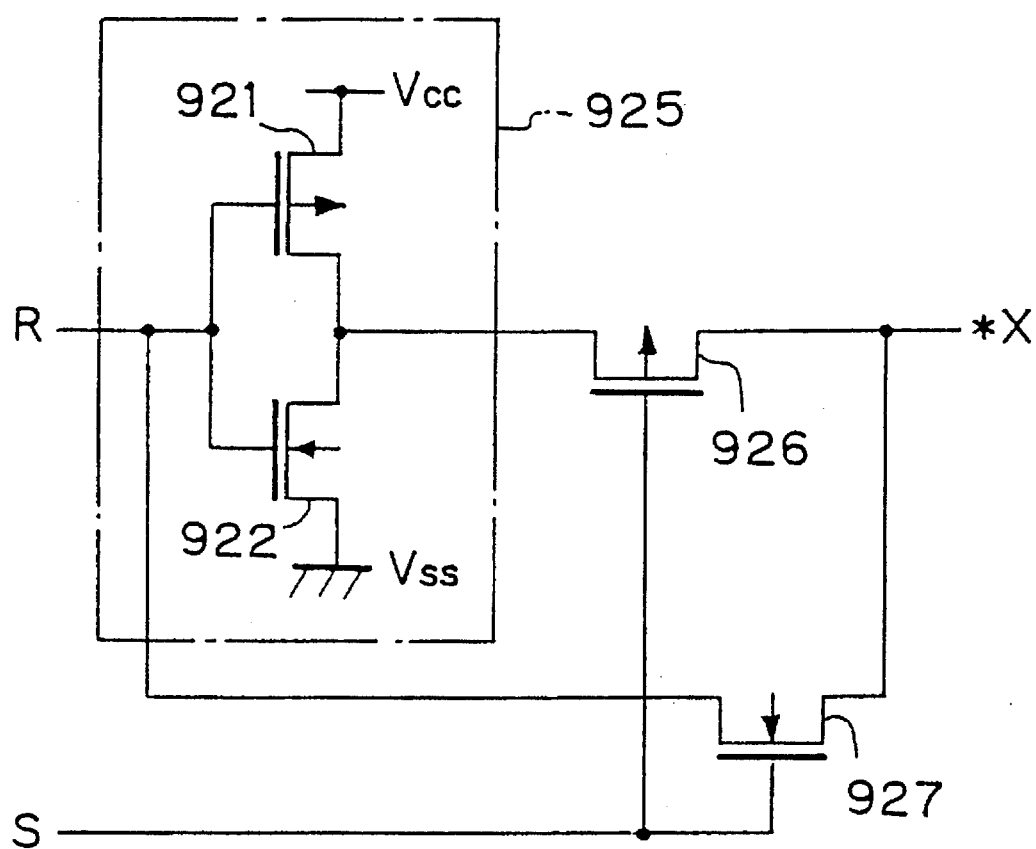
FIG. 121 shows an exclusive NOR circuit in the thirty-fourth embodiment.

FIG. 121 shows an exclusive NOR circuit of the thirty-fourth embodiment.

The exclusive NOR circuit of the thirty-fourth embodiment comprises a first CMIS inverter 925 in which the source of a first pMIS transistor 921 is connected to a high-voltage power supply line, the source of a first nMIS transistor 922 is connected to a low-voltage power supply line, the gates of the first pMIS transistor 921 and first nMIS transistor 922 are connected to each other to serve as an input terminal, and the drains of the first pMIS transistor 921 and first nMIS transistor 922 are connected to each other to serve as an output terminal; a second nMIS transistor 927 whose drain is connected to the input terminal of the first CMIS inverter 925 and provided with a first input R; and a second pMIS transistor 926 whose source is connected to the output terminal of the first CMIS inverter 925, whose drain is connected to the source of the second nMIS transistor 927, and whose gate is connected to the gate of the second nMIS transistor 927 and provided with a second input S. The exclusive NOR, *X, of the first input R and second input S is output from the contact point between the drain of the second pMIS transistor 926 and the source of the second nMIS transistor 927.

In the foregoing circuitry, when the input S represents 1, the nMIS transistor 926 is turned on and the pMIS transistor 927 is turned off. The output *X equals the input R. When the input S represents 0, the nMIS transistor 927 is turned off and the pMIS transistor 926 is turned on. The output *X equals to the input R whose polarity is reversed by the CMIS inverter. The output *X is therefore the exclusive NOR of the inputs R and S.

The exclusive NOR circuit of the thirty-fourth embodiment has four circuit elements which is a half of the number of elements in the circuit in FIG. 119. Moreover, since the negative signal *R of the input R and the negative signal *S of the input S are unnecessary, two CMIS inverters, which are required when neither the input *R nor *S is available, need not be installed additionally. Using the exclusive NOR circuit, the integration of a semiconductor integrated circuit can be improved.

Figure 122:
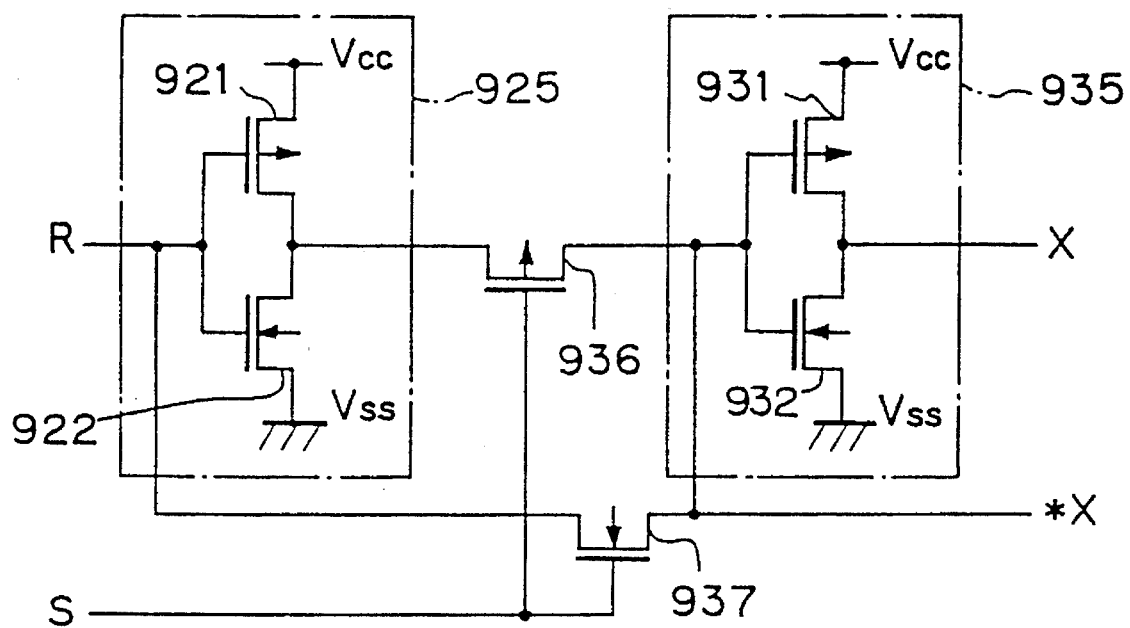
FIG. 122 shows an exclusive OR circuit in the thirty-fifth embodiment.

FIG. 122 shows an exclusive NOR circuit of the thirty-fifth embodiment. Components identical to those in FIG. 121 bear the same reference numerals, of which description will be omitted.

In this circuit, the input terminal of a CMIS inverter 935 made up of a pMIS transistor 931 and an nMIS transistor 932 is connected to the output terminal of the exclusive NOR circuit in FIG. 121. The exclusive OR, X, of the inputs R and S is fetched from the output terminal of the CMIS inverter 935.

The exclusive OR circuit has six circuit elements which is less than 8 or the number of elements in the circuit in FIG. 119. Moreover, since the negative signal *R of the input R and the negative signal *S of the input S are unnecessary, two CMIS inverters, which are required when neither the input *R nor *S is available, need not be installed additionally. Using this exclusive OR circuit, the integration of a semiconductor integrated circuit can be improved.

The exclusive OR circuit gains an advantage over the one in FIG. 120 in terms of an output driving capacity.

Figure 123:
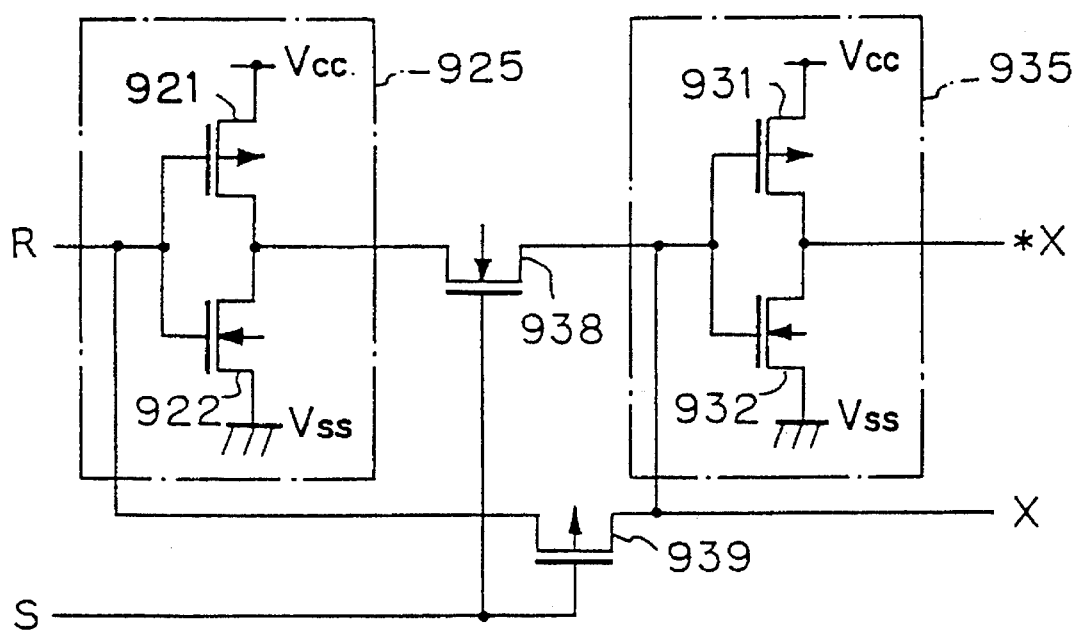
FIG. 123 shows an exclusive NOR circuit in the thirty-sixth embodiment.

FIG. 123 shows an exclusive NOR circuit of the thirty-sixth embodiment. Components identical to those in FIG. 120 bear the same reference numerals, and a description thereof will be omitted.

In this circuit, the input terminal of a CMIS inverter 935 made up of a pMIS transistor 931 and an nMIS transistor 932 is connected to the output terminal of the exclusive OR circuit in FIG. 120. The exclusive NOR, *X, of the inputs R and S is fetched from the output terminal of the CMIS inverter 935.

The exclusive NOR circuit has six circuit elements that is less than eight or the number of elements in the circuit in FIG. 119. Moreover, since the negative signal *R of the input R and the negative signal *S of the input S are unnecessary, two CMIS inverters, which are required when neither the input *R nor *S is available, need not be additionally installed. Using this exclusive OR circuit, the integration of a semiconductor integrated circuit can be improved.

The exclusive OR circuit gains an advantage over the one in FIG. 121 in terms of output driving capacity.

Figure 124:
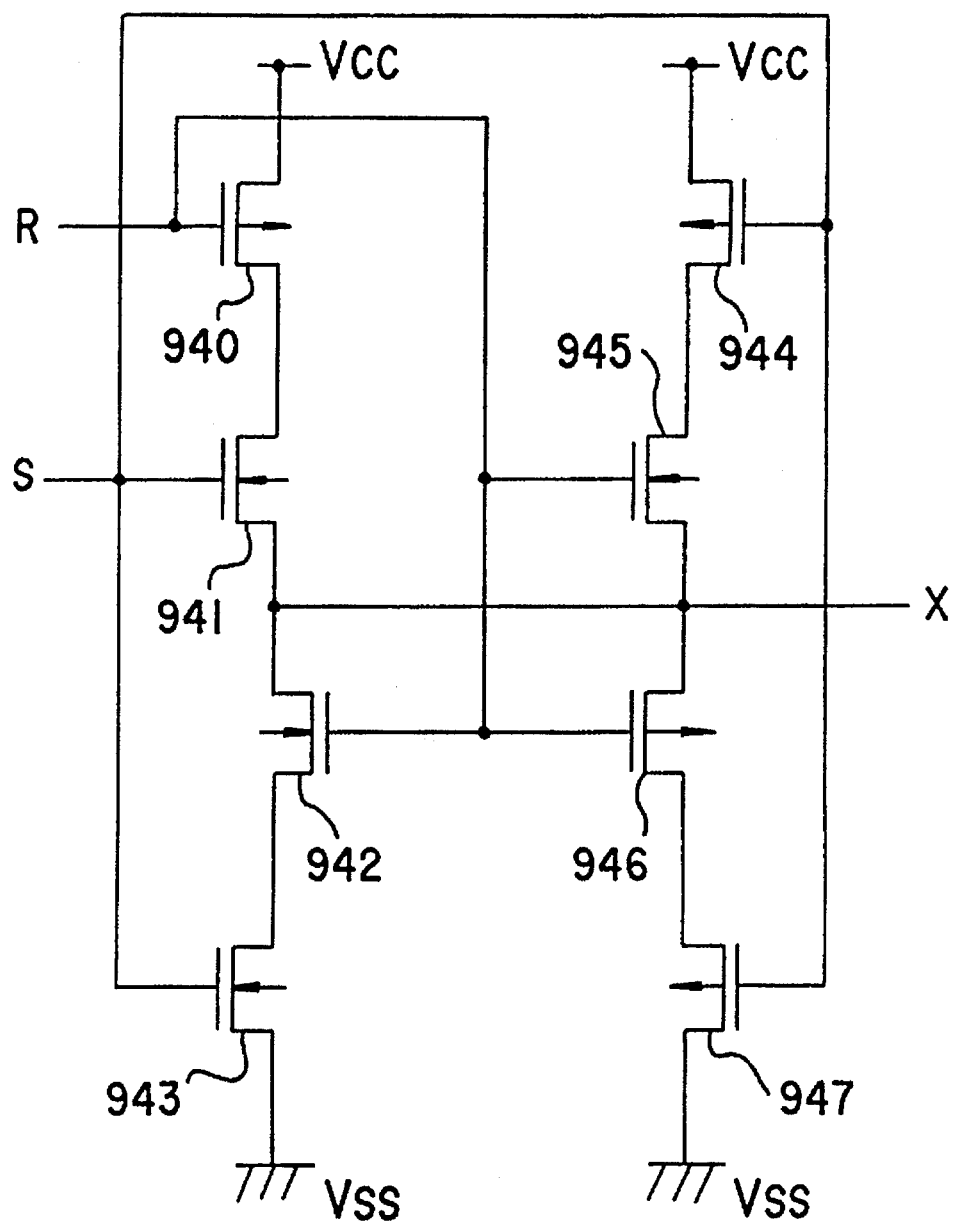
FIG. 124 shows an exclusive OR circuit in the thirty-seventh embodiment.

FIG. 124 shows an exclusive OR circuit of the thirty-seventh embodiment.

In the circuit, the source of a pMIS transistor 940 is connected to a high-voltage power supply line Vcc, and the drain thereof is connected to the drain of an nMIS transistor 942 via an nMIS transistor 941. The source of the nMIS transistor 942 is connected to a low-voltage power supply line Vss via an nMIS transistor 943. The drain of an nMIS transistor 945 is connected to the high-voltage power supply line Vcc via a pMIS transistor 944, and the source thereof is connected to the source of the pMIS transistor 946. The drain of the pMIS transistor 946 is connected to the low-voltage power supply line Vss via the pMIS transistor 947.

The gates of the nMIS transistors 942 and 945 or the pMIS transistors 940 and 946 are connected to each other, to which an input R is supplied. The gates of the nMIS transistors 941 and 943 or the pMIS transistors 944 and 947 are connected to each other, to which an input S is supplied. The sources of the nMIS transistors 941 and 945 are connected to each other, from which an output X is fetched.

In the foregoing circuitry, when the input S represents 1, the nMIS transistors 941 and 943 are turned on, while the pMIS transistors 944 and 947 are turned off. The output X equals to the input R whose polarity if reversed by a CMIS inverter made up of the pMIS transistor 940 and nMIS transistor 942. When the input S represents 0, the nMIS transistors 941 and 943 are turned off, while the pMIS transistors 944 and 947 are turned on. The output X equals to the input R that has passed through a non-reverse gate made up of the nMIS transistor 945 and pMIS transistor 946; that is, the input R itself. The output X is therefore the exclusive OR of the inputs R and S.

The number of elements in the exclusive OR circuit is eight or the same as that in the circuit in FIG. 119. Since the negative signal *R of the input R and the negative signal *S of the input S are unnecessary, two CMIS inverters, which are required when neither the input *R nor *S is available, need not be additionally installed. Using this exclusive OR circuit, the integration of a semiconductor integrated circuit can be improved.

The exclusive OR circuit gains an advantage over the one in FIG. 121 in terms of the output driving capacity, and wins an advantage over the one in FIG. 122 in terms of the high-speed operation.

Figure 125:
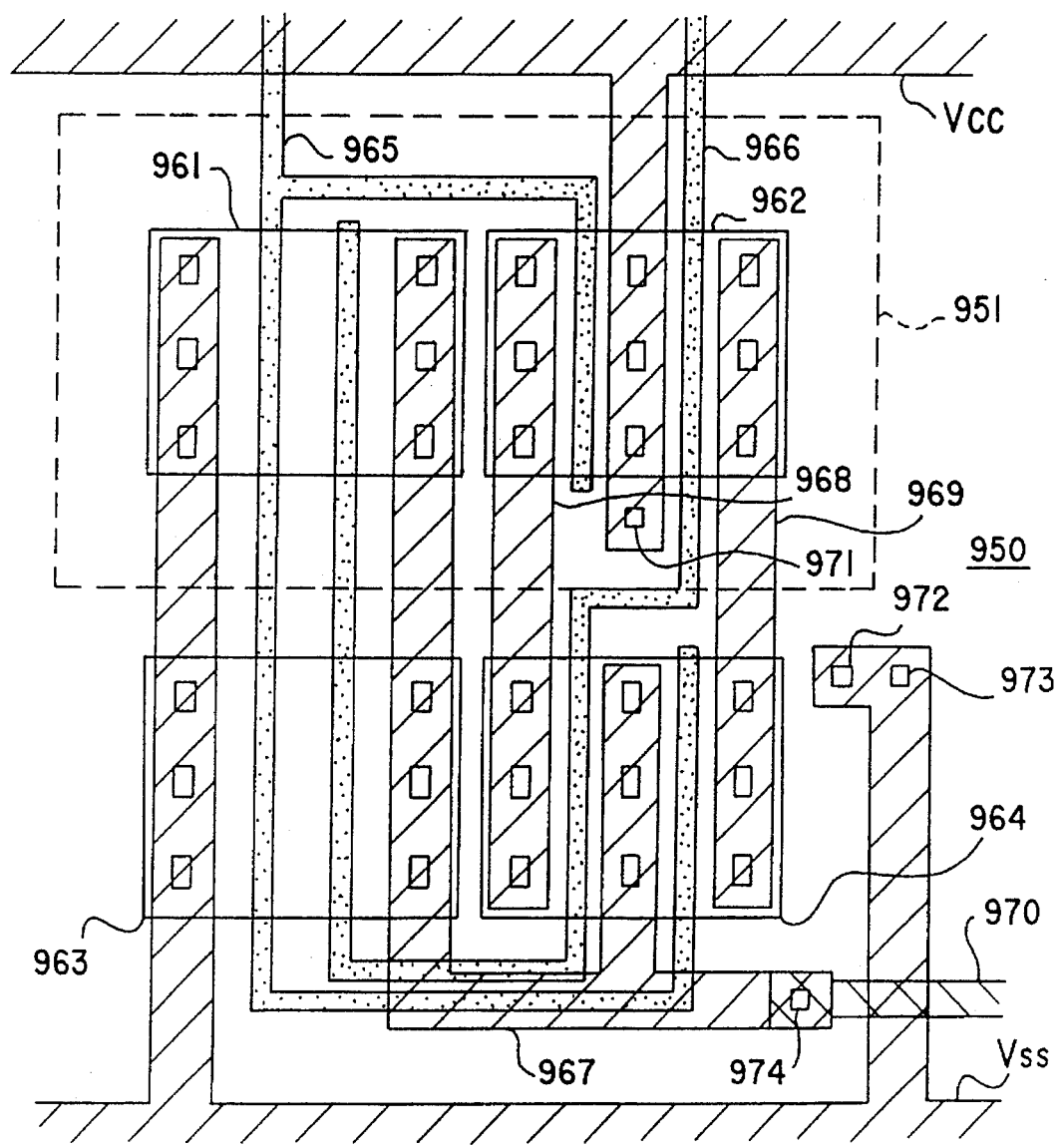
FIG. 125 shows a patten on a chip representing the circuit in FIG. 124.

FIG. 125 shows a pattern on a chip of a circuit in FIG. 124. In this circuit, an n-type well 951 is formed on the front surface of a p-type substrate 950, p-type diffused regions 961 and 962 are formed in the n-type well 95, and n-type diffused regions 963 and 964 are formed in the p-type substrate 950 near the n-type well 951. In FIG. 125, reference numerals 965 and 966 denote gates in the zero horizon. The gates 965 and 966 are made of poly-silicon or the like. 967, 968, and 969 denote metallic lines in the first layer from the p-type substrate 950; and 970 denotes a metallic line in the second layer from the p-type substrate 950. Small rectangles in FIG. 125 represent interlayer connection contacts. Among the contacts, a contact 971 connects the high-voltage power supply line Vcc with the n-type well 951. Contacts 972 and 973 connect the low-voltage power supply line Vss with the p-type substrate 950. A contact 974 connects the metallic line 967 with the metallic line 970.

As apparent from FIG. 125, the chip area occupied by this exclusive OR circuit is relatively small.

As described above, the exclusive OR circuit of the thirty-third embodiment or the exclusive NOR circuit of the thirty-fourth embodiment has four circuit elements which is half of the number of elements in the conventional circuit in FIG. 119. Moreover, since the negative signal *R of the input R and the negative signal *S of the input S are unnecessary, two CMIS inverters, which are required when neither the input *R nor *S is available, need not be additionally installed. The thirty-third or thirty-fourth embodiment has the superb advantages that the number of circuit elements can be reduced and that the integration of a semiconductor integrated circuit can be improved.

The exclusive OR circuit of the thirty-fifth embodiment or the exclusive NOR circuit of the thirty-sixth embodiment has six circuit elements which is a half of the number of elements in the conventional circuit in FIG. 119. Moreover, since the negative signal *R of the input R and the negative signal *S of the input S are unnecessary, two CMIS inverters, which are required when neither the input *R nor *S is available, need not be additionally installed. The thirty-fifth and thirty-sixth embodiments have superb advantages in that the number of circuit elements can be reduced and that the integration of a semiconductor integrated circuit can be improved.

The exclusive OR circuit of the thirty-fifth embodiment gains an advantage over the one of the thirty-third embodiment in terms of the output driving capacity. The exclusive NOR circuit of the thirty-sixth embodiment wins an advantage over the one of the thirty-fourth embodiment in terms of the output driving capacity.

The exclusive OR circuit of the thirty-seventh embodiment has eight elements which is the same number of elements as that in the conventional circuit in FIG. 119. Since the negative signal *R of the input R and the negative signal *S of the input S are unnecessary, two CMIS inverters, which are required when neither the input *R nor *S is available, need not be additionally installed. Using this exclusive OR circuit, the integration of a semiconductor integrated circuit can be improved.

The exclusive OR circuit of the thirty-seventh embodiment gains advantage over the one of the thirty-third embodiment in terms of the output driving capacity, and wins an advantage over the one of the thirty-fifth embodiment in terms of the high-speed operation.

INDUSTRIAL APPLICABILITY

Flash memories are expected to substitute for magnetic storages. For use in portable equipment on behalf of magnetic storages, in particular, the properties of flash memories; that is, small size and light weight will prove very helpful. For actual use in portable equipment in place of magnetic storage, the flash memory must further be innovated to achieve downsizing, an increase in operational speed, reduction in power consumption, and decrease in voltage requirements. The present invention provides an innovative flash memory and solves many problems obstructing the widespread use of the flash memory.

We claim:

1. An exclusive OR circuit, comprising:

a first series circuit in which the source of a first pMIS transistor (940) is connected to a positive-voltage power supply line, the drain of said first pMIS transistor is connected to the drain of a first nMIS transistor (942) via a second nMIS transistor (941), and the source of said first nMIS transistor is connected to a low-voltage power supply line via a fourth nMIS transistor (943); and a second series circuit in which the drain of a third nMIS transistor (945) is connected to said high-voltage power supply line Vcc via a second pMIS transistor (944), the source of said third nMIS transistor is connected to the source of a third pMIS transistor (946), and the drain of said third pMIS transistor is connected to said low-voltage power supply line via a fourth pMIS transistor (947);

the gates of said first nMIS transistor, said third nMIS transistor, said first pMIS transistor, and said third pMIS transistor being connected to one another and provided with a first input (R); the gates of said second nMIS transistor, said fourth nMIS transistor, said second pMIS transistor, and said fourth pMIS transistor being connected to one another and provided with a second input (S); the sources of said second nMIS transistor and said third nMIS transistor being connected to each other and providing the exclusive OR (X) of said first and second inputs.

* * * * *

UNITED STATES PATENT AND TRADEMARK OFFICE
CERTIFICATE OF CORRECTION

PATENT NO. : 5,576,637
DATED : November 19, 1996
INVENTOR(S) : Akaogi, et. al.

It is certified that error appears in the above-indentified patent and that said Letters Patent is hereby corrected as shown below:

Title page, item [30], delete "September 15, 1992" and insert therefor-- September 25, 1992--.

Signed and Sealed this

Sixth Day of May, 1997

Attest:

BRUCE LEHMAN

Attesting Officer                Commissioner of Patents and Trademarks